United States Patent
Kinugawa et al.

(10) Patent No.: US 10,033,154 B2
(45) Date of Patent: Jul. 24, 2018

(54) SEMICONDUCTOR OPTICAL ELEMENT, SEMICONDUCTOR LASER ELEMENT, AND METHOD FOR MANUFACTURING SEMICONDUCTOR OPTICAL ELEMENT AND SEMICONDUCTOR LASER ELEMENT, AND METHOD FOR MANUFACTURING SEMICONDUCTOR LASER MODULE AND SEMICONDUCTOR ELEMENT

(71) Applicant: Furukawa Electric Co., Ltd., Tokyo (JP)

(72) Inventors: Kouhei Kinugawa, Tokyo (JP);
Hidehiro Taniguchi, Tokyo (JP);
Masafumi Tajima, Tokyo (JP);
Hirotatsu Ishii, Tokyo (JP); Takeshi Namegaya, Tokyo (JP)

(73) Assignee: Furukawa Electronic Co., Ltd., Tokyo (JP)

(*) Notice: Subject to any disclaimer, the term of this patent is extended or adjusted under 35 U.S.C. 154(b) by 0 days.

(21) Appl. No.: 14/622,363

(22) Filed: Feb. 13, 2015

(65) Prior Publication Data

US 2015/0180203 A1  Jun. 25, 2015

Related U.S. Application Data

(63) Continuation-in-part of application No. PCT/JP2014/053361, filed on Feb. 13, 2014, and a
(Continued)

(51) Int. Cl.
*H01L 31/00* (2006.01)
*H01S 5/16* (2006.01)
(Continued)

(52) U.S. Cl.
CPC ............ *H01S 5/162* (2013.01); *H01S 5/2072* (2013.01); *H01L 21/0262* (2013.01);
(Continued)

(58) Field of Classification Search
CPC ...... H01S 5/162; H01S 5/2072; H01S 5/2031; H01S 5/2068; H01S 5/22; H01S 5/222;
(Continued)

(56) References Cited

U.S. PATENT DOCUMENTS 5,699,375 A  12/1997 Paoli
5,708,674 A  1/1998 Beernink et al.
(Continued)

FOREIGN PATENT DOCUMENTS

CN  101796699 A  8/2010
CN  101868888 A  10/2010
(Continued)

OTHER PUBLICATIONS

Office Action dated Feb. 3, 2015, in co-pending U.S. Appl. No. 14/460,090.
(Continued)

*Primary Examiner* — Vu A Vu
(74) *Attorney, Agent, or Firm* — Oblon, McClelland, Maier & Neustadt, L.L.P.

(57) ABSTRACT

A semiconductor optical element includes a semiconductor layer portion that includes an optical waveguide layer. The semiconductor layer portion contains a first impurity having a function of suppressing atomic vacancy diffusion and a second impurity having a function of promoting atomic vacancy diffusion, between a topmost surface of the semiconductor layer portion and the optical waveguide layer. The semiconductor layer portion includes two or more regions that extend in a deposition direction. At least one of the two or more regions contains both the first impurity and the
(Continued)

second impurity. The two or more regions have different degrees of disordering in the optical waveguide layer achieved through atomic vacancy diffusion and different band gap energies of the optical waveguide layer.

7 Claims, 100 Drawing Sheets

Related U.S. Application Data continuation-in-part of application No. 14/460,090, filed on Aug. 14, 2014, which is a continuation of application No. 12/716,315, filed on Mar. 3, 2010, now Pat. No. 8,842,707.

(51) Int. Cl.

| | |
|---|---|
| *H01S 5/20* | (2006.01) |
| *H01S 5/30* | (2006.01) |
| *H01S 5/22* | (2006.01) |
| *H01S 5/32* | (2006.01) |
| *H01S 5/343* | (2006.01) |
| *H01L 21/02* | (2006.01) |

(52) U.S. Cl.
CPC .. *H01L 21/02546* (2013.01); *H01L 21/02579* (2013.01); *H01S 5/2031* (2013.01); *H01S 5/2068* (2013.01); *H01S 5/22* (2013.01); *H01S 5/222* (2013.01); *H01S 5/3054* (2013.01); *H01S 5/3211* (2013.01); *H01S 5/34313* (2013.01)

(58) Field of Classification Search
CPC .. H01S 5/3054; H01S 5/3211; H01S 5/34313; H01L 21/02546; H01L 21/02579; H01L 21/0262
USPC .......................................................... 257/14
See application file for complete search history.

(56) References Cited

U.S. PATENT DOCUMENTS

| | | | |
|---|---|---|---|
| 5,764,669 A | 6/1998 | Nagai | |
| 6,005,881 A | 12/1999 | Ikoma | |
| 6,590,918 B1 * | 7/2003 | Mannou | B82Y 20/00 257/79 |
| 6,674,778 B1 | 1/2004 | Lin et al. | |
| 7,590,158 B2 * | 9/2009 | Ono | B82Y 20/00 372/43.01 |
| 8,842,707 B2 | 9/2014 | Taniguchi et al. | |
| 2004/0119081 A1 | 6/2004 | Takemi et al. | |
| 2007/0026620 A1 | 2/2007 | Yamada | |
| 2007/0045651 A1 * | 3/2007 | Suzuki | B82Y 20/00 257/102 |
| 2010/0195685 A1 | 8/2010 | Taniguchi et al. | |
| 2010/0232464 A1 | 9/2010 | Taniguchi et al. | |
| 2013/0044781 A1 | 2/2013 | Taniguchi et al. | |

FOREIGN PATENT DOCUMENTS

| | | |
|---|---|---|
| EP | 0 818 860 A1 | 1/1998 |
| EP | 2 187 488 A1 | 5/2010 |
| EP | 2 214 272 A1 | 8/2010 |
| JP | 6-77596 A | 3/1994 |
| JP | 8-236860 A | 9/1996 |
| JP | 9-23037 A | 1/1997 |
| JP | 10-65278 A | 3/1998 |
| JP | 10-200190 A | 7/1998 |
| JP | 2001-15859 A | 1/2001 |
| JP | 2007-242718 A | 9/2007 |
| JP | 2011-103494 A | 5/2011 |
| JP | 2011-233644 A | 11/2011 |
| JP | 2012-222028 A | 11/2012 |
| JP | 2012-222045 A | 11/2012 |
| JP | 2014-3229 A | 1/2014 |
| WO | WO 2009/031206 A1 | 3/2009 |
| WO | WO 2009/066739 A1 | 5/2009 |
| WO | WO 2011/135803 A1 | 11/2011 |
| WO | WO 2012/137426 A1 | 10/2012 |

OTHER PUBLICATIONS

International Search Report dated May 27, 2014 in PCT/JP2014/053361 (with English language translation).
Office Action dated Jul. 15, 2015 in co-pending U.S. Appl. No. 14/460,090.
Office Action dated Dec. 10, 2015 in co-pending U.S. Appl. No. 14/460,090.
U.S. Appl. No. 14/825,660, filed Aug. 13, 2015, Kinugawa, et al.

* cited by examiner

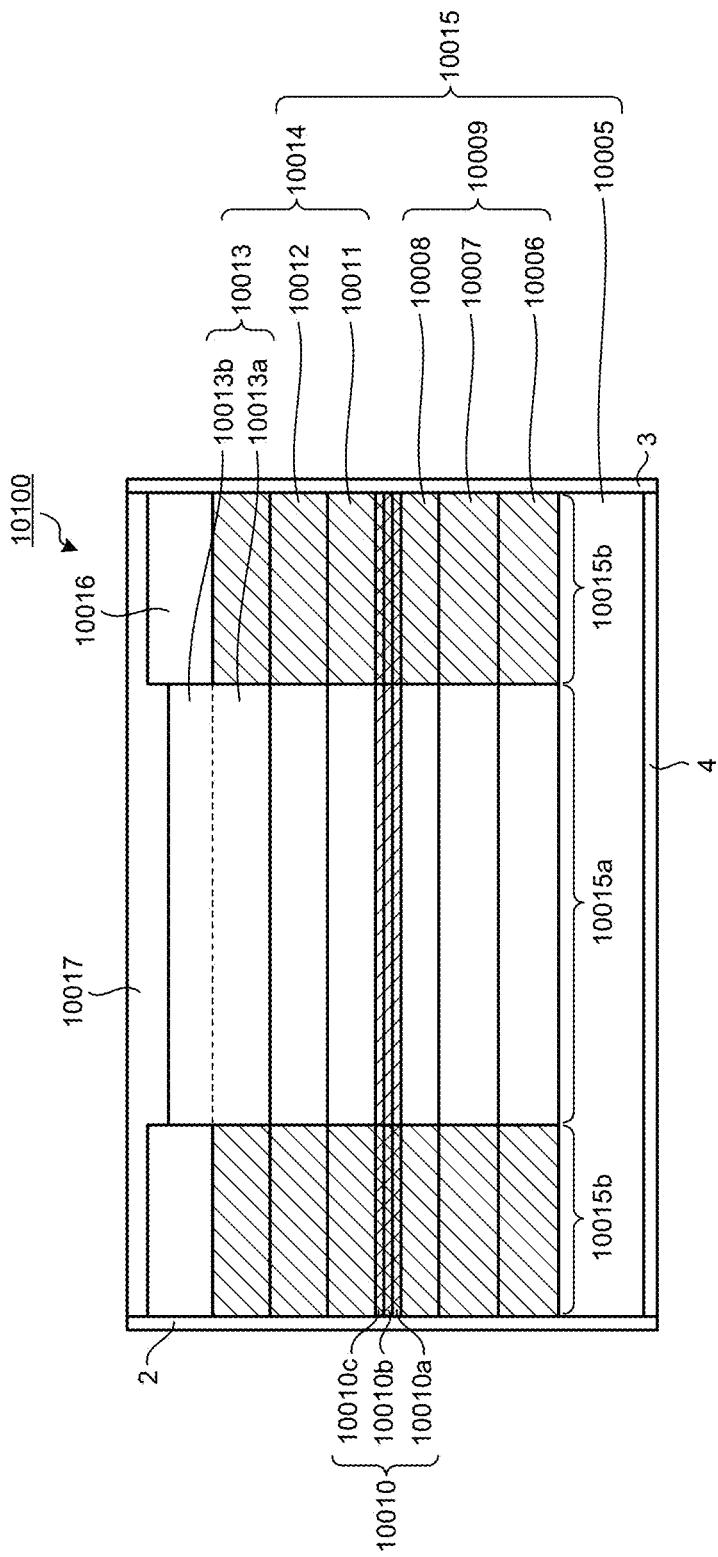

| | | EXAMPLE 1-1 | EXAMPLE 1-2 | EXAMPLE 1-3 | COMPARATIVE EXAMPLE 1 |
|---|---|---|---|---|---|
| NON-WINDOW REGION | C CONTENT [$cm^{-2}$] | $9.52 \times 10^{14}$ | | | |
| | Zn CONTENT [$cm^{-2}$] | $1.60 \times 10^{14}$ | | | |
| | AMOUNT OF Eg SHIFT [meV] | 5 | | | |
| WINDOW REGION | C CONTENT [$cm^{-2}$] | $9.52 \times 10^{14}$ | | | |
| | ETCHED AMOUNT D [nm] | 99 | 72 | 30 | 0 |
| | Zn CONTENT [$cm^{-2}$] | $3.88 \times 10^{13}$ | $7.25 \times 10^{13}$ | $1.25 \times 10^{14}$ | $1.60 \times 10^{14}$ |
| | AMOUNT OF Eg SHIFT [meV] | 136 | 124 | 105 | 95 |
| ΔEg [meV] | | 131 | 119 | 100 | 90 |

|  |  | EXAMPLE 2 | COMPARATIVE EXAMPLE 2 |
|---|---|---|---|
| NON-WINDOW REGION | C CONTENT [cm$^{-2}$] | 8.53×10$^{14}$ |  |
|  | Zn CONTENT [cm$^{-2}$] | 1.25×10$^{14}$ |  |
|  | AMOUNT OF Eg SHIFT [meV] | 9 |  |
| WINDOW REGION | C CONTENT [cm$^{-2}$] | 9.52×10$^{14}$ | 8.53×10$^{14}$ |
|  | Zn CONTENT [cm$^{-2}$] | 1.25×10$^{14}$ |  |
|  | AMOUNT OF Eg SHIFT [meV] | 105 | 22 |
| ΔEg [meV] |  | 96 | 13 |

|  |  | EXAMPLE 3-1 | EXAMPLE 3-2 | COMPARATIVE EXAMPLE 3 |
|---|---|---|---|---|
| NON-WINDOW REGION | Zn CONTENT [$cm^{-2}$] | $4.38 \times 10^{14}$ | $1.45 \times 10^{15}$ | $1.91 \times 10^{15}$ |
|  | AMOUNT OF Eg SHIFT [meV] | 2 | 14 | 30 |
| WINDOW REGION | Zn CONTENT [$cm^{-2}$] | $1.91 \times 10^{15}$ | | |
|  | AMOUNT OF Eg SHIFT [meV] | 52 | | |
| ΔEg [meV] | | 50 | 38 | 22 |

|  |  | EXAMPLE 4-1 | EXAMPLE 4-2 | COMPARATIVE EXAMPLE 4 |
|---|---|---|---|---|
| NON-WINDOW REGION | Zn CONTENT [$cm^{-2}$] | $4.38 \times 10^{14}$ | $1.23 \times 10^{15}$ | $1.50 \times 10^{15}$ |
| | AMOUNT OF Eg SHIFT [meV] | 21 | 16 | 14 |
| WINDOW REGION | Zn CONTENT [$cm^{-2}$] | $4.38 \times 10^{14}$ | | |
| | AMOUNT OF Eg SHIFT [meV] | 29 | | |
| ΔEg [meV] | | 8 | 13 | 15 |

|  |  | EXAMPLE 5-1 | EXAMPLE 5-2 | COMPARATIVE EXAMPLE 5 |
|---|---|---|---|---|
| NON-WINDOW REGION | C CONTENT [$cm^{-2}$] | $5.80 \times 10^{14}$ | $7.20 \times 10^{14}$ | $1.20 \times 10^{15}$ |
|  | AMOUNT OF Eg SHIFT [meV] | 3 | 4 | 14 |
| WINDOW REGION | C CONTENT [$cm^{-2}$] | $1.20 \times 10^{15}$ | | |
|  | AMOUNT OF Eg SHIFT [meV] | 24 | | |
| ΔEg [meV] | | 21 | 20 | 10 |

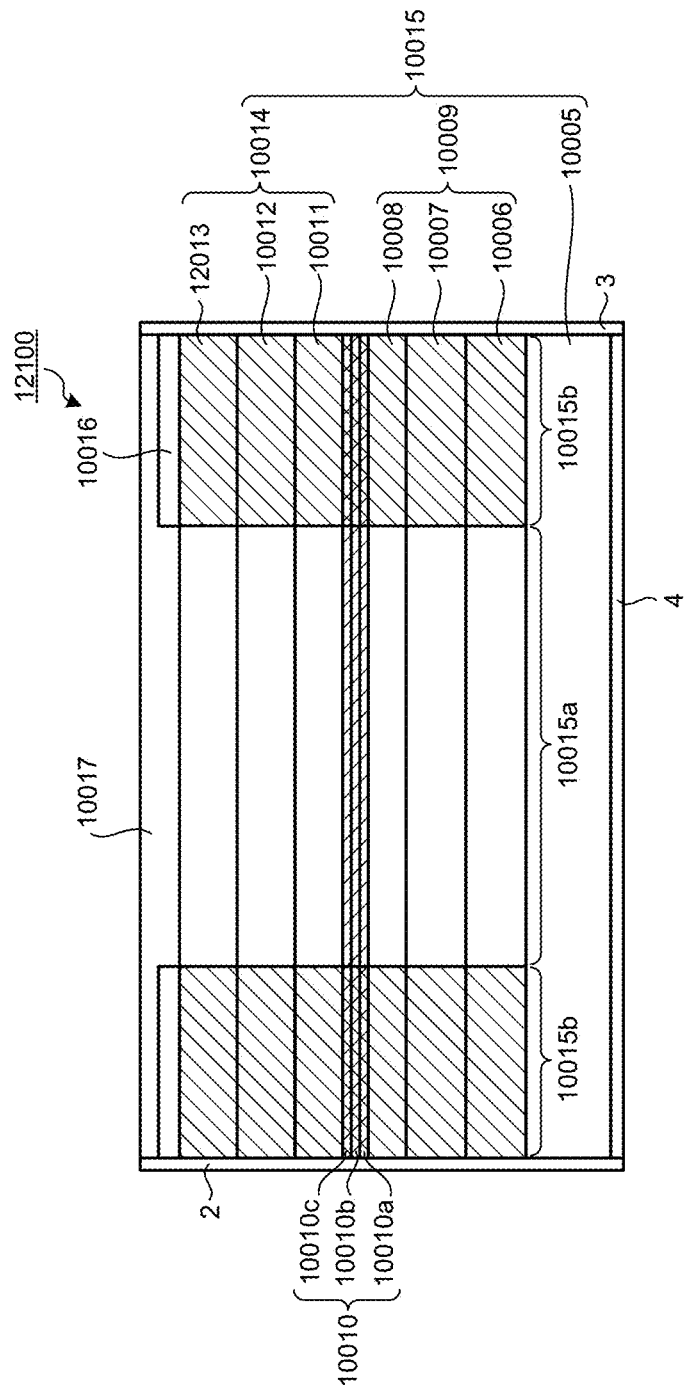

SEMICONDUCTOR OPTICAL ELEMENT, SEMICONDUCTOR LASER ELEMENT, AND METHOD FOR MANUFACTURING SEMICONDUCTOR OPTICAL ELEMENT AND SEMICONDUCTOR LASER ELEMENT, AND METHOD FOR MANUFACTURING SEMICONDUCTOR LASER MODULE AND SEMICONDUCTOR ELEMENT

CROSS-REFERENCE TO RELATED APPLICATIONS

This application is a continuation-in-part of U.S. application Ser. No. 14/460,090, which is a continuation of U.S. application Ser. No. 12/716,315 filed on Mar. 3, 2010, which is a continuation of PCT International Application No. PCT/JP2007/067231 filed on Sep. 4, 2007, and which claims the benefit of priority from PCT International Application No. PCT/JP2014/053361 filed on Feb. 13, 2014, entire contents of which are incorporated herein by reference.

BACKGROUND OF THE INVENTION

1. Field of the Invention

The present invention relates to a semiconductor optical element, a semiconductor laser element, and method for manufacturing a semiconductor optical element and a semiconductor laser element, and method for manufacturing a semiconductor laser module and a semiconductor element.

2. Description of the Related Art

Conventionally, in semiconductor laser elements that output laser beams by amplifying light generated by recombination of carriers within active layers, light-emitting facets may be degraded due to strong light densities and damage called catastrophic optical damage (COD) may be caused. As a countermeasure against this damage, it has been proposed to provide window regions that absorb less laser light than the insides of active layers, by increasing energy-band gaps at light-emitting facets.

In recent years, to form a window region in a GaAs semiconductor laser element, there has been proposed a technique using an impurity free vacancy disordering (IFVD) method of disordering a region corresponding to the window region by performing a predetermined thermal treatment after depositing a promoting film formed correspondingly to the window region to promote diffusion of Ga and a suppression film formed correspondingly to a non-window region to suppress the diffusion of Ga (see Japanese Patent Application Laid-open No. H7-122816).

SUMMARY OF THE INVENTION

A semiconductor optical element according to an aspect of the present invention includes a semiconductor layer portion that includes an optical waveguide layer. The semiconductor layer portion contains a first impurity having a function of suppressing atomic vacancy diffusion and a second impurity having a function of promoting atomic vacancy diffusion, between a topmost surface of the semiconductor layer portion and the optical waveguide layer. The semiconductor layer portion includes two or more regions that extend in a deposition direction. At least one of the two or more regions contains both the first impurity and the second impurity. The two or more regions have different degrees of disordering in the optical waveguide layer achieved through atomic vacancy diffusion and different band gap energies of the optical waveguide layer.

A semiconductor laser element that is an edge emitting semiconductor laser element according to another aspect of the present invention, includes a semiconductor layer portion including an active layer. The semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction. The semiconductor layer portion contains a first impurity having a function of suppressing the atomic vacancy diffusion and a second impurity having a function of promoting the atomic vacancy diffusion, between a topmost surface of the semiconductor layer portion and the active layer. The non-window region has a higher content of the first impurity than in the window region, and contains the second impurity.

A semiconductor laser element that is an edge emitting semiconductor laser element according to still another aspect of the present invention, includes a semiconductor layer portion including an active layer. The semiconductor layer portion has a non-window region including a part of the active layer and extending in a deposition direction, and a window region provided at least in a region adjacent to a facet from which laser light is output, the window region including another part of the active layer, having a higher band gap energy increased through atomic vacancy diffusion than that in the non-window region, and extending in the deposition direction. The semiconductor layer portion contains a first impurity having a function of suppressing the atomic vacancy diffusion and a second impurity having a function of promoting the atomic vacancy diffusion, between a topmost surface of the semiconductor layer portion and the active layer. The window region has a higher content of the second impurity than in the non-window region, and contains the first impurity.

A semiconductor laser element that is an edge emitting semiconductor laser element according to still another aspect of the present invention, includes a semiconductor layer portion including an active layer. The semiconductor layer portion has a non-window region including a part of the active layer, and a window region provided at least in a region adjacent to a facet from which laser light is output, the window region including another part of the active layer and having a higher band gap energy increased through atomic vacancy diffusion than that in the non-window region. A topmost layer region of the non-window region in the semiconductor layer portion contains a first impurity of a first conductivity type having a function of suppressing atomic vacancy diffusion and a second impurity of the first conductivity type having a function of promoting atomic vacancy diffusion. The topmost layer region has a higher content of one of the first impurity and the second impurity with a lower diffusion coefficient.

A semiconductor laser module according to still another aspect of the present invention includes the semiconductor laser element according to an aspect of the present invention, and capable of operating without adjusting temperature of the semiconductor laser element.

A method for manufacturing a semiconductor optical element that includes a semiconductor layer portion including an optical waveguide layer, and having two or more regions with different degrees of disordering in the optical waveguide layer achieved through atomic vacancy diffusion and different band gap energies of the optical waveguide layer, according to still another aspect of the present invention includes: forming a semiconductor layer portion; depositing a dielectric film on the semiconductor layer portion; and annealing to form atomic vacancies in a first region that is at least one of the two or more regions. The forming includes forming a second impurity-containing layer on a topmost layer of the semiconductor layer portion, the second impurity-containing layer containing a second impurity of a first conductivity type having a function of promoting atomic vacancy diffusion; forming a first impurity-containing layer on a surface of the second impurity-containing layer, the first impurity-containing layer containing a first impurity of the first conductivity type having a function of suppressing atomic vacancy diffusion.

A method for manufacturing a semiconductor optical element that includes a semiconductor layer portion including an optical waveguide layer, and having two or more regions with different degrees of disordering in the optical waveguide layer achieved through atomic vacancy diffusion and different band gap energies of the optical waveguide layer, according to still another aspect of the present invention includes: forming a semiconductor layer portion; depositing a dielectric film on the semiconductor layer portion; and annealing to form atomic vacancies in a first region that is at least one of the two or more regions. The forming includes forming a first impurity-containing layer on a topmost layer of the semiconductor layer portion, the first impurity-containing layer containing a first impurity of a first conductivity type having a function of suppressing atomic vacancy diffusion; forming a second impurity-containing layer on a surface of the first impurity-containing layer, the second impurity-containing layer containing a second impurity of the first conductivity type having a function of promoting atomic vacancy diffusion; and removing at least a part of the second impurity-containing layer formed in a second region that is not the first region and that is at least one of the two or more regions.

A method for manufacturing a semiconductor laser element that is an edge emitting semiconductor laser element that includes a semiconductor layer portion including an active layer, the semiconductor layer portion having a non-window region including a part of the active layer and a window region provided at least in a region adjacent to a facet from which laser light is output, the window region including another part of the active layer and having a higher band gap energy increased through atomic vacancy diffusion than that in the non-window region, according to still another aspect of the present invention includes: forming the semiconductor layer portion; depositing a dielectric film on the semiconductor layer portion; and annealing to form and to diffuse atomic vacancies in the window region. The forming of the semiconductor layer portion includes allowing a topmost layer region of the semiconductor layer portion to contain one of the first impurity having a function of suppressing atomic vacancy diffusion and the second impurity having a function of promoting atomic vacancy diffusion with a lower diffusion coefficient in a larger amount.

A method for manufacturing a semiconductor element that includes a semiconductor layer structure having a first region, and a second region with a higher degree of disordering achieved through atomic vacancy diffusion than that in the first region, according to still another aspect of the present invention includes: forming the semiconductor layer structure with doping a first impurity having a function of suppressing atomic vacancy diffusion or a second impurity having a function of promoting atomic vacancy diffusion; enabling disordered crystals to grow more easily in the second region than in the first region of the semiconductor layer structure; bringing a topmost surface of the first region and a topmost surface of the second region into contact with a uniform medium; and annealing to form and to diffuse the atomic vacancies in the second region. The enabling includes at least one of: allowing an amount of the first impurity having a function of suppressing atomic vacancy diffusion to be smaller in the second region than in the first region, and allowing an amount of the second impurity having a function of promoting atomic vacancy diffusion to be smaller in the first region than in the second region.

The above and other features, advantages, and technical and industrial significance of this invention will be better understood by reading the following detailed description of presently preferred embodiments of the invention, when considered in connection with the accompanying drawings.

BRIEF DESCRIPTION OF THE DRAWINGS

FIG. 34B is a cross-sectional view along a y-z plane in the semiconductor laser element according to the third embodiment;

FIG. 90B is a cross-sectional view along the y-z plane in the semiconductor laser element according to the tenth embodiment;

FIG. 114 is a schematic for explaining a method for manufacturing a semiconductor element according to the fourteenth embodiment;

FIG. 115 is a schematic for explaining the method for manufacturing a semiconductor element according to the fourteenth embodiment;

FIG. 116 is a schematic for explaining the method for manufacturing a semiconductor element according to the fourteenth embodiment;

FIG. 117 is a schematic for explaining the method for manufacturing a semiconductor element according to the fourteenth embodiment;

FIG. 118 is a schematic for explaining the method for manufacturing a semiconductor element according to the fourteenth embodiment;

FIG. 119 is a schematic illustrating a relation between the etched amount of the p-type contact layer and the amount of gap energy shift in a second region in Example 10;

FIG. 120 is an SEM photograph representing how the dielectric film is uniformly formed across the topmost surfaces of the first region and the second region in the semiconductor layer structure according to Example 10;

FIG. 121 is a cross-sectional view along the y-z plane in a semiconductor element fabricated with the manufacturing method according to a first modification;

FIG. 122 is a schematic for explaining the method for manufacturing a semiconductor element according to the first modification;

FIG. 123 is a cross-sectional view along the y-z plane in a semiconductor element fabricated with the manufacturing method according to a second modification;

FIG. 124 is a schematic for explaining the method for manufacturing a semiconductor element according to the second modification;

FIG. 125 is a schematic for explaining the method for manufacturing a semiconductor element according to the second modification;

Figure 126:
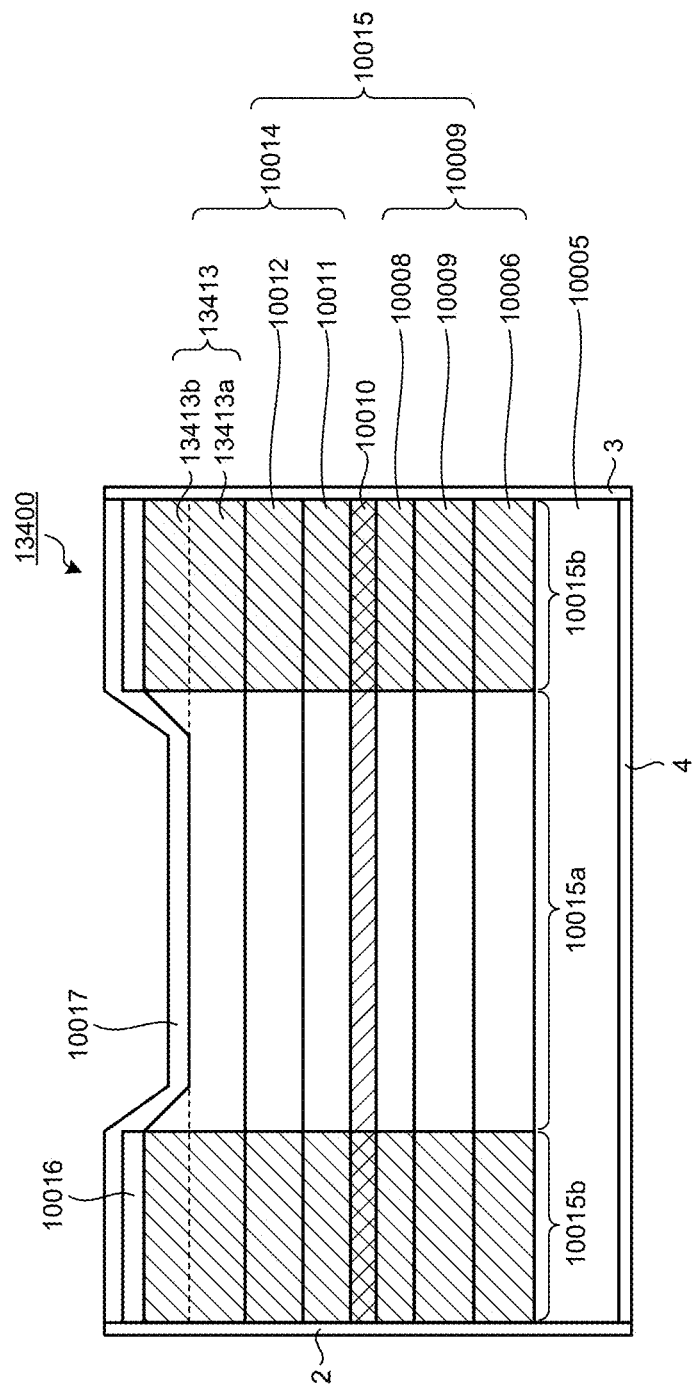
Figure 127:
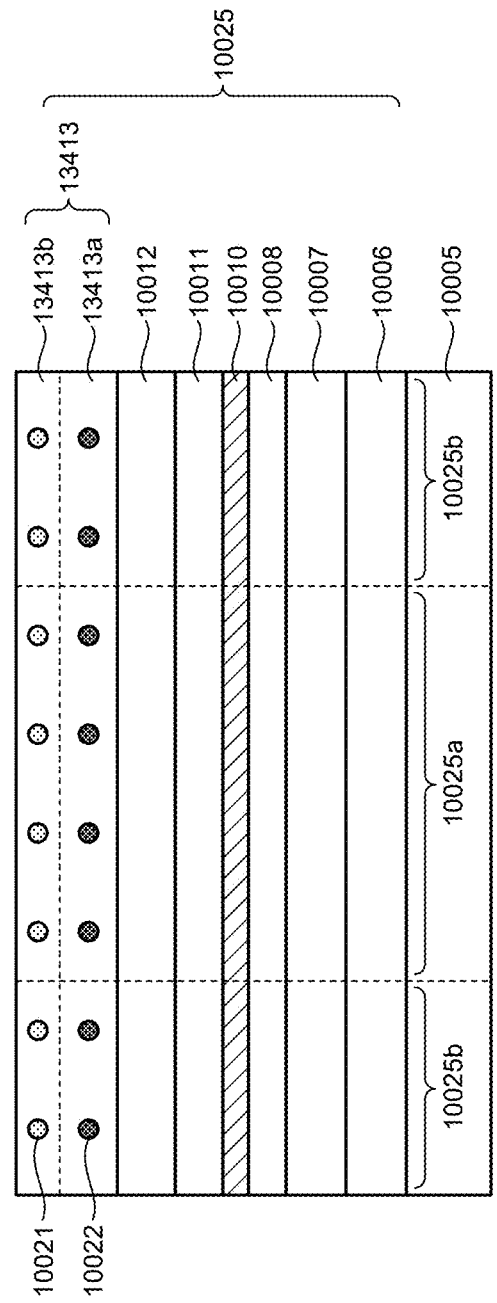
Figure 128:
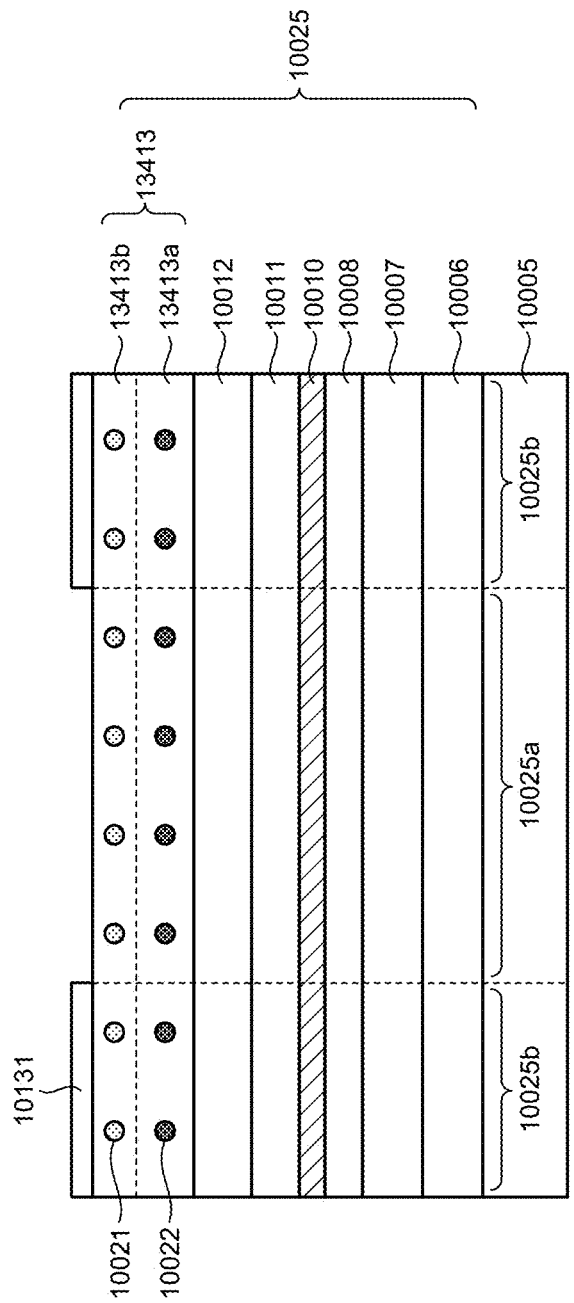
Figure 129:
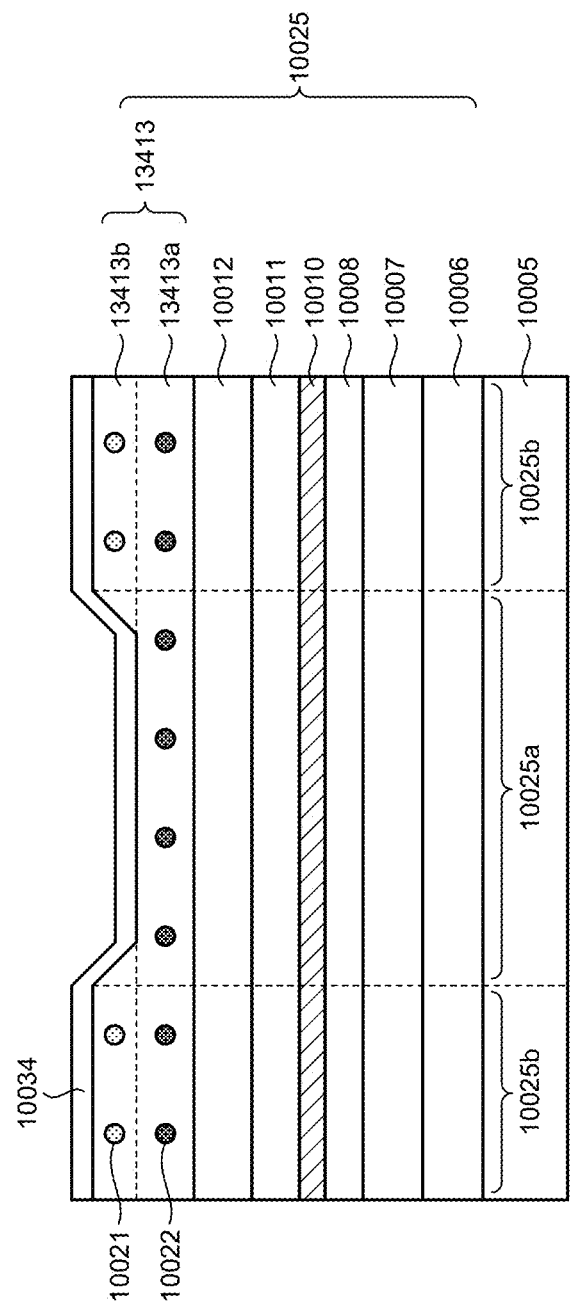
Figure 130:
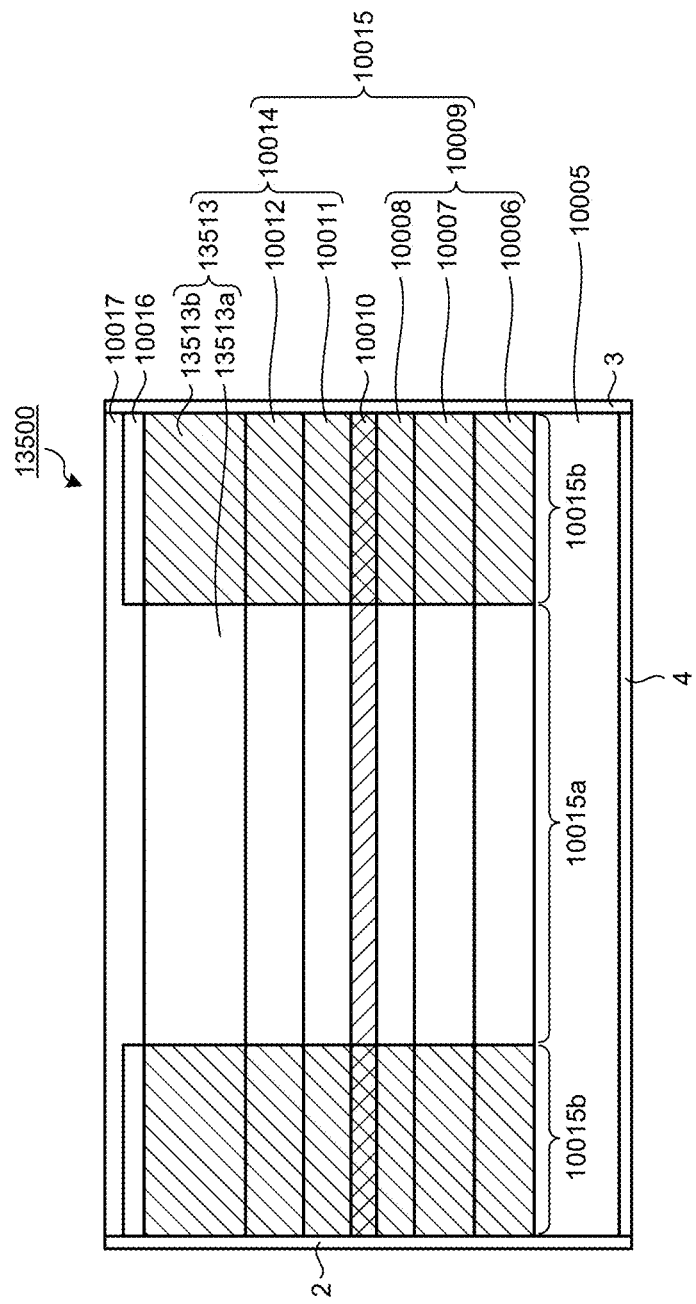
Figure 131:
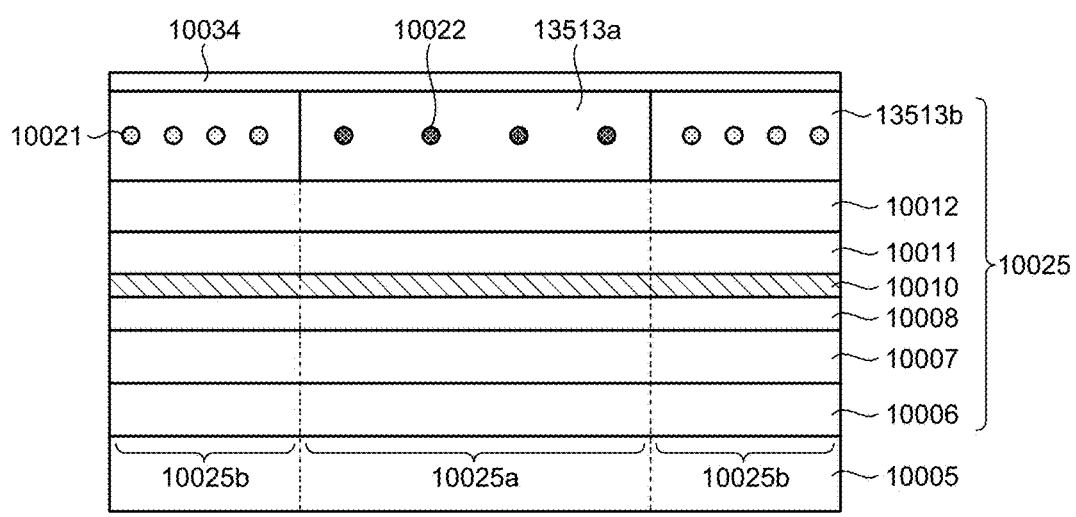
Figure 132:
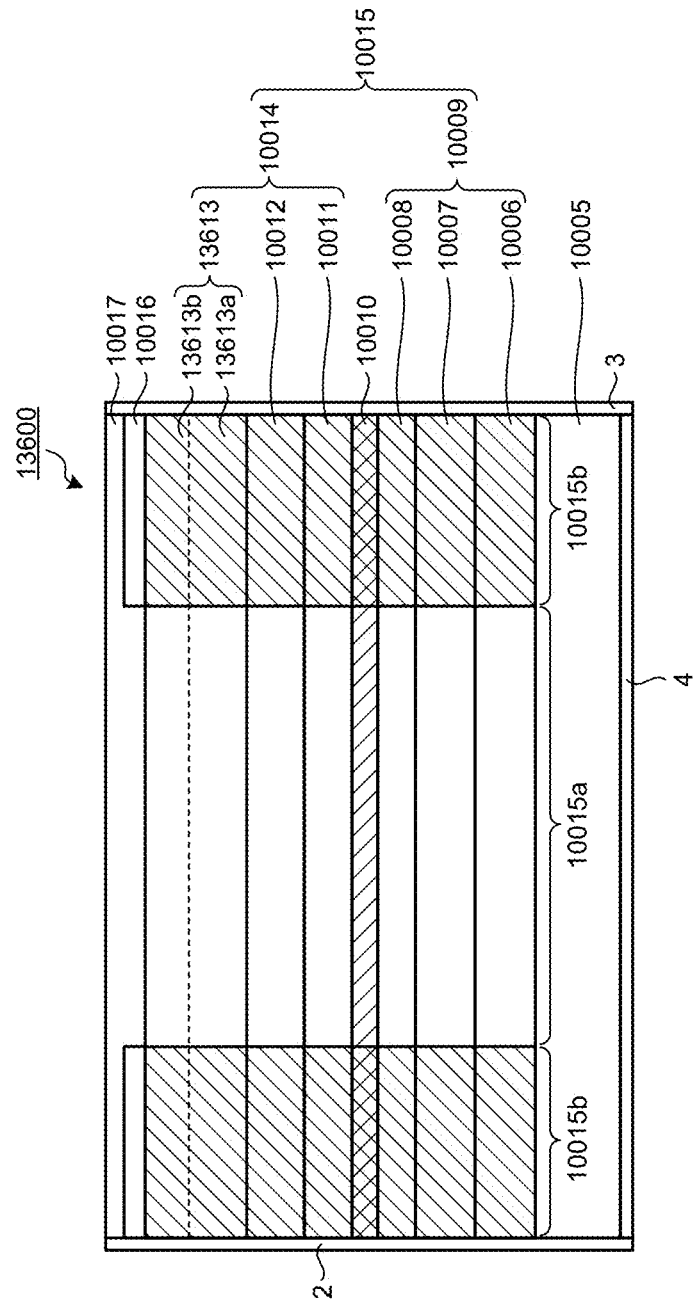
Figure 133:
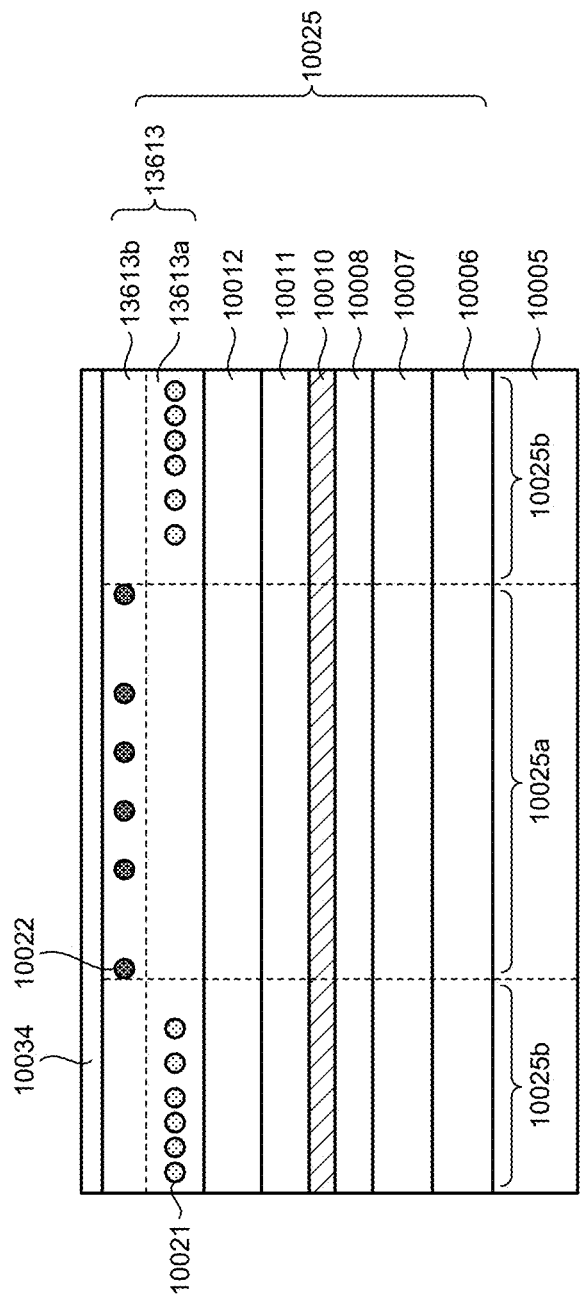
Figure 134:
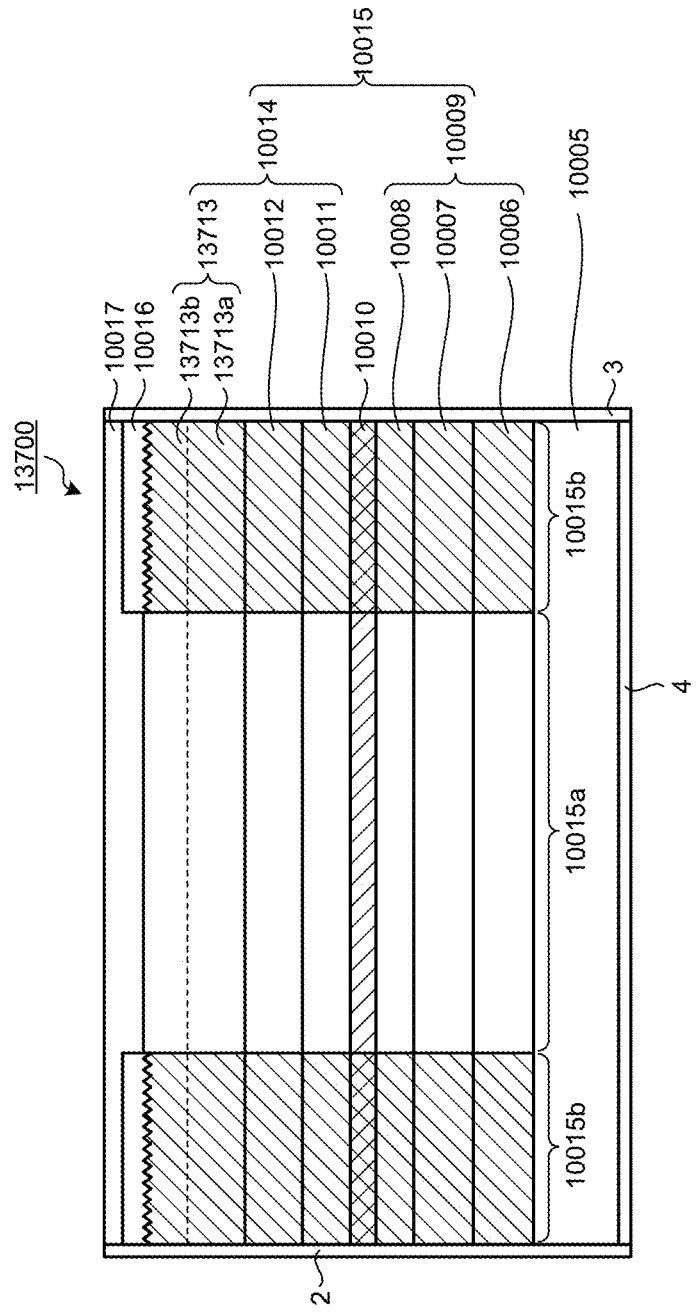
Figure 135:
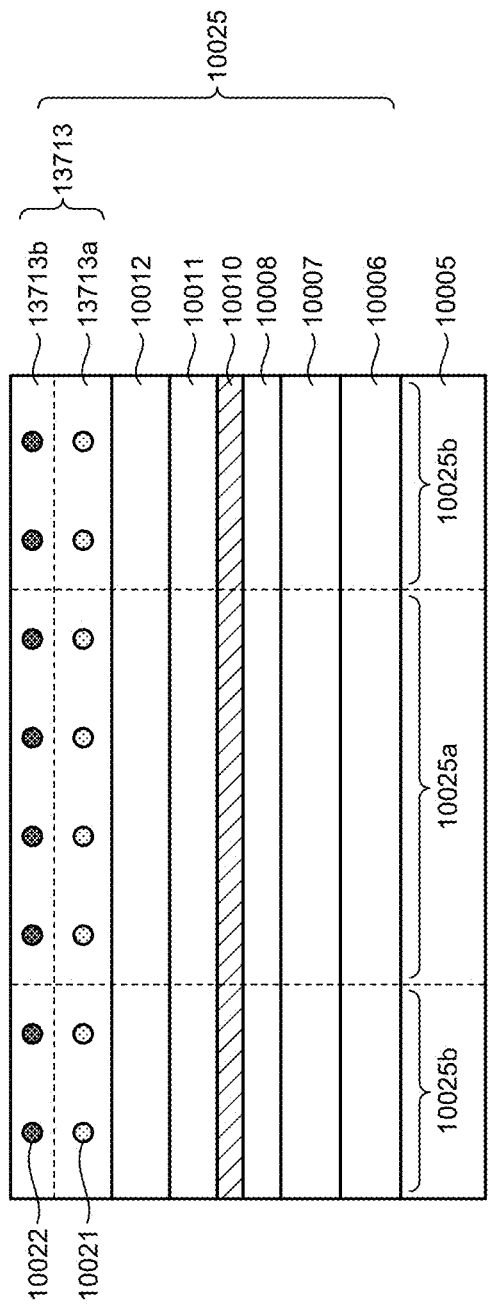
Figure 136:
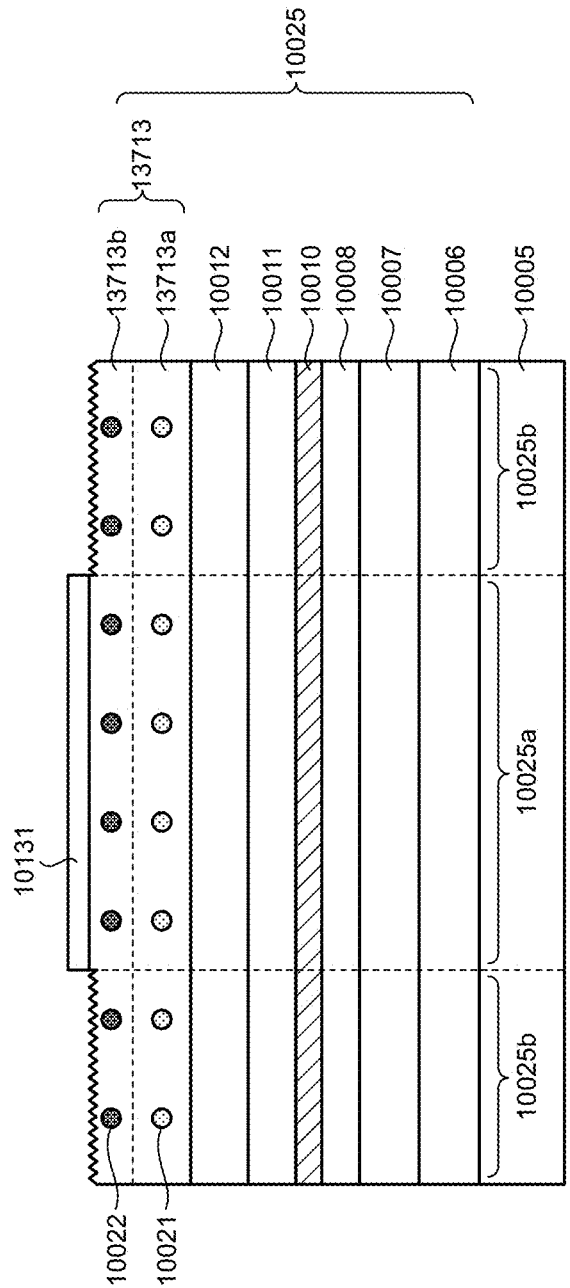
Figure 137:
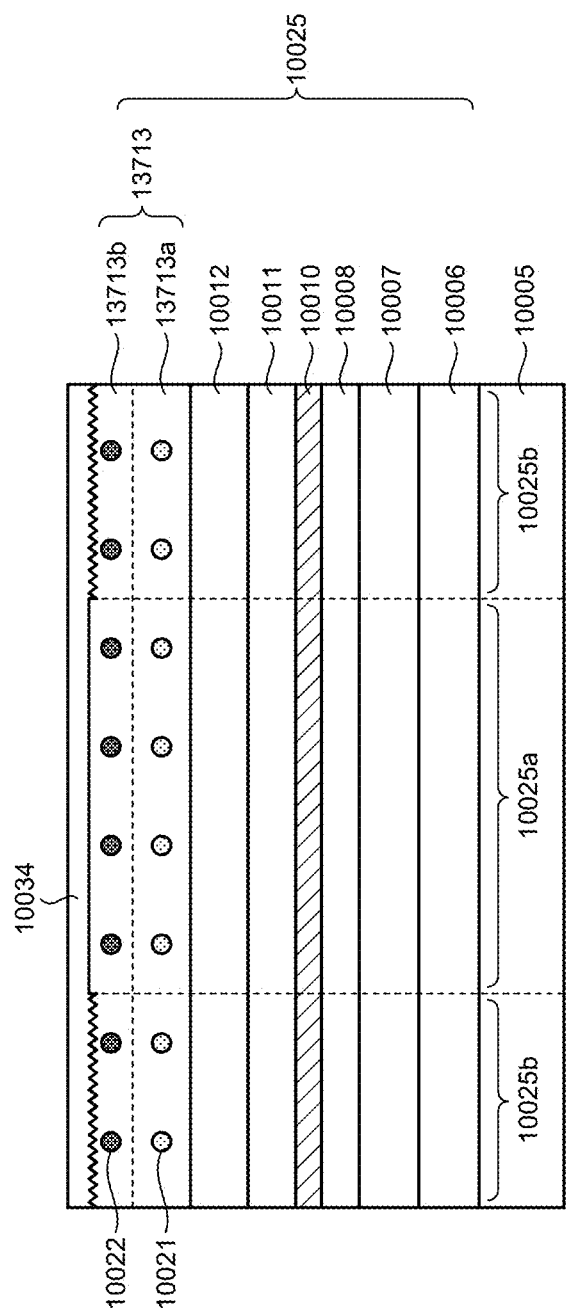
Figure 138:
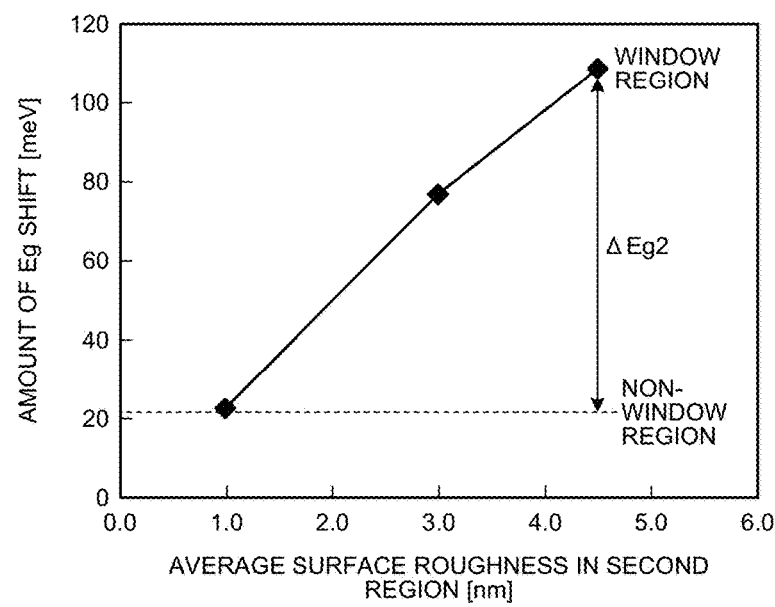
Figure 139:
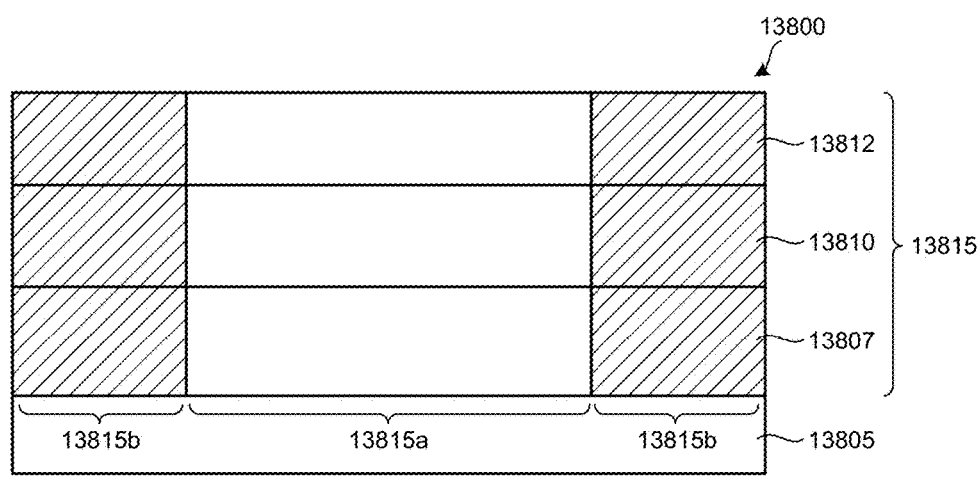
Figure 140:
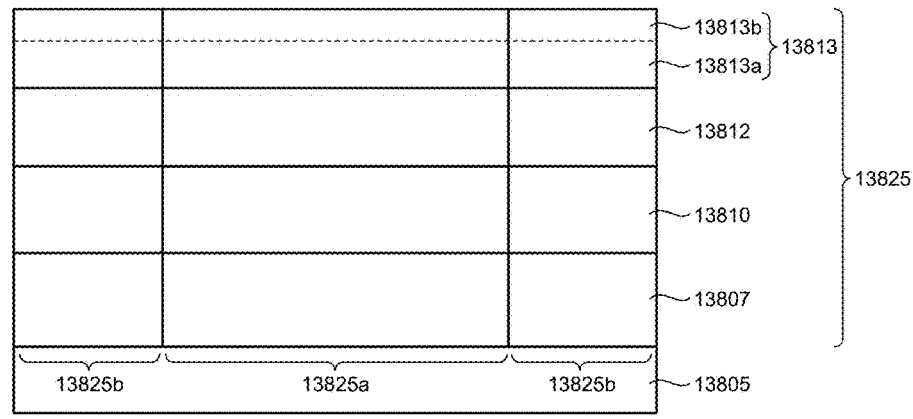
Figure 141:
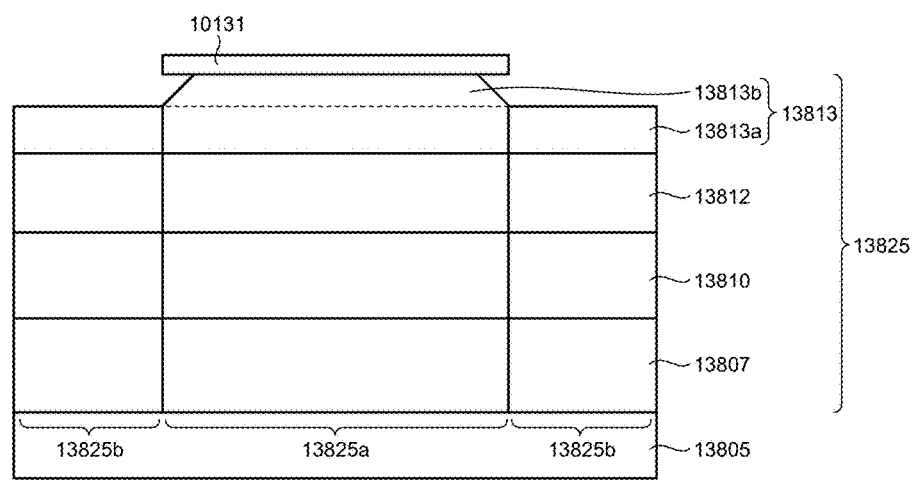
Figure 142:
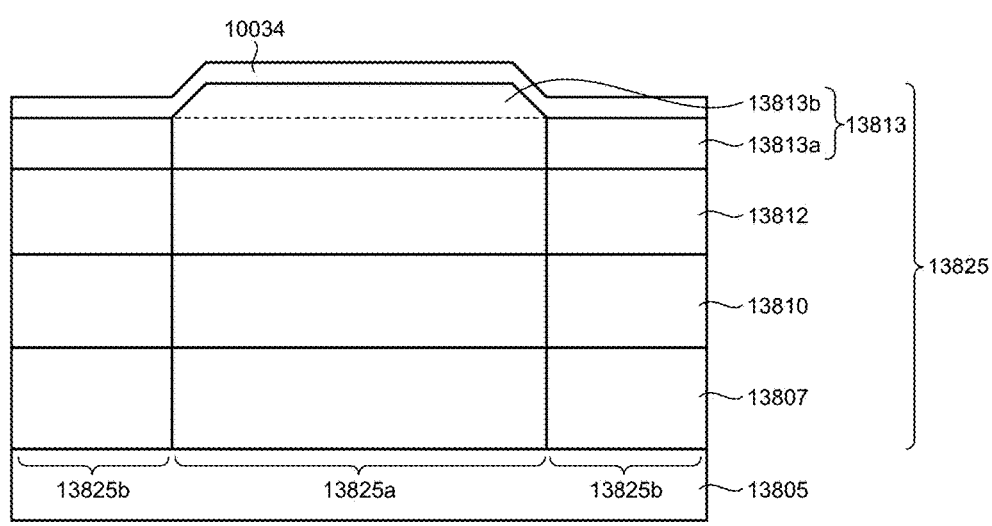

FIG. 126 is a cross-sectional view along the y-z plane in a semiconductor element according to a third modification;

FIG. 127 is a schematic for explaining a method for manufacturing a semiconductor element according to the third modification;

FIG. 128 is a schematic for explaining the method for manufacturing a semiconductor element according to the third modification;

FIG. 129 is a schematic for explaining the method for manufacturing a semiconductor element according to the third modification;

FIG. 130 is a cross-sectional view along the y-z plane in a semiconductor element according to a fourth modification;

FIG. 131 is a schematic for explaining an exemplary method for manufacturing a semiconductor element according to the fourth modification;

FIG. 132 is a cross-sectional view along the y-z plane in a semiconductor element according to a fifth modification;

FIG. 133 is a schematic for explaining an exemplary method for manufacturing a semiconductor element according to the fifth modification;

FIG. 134 is a cross-sectional view along the y-z plane in a semiconductor element that can be fabricated with the manufacturing method according to a fifteenth embodiment of the present invention;

FIG. 135 is a schematic for explaining a method for manufacturing a semiconductor element according to the fifteenth embodiment;

FIG. 136 is a schematic for explaining the method for manufacturing a semiconductor element according to the fifteenth embodiment;

FIG. 137 is a schematic for explaining the method for manufacturing a semiconductor element according to the fifteenth embodiment;

FIG. 138 is a schematic illustrating a relation between the average surface roughness of and the amount of band gap energy shift in the second region in Example 11;

FIG. 139 is a cross-sectional view along the x-y plane in a semiconductor element that can be fabricated with the manufacturing method according to a sixteenth embodiment of the present invention;

FIG. 140 is a schematic for explaining a method for manufacturing a semiconductor element according to the sixteenth embodiment;

FIG. 141 is a schematic for explaining the method for manufacturing a semiconductor element according to the sixteenth embodiment; and FIG. 142 is a schematic for explaining an exemplary method for manufacturing a semiconductor element according to the sixteenth embodiment.

DETAILED DESCRIPTION OF THE PREFERRED EMBODIMENTS

Embodiments of a semiconductor optical element, a semiconductor laser element, and method for manufacturing a semiconductor optical element and a semiconductor laser element, and method for manufacturing a semiconductor laser module and a semiconductor element according to the present invention formed using the IFVD method will be explained below with reference to the accompanying drawings. The present invention is not limited by these embodiments. Furthermore, in the drawings, like parts are denoted by like reference numerals. Further, the drawings are schematic, and it should be noted that the relationship between a thickness and a width of each layer and the ratios among the layers may be different from the actual. The relationship between sizes and the ratios may also be different among the drawings.

First Embodiment

Figure 1:
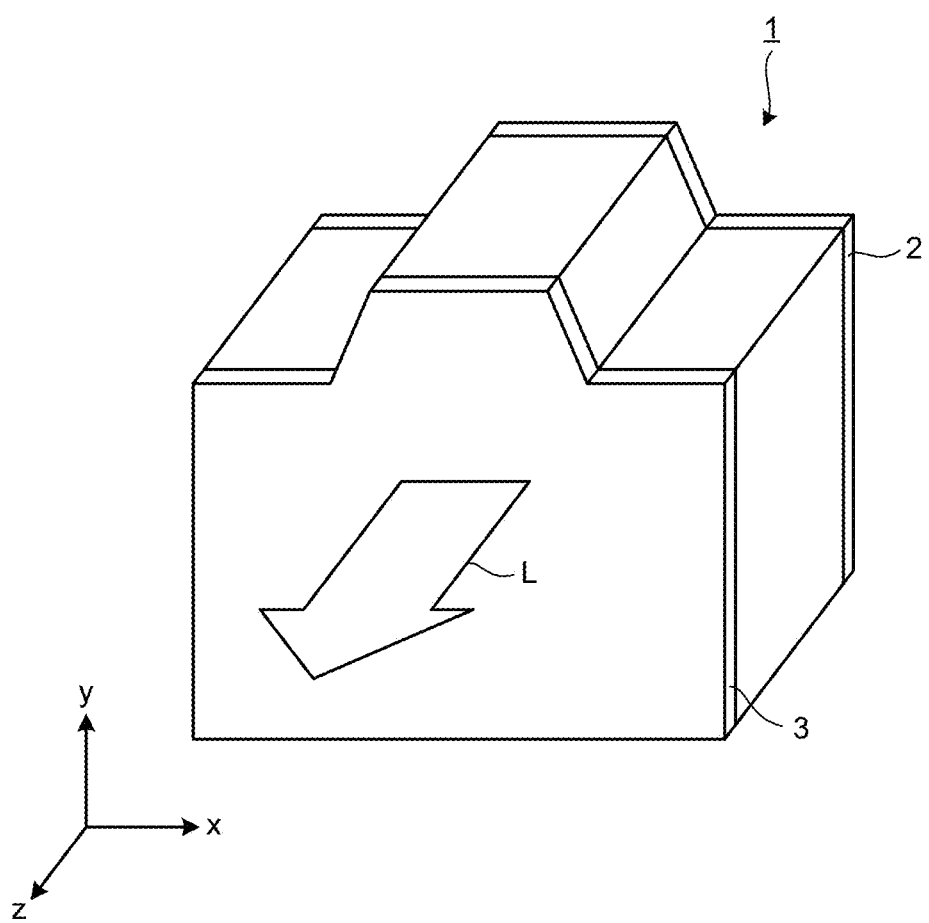
FIG. 1 is a perspective view of a semiconductor laser element according to a first embodiment.
Figure 2:
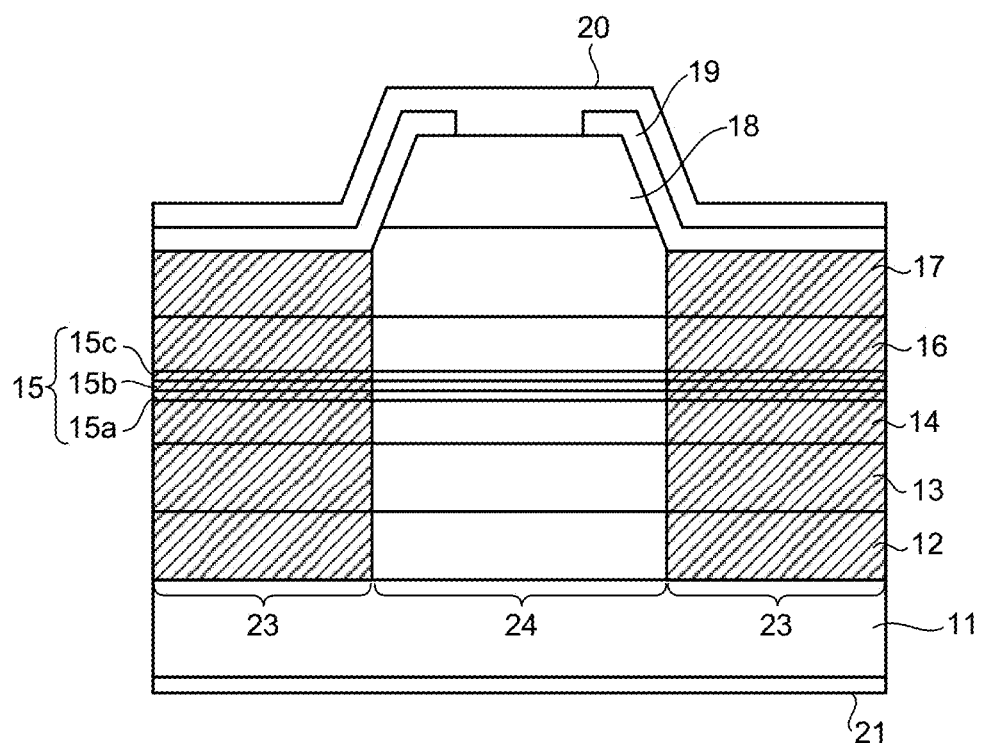
FIG. 2 is a cross section of the semiconductor laser element depicted in FIG. 1.
Figure 3:
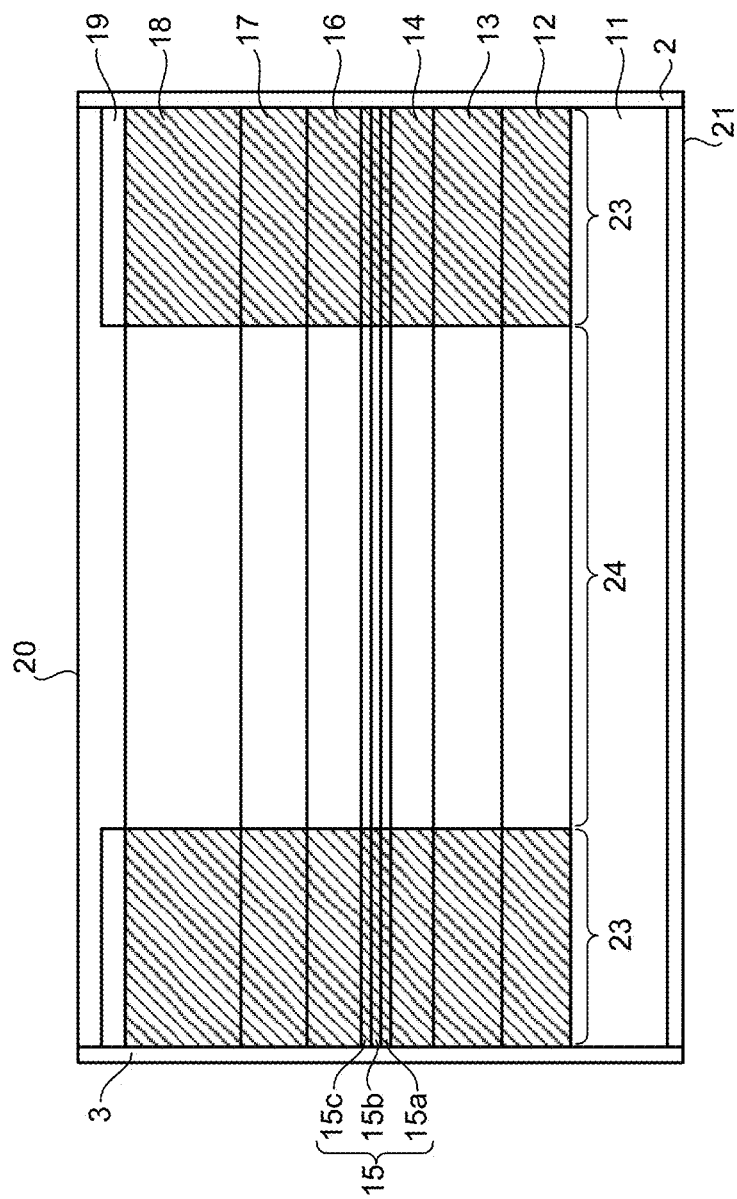
FIG. 3 is a longitudinal section of the semiconductor laser element depicted in FIG. 1.

A semiconductor laser element according to a first embodiment is explained first. The semiconductor laser element according to the first embodiment has C (carbon) doped as an impurity into a layer formed to inject a positive hole into an active layer. FIG. 1 is a perspective view of the semiconductor laser element according to the first embodiment. FIG. 2 is a cross section of the semiconductor laser element depicted in FIG. 1. FIG. 3 is a longitudinal cross section of the semiconductor laser element depicted in FIG. 1. Hereinafter, a direction perpendicular to the deposition direction of the semiconductor layers, and perpendicular to the direction in which the laser light is output is referred to as an x axis. The deposition direction of the semiconductor layers is referred to as a y axis, and the direction in which the laser light is output is referred to as a z axis, as illustrated in FIG. 1.

As depicted in FIG. 1, a semiconductor laser element 1 according to the first embodiment has a ridge structure constricting a current in a striped form, has a high reflection film 2 having a reflectivity of 90% or higher, for example and formed at a reflection end (rear facet) of laser light L, and has a low reflection film 3 having a reflectivity of 10% or lower, for example and formed at an exit end (the facet being on the opposite side of the rear facet and from which the light is output) of the laser light. Laser light generated inside the semiconductor laser element 1 and laser light reflected at the high reflection film 2 are transmitted through the low reflection film 3, and are emitted to the outside.

A structure of the semiconductor laser element 1 depicted in FIG. 1 is explained next with reference to FIG. 2 and FIG. 3. As depicted in FIG. 2 and FIG. 3, in the semiconductor laser element 1, an n-buffer layer 12, an n-cladding layer 13, an n-guide layer 14, an active layer 15, a p-type guide layer 16, a p-type cladding layer 17, a p-type contact layer 18, and an insulation layer 19 are sequentially stacked on a substrate 11, which is an n-GaAs substrate. The semiconductor laser element 1 has an upper electrode 20 formed above the p-type contact layer 18 and a lower electrode 21 formed below the substrate 11. An impurity, which is C, is doped into the p-type guide layer 16 formed on a side of stacking a p-type type cladding, that is, above the active layer 15, into the p-type cladding layer 17 formed on the side of stacking the p-type type cladding with respect to the active layer 15, and into the p-type contact layer 18 formed to inject the positive hole into the active layer 15. As depicted in FIG. 2 and FIG. 3, the semiconductor laser element 1 has a ridge structure constricting in a striped form a current injected into the active layer 15, and functioning as an optical waveguide along the stripe. The semiconductor laser element 1 is processed in a mesa form in which a width of a layer region including an upper part of the p-type cladding layer 17 plus the p-type contact layer 18 is narrowed down in a direction perpendicular to a laser-light emission direction. A window region 23 that absorbs less laser light than a non-window region 24 is provided at a light-emitting facet of the semiconductor laser element 1. The window region 23 includes a disordered portion formed by diffusion of group-type III vacancies, and the non-window region 24 has the active layer 15 of a quantum well structure and does not include the disordered portion. By disordering the window region 23, an energy band gap in the window region 23 is increased such that its difference from an energy band gap in the non-window region 24 becomes equal to or greater than 50 meV to suppress absorption of laser light and prevent COD.

The substrate 11 is made of a material including n-GaAs. The n-buffer layer 12 is a buffer layer necessary for growing a stacked structure of high-quality epitaxial layers on the substrate 11, and is made of a layer material including n-GaAs. The n-cladding layer 13 and the n-guide layer 14 have refractive indices and thicknesses, which are determined to achieve an arbitrary optical confinement state with respect to a stacking direction, and are made of materials including n-AlGaAs. Preferably, an Al composition in the n-guide layer 14 is equal to or greater than 20% and less than 40%. An Al composition in the n-cladding layer 13 is usually set greater than the Al composition in the n-guide layer 14 to decrease its refractive index. In a high-output horizontal multi-mode oscillation element formed with the window region according to the present invention, a film thickness of the n-guide layer 14 is preferably equal to or larger than 200 nanometers, for example, about 400 nanometers. A thickness of the n-cladding layer 13 is preferably equal to or larger than 1 micrometer, and may be about 3 micrometers. An intentionally not-doped high-purity layer may be used as the n-guide layer 14, but if a thickness of the n-guide layer 14 is set equal to or larger than 100 nanometers, influence by a residual impurity is large, and thus doping is preferably performed.

The active layer 15 includes a lower barrier layer 15a, a quantum well layer 15b, and an upper barrier layer 15c. The lower barrier layer 15a and the upper barrier layer 15c have a function of a barrier that confines carriers in the quantum well layer 15b, and are made of materials including intentionally not-doped high-purity AlGaAs. The quantum well layer 15b is made of a material including intentionally not-doped high-purity InGaAs. Light-emission recombined energy of the confined carriers is determined by a structure of a potential well determined by an In composition and a film thickness of the quantum well layer 15b and compositions of the lower barrier layer 15a and the upper barrier layer 15c. While a structure of a single quantum well layer (SQW) has been explained above, a structure of a multi-quantum well layer (MQW) with the quantum well layer 15b, the lower barrier layer 15a, and the upper barrier layer 15c stacked repeatedly by a predetermined number of times may be provided. While a structure of an intentionally not-doped high-purity layer has been explained above, donors and acceptors may be intentionally added to the quantum well layer 15b, the lower barrier layer 15a, and the upper barrier layer 15c. Further, because the lower barrier layer 15a and the n-guide layer 14 may have a same composition, and the upper barrier layer 15c and the p-type guide layer 16 may have a same composition, the lower barrier layer 15a and the upper barrier layer 15c are not necessarily structured.

The p-type guide layer 16 and the p-type cladding layer 17 pair with the above-described n-cladding layer 13 and the n-guide layer 14, and their refractive indices and thicknesses are determined to achieve an arbitrary confinement state with respect to the stacking direction. The p-type guide layer 16 and the p-type cladding layer 17 are made of materials including p-type AlGaAs. An Al composition of the p-type guide layer 16 is generally equal to or greater than 20%, and is preferably equal to or greater than 30%. This is to increase an energy shift in the window region 23, which is a change in an energy band gap due to disordering, and to perform highly selective disordering in the window region 23 adequately. An Al composition in the p-type cladding layer 17 is usually 40% to 50%. To decrease a waveguide loss by shifting an optical field in the layer towards the n-cladding layer 13, the Al composition in the p-type cladding layer 17 is set a little greater than that in the n-cladding layer 13. An Al composition in the p-type guide layer 16 is set smaller than the Al composition in the p-type cladding layer 17. In the high-output horizontal multi-mode oscillation element formed with the window region according to the present invention, a film thickness of the p-type guide layer 16 is preferably equal to or larger than 200 nanometers, for example, about 400 nanometers. A thickness of the p-type cladding layer 17 is preferably around 1 to 2 micrometers. An intentionally not-doped high-purity layer may be used as the p-type guide layer 16, but if a thickness of the guide layer is set equal to or larger than 100 nanometers, influence by conductivity variation due to a residual impurity is large, and thus to increase manufacture reproducibility, intentional doping is preferably performed.

Carbon (C) is doped as an acceptor impurity, into the p-type cladding layer 17 and the p-type guide layer 16. Concentration of C in the p-type guide layer 16 is set to 0.1 to $1.0 \times 10^{17}$ cm$^{-3}$, and is preferably about 0.5 to $1.0 \times 10^{17}$ cm$^{-3}$. In the p-type cladding layer 17, it is set equal to or higher than $1.0 \times 10^{17}$ cm$^{-3}$.

The p-type contact layer 18 is for making the p-type cladding layer 17 come in Ohmic contact with the upper electrode 20. The p-type contact layer 18 is made of a layer material including p-type GaAs. A high concentration of C is doped into the p-type contact layer 18, thereby achieving the Ohmic contact.

Figure 4:
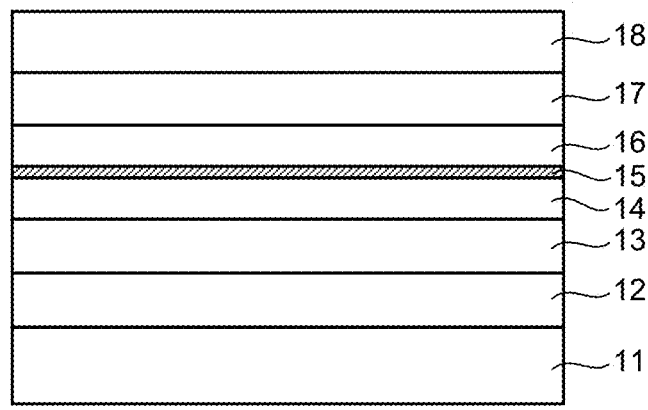
FIG. 4 is an explanatory diagram for a manufacturing method of the semiconductor laser element according to the first embodiment.

A manufacturing method of the semiconductor laser element 1 is explained next with reference to FIG. 4 to FIG. 8. First, as depicted in FIG. 4, the n-buffer layer 12, the n-cladding layer 13, the n-guide layer 14, the active layer 15, the p-type guide layer 16, the p-type cladding layer 17, and the p-type contact layer 18 are formed on the substrate 11 by epitaxial growth. Carbon (C) is doped as an impurity in the p-type guide layer 16, the p-type cladding layer 17, and the p-type contact layer 18.

Figure 5:
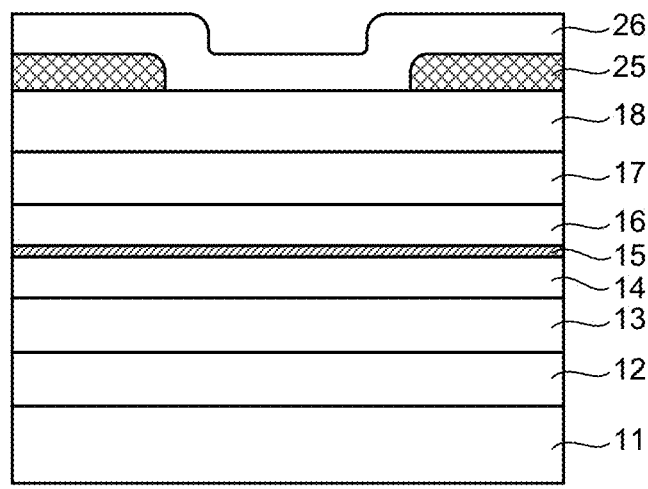
FIG. 5 is an explanatory diagram for the manufacturing method of the semiconductor laser element according to the first embodiment.

Next, 100 nanometers, for example, of SiN$_x$ is deposited on the p-type contact layer 18 by using a catalytic chemical vapor deposition (CVD) method. This SiN$_x$ film has a higher proportion of N than the stoichiometric composition, and is formed in a state in which flow rates of silane and ammonia, which are the raw materials, are adjusted to be ammonia rich. Thereafter, SiN$_x$ in a region other than a region corresponding to the window region 23 is removed by performing photolithography and etching, thereby forming a promoting film 25 as depicted in FIG. 5. Because the promoting film 25 is a film formed of SiN$_x$ in an N-rich condition, it is a sparse film. The promoting film 25 needs to be formed to include a facet from which laser light is emitted. The promoting film 25 is formed in a latticed form and a striped form on a plane of the semiconductor laser element 1, to cover the active layer 15 when viewed from a laser-light emission side. Next, 30 nanometers, for example, of a SiN$_x$ film formed in a Si-rich condition is deposited on the p-type contact layer 18 and the promoting film 25 by using the catalytic CVD method, thereby forming a suppression film 26. This SiN$_x$ has a higher proportion of Si than the stoichiometric composition. Because the suppression film 26 is formed by the catalytic CVD method, it becomes a dense film. The promoting film 25 may be formed after a SiN$_x$ film for forming a suppression film 26 is formed and the SiN$_x$ corresponding to the window region 23 is removed to form the suppression film 26.

Figure 6:
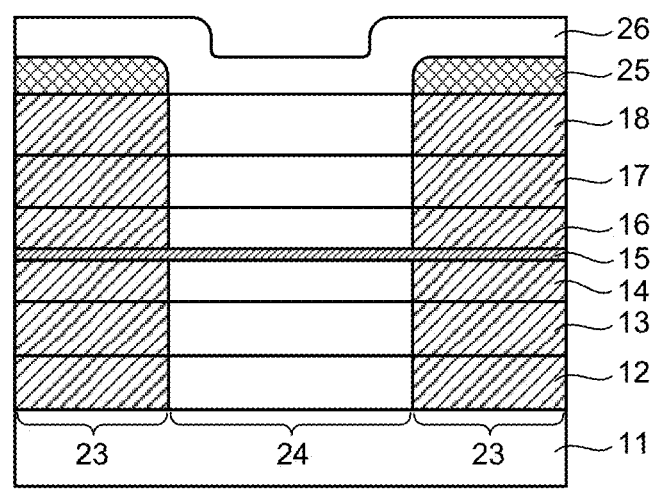
FIG. 6 is an explanatory diagram for the manufacturing method of the semiconductor laser element according to the first embodiment.

Rapid thermal annealing (RTA) is performed next for 30 seconds at 915° C., for example. Because the promoting film 25 is a sparse film, the film is able to absorb diffused Ga. Therefore, the promoting film 25 absorbs Ga in each layer positioned below the promoting film 25 by the RTA. Vacancies are generated on a surface of the p-type contact layer 18 contacting the promoting film 25 below the promoting film 25, and the vacancies are diffused to the active layer 15. The quantum well layer 15b positioned below the promoting film 25 is disordered, thereby forming the window region 23 as depicted in FIG. 6. The promoting film 25 has a function of promoting disordering in the window region 23 by absorbing Ga and promoting the diffusion of vacancies. The suppression film 26 is formed to contact the p-type contact layer 18 in a region where the promoting film 25 is not formed. Because the suppression film 26 is a dense film, it does not absorb Ga, and suppresses diffusion of Ga. As a result, in the region where the promoting film 25 is not formed, vacancies are not generated, disordering thus does not occur, and this region becomes the non-window region 24 that does not include the disordered portion. The suppression film 26 thus has a function of suppressing disordering in the non-window region 24.

Figure 7:
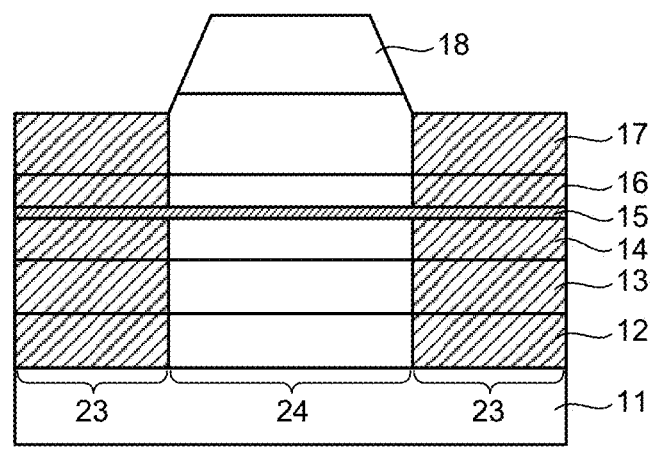
FIG. 7 is an explanatory diagram for the manufacturing method of the semiconductor laser element according to the first embodiment.
Figure 8:
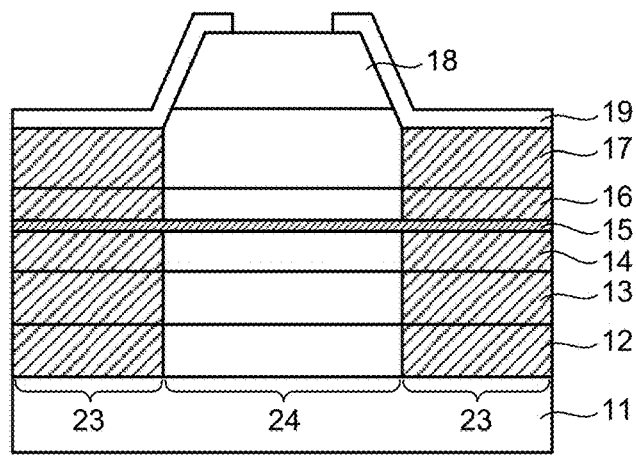
FIG. 8 is an explanatory diagram for the manufacturing method of the semiconductor laser element according to the first embodiment.

After the promoting film 25 and the suppression film 26 are removed, the p-type contact layer 18 other than a region contacting the upper electrode 20 and an upper portion of the p-cladding layer 17 are removed to form a ridge structure, by performing photolithography and etching, as depicted in FIG. 7. After the insulation layer 19 is formed, the insulation layer 19 other than a region contacting the upper electrode 20 is removed, by performing photolithography and etching, as depicted in FIG. 8. After the upper electrode 20 and the lower electrode 21 are formed, a semiconductor wafer is cleaved, and the high reflection film 2 and the low reflection film 3 are formed on the cleaved surfaces, and each semiconductor laser elements 1 is cut out, thereby forming finally the semiconductor laser element 1.

As described above, in the semiconductor laser element 1 according to the first embodiment, C is doped as an impurity into the p-type guide layer 16 which is a layer close to the active layer 15, and the p-type cladding layer 17 and the p-type contact layer 18, which are layers above the p-type guide layer 16.

Figure 9:
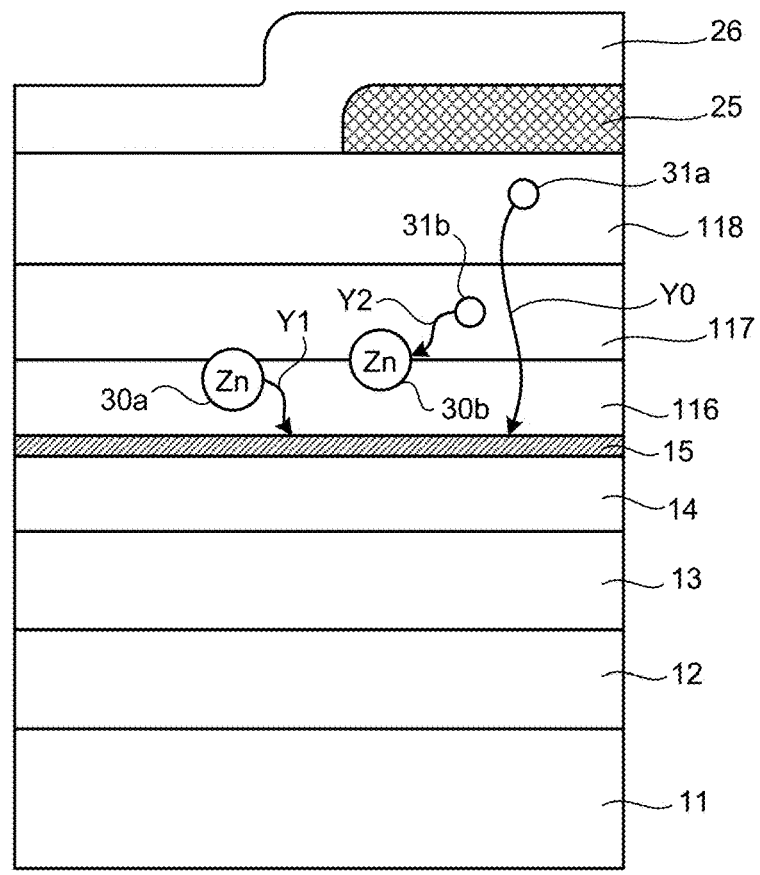
FIG. 9 is an explanatory diagram for diffusion of vacancies and interstitial Zn in a semiconductor laser element according to a conventional technique.

In a semiconductor laser element according to a conventional technique depicted in FIG. 9, Zn that preferentially substitutes a group-III site as an impurity is doped into a p-type guide layer 116, a p-type cladding layer 117, and a p-type contact layer 118. Zinc has a large diffusion coefficient and high impurity diffusion performance, and easily generates interstitial atoms, and the generated interstitial atoms have a high diffusion velocity. When the promoting function of the promoting film 25 is functioning adequately, a group-III vacancy 31a generated by diffusion of Ga occupying the group-III reaches the active layer 15 to form a window region as indicated by an arrow Y0 in FIG. 9. However, an interstitial Zn 30b generated may recombine with a group-III vacancy 31b as indicated by an arrow Y2 in FIG. 9. Because the interstitial Zn 30b and the group-III vacancy 31b are both of group-III, they tend to be recombined easily. Particularly, Zn easily generates an interstitial atom, and a diffusion velocity of the generated interstitial atom is large. Therefore, a lot of the interstitial Zn and the group-III vacancies are considered to be recombined together. The vacancy concentration is then decreased, and sufficient vacancies do not reach the active layer 15. As a result, the promoting function of the promoting film 25 is degraded, and a large energy-band gap cannot be obtained in the window region 23.

Further, because Zn is easily diffused, an interstitial Zn 30a generated may reach the active layer 15 by RTA in the IFVD method as indicated by an arrow Y1 in FIG. 9. A laser oscillation performance of the quantum well layer 15b in the active layer 15 would then be hindered. Further, a function of suppressing disordering by the suppression film 26 would be degraded by the generation of the interstitial Zn 30a, and an energy band gap in the non-window region 24 would be increased. Therefore, in the conventional technique, it has not been possible to obtain a sufficient difference between the energy band gap in the window region and the energy band gap in the non-window region.

Figure 10:
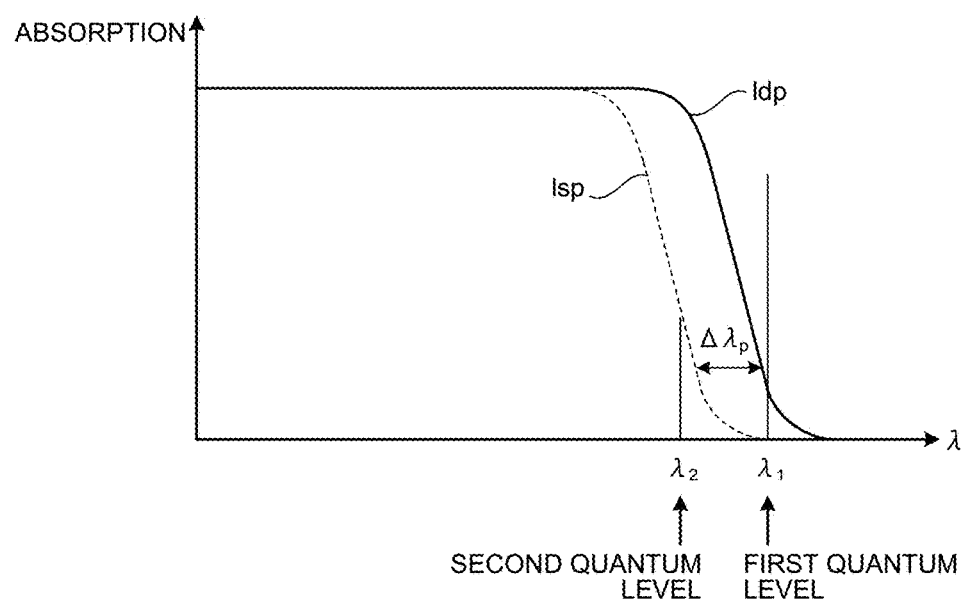
FIG. 10 depicts wavelength changes of light absorption amounts in a window region and a non-window region of the semiconductor laser element according to the conventional technique.

Consequently, in the conventional technique, a wavelength change of the light absorption amount in the window region, as indicated by a curve lsp in FIG. 10, may shift to a wavelength side longer than the setting, and light near a wavelength of oscillated laser light may be absorbed. A wavelength change of the light absorption amount in the non-window region, as indicated by a curve ldp in FIG. 10, may shift to a wavelength side shorter than a set wavelength of laser light.

Figure 11:
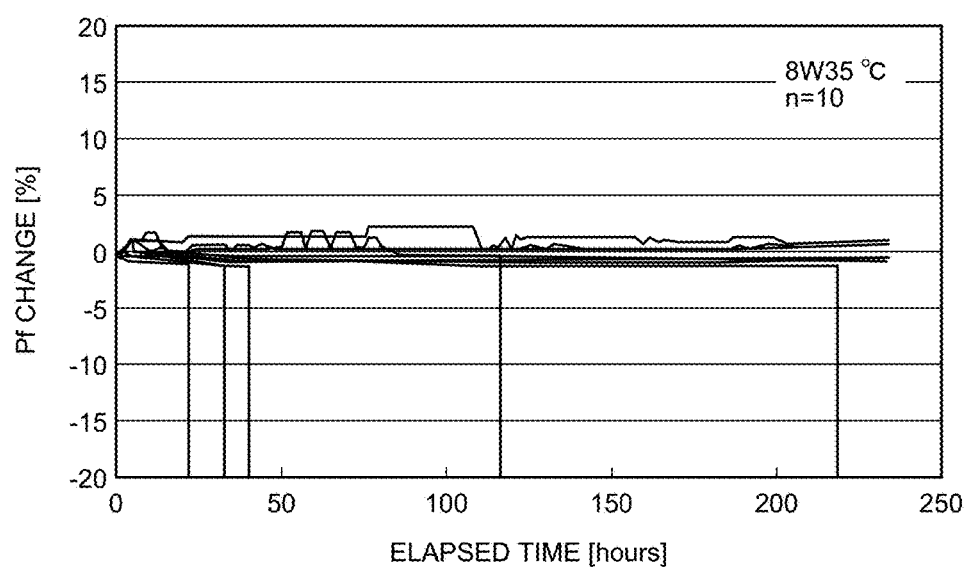
FIG. 11 depicts time dependency of a change in laser light intensity of the semiconductor laser element according to the conventional technique.

Therefore, as depicted in FIG. 10, in the conventional technique, a wavelength difference $\Delta\lambda_p$ between light absorbed in the window region and light absorbed in the non-window region becomes small, and absorption of laser light in the window region and degradation of the semiconductor laser element due to COD occurs. Particularly, when the semiconductor laser element is driven under severe conditions, laser light may be output, which has a wavelength $\lambda_2$ corresponding to a second quantum level, which is shorter than a wavelength $\lambda_1$ that corresponds to a first quantum level and is a set wavelength of laser light. In the conventional technique, laser light of this wavelength $\lambda_2$ is absorbed and COD occurs in the window region, as indicated by the curve lsp. In the window region, when not only laser light of the wavelength $\lambda_2$ but also laser light of a wavelength shorter than the wavelength $\lambda_1$ corresponding to a first quantum level and corresponding to higher-order energy oscillation caused by light holes is output, light of this wavelength is absorbed. As a result, in the conventional technique, intensity of laser light decreases in a short period of time, and a long-life semiconductor laser element maintaining high reliability could not be obtained, as indicated by a time dependency of a change in laser light intensity (Pf) in FIG. 11.

Figure 12:
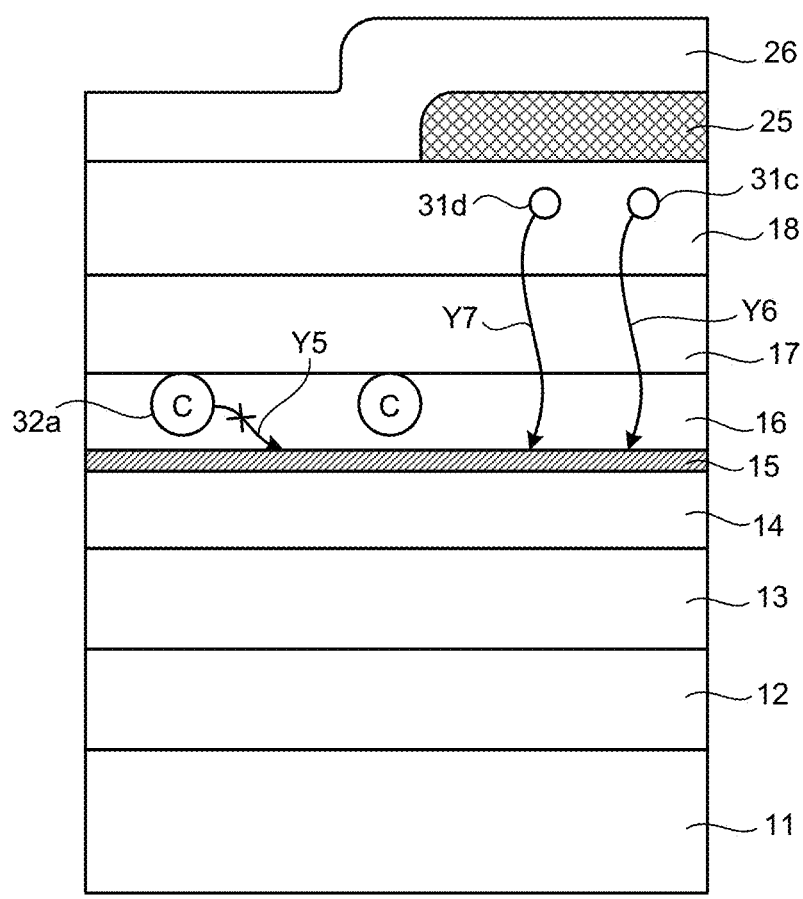
FIG. 12 is an explanatory diagram for diffusion of vacancies and C in the semiconductor laser element according to the first embodiment.

In contrast, in the semiconductor laser element 1 according to the first embodiment, C that preferentially substitutes the group-V site as an impurity is doped into the p-type guide layer 16, the p-type cladding layer 17, and the p-type contact layer 18. Carbon has a very small diffusion coefficient. For example, the diffusion coefficient of C in a thermal treatment at 950° C. is equal to or smaller than $3\times10^{-14}$ cm$^2$/s. When a diffusion coefficient of an impurity is D and a diffusion time period is t, a diffusion length of the impurity is $(Dt)^{1/2}$. Specifically, when an impurity having a diffusion coefficient of $3\times10^{-14}$ cm$^2$/s is thermally treated at an RTA temperature for 30 seconds, a diffusion length of this impurity becomes about 9.5 nanometers as a result of calculation using $(Dt)^{1/2}$. Usually, because a material layer of a range of around 9.5 nanometers based on the active layer 15 is not doped with an impurity, the impurity having a diffusion coefficient of $3\times10^{-14}$ cm$^2$/s does not reach the active layer 15. Therefore, C having a diffusion coefficient of $3\times10^{-14}$ cm$^2$/s does not move to the active layer 15 as exemplified by an arrow Y5 in FIG. 12, even if RTA is performed. Consequently, even if C is doped into the p-type guide layer 16, which is a layer above the active layer 15 like in the semiconductor laser element 1, the laser oscillation function of the quantum well layer 15b and the suppression function of the suppression film 26 are not inhibited by the doped C. As a result, increase in an energy band gap is adequately suppressed in the non-window region.

While C is a group-IV atom, C enters a group-V site and becomes an acceptor, in a group-III-V compound semiconductor such as GaAs in which a group-V element is As. In GaAs, C preferentially substitutes the group-V site, which is a group different from that of Ga occupying the group-III and absorbed in the promoting film 25. Therefore, C that occupies the group-V site does not easily recombine with group III vacancies 31c and 31d generated by diffusion of Ga in the promoting film 25. Consequently, in a region corresponding to the window region, vacancy concentration does not decrease by recombination, and the generated group-III vacancies 31c and 31d smoothly reach the active layer 15 to properly form the window region, as indicated by arrows Y6 and Y7. As a result, C used as the impurity does not hinder the promoting function of the promoting film 25, and thus a large energy band gap is obtained in the window region 23.

Figure 13:
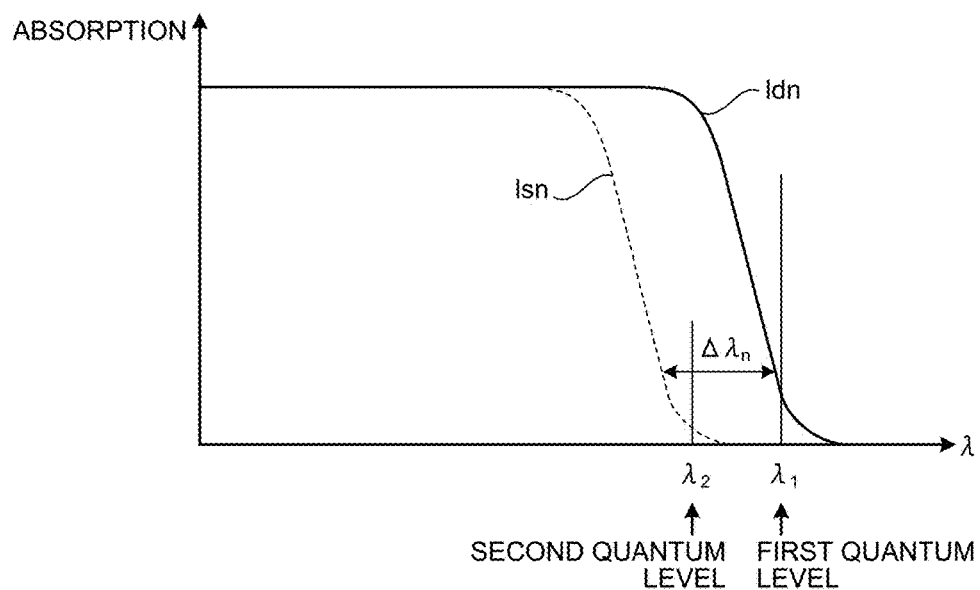
FIG. 13 depicts wavelength changes of light absorption amounts in a window region and a non-window region of the semiconductor laser element according to the first embodiment.

FIG. 13 depicts wavelength changes of light absorption amounts in the window region and the non-window region of the semiconductor laser element 1. In FIG. 13, a curve ldn indicates a wavelength change of a light absorption amount in the non-window region, and a curve lsn indicates a wavelength change of a light absorption amount in the window region. In the first embodiment, as a result of using C as the impurity, the promoting function of the promoting film 25 works adequately, disordering in the window region is performed sufficiently, and the suppression function of the suppression film 26 works adequately. As a result, a wavelength difference $\Delta\lambda_n$ between light absorbed in the window region and light absorbed in the non-window region, which is larger than that of the conventional technique is obtained. In other words, a sufficient difference between the energy band gap in the window region and the energy band gap in the non-window region is obtained in the semiconductor laser element 1. Further, as indicated by the curve lsn, in the window region, absorption of laser light of a wavelength corresponding to higher-order energy oscillation, such as the wavelength $\lambda_2$ corresponding to the second quantum level does not occur. Therefore, laser light of a wavelength corresponding to this higher-order energy oscillation is not absorbed and COD is not generated in the window region, even if driving under severe conditions and higher-order energy oscillation are performed. Because the suppression function of the suppression film 26 also functions adequately, in the non-window region, absorption characteristics as set are demonstrated as indicated by the curve ldn. Therefore, it is possible to precisely output laser light of a set wavelength.

Figure 14:
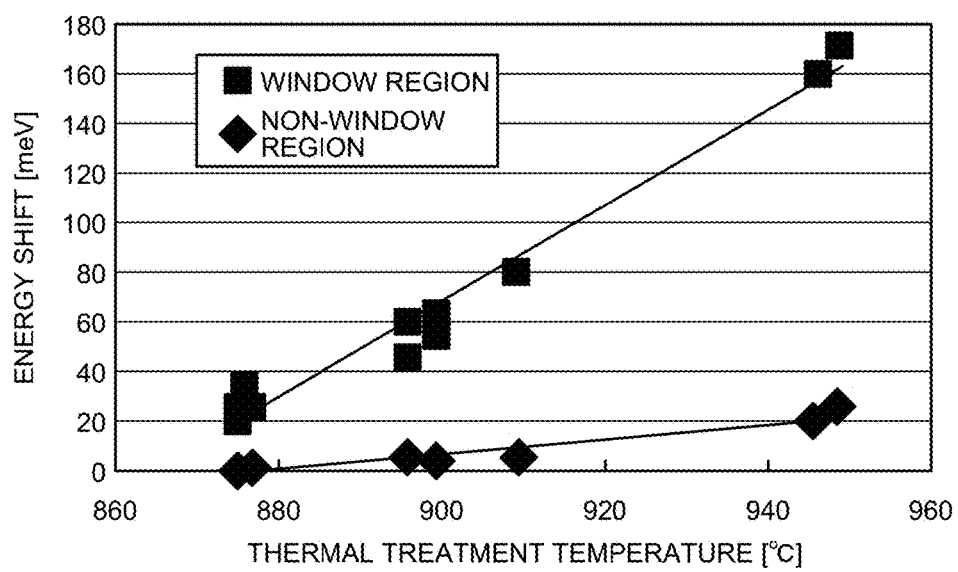
FIG. 14 depicts a relationship between thermal treatment temperatures of RTA and energy shift amounts in the window region and the non-window region of the semiconductor laser element according to the first embodiment.

Energy band gaps in the window region and the non-window region of the semiconductor laser element 1 are now explained. FIG. 14 depicts a relationship between thermal treatment temperatures of RTA performed for disordering and energy shift amounts in the window region and the non-window region of the semiconductor laser element 1. The energy shift amount is a change in an energy band gap changed by disordering. FIG. 14 depicts results for the semiconductor laser element 1 in which a doping amount of C at an active layer 15 side in the p-type guide layer 16 is $5\times10^{16}$ cm$^{-3}$, a doping amount of C at an active layer 15 side in the p-type cladding layer 17 is $5\times10^{17}$ cm$^{-3}$, and a doping amount of C at an active layer 15 side in the p-type contact layer 18 is $3\times10^{19}$ cm$^{-3}$.

When promotion of disordering is performed adequately, a large energy-shift is exhibited in the window region, because an energy band gap after disordering becomes larger than that before disordering. As described above, in the first embodiment, it is possible to promote disordering in the window region adequately by doping C as the impurity. As depicted in FIG. 14, in the window region, when RTA is performed at a thermal treatment temperature of 900° C. or higher, an energy shift amount becomes equal to or greater than 60 meV, and an energy band gap is increased.

If disordering is suppressed adequately, a small energy shift is demonstrated in the non-window region, because a large change does not occur between the energy band gaps before and after the disordering. As described above, in the first embodiment, it is possible to adequately suppress disordering in the non-window region by doping C as the impurity. Therefore, as depicted in FIG. 14, energy shift is hardly recognized in the non-window region, when a thermal treatment temperature of RTA is 900° C. Only an energy shift amount of about 20 meV is exhibited when a thermal treatment temperature of RTA is as high as 950° C.

When a difference between an energy band gap in the window region and an energy band gap in the non-window region is equal to or larger than 50 meV, it is possible to suppress absorption of laser light in the window region and prevent COD. Even when light absorption at a facet is suppressed by employing a window structure, a facet region is an area where a local temperature increase easily occurs. As light emission intensity increases, a partial temperature increase cannot be avoided in many cases. When a temperature increases, an energy band gap of a semiconductor becomes small at about (−0.5) meV/° C. Therefore, a difference generated between an energy band gap in the window region and an energy band gap in the non-window region is set off. Consequently, if a difference between an energy band gap in the window region and an energy band gap in the non-window region can be set to 70 meV, a temperature difference $\Delta Tw$ of about 20° C. between a temperature in the non-window region and a temperature in the window region is permissible. Further, if a difference between an energy band gap in the window region and an energy band gap in the non-window region can be set to 100 meV, a large $\Delta Tw$ of about 50° C. is permissible. Therefore, the larger the difference that can be set is between the energy band gap in the window region and the energy band gap in the non-window region, the higher the output of the element achieved is. As described above, the difference between the energy band gap in the window region and the energy band gap in the non-window region needs to be equal to or greater than 50 meV, and is more preferably 70 meV, and even more preferably 100 meV. As depicted in FIG. 14, in the semiconductor laser element 1, the difference between the energy band gap in the window region and the energy band gap in the non-window region can be set equal to or larger than 50 meV, when RTA is performed at a thermal treatment temperature equal to or higher than 900° C. It is understood from the example in FIG. 14 that thermal treatment temperatures corresponding to energy differences between energy band gaps of 70 meV and 100 meV are about 905° C. and 925° C., respectively.

Therefore, in the first embodiment, the difference between the energy band gap in the window region and the energy band gap in the non-window region of 50 meV or greater is obtained by performing RTA at 900° C. or higher, thereby preventing COD.

Figure 15:
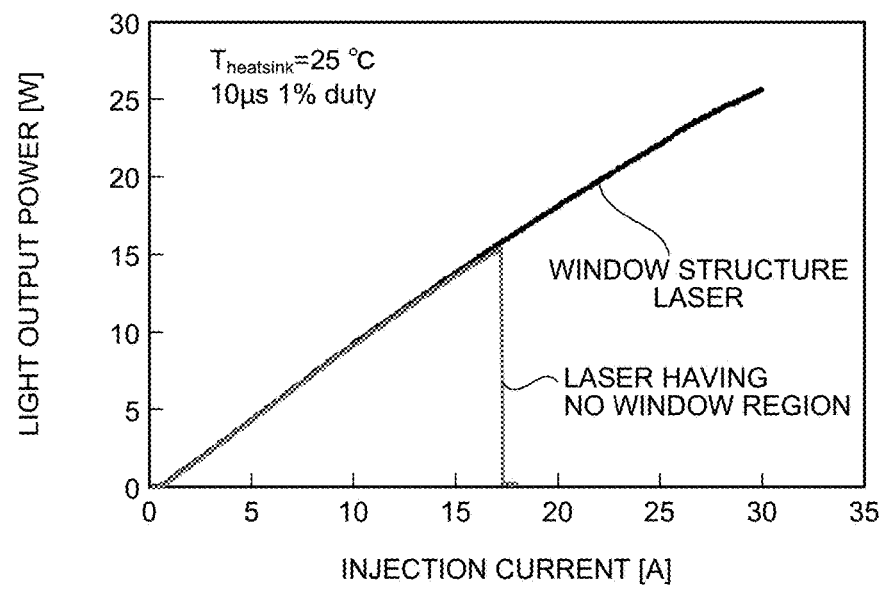
FIG. 15 depicts light output characteristics upon pulse driving of the semiconductor laser according to the first embodiment.

Output characteristics of laser light of the semiconductor laser element 1 according to the first embodiment are explained. FIG. 15 depicts optical output characteristics of pulse driving of a window structure laser having a difference between an energy band gap in the window region and an energy band gap in the non-window region of 65 meV, which is the semiconductor laser element 1 according to the first embodiment, and a laser without a window region as a reference. FIG. 15 depicts results for one of the semiconductor laser elements 1 for which results are illustrated in FIG. 14, which was subjected to RTA at 900° C. for 30 seconds. As depicted in FIG. 15, when a drive current is gradually increased to make conditions severe, COD generating destruction occurs around a drive current of 17 amperes in the laser without the window region. In contrast, in the window structure laser, which is the semiconductor laser element 1 according to the first embodiment, COD does not occur even if a drive current is increased to a measurement limit of 30 amperes, and it is possible to output laser light normally.

Figure 16:
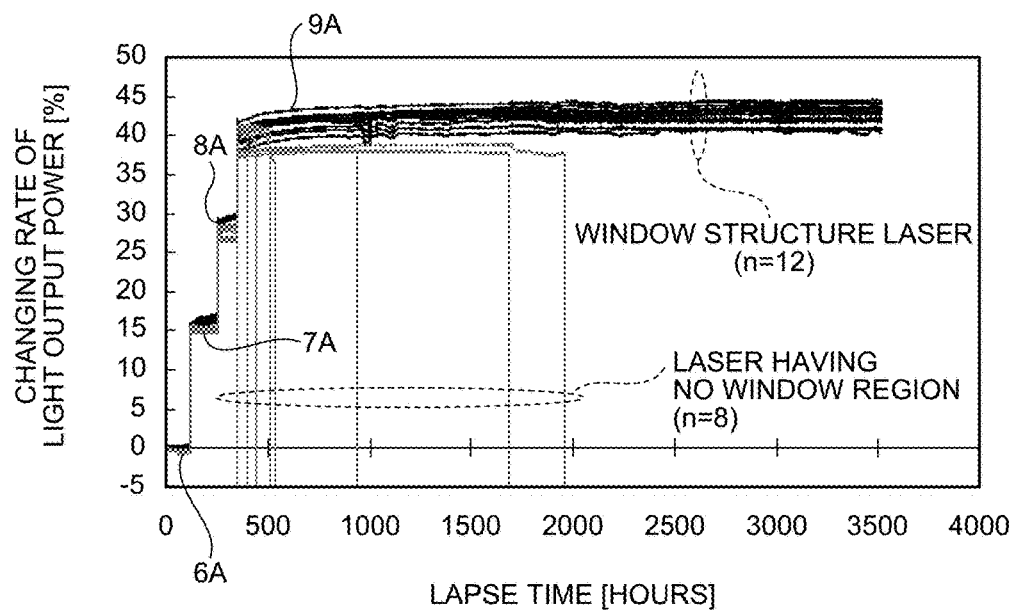
FIG. 16 depicts ageing test results of the semiconductor laser according to the first embodiment.

FIG. 16 depicts ageing test results of a window structure laser having a difference between an energy band gap in the window region and an energy band gap in the non-window region of 60 meV, which is the semiconductor laser element 1 according to the first embodiment, and a laser without a window region as a reference. FIG. 16 depicts results for one of the semiconductor laser elements 1 depicted in FIG. 14, which was subjected to RTA at 900° C. for 30 seconds. FIG. 16 depicts time dependencies of changing rates in optical output when drive current is increased in steps of 6, 7, 8, and 9 amperes. As depicted in FIG. 16, when a drive current is increased to create more severe conditions, intensity of laser light decreases in a short period of time in the laser without the window region, and a semiconductor laser element having a long life and maintaining high reliability could not be obtained. In contrast, the window structure laser, which is the semiconductor laser element 1 according to the first embodiment was able to maintain high intensity of laser light for a long period of time until the end of the test even when a drive current was increased to create the more severe conditions. That is, the window structure laser, which is the semiconductor laser element 1 according to the first embodiment, is able to maintain a long life while maintaining high reliability.

As explained above, in the first embodiment, it is possible to promote disordering in the window region and suppress disordering in the non-window region by doping C as the impurity instead of Zn in a layer formed on a side of stacking a p-type cladding with respect to the active layer. As a result, in the first embodiment, it is possible to realize a highly reliable semiconductor laser element preventing COD even upon driving of the semiconductor laser element under severe conditions.

Figure 17:
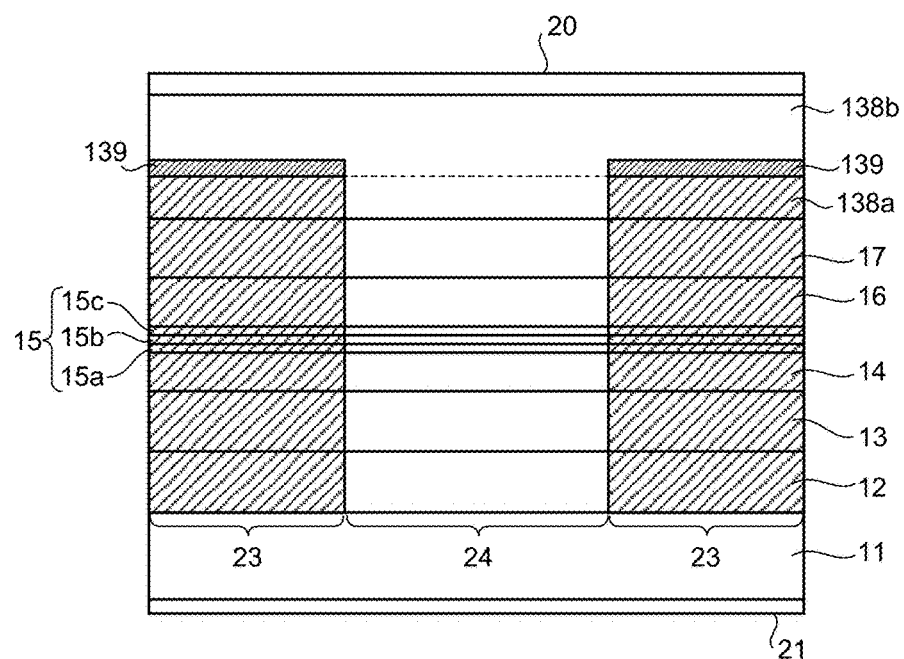
FIG. 17 is another example of a cross section of the semiconductor laser element according to the first embodiment.

While the semiconductor laser element 1 of a so-called ridge structure has been explained as the first embodiment, it may be a semiconductor laser element including a layer having a current constricting function. In this case, as depicted in FIG. 17, a current non-injecting layer 139 is provided between a p-type first contact layer 138*a* doped with C as an impurity and a p-type second contact layer 138*b* doped with C as an impurity. The p-type second contact layer 138*b* doped with C of a higher concentration than that in the p-type first contact layer 138*a* and the upper electrode 20 are formed on the p-type first contact layer 138*a* and the current non-injecting layer 139. That is, C that preferentially substitutes a group-V site is doped into an active layer 15 side of the p-type first contact layer 138*a* and the p-type second contact layer 138*b* that are formed above the active layer 15 to inject carriers into the active layer 15. The p-type first contact layer 138*a* and the p-type second contact layer 138*b* are made of layer materials including p-type GaAs. The current non-injecting layer 139 is a layer constricting a current injected from outside via the upper electrode 20 and supplying the constricted current to the active layer 15, thereby improving a carrier density in the quantum well layer 15*b* with respect to a horizontal direction. To prevent the current injected from the upper electrode 20 from passing through the inside, the current non-injecting layer 139 is made of a layer material including n-GaAs having n-type conductivity.

Figure 18:
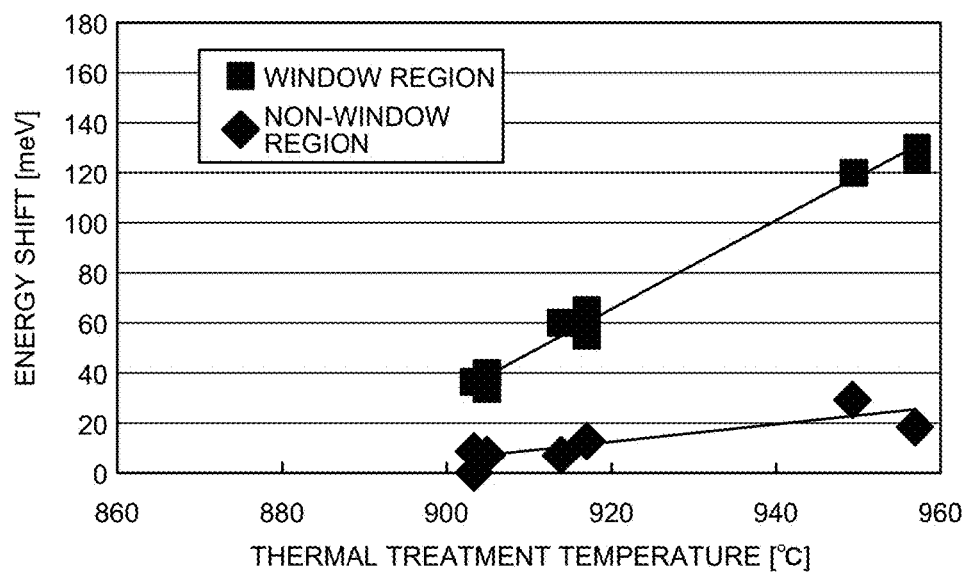
FIG. 18 depicts a relationship between thermal treatment temperatures of RTA and energy shift amounts in a window region and a non-window region of the semiconductor laser element depicted in FIG. 17.

As depicted in FIG. 17, in a semiconductor laser element including a layer having a current constricting function, by doping C as an impurity instead of Zn into a layer formed at a side of stacking a p-type type cladding with respect to the active layer 15, it is possible to perform promotion of disordering in the window region and suppression of disordering in the non-window region adequately. As a result, as depicted in FIG. 18, it is possible to obtain a large energy-shift amount in the window region 23, and to decrease an energy shift amount in the non-window region 24. In this case, as depicted in FIG. 18, by performing RTA at 915° C. or higher, it is possible to obtain a difference between an energy band gap in the window region 23 and an energy band gap in the non-window region 24 of 50 meV or greater, and to realize a highly reliable semiconductor laser element preventing COD, similarly to the semiconductor laser element 1. While 50 meV or more of an energy difference between the energy band gaps is necessary, it is more preferably 70 meV, and even more preferably 100 meV. In an example of FIG. 18, an energy difference of 70 meV is achieved at around 930° C., and an energy difference of 100 meV is achieved at around 950° C. While the energy difference 100 meV is achieved at around 950° C. in the example of FIG. 18, a shift amount in the non-window region reaches 20 meV, and performance of the element may be slightly degraded.

Figure 19:
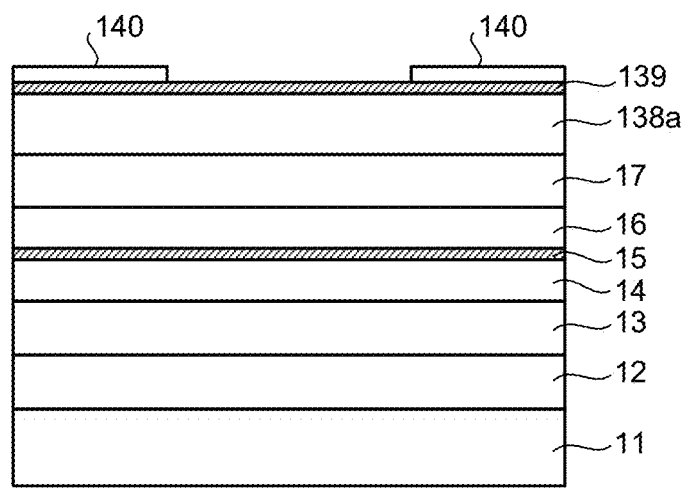
FIG. 19 is an explanatory diagram for a manufacturing method of the semiconductor laser element depicted in FIG. 17.
Figure 20:
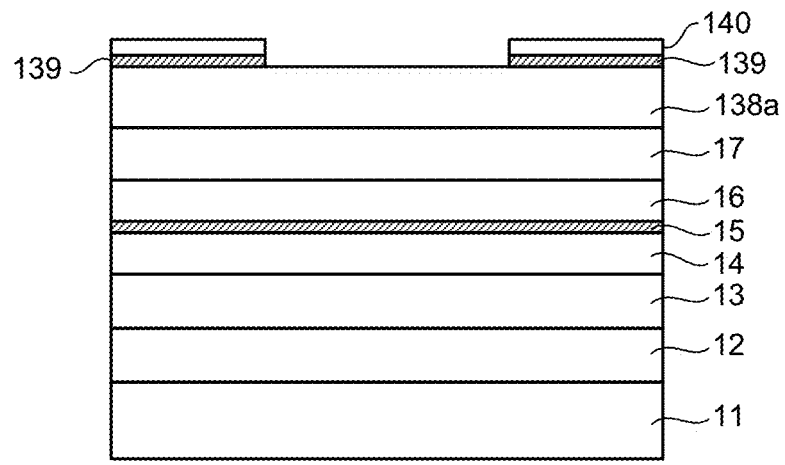
FIG. 20 is an explanatory diagram for the manufacturing method of the semiconductor laser element depicted in FIG. 17.
Figure 21:
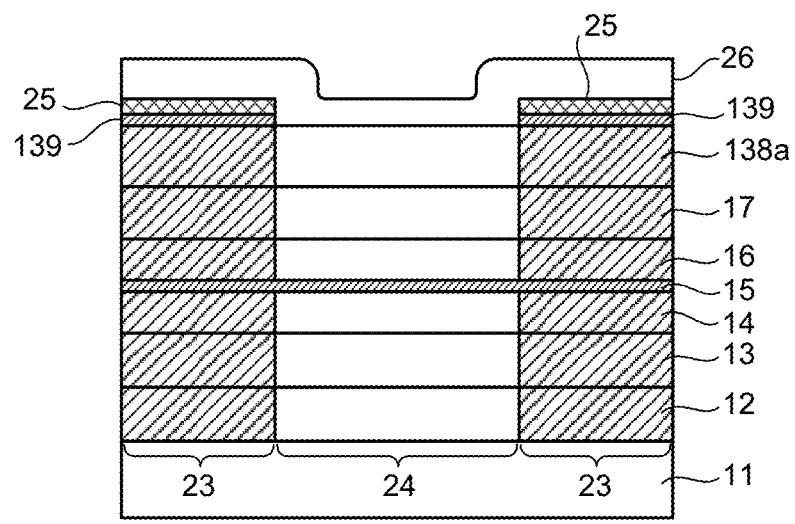
FIG. 21 is an explanatory diagram for the manufacturing method of the semiconductor laser element depicted in FIG. 17.
Figure 22:
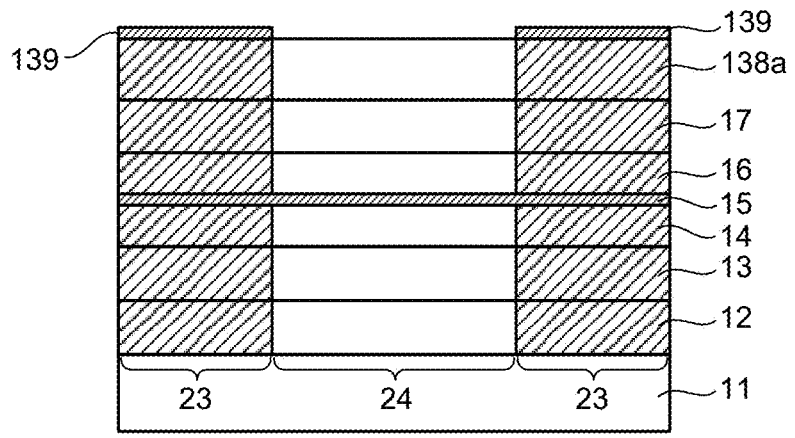
FIG. 22 is an explanatory diagram for the manufacturing method of the semiconductor laser element depicted in FIG. 17.
Figure 23:
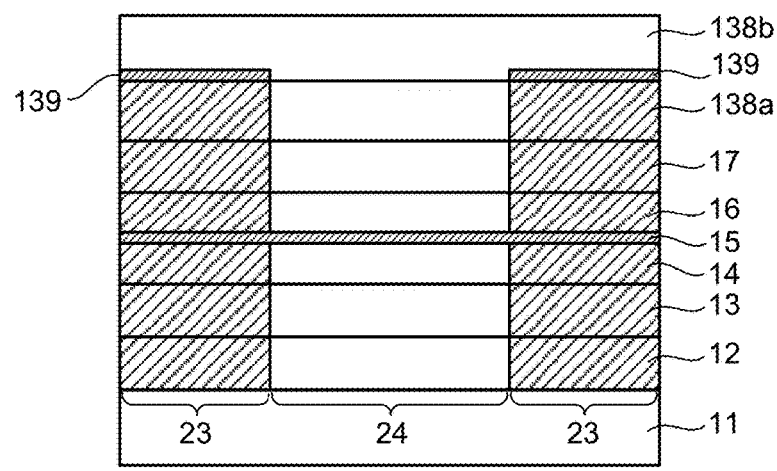
FIG. 23 is an explanatory diagram for the manufacturing method of the semiconductor laser element depicted in FIG. 17.

A manufacturing method of the semiconductor laser element depicted in FIG. 17 is explained below with reference to FIG. 19 to FIG. 23. As depicted in FIG. 19, the n-buffer layer 12, the n-cladding layer 13, the n-guide layer 14, the active layer 15, the p-type guide layer 16, the p-type cladding layer 17, the p-type first contact layer 138*a*, and an n-GaAs layer that forms the current non-injecting layer 139 are formed on the substrate 11 by epitaxial growth. After an SiO$_2$ film 140 is formed, the SiO$_2$ film 140 other than a region corresponding to the current non-injecting layer 139 is removed by photolithography and etching. As depicted in FIG. 20, etching is performed using the SiO$_2$ film 140 as an etching mask, thereby forming the current non-injecting layer 139. The etching mask is not necessarily the SiO$_2$ film, and the promoting film 25 formed in the subsequent step may be used as the etching mask. Etching may be performed by forming only a resist without forming the SiO$_2$ film. Thereafter, as depicted in FIG. 21, the promoting film 25 and the suppression film 26 are formed, and disordering is performed by RTA, thereby forming the window region 23 and the non-window region 24 similarly to the method depicted in FIG. 5 and FIG. 6. As depicted in FIG. 21, the promoting film 25 and the suppression film 26 are removed, and a surface cleaning process is performed on surfaces of the p-first contact layer 138*a* and the current non-injecting layer 139. Thereafter, as depicted in FIG. 23, p-GaAs is regrown to form the p-type second contact layer 138*b*, and the upper electrode 20 and the lower electrode 21 are formed. A GaAs thin-film layer may be provided on a regrowth interface to prevent surface oxidization after etching on the current non-injecting layer 139. Formation of the promoting film 25, formation of the suppression film 26, RTA, and removal of the promoting film 25 and the suppression film 26 depicted in FIG. 21 are not necessarily performed after forming the current non-injecting layer, and may be performed after forming the n-GaAs layer that forms the current non-injecting layer 139, or after forming the p-type second contact layer 138*b*. The processes described above only need to be performed before forming the upper electrode 20 and with a timing that allows disordering of the active layer 15.

Figure 24:
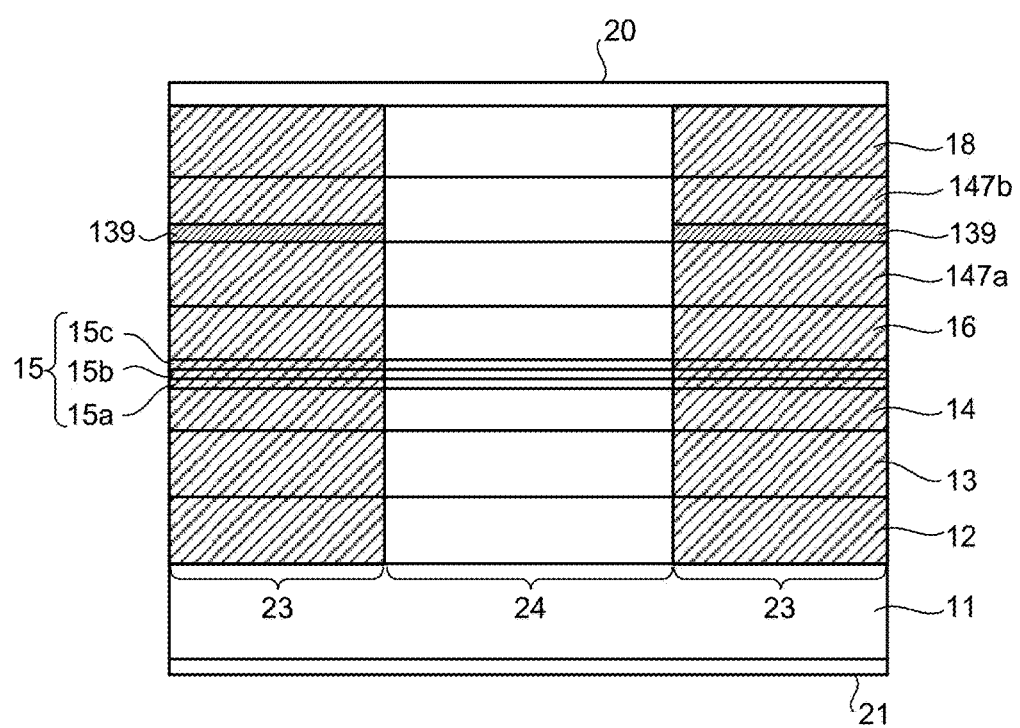
FIG. 24 is another example of a cross section of the semiconductor laser element according to the first embodiment.

While a semiconductor laser element having a horizontal optical mode of multi-mode (hereinafter, "multi-mode") has been explained as a semiconductor laser element including a layer having a current constricting function in FIG. 17, the semiconductor laser element may have horizontal optical mode of single mode (hereinafter, "single mode") as depicted in FIG. 24. In this case, as depicted in FIG. 24, the current non-injecting layer 139 is provided between a p-type first cladding layer 147*a* doped with C and a p-type second cladding layer 147*b* doped with C. That is, C that preferentially substitutes a group-V site is doped on an active layer 15 side of the p-first cladding layer 147*a* and the p-type second cladding layer 147*b* formed above the active layer 15. When the semiconductor laser element is of a single mode type depicted in FIG. 24, a sufficient difference between an energy band gap in the window region 23 and an energy band gap in the non-window region 24 is similarly obtained by doping C into a layer formed on a side of stacking a p-type cladding with respect to the active layer 15, thereby achieving a highly reliable semiconductor laser element preventing COD.

Second Embodiment

A second embodiment is explained next. A semiconductor laser element according to the second embodiment has C doped into a layer near an active layer and has Zn doped into a layer formed on an upper electrode side of the layer doped with C.

Figure 25:
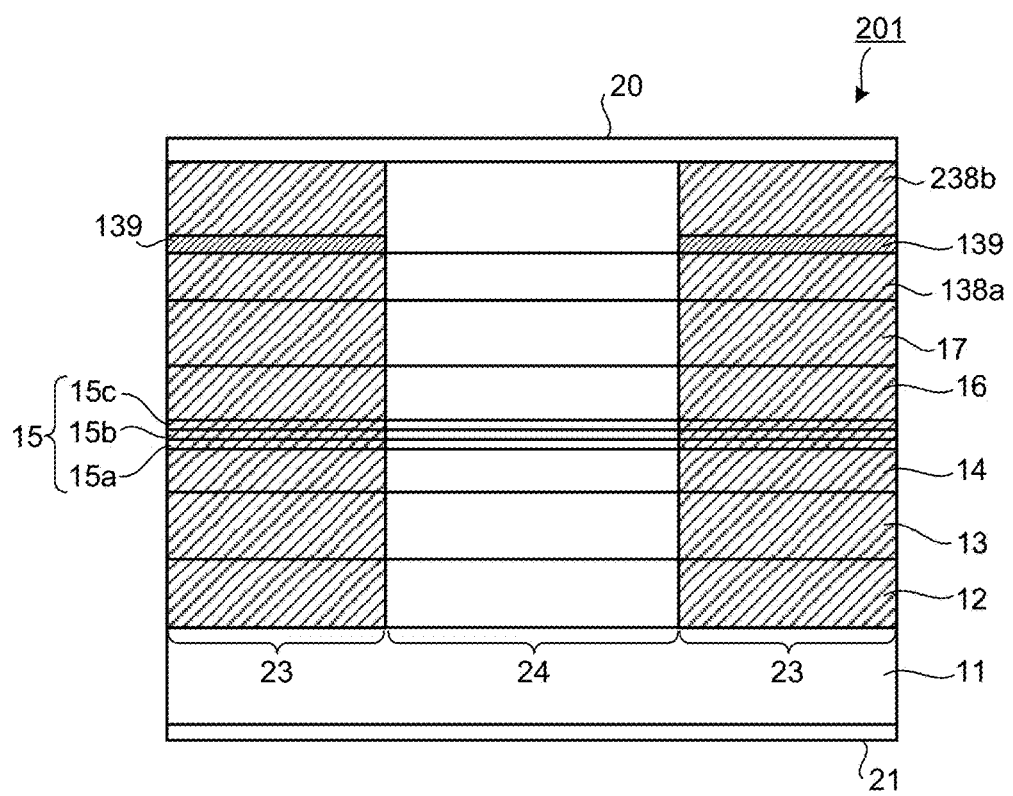
FIG. 25 is a cross section of a semiconductor laser element according to a second embodiment.

FIG. 25 is a cross section of a semiconductor laser according to the second embodiment. As depicted in FIG. 25, a semiconductor laser element 201 according to the second embodiment includes a layer having a current constricting function, and has a p-type second contact layer 238b that is doped with Zn as an impurity and formed on the p-type first contact layer 138a and the current non-injecting layer 139. In the semiconductor laser element 201, the current non-injecting layer 139 is formed by using a method similar to the method depicted in FIG. 19 and FIG. 20. Thereafter, a surface cleaning process is performed on the p-type first contact layer 138a and the current non-injecting layer 139, p-type GaAs is regrown, and the p-type second contact layer 238b doped with Zn is formed. The window region 23 and the non-window region 24 are formed by using a method similar to the method depicted in FIG. 21 and FIG. 22. Thereafter, the upper electrode 20 and the lower electrode 21 are formed.

As explained above, the semiconductor laser element 201 depicted in FIG. 25 has a structure in which the p-type second contact layer 238b doped with Zn as an impurity is formed instead of the p-type second contact layer 138b in the semiconductor laser element depicted in FIG. 17 according to the first embodiment.

In the semiconductor laser element depicted in FIG. 17, the p-type second contact layer 138b doped with C as an impurity is formed by its regrowth on the p-type first contact layer 138a and the current non-injecting layer 139. In this case, C is doped into GaAs by adding halogenated carbon such as $CCl_4$ or CBr4 or by using carbon of an organometallic origin of a semiconductor component such as TMGa or TMAs. To achieve Ohmic contact with an upper electrode, a high concentration of C needs to be doped into the p-type second contact layer 238b. For example, while a carrier concentration of the p-type first contact layer 138a is $1 \times 10^{18}$ cm$^{-3}$, a carrier concentration of the p-type second contact layer 138b is $1 \times 10^{19}$ cm$^{-3}$. To smoothly dope this high concentration of C into GaAs, the p-type second contact layer 138b needs to be formed by performing regrowth at a relatively low temperature of about 600° C. or lower.

Figure 26:
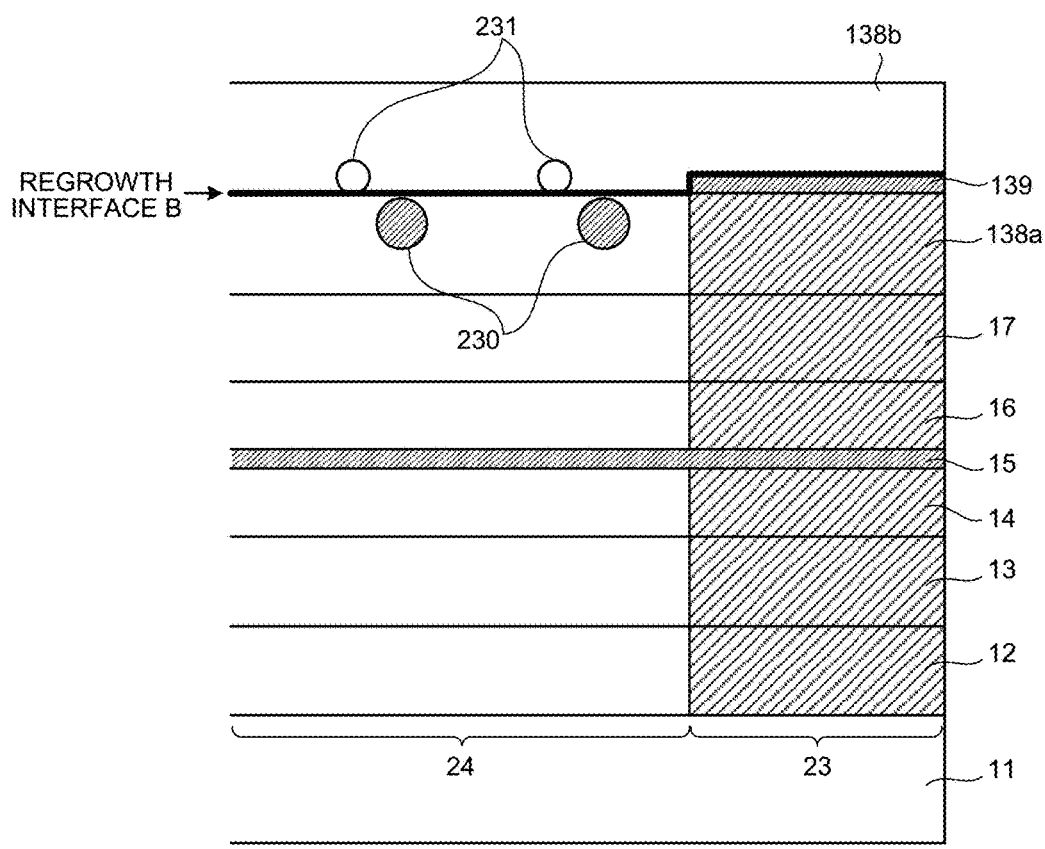
FIG. 26 is an explanatory diagram for a state of a regrowth interface in the semiconductor laser element depicted in FIG. 17.

However, in the semiconductor laser element including a layer having a current constricting function, because forming of the current non-injecting layer 139 is performed, as depicted in FIG. 26, an impurity 230 tends to remain on a regrowth interface B, and crystal quality tends to be degraded. Further, in regrowth performed at a low temperature equal to or lower than 600° C., a point defect 231 attributable to an antisite or a cluster tends to be included. Due to this point defect 231, crystal quality of the regrowth interface B between the p-type first contact layer 138a and the p-type second contact layer 138b that is doped with C as an impurity becomes sometimes unstable. Consequently, absorption of Ga by the promoting film 25 and diffusion of vacancies to the active layer 15 are inhibited, and the formation of the window region 23 may not be smoothly carried out. Further, in addition to the point defect 231, vacancies may be generated at the regrowth interface B, and the function of suppressing disordering of the suppression film 26 may not function adequately due to the diffusion of the generated vacancies into the active layer 15.

In contrast, in the semiconductor laser element 201 according to the second embodiment, the p-type second contact layer 238b is formed by doping a high concentration of Zn into GaAs. In doping Zn, regrowth is performed at a high temperature of, for example, 650° C. or higher, which is higher than that for doping C. Because regrowth is performed at a high temperature in the semiconductor laser element 201, generation of a point defect is considered to be suppressed. Thus, in the semiconductor laser element 201, the degradation of the promoting function of the promoting film 25 and degradation of the suppression function that are attributable to the point defect is considered to be low. Zn has a characteristic of being easily diffused as compared with C. However, the semiconductor laser element 201 has the p-type guide layer 16, the p-type cladding layer 17, and the p-type first contact layer 138a, which are between the p-type second contact layer 238b doped with Zn and the active layer 15. Particularly, the p-type cladding layer 17 is formed with a thick film thickness of 1 micrometer to 2 micrometers. Therefore, in the semiconductor laser element 201, a distance by which Zn does not reach the active layer 15 even if Zn is diffused by RTA is provided between the p-type second contact layer 238b and the active layer 15. Consequently, even if RTA is performed, Zn does not reach the active layer 15, and laser oscillation performance of the quantum well layer 15b in the non-window region 24 is considered to be not hindered.

Figure 27:
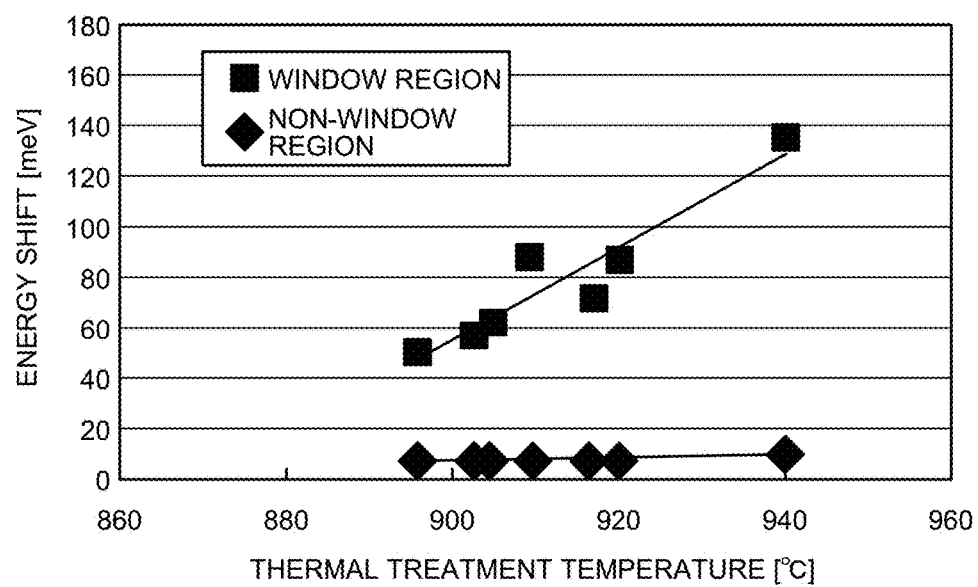
FIG. 27 depicts a relationship between thermal treatment temperatures of RTA and energy shift amounts in a window region and a non-window region of the semiconductor laser element depicted in FIG. 25.

A difference between an energy band gap in the window region and an energy band gap in the non-window region of the semiconductor laser element 201 is explained. FIG. 27 depicts a relationship between thermal treatment temperatures of RTA and energy shift amounts in the window region and the non-window region of the semiconductor laser element 201. As depicted in FIG. 27, by performing RTA at 900° C., a difference between the energy band gap in the window region 23 and the energy band gap in the non-window region 24 of 50 meV or greater is obtained. Further, even when RTA is performed at a thermal treatment temperature of 900° C. or higher, for example at 940° C., the energy-shift amount in the non-window region 24 is suppressed low, and a large energy-shift amount is obtained in the window region 23. In the semiconductor laser element 201, because the p-type guide layer 16, the p-type cladding layer 17, and the p-type first contact layer 138a are formed between the active layer 15 and the p-type second contact layer 238b, it is considered that the diffused Zn does not reach the active layer 15 even if Zn is diffused from the p-type second contact layer 238b by RTA. In other words, in the semiconductor laser element 201, a distance between the active layer 15 and the p-type second contact layer 238b is set to a distance in which Zn diffused from the p-type second contact layer 238b is unable to reach the active layer 15. Particularly, because the p-type cladding layer 17 has a thickness of 1 micrometer to 2 micrometers, it is considered that Zn diffused from the p-type second contact layer 238b is unable to reach the active layer 15. Although an energy difference between energy band gaps needs to be equal to or larger than 50 meV, 70 meV is more preferable, and 100 meV is even more preferable. It is understood from an example of FIG. 27 that thermal treatment temperatures corresponding to energy differences of 50 meV, 70 meV, and 100 meV are approximately 905° C., 912° C., and 925° C., respectively.

Figure 28:
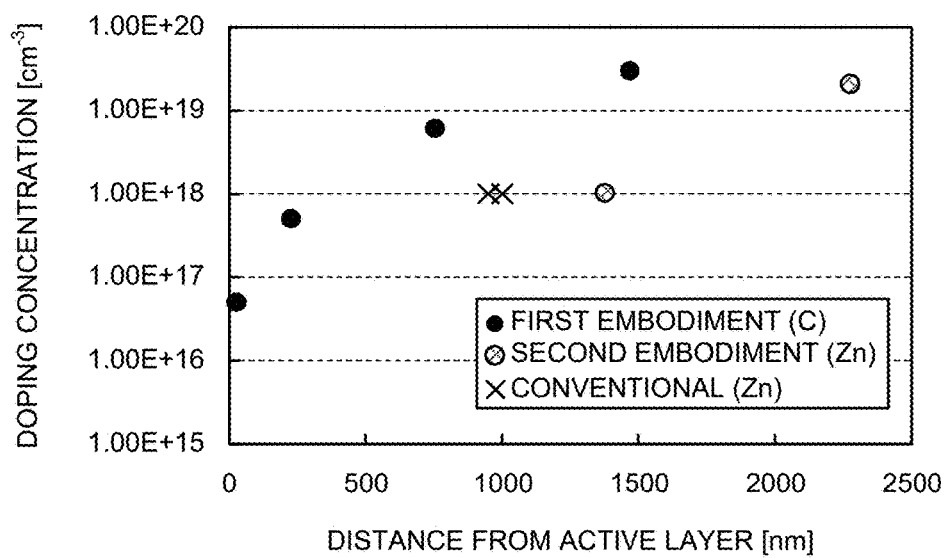
FIG. 28 depicts a relationship between distances of C from an active layer in the first embodiment, Zn from an active layer in the second embodiment, and Zn from an active layer in the conventional technique, and doping concentrations of these impurities.

FIG. 28 depicts a relationship between a distance of C from an active layer in the first embodiment, Zn from an active layer in the second embodiment, and Zn from an active layer in the conventional technique, and doping concentrations of these impurities. A distance of Zn doped in a semiconductor laser from an active layer in the conventional technique is as short as about 1000 nanometers, and a distance of doped Zn from an active layer in the second embodiment is as long as about 1400 nanometers. Further, in the second embodiment, by increasing a distance of the doped Zn from an active layer to about 2300 nanometers, doping concentration of Zn can be increased to about $1.0 \times 10^{19}$ cm$^{-3}$ which is about the same as the doping concentration of C doped in the semiconductor laser element 1 according to the first embodiment. Therefore, in the semiconductor laser element 201 according to the second embodiment, a doping concentration of Zn can be flexibly set to match different uses of the semiconductor laser element 201, by increasing a distance of the doped Zn from the active layer to equal to or longer than a diffusion distance of Zn dependent on a thermal treatment temperature of RTA. As explained above, in the second embodiment, by increasing a distance of Zn as an impurity from an active layer, Zn can be prevented from reaching the active layer, as depicted in FIG. 28. Accordingly, it is possible to select Zn, in addition to C, as an impurity to achieve a highly reliable semiconductor laser.

In this manner, in the second embodiment, by increasing a distance between the active layer 15 and a layer doped with Zn to equal to or more than a diffusion distance of Zn dependent on a thermal treatment temperature of RTA, a highly reliable semiconductor laser element preventing COD is achieved even when Zn is selected as an impurity. In the second embodiment, by setting a distance between the active layer 15 and a layer doped with Zn correspondingly with a diffusion distance of Zn upon RTA, it is possible to select Zn as an impurity. Therefore, the selection for impurity to be doped in each layer is improved.

As described above, in the semiconductor laser element 1 having the p-type second contact layer 138b formed by regrowth at a low temperature of about 600° C. or lower for doping C, there is a risk of destabilization of crystal quality in a regrowth interface between the p-type first contact layer 138a and the p-type second contact layer 138b. However, it is considered that destabilization of crystal quality in the regrowth interface is preventable by performing a surface cleaning process at a high temperature before regrowing the p-type second contact layer 138b. For example, by performing a surface cleaning process in arsine at a high temperature of 650° C. or higher, residual of an impurity is prevented, and crystal quality at the regrowth interface is stabilized. As a result, absorption of Ga by the promoting film 25, diffusion of vacancies into the active layer 15, and a function of suppressing disordering by the suppression film 26 are performed adequately, and it is considered that an even more reliable semiconductor laser element can be achieved.

Figure 29:
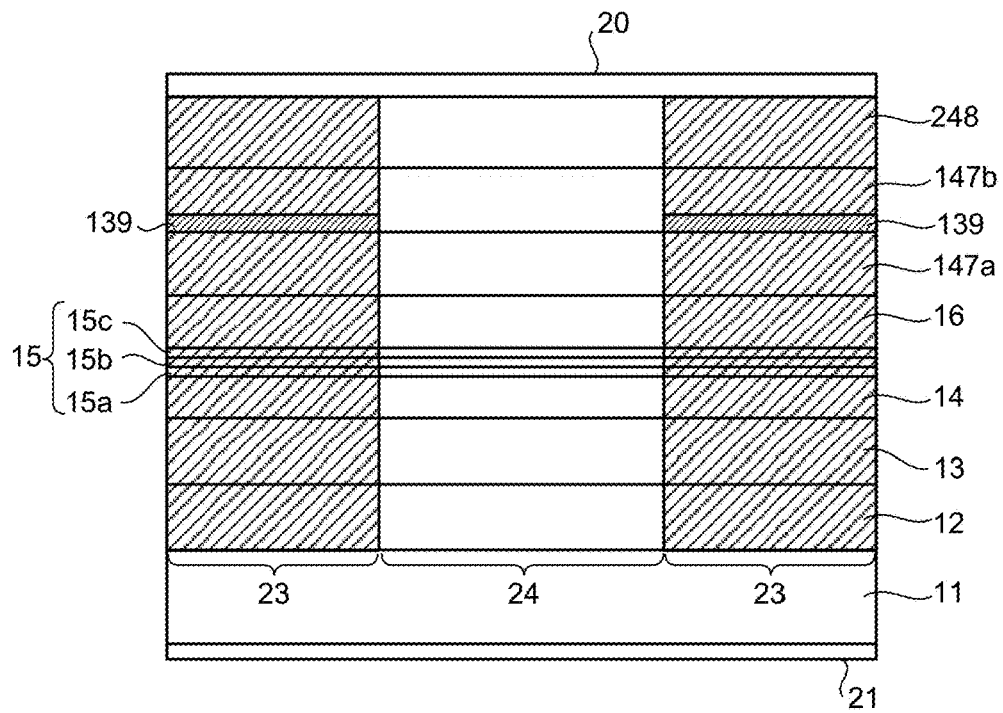
FIG. 29 is another example of a cross section of the semiconductor laser element according to the second embodiment.

While the semiconductor laser element 201 of a multi-mode type has been explained in the second embodiment, as depicted in FIG. 29, of course the semiconductor laser element may be of a single mode type. The semiconductor laser element depicted in FIG. 29 has a p-type contact layer 248 doped with Zn as an impurity instead of the p-type contact layer 18 in the semiconductor laser element of the single-mode type according to the first embodiment depicted in FIG. 24. In this case, film thicknesses of the p-type guide layer 16, the p-type first cladding layer 147a, and the p-type second cladding layer 147ba may be adjusted to make a distance between the active layer 15 and the p-type contact layer 248 doped with Zn equal to or larger than a diffusion distance of Zn dependent on a thermal treatment temperature of RTA. Particularly, Zn diffused from the p-type contact layer 248 is considered to be unable to reach the active layer 15, by setting a total of the film thicknesses of the p-type first cladding layer 147a and the p-type second cladding layer to 1 micrometer to 2 micrometers.

Figure 30:
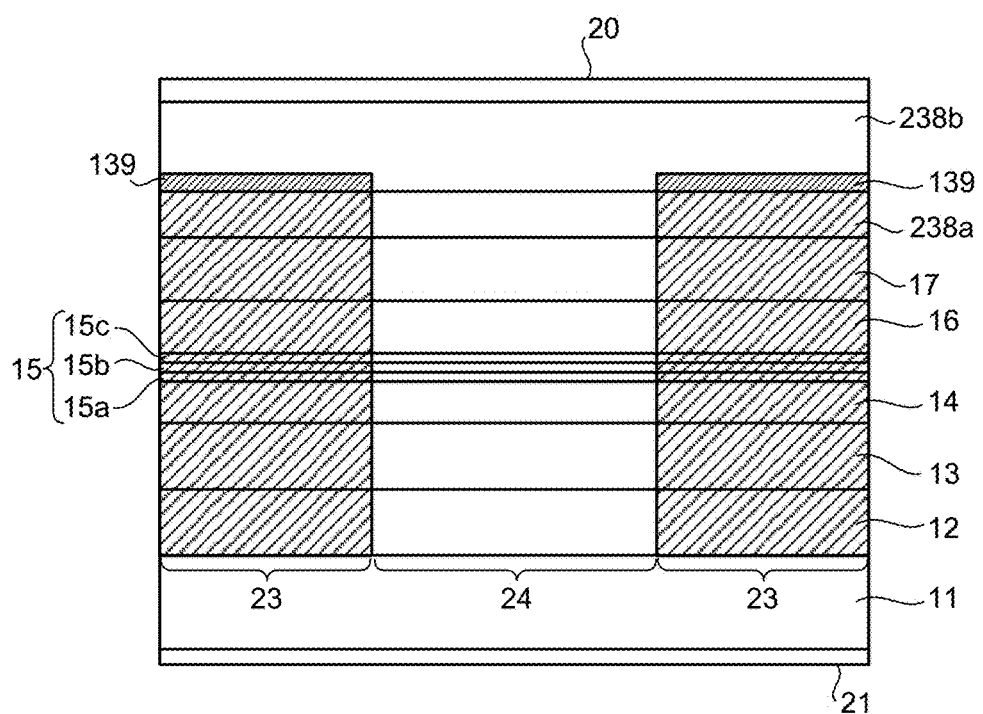
FIG. 30 is another example of a cross section of the semiconductor laser element according to the second embodiment.

When a distance between the active layer 15 and a layer doped with Zn is set equal to or longer than a diffusion distance of Zn dependent on a thermal treatment temperature of RTA, a p-type first contact layer 238a doped with Zn as an impurity may be formed instead of the p-type first contact layer 138a in the semiconductor laser element 201 depicted in FIG. 25, as depicted in FIG. 30. In this case, because a film thickness of the p-type cladding layer 17 is as large as 1 micrometer to 2 micrometers, Zn diffused from the p-type first contact layer 238a and the p-type second contact layer 238b is considered to be unable to reach the active layer 15.

Figure 31:
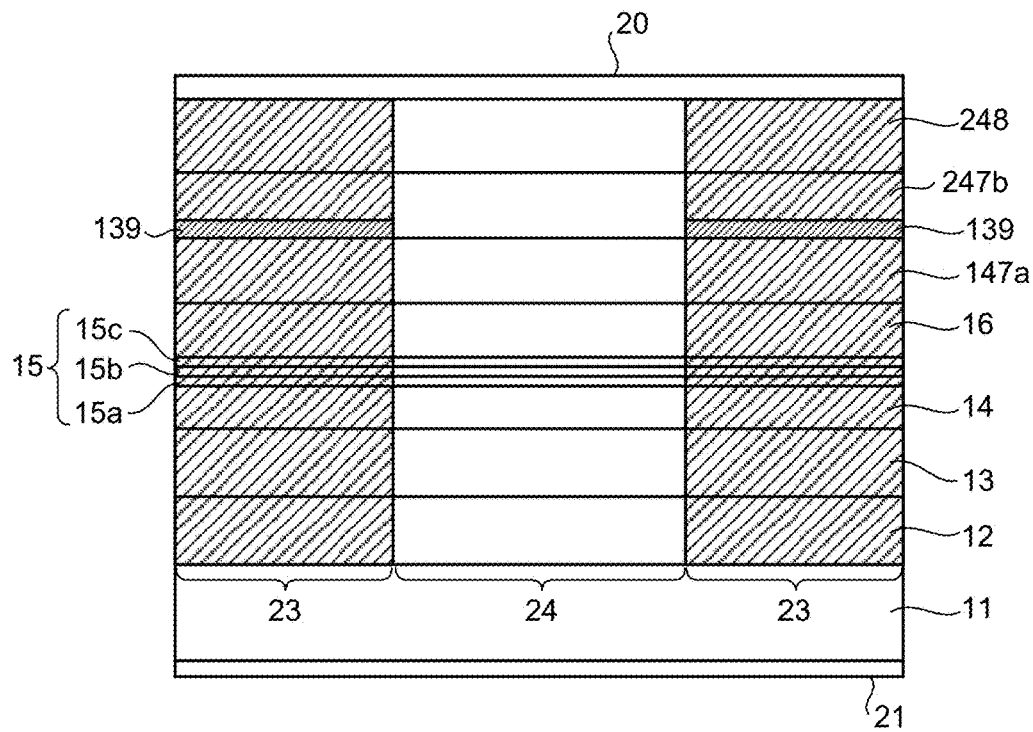
FIG. 31 is another example of a cross section of the semiconductor laser element according to the second embodiment.

Not being limited to the semiconductor laser element of the multi-mode type, the semiconductor laser element may be of a single-mode type formed with a p-type second cladding layer 247b doped with Zn as an impurity in place of the p-type second cladding layer 147b in the semiconductor laser element depicted in FIG. 29, as depicted in FIG. 31. In this case, film thicknesses of the p-type guide layer 16 and the p-type first cladding layer 147a may be adjusted to set a distance between the active layer 15 and the p-type second cladding layer 247b doped with Zn to be equal to or larger than a diffusion distance of Zn dependent on a thermal treatment temperature of RTA. For example, diffused Zn is considered to be unable to reach the active layer 15, by setting a film thickness of the p-type first cladding layer 147a to 1 micrometer to 2 micrometers.

Figure 32:
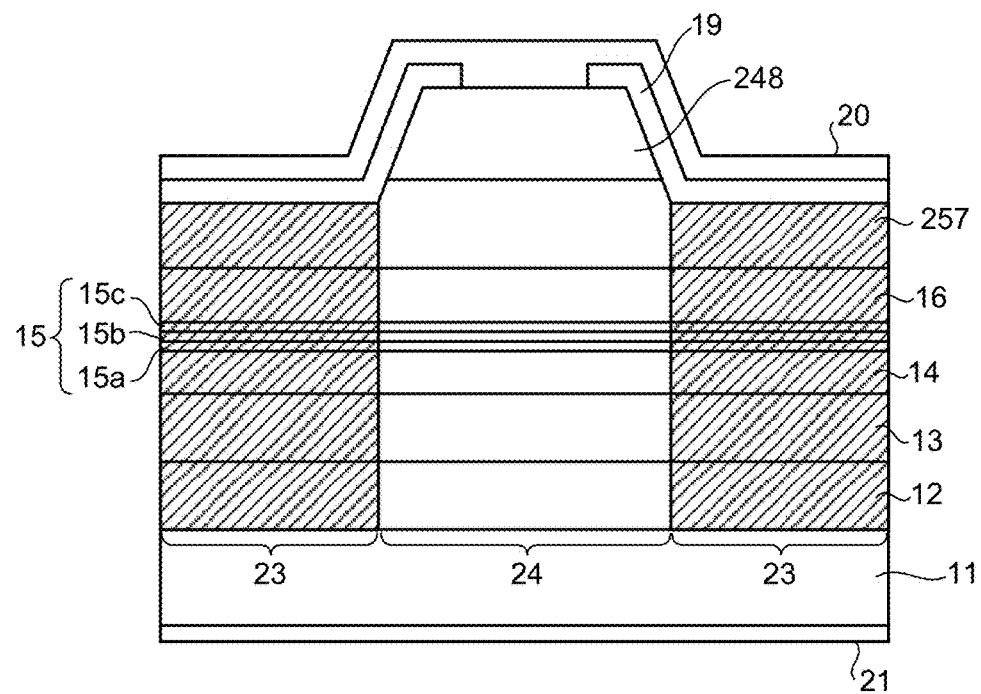
FIG. 32 is another example of a cross section of the semiconductor laser element according to the second embodiment.

The present invention is not limited to a semiconductor laser element including a layer having a current constricting function, and may be applied to a semiconductor laser element of a ridge structure. For example, the p-type contact layer 248 doped with Zn as an impurity is formed as depicted in FIG. 32, instead of the p-type contact layer 18 in the semiconductor laser element 1 depicted in FIG. 2 as the example of the first embodiment. In this case, film thicknesses of the p-type guide layer 16 and the p-type cladding layer 17a may be adjusted to set distances from the active layer 15 to the p-type contact layer 248 and a p-type cladding layer 257 doped with Zn to be equal to or larger than a diffusion distance of Zn dependent on a thermal treatment temperature of RTA. For example, diffused Zn is considered to be unable to reach the active layer 15, by setting a film thickness of the p-type cladding layer 17 to 1 micrometer to 2 micrometers. Further, the p-type cladding layer 257 doped with Zn as an impurity is formed as depicted in FIG. 32, instead of the p-type cladding layer 17 in the semiconductor laser element 1 depicted in FIG. 2. In this case, distances from the active layer 15 to the p-type contact layer 248 and the p-type cladding layer 257 doped with Zn is set equal to or larger than a diffusion distance of Zn dependent on a thermal treatment temperature of RTA, by decreasing a thermal treatment temperature of RTA, shortening a thermal treatment time period of RTA, and adjusting a concentration distribution of Zn, in addition to adjusting a film thickness of the p-type guide layer 16. As explained above, in the semiconductor laser element according to the second embodiment, a distance between the active layer 15 and a layer doped with Zn is set equal to or larger than a diffusion distance of Zn dependent on a thermal treatment temperature of RTA, and C is doped into a layer near the active layer 15. As a result, even if Zn is selected as an impurity, it is considered that COD is able to be prevented.

Figure 33:
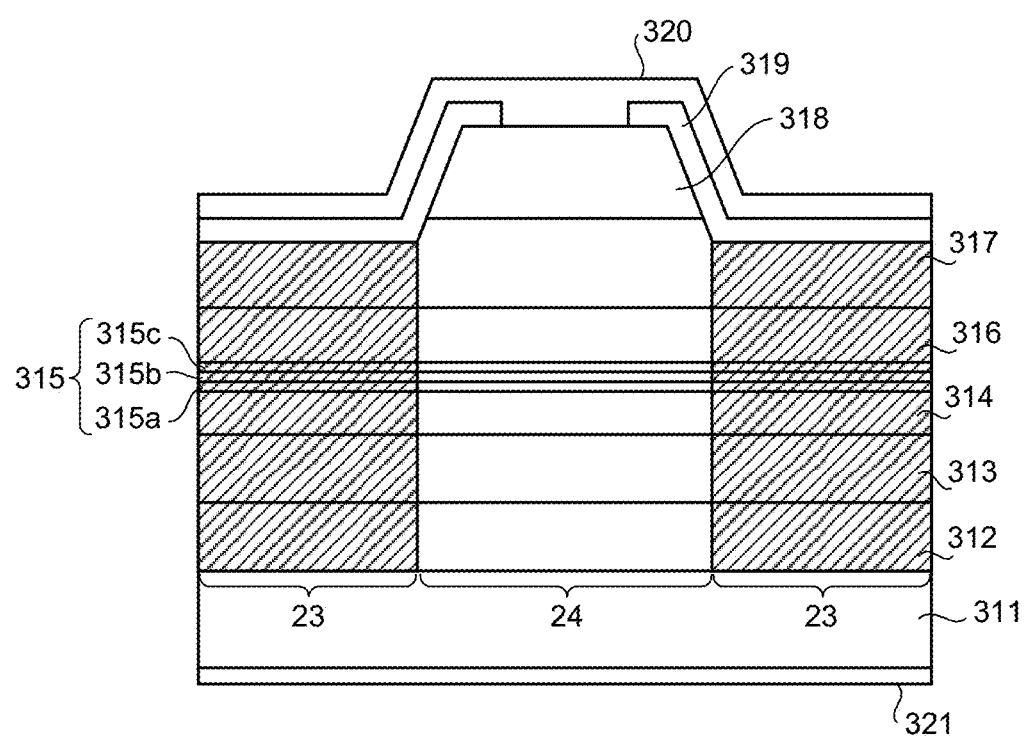
FIG. 33 is another example of a cross section of the semiconductor laser element according to the first and second embodiments.

While formation of a p-type semiconductor film layer doped with C as an impurity on an active layer has been explained, if an n-type semiconductor film layer is to be formed on an active layer, preferably, Se is doped as an impurity as depicted in FIG. 33, for example. Se is a group-VI atom, and in a group-III-V compound semiconductor, Se enters a group-V site and becomes a donor. In GaAs, Se preferentially substitutes the group-V site which is a group different from Ga that occupies the group-III absorbed by the promoting film 25. Further, because Se has a very small diffusion coefficient like C, degradation in the promoting function of the promoting film and degradation in the suppression function of the suppression film are considered to be reduced, even if RTA is performed. A substrate 311, a p-type buffer layer 312, a p-type cladding layer 313, a p-type guide layer 314, a lower barrier layer 315a, an upper barrier layer 315c, an n-guide layer 316, an n-cladding layer 317, and an n-contact layer 318 in a semiconductor laser element depicted in FIG. 33 are formed of layer materials having n and p types opposite to those of layers in corresponding stacking positions in a stacking direction of the substrate 11, which are the n-buffer layer 12, the n-cladding layer 13, the n-guide layer 14, the lower barrier layer 15a, the upper barrier layer 15c, the p-type guide 16, the p-type cladding layer 17, and the p-type contact layer 18 depicted in FIG. 2, respectively. The n-guide layer 316, the n-cladding layer 317, and the n-contact layer 318 are doped with Se.

According to an embodiment of the present invention, by doping an impurity that preferentially substitutes a group-V site into a layer near an active layer, it is possible to prevent promotion of disordering in a window region and suppression of disordering in a non-window region from degrading, and to increase a difference between an energy band gap in the window region and an energy band gap in the non-window region. Therefore, it is possible to realize a highly reliable semiconductor laser element suppressing COD even if the semiconductor laser element is driven under severe conditions.

Third Embodiment

A semiconductor optical element according to a third embodiment of the present invention will be explained. The semiconductor optical element according to the third embodiment is a semiconductor laser element, and has a ridge structure providing optical confinement in the width direction and providing a current confining structure.

Figure 34A:
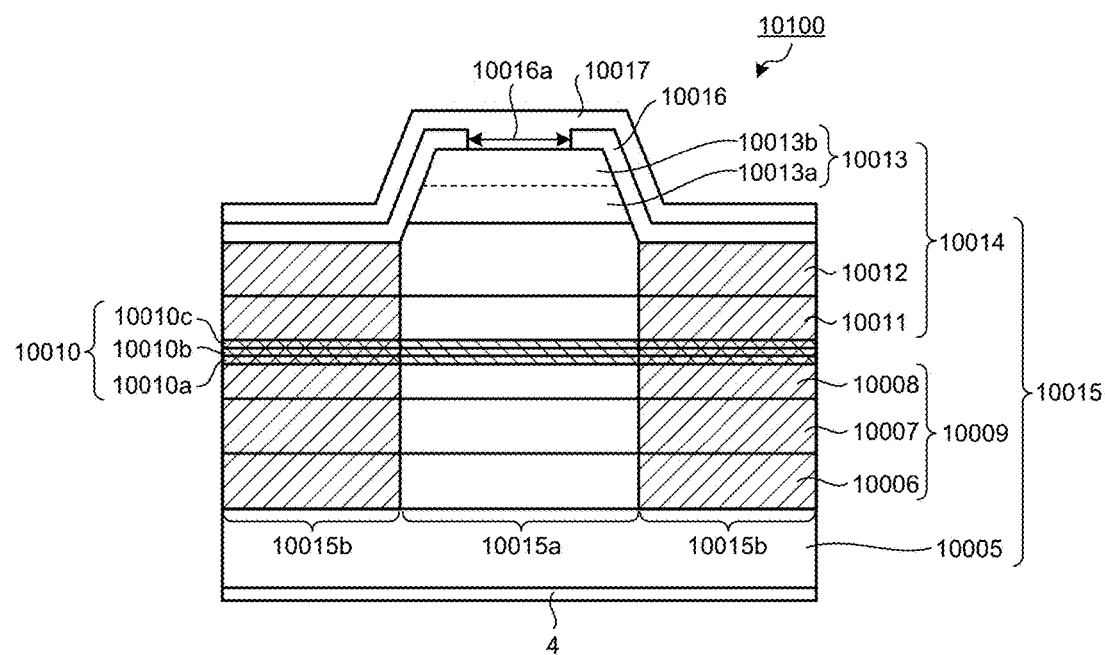
FIG. 34A is a cross-sectional view along an x-y plane in the semiconductor laser element according to the third embodiment.

FIG. 34A is a cross-sectional view along the x-y plane in the semiconductor laser element according to the third embodiment, and FIG. 34B is a cross-sectional view along the y-z plane in the semiconductor laser element according to the third embodiment. As illustrated in FIG. 34A, this semiconductor laser element 10100 is provided with a semiconductor layer portion 10015 including a substrate 10005 the bottom surface of which is provided with a lower electrode 4 that is an n-side electrode made of n-type gallium arsenide (GaAs), and an n-type semiconductor layer section 10009, an active layer 10010, and a p-type semiconductor layer section 10014. The n-type semiconductor layer section 10009 includes an n-type buffer layer 10006, an n-type cladding layer 10007, and an n-type guide layer 10008, and the p-type semiconductor layer section 10014 includes a p-type guide layer 10011, a p-type cladding layer 10012, and a p-type contact layer 10013. The n-type semiconductor layer section 10009, the active layer 10010, and the p-type semiconductor layer section 10014 are sequentially formed on the substrate 10005. The p-type contact layer 10013 includes two layers of a p-type contact layer 10013a and a p-type contact layer 10013b. The p-type contact layer 10013 has a trapezoidal cross section, and has stripes extending in the z-axial direction. This p-type contact layer 10013 provides the ridge structure to the semiconductor laser element 10100. The semiconductor laser element 10100 also includes an insulating film 10016 that is formed on the p-type semiconductor layer section 10014, and an upper electrode 10017 that is a p-side electrode that is brought into contact with the p-type contact layer 10013 via a part of the upper base of the trapezoidal ridge structure, the part being not provided with the insulating film 10016.

The n-type buffer layer 10006 is made of GaAs, and is a buffer layer allowing high-quality epitaxial layers to be grown on the substrate 10005. The n-type cladding layer 10007 and the n-type guide layer 10008 are made of AlGaAs, with refractive index and thickness set in such a manner that desired optical confinement in the deposition direction is achieved. It is desirable for the Al composition of the n-type guide layer 10008 to be equal to or higher than 20 percent and equal to or lower than 40 percent. The refractive index of the n-type cladding layer 10007 is smaller than that of the n-type guide layer 10008. It is preferable for the n-type guide layer 10008 to have a thickness equal to or more than 50 nanometers, e.g., approximately 1000 nanometers. It is preferable for the n-type cladding layer 10007 to have a thickness equal to or more than 1 micrometer, and approximately 3 micrometers. The n-type semiconductor layer section 10009 contains silicon (Si), for example, as an n-type dopant.

The active layer 10010 is provided with a lower barrier layer 10010a, a quantum well layer 10010b, and an upper barrier layer 10010c, and has a single quantum well (SQW) structure. The lower barrier layer 10010a and the upper barrier layer 10010c serve as barriers for confining carriers to the quantum well layer 10010b, and are made of highly-pure AlGaAs that is intentionally kept undoped. The quantum well layer 10010b is made of highly-pure InGaAs that is intentionally kept undoped. The In composition and the film thickness of the quantum well layer 10010b, and the compositions of the lower barrier layer 10010a and the upper barrier layer 10010c are set based on a desired central wavelength (e.g., 0.98 micrometer). The active layer 10010 may have a multiple quantum well (MQW) structure including repetitions of a layered structure having the quantum well layer 10010b and the barrier layers formed on top of and on the bottom of the quantum well layer 10010b, respectively, or may have a bulk structure not having the lower barrier layer 10010a and the upper barrier layer 10010c. Although explained herein is a structure with highly-pure layers that are intentionally kept undoped, the quantum well layer 10010b, the lower barrier layer 10010a, and the upper barrier layer 10010c may alternatively be intentionally doped with a donor or an acceptor.

The p-type guide layer 10011 and the p-type cladding layer 10012 are paired with the n-type cladding layer 10007 and the n-type guide layer 10008, respectively, and are made of AlGaAs the refractive index and thickness of which are set to achieve desired optical confinement in the deposition direction. The Al composition of the p-type guide layer 10011 is preferably equal to or higher than 20 percent and equal to or lower than 40 percent. The refractive index of the p-type cladding layer 10012 is smaller than that of the p-type guide layer 10011. The Al composition of the p-type cladding layer 10012 is set somewhat higher than that of the n-type cladding layer 10007 so that the optical field in the layers is shifted toward the n-type cladding layer 10007 to reduce a waveguide loss. The Al composition of the p-type guide layer 10011 is set lower than that of the p-type cladding layer 10012. The thickness of the p-type guide layer 10011 is preferably equal to or more than 50 nanometers, and, for example, 1000 nanometers or so. The thickness of the p-type cladding layer 10012 is preferably 1 micrometer to 3 micrometers or so. The p-type semiconductor layer section 10014 contains carbon (C) as a p-type dopant. The C concentration of the p-type guide layer 10011 is set to $0.1 \times 10^{17}$ cm$^{-3}$ to $1.0 \times 10^{17}$ cm$^{-3}$, for example, and is preferably $0.5 \times 10^{17}$ cm$^{-3}$ to $1.0 \times 10^{17}$ cm$^{-3}$ or so. The C concentration of the p-type cladding layer 10012 is set to equal to or more than $1.0 \times 10^{17}$ cm$^{-3}$, for example.

The p-type contact layer 10013 includes the p-type contact layer 10013a made of GaAs that is doped with C as a p-type impurity at a concentration of approximately $1.0 \times 10^{17}$ cm$^{-3}$ to $5.0 \times 10^{19}$ cm$^{-3}$ to $5.0 \times 10^{20}$ cm$^{-3}$, for example, and the p-type contact layer 10013b made of GaAs that is doped with zinc (Zn) as a p-type impurity in a concentration of $1.0 \times 10^{17}$ cm$^{-3}$ to $5.0 \times 10^{19}$ cm$^{-3}$ to $5.0 \times 10^{20}$ cm$^{-3}$ or so, for example. C and Zn have functions of promoting and suppressing atomic vacancy diffusion during rapid thermal annealing (RTA) in the manufacture process. The C and the Zn themselves might become diffused in the RTA, but, in the third embodiment, the conditions of the RTA such as temperature and time are adjusted so that the C and the Zn do not diffuse into the active layer 10010 in the RTA. The insulating film 10016 is made of SiNx, for example. The upper electrode 10017 is made of a metallic material that brought into an ohmic contact with the semiconductor material in the p-type contact layer 10013.

In a window region 10015b, the insulating film 10016 separates the upper electrode 10017 from the p-type contact layer 10013 that is at the topmost surface of the semiconductor layer portion 10015. With this structure, a current injection area is selectively formed in a non-window region 10015a of the semiconductor laser element 10100. Alternatively, to suppress the current injection into the window region 10015b without using the insulating film 10016, the upper electrode 10017 may be deposited directly on top of the non-window region 10015a in a selective manner.

Furthermore, in the semiconductor laser element 10100, a current confining structure is achieved by using the insulating film 10016 to limit the area in which the upper electrode 10017 is brought into contact with the p-type semiconductor layer section 10014. In other words, the current path followed by the vacancy carriers injected from the upper electrode 10017 via the p-type semiconductor layer section 10014 is limited to the current injection area that is confined by the opening 10016a, and that is in contact with the p-type contact layer 10013 at the topmost surface of the semiconductor layer portion 10015, so that a high density current is efficiently injected into the active layer 10010, and used in oscillating the laser light L.

Figure 34C:
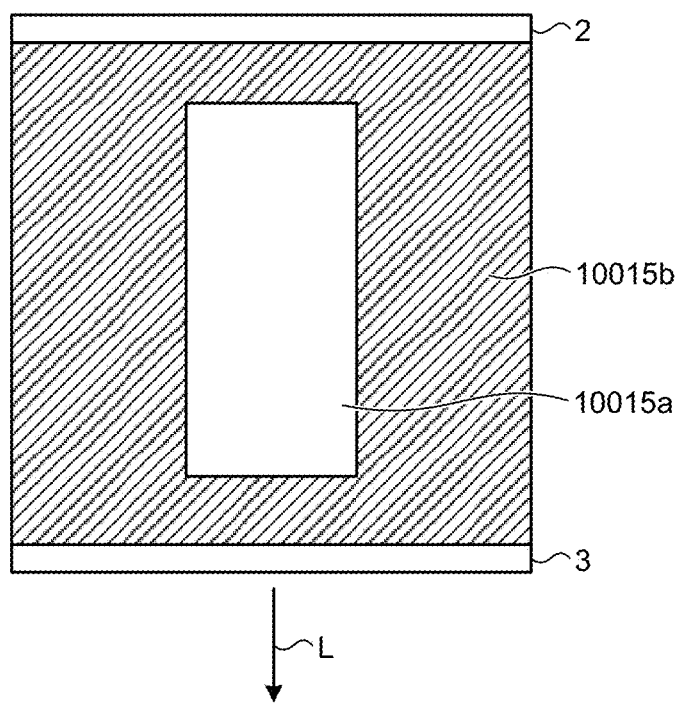
FIG. 34C is a cross-sectional view of along an x-z plane in the semiconductor laser element according to the third embodiment.

The semiconductor layer portion 10015 has the non-window region 10015a, and the window region 10015b in which the active layer 10010 has larger band gap energy than that in the non-window region 10015a. The non-window region 10015a and the window region 10015b are two areas extending in the deposition direction in the semiconductor layer portion 10015. FIG. 34C is a cross-sectional view along the x-z plane in the semiconductor laser element according to the third embodiment. As illustrated in FIG. 34C, the window region 10015b is formed along the four facets of the semiconductor laser element 10100, in a manner surrounding the non-window region 10015a. In other words, two sides of the border between the non-window region 10015a and the window region 10015b are provided along the light guiding direction at the center of the semiconductor laser element 10100, and the remaining two sides at the ends of facets of the semiconductor laser element 10100 are provided in a manner traversing the light guiding direction, being at the ends with respect to the light guiding direction in the semiconductor laser element 10100. The window region 10015b is a region in which disordered crystals through atomic vacancy diffusion are obtained sufficiently by the RTA, and has a higher degree of disordering than in the non-window region 10015a. With this structure, the difference between the band gap energy in the active layer 10010 in the window region 10015b and that in the non-window region 10015a is set to 10 milli electron volts or higher, for example. One electron volt is approximately $1.60 \times 10^{-19}$ joules.

The window region is a region with a higher band gap energy than the region near the center of the active layer that is caused to emit light by current injection, and is a region in which disordered crystals are sufficiently obtained. The non-window region is a region that is not the window region, and in which disordering is suppressed. Larger differences in the degree of disordering obtained by atomic vacancy diffusion and band gap energy between the window region and the non-window region can make a window region that absorbs a smaller amount of laser light and reduce the risk of COD.

The semiconductor laser element 10100 also has a structure in which the current injection area is positioned away from the window region 10015b so that the current injected into the window region 10015b is reduced. If a current is injected into the window region 10015b, the window region 10015b becomes heated by the injected current. The band gap in a semiconductor is generally known to be smaller when the temperature is higher. This means that, if a current is injected into the window region 10015b, the band gap in the window region 10015b will be lower. When a band gap in the window region 10015b is smaller, the difference between the band gap energy in the window region 10015b and that in the non-window region 10015a becomes smaller, despite such a difference is achieved by disordered crystals in the active layer 10010.

Because the semiconductor laser element 10100 according to the third embodiment is provided with the current injection area positioned at the topmost surface of the non-window region 10015a and positioned away from the window region 10015b in the semiconductor layer portion 10015, the difference between the band gap energy in the window region 10015b and that in the non-window region 10015a is prevented from being reduced. Therefore, a semiconductor laser element with a larger band gap energy difference can be achieved.

An operation of the semiconductor laser element 10100 will now be explained. To begin with, a voltage is applied between the lower electrode 4 and the upper electrode 10017, and carriers are injected into the active layer 10010 via the n-type semiconductor layer section 10009 and the p-type semiconductor layer section 10014. The opening 10016a on the insulating film 10016 confines the current path of the hole carriers injected from the upper electrode 10017 via the p-type semiconductor layer 14, so that the high density current is efficiently injected into the active layer 10010. The width of the opening 10016a that is the width at which the current is injected is referred to as a current injection width. The active layer 10010 receiving the current injection emits light at a given central wavelength. The emitted light is confined and guided near the active layer 10010 by the ridge structure in the x-axial direction, and by the refractive index difference between the guide layers and the cladding layers in the y-axial direction, and the laser is oscillated by the light amplifying effect of the active layer 10010 and the optical resonator formed by the high reflection film 2 and the low reflection film 3. As a result, the semiconductor laser element 10100 outputs the laser light L, same as illustrated in FIG. 1.

The semiconductor laser element 10100 may be configured to oscillate in single-mode when the current injection width is 6 micrometers, for example, and the optical intensity is 500 milliwatts or higher. In such a configuration, the semiconductor laser element 10100 can achieve a maximum optical power per micrometer of the current injection width of 80 Wpm or higher. The semiconductor laser element 10100 may also be configured to oscillate in multi-mode when the current injection width is 100 micrometers, for example, and when the optical intensity is 11 watts or higher. In this configuration, the semiconductor laser element 10100 can achieve a maximum optical power per micrometer of the current injection width of 110 Wpm or higher. Because the optical power per unit current injection width reaches an extremely high level in high-output lasers as described above, COD is more likely to occur. In the semiconductor laser element 10100 according to the third embodiment, however, because the risk of COD is reduced, a semiconductor laser element that is reliable even with a high level output can be provided.

In the semiconductor laser element 10100, the p-type contact layer 10013b is not provided on the window region 10015b, as illustrated in FIG. 34B. In other words, the thickness of the p-type semiconductor layer section 10014, which is positioned between the topmost surface of the semiconductor layer portion 10015 and the active layer 10010, is different in the window region 10015b and in the non-window region 10015a. This is because, after the p-type contact layer 10013b uniformly doped with Zn is formed on the non-window region 10015a and the window region 10015b, the p-type contact layer 10013b is removed from the window region 10015b by etching or the like, before being processed with the RTA. Because the p-type contact layer 10013b is thus removed, higher Zn content of the p-type semiconductor layer section 10014 can be ensured in the non-window region 10015a, compared with that in the window region 10015b, even after being processed with the RTA.

When Zn is used as a dopant together with C, Zn is a first impurity having a function of suppressing disordering in the active layer 10010, for reasons described later. Therefore, when the p-type semiconductor layer section 10014 has a higher Zn content in the non-window region 10015a than in the window region 10015b, disordering in the non-window region 10015a is suppressed. As a result, the differences in the degree of disordering obtained by atomic vacancy diffusion and band gap energy difference between the non-window region 10015a and the window region 10015b are increased. In this manner, the amount of laser light absorbed at the facets is reduced, and the risk of COD is reduced.

As mentioned earlier, the difference in the band gap energy in the active layer 10010 in the window region 10015b and that in the non-window region 10015a is set to 10 milli electron volts or higher, for example. Such a band gap energy difference can be ensured by setting the first impurity content of the window region 10015b lower by $3.5 \times 10^{13}$ cm$^{-2}$ or more than that of the non-window region 10015a, or by setting a second impurity content of the window region 10015b higher by $3.5 \times 10^{13}$ cm$^{-2}$ or more than that of the non-window region 10015a. The impurity content of the p-type semiconductor layer section 10014 is the gross impurity content of the layers from the p-type guide layer 10011 to the p-type contact layer 10013 containing impurities, and can be acquired by calculating an integral of the dopant concentration with respect to the layer thickness of the layers containing impurities.

As described above, in the semiconductor laser element 10100 according to the third embodiment, because the p-type semiconductor layer section 10014 has a higher Zn content in the non-window region 10015a than in the window region 10015b, a semiconductor laser element with a larger band gap energy difference can be achieved.

Figure 35:
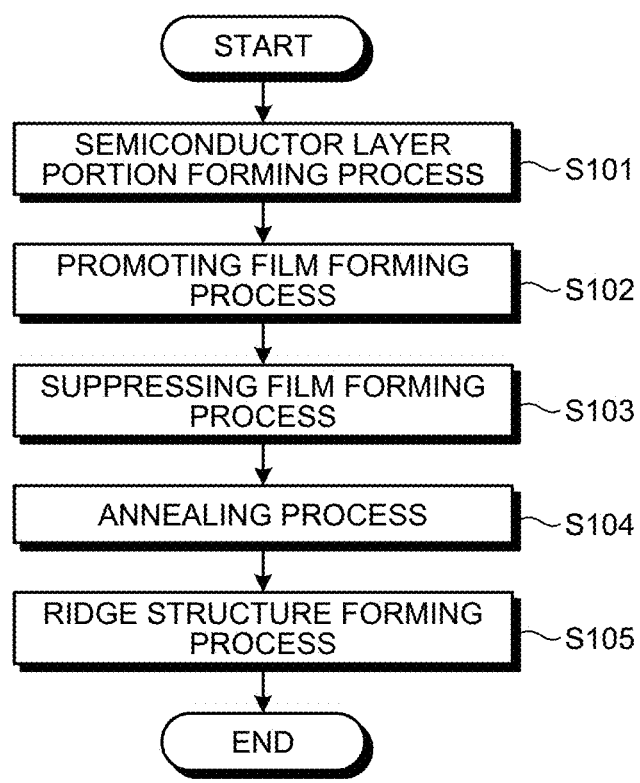
FIG. 35 is a flowchart of a method for manufacturing a semiconductor laser element.

An exemplary method for manufacturing a semiconductor laser element 10100 will now be explained. FIG. 35 is a flowchart of the method for manufacturing the semiconductor laser element. As illustrated in FIG. 35, the method for manufacturing semiconductor laser element 10100 according to the third embodiment includes a semiconductor layer portion forming process (Step S101), a promoting film forming process (Step S102), a suppressing film forming process (Step S103), an annealing process (Step S104), and a ridge structure forming process (Step S105).

Each of these processes will now be explained. The values specified in these processes are merely exemplary, and the third embodiment is not limited thereto.

Semiconductor Layer Portion Forming Process

Figure 36:
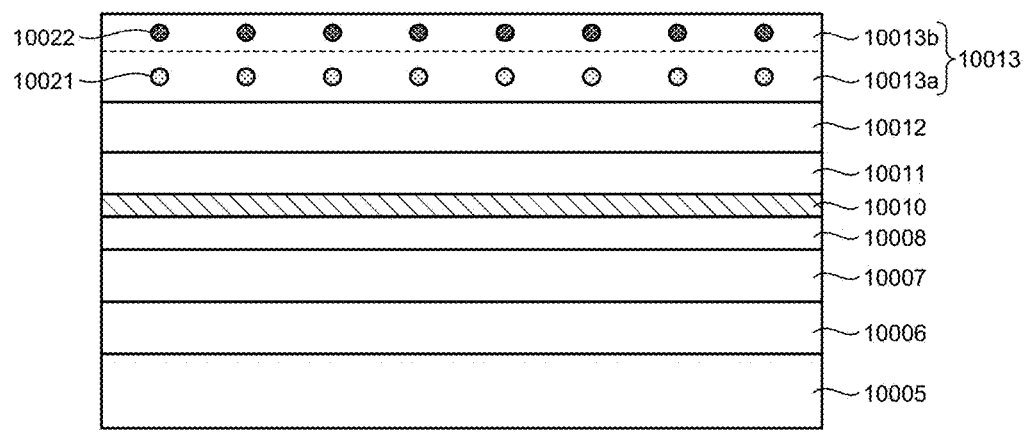
FIG. 36 is a schematic for explaining an exemplary method for manufacturing a semiconductor laser element according to the third embodiment.

To begin with, the semiconductor layer portion forming process at Step S101 will now be explained. In this process, to begin with, as illustrated in FIG. 36, the n-type buffer layer 10006, the n-type cladding layer 10007, the n-type guide layer 10008, the active layer 10010, the p-type guide layer 10011, the p-type cladding layer 10012, and the p-type contact layer 10013 are epitaxially grown on the substrate 10005 through metal organic chemical vapor deposition (MOCVD). The p-type contact layer 10013a is doped with C (C 10021) that is a p-type second impurity, and the p-type contact layer 10013b is doped with Zn (Zn 10022) that is a p-type first impurity.

Figure 37:
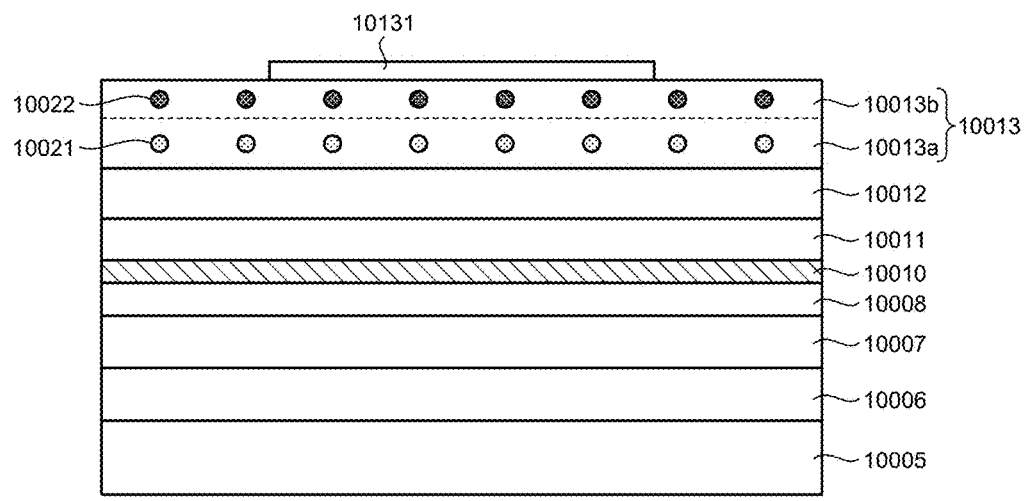
FIG. 37 is a schematic for explaining the exemplary method for manufacturing a semiconductor laser element according to the third embodiment.
Figure 38:
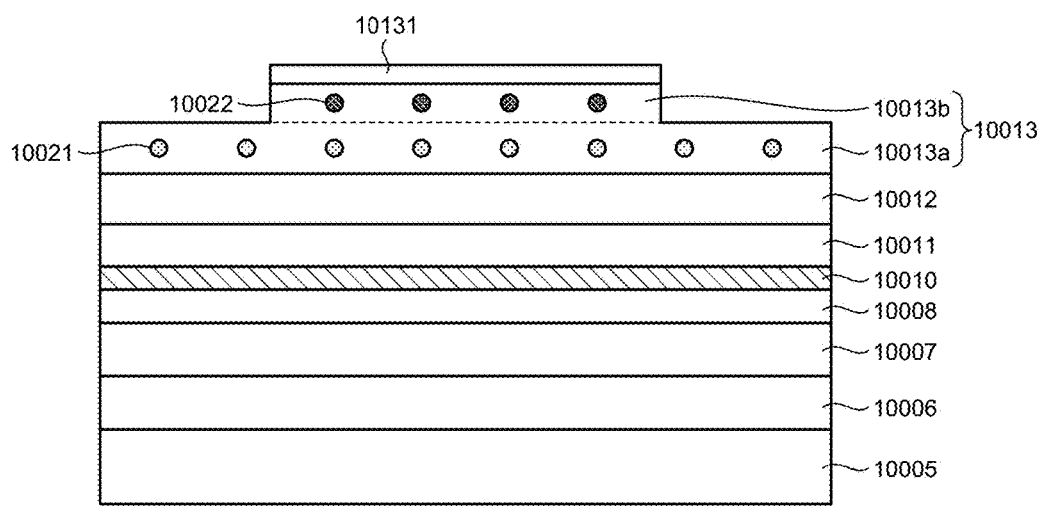
FIG. 38 is a schematic for explaining the exemplary method for manufacturing a semiconductor laser element according to the third embodiment.
Figure 39:
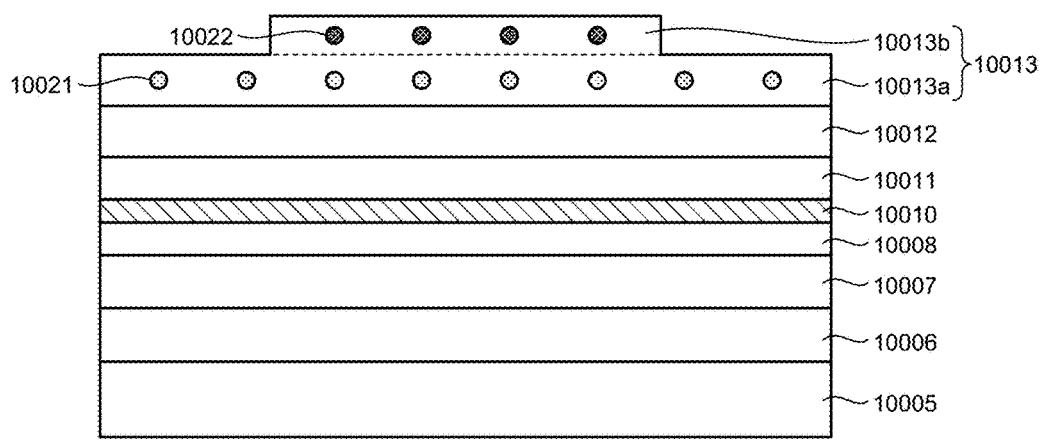
FIG. 39 is a schematic for explaining the exemplary method for manufacturing a semiconductor laser element according to the third embodiment.

A photolithography process and an etching process are then performed to remove the p-type contact layer 10013b from an area corresponding to the window region 10015b, as illustrated in FIGS. 37 and 38. The photoresist 10131 is then removed, as illustrated in FIG. 39. Through this process, the semiconductor layer portion 10015 including the layers from the substrate 10005 to the p-type contact layer 10013 is achieved.

Promoting Film Forming Process

Figure 40:
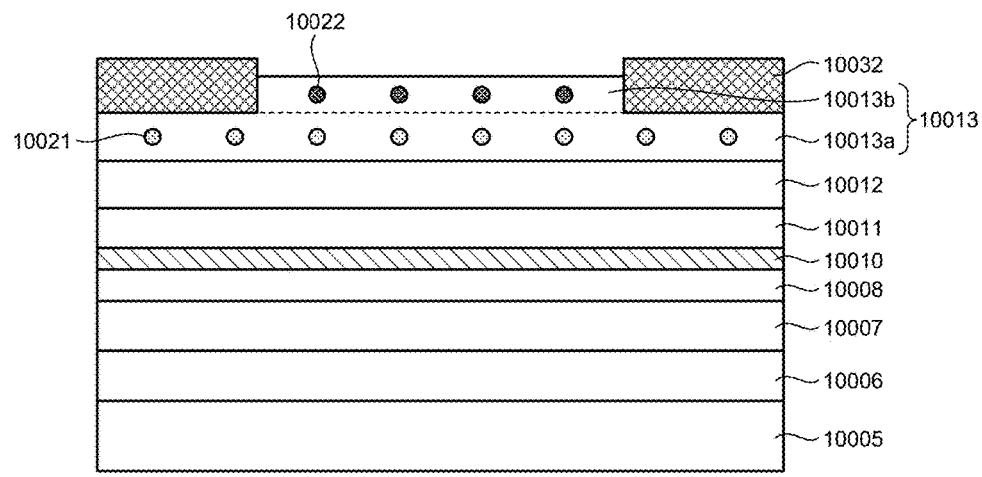
FIG. 40 is a schematic for explaining the exemplary method for manufacturing a semiconductor laser element according to the third embodiment.

The promoting film forming process at Step S102 will now be explained. Formed in this process is a promoting film 10032 for promoting disordering through atomic vacancy diffusion and allowing the window region 10015b to be formed thereby. Atomic vacancy diffusion is also referred to as IFVD. To begin with, the promoting film 10032 that is a SiN insulating layer is deposited on the top surface of the semiconductor layer portion 10015. The photolithography process and the etching process are then performed, as illustrated in FIG. 40, to remove the promoting film 10032 from the area in which the non-window region 10015a is to be provided. Through this process, the promoting film 10032 is formed on the top surface of the region to be the window region 10015*b*.

Suppressing Film Forming Process

Figure 41:
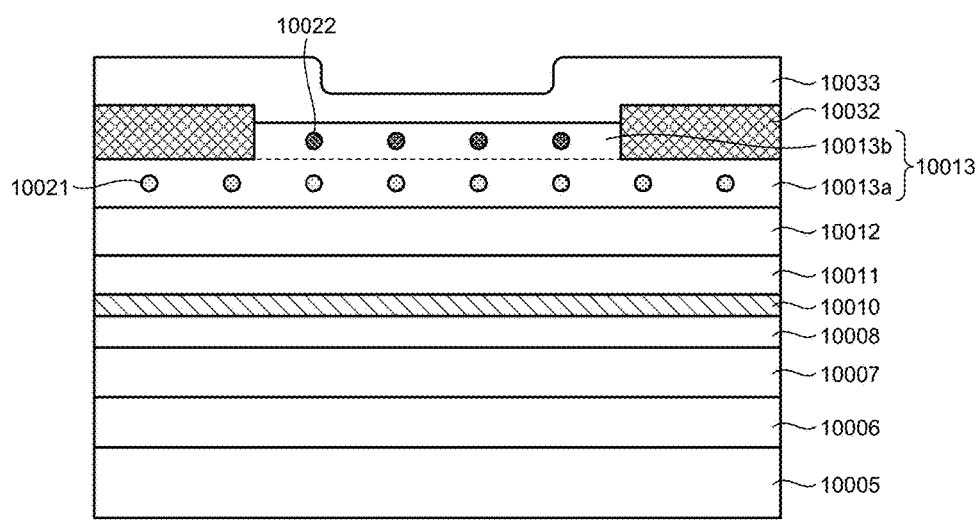
FIG. 41 is a schematic for explaining the exemplary method for manufacturing a semiconductor laser element according to the third embodiment.

The suppressing film forming process at Step S103 will now be explained. In this process, an suppressing film 10033 that is a SiN insulating layer is formed, as illustrated in FIG. 41.

The promoting film 10032 is a sparse SiN insulating layer with a refractive index of 1.9, for example, and the suppressing film 10033 is a dense SiN insulating layer with a refractive index of 2.0, for example. It should be noted that the promoting film 10032 may be the dense SiN insulating layer, and the suppressing film 10033 may be the sparse SiN insulating layer depending on the conditions of the RTA (see Japanese Patent Application Laid-open No. 2011-103494).

In the third embodiment, the promoting film is deposited and removed from the area in which the non-window region 10015*a* is to be provided, and the suppressing film is deposited subsequently. Alternatively, the suppressing film may be first deposited and removed from the area in which the window region 10015*b* is to be provided, and the promoting film may be subsequently deposited. Furthermore, in the third embodiment, a film of SiNx is used as the promoting film and the suppressing film, but a film of SiOx, ZnOx, AlOx, AlNx, AlOxNy, TiOx, TiNx, TiOxNy, TaOx, HfOx, or the like may be used as the promoting film and the suppressing film.

Annealing Process

The annealing process at Step S104 will now be explained. In this process, the semiconductor layer portion 10015 is annealed over a short time period with the RTA. When the semiconductor layer portion 10015 is annealed with the RTA, the promoting film 10032 and the suppressing film 10033 absorb Ga atoms 10024, creating atomic vacancies 10023 on the surfaces of the p-type contact layers 13*a* and 13*b*, as illustrated as an example for the promoting film 10032 in FIG. 42. The atomic vacancies 10023 diffuse as diffusing species, thereby inducing disordering in the layers of the semiconductor layer portion, particularly in the active layer 10010. In the region on which the promoting film 10032 is formed in a manner in contact with the p-type contact layer 10013*a*, the sparse promoting film 10032 promotes disordering in the active layer 10010, and the window region 10015*b* is formed thereby, as illustrated in FIG. 43.

Figure 43:
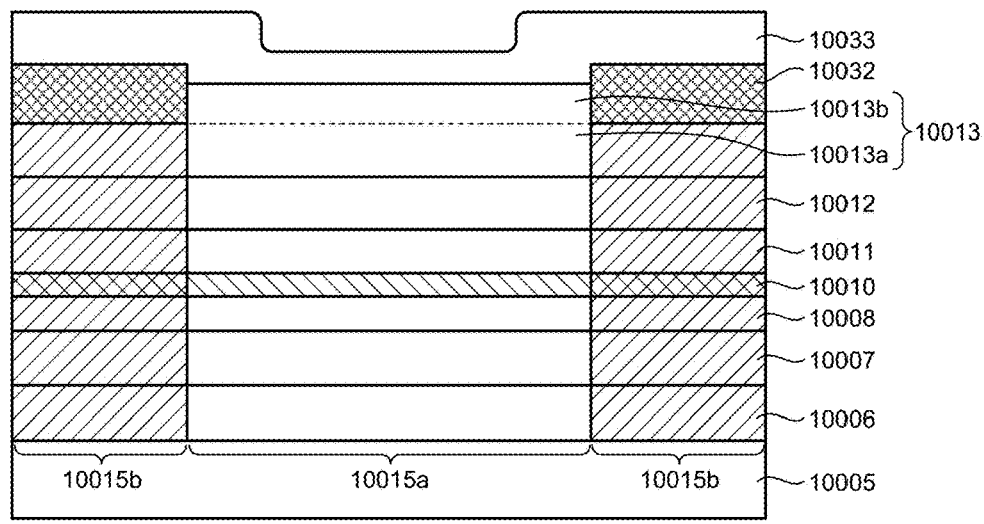
FIG. 43 is a schematic for explaining the exemplary method for manufacturing a semiconductor laser element according to the third embodiment.

By contrast, in the region on which the suppressing film 10033 is provided in a manner in contact with the p-type contact layer 10013*b*, the dense suppressing film 10033 inhibits disordering in the active layer 10010, and the non-window region 10015*a* is formed thereby, as illustrated in FIG. 43.

Figure 42:
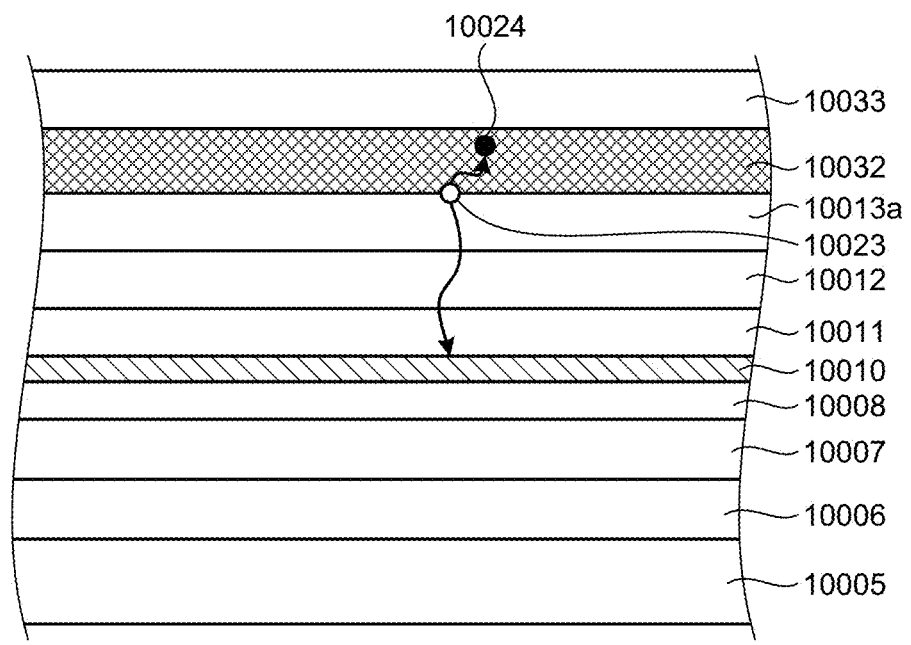
FIG. 42 is a schematic for explaining an atomic vacancy formation process in which a promoting film is allowed to absorb Ga atoms, in the semiconductor laser element according to the third embodiment.

During the RTA, disordering is promoted and suppressed by the doped impurities, in parallel with a process of atomic vacancy formation in which the promoting film 10032 and the suppressing film 10033 absorb the Ga atoms 10024, as illustrated in FIG. 42. The process of promoting disordering is presumed to take place because the thermal diffusion of the doped impurities promotes vacancy diffusion, or because the thermally diffused doped impurities kick out the Ga atoms 10024. The process of suppressing disordering is presumed to take place because the doped impurities become thermally diffused and fill out the atomic vacancies 10023. The RTA causes these processes simultaneously. The types, the concentrations, and the combination of impurities, the RTA temperature and time, the conditions of the promoting film and the suppressing film, and the like determine the effect of which one of these processes becomes more dominant.

In the third embodiment, therefore, the types, the concentrations, and the combination of impurities, the temperature and the time of the RTA, the conditions of the promoting film and the suppressing film, and the like are optimized so that the difference in the degree of disordering in the active layer 10010 in the window region 10015*b* and that in the non-window region 10015*a* is increased. The RTA conditions such as the temperature and the time are adjusted so that the RTA does not cause the impurities to diffuse into the active layer 10010. This is to prevent the impurities having been introduced into the active layer 10010 from absorbing light, and deteriorating the output characteristics of the semiconductor laser element.

Hereinafter, the second impurity doped to promote disordering by promoting either diffusion of or formation of the atomic vacancies 10023 or both is referred to as a promoting species, and the first impurity doped to inhibit disordering by suppressing either the diffusion or generation of the atomic vacancies 10023 or both is referred to as an suppressing species. When the p-type semiconductor layer section 10014 contains a larger amount of the promoting species, disordering is promoted, and the degree of disordering becomes higher and the band gap energy is increased. When the amount of the suppressing species contained in the p-type semiconductor layer section 10014 is increased, disordering is suppressed, and the degree of disordering remains low, and an increase of the band gap energy are suppressed.

In the third embodiment, C 10021 functions as the promoting species, and Zn 10022 functions as the suppressing species. In the window region 10015*b* where the p-type contact layer 10013*b* is removed by etching so that the amount of Zn 10022 that is the suppressing species is reduced, the effect of C 10021 promoting disordering becomes dominant. By contrast, in the non-window region 10015*a* containing more Zn 10022 that is the suppressing species, Zn 10022 inhibits disordering. By making the impurity contents different in such a manner that the p-type semiconductor layer section 10014 contains more Zn 10022 that is the suppressing species in the non-window region 10015*a*, the resultant degrees of disordering in these regions become different, and the band gap energy difference is increased. Therefore, compared with the conventional technology in which the Zn 10022 contents of the non-window region 10015*a* and the window region 10015*b* are not changed, the effect of suppressing the risk of COD is more prominent.

During disordering in the active layer 10010 by the annealing process, the SQW composition is changed by the atomic vacancies diffusion, thereby causing the band gap energy to change, but the annealing process does not introduce impurities such as C and Zn themselves into the active layer 10010. In other words, disordered crystals grow in the quantum well layer 10010*b* made of highly-pure InGaAs intentionally kept undoped, by the atomic vacancies diffused from the lower barrier layer 10010*a*, the upper barrier layer 10010*c*, and the like made of AlGaAs. As disordered crystals grow further, the band gap energy of the active layer 10010 is increased.

Figure 44:
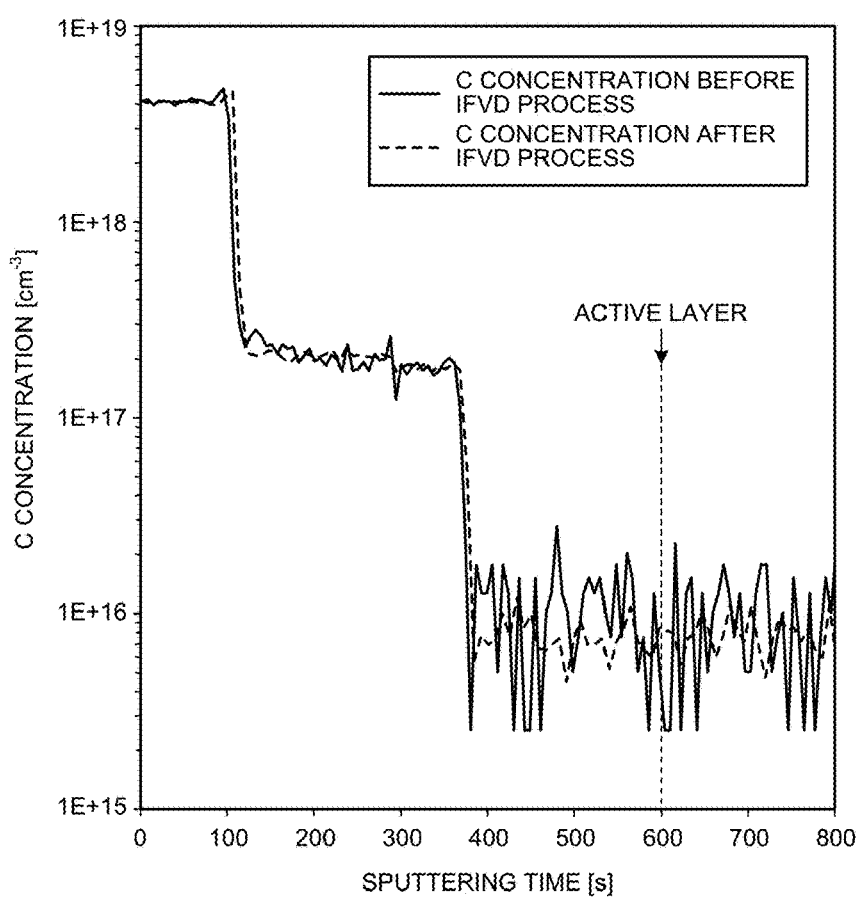
FIG. 44 is a schematic of a result of a secondary ion mass spectrometry (SIMS) analysis indicating the C concentration in the semiconductor layer portion before and after an annealing process.
Figure 45:
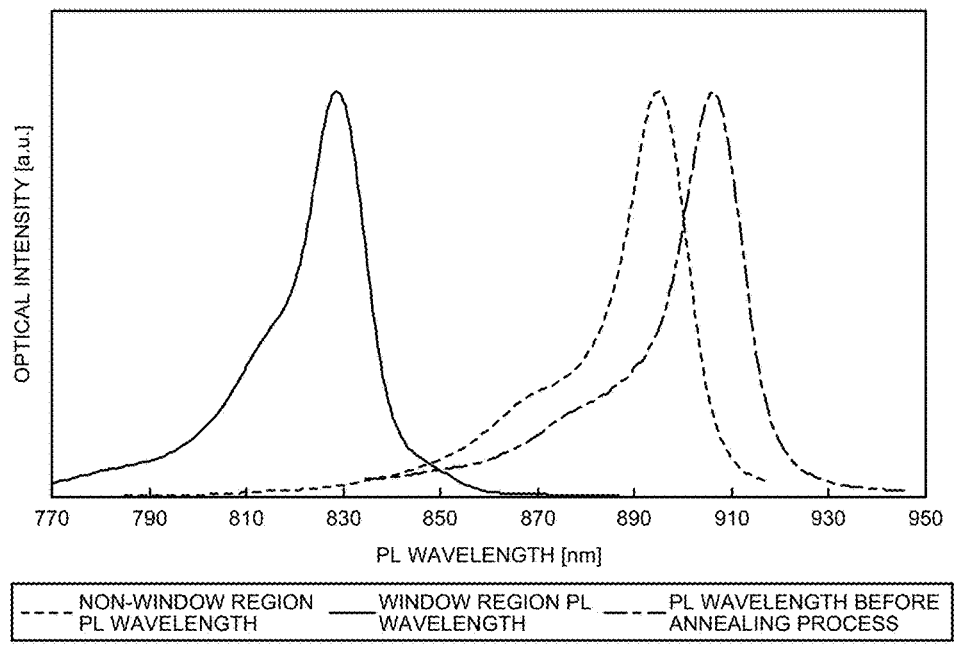
FIG. 45 illustrates spectrums indicating a photoluminescence wavelength in a window region and that in a non-window region in the semiconductor laser element before and after the annealing process.

FIG. 44 is a schematic of a result of a secondary ion mass spectrometry (SIMS) analysis indicating the C concentration in the semiconductor layer portion before and after the annealing process. The horizontal axis represents the time over which the semiconductor layer portion is sputtered, and the position indicated by the dotted line corresponds to the position of the active layer. In the vertical axis, 1E+17 represents $1\times10^{17}$. As illustrated in FIG. 44, the C concentration of the active layer 10010 does not change before and after the annealing process (IFVD process), indicating that any impurity is not introduced into the active layer 10010. FIG. 45 provides spectrums indicating a photoluminescence wavelength (PL wavelength) in the window region and that in the non-window region in the semiconductor laser element before and after the annealing process. FIG. 45 indicates that the PL wavelength is shorter in the window region than in the non-window region. In other words, FIG. 45 indicates that the band gap energy and the degree of disordering are high in the window region than those in the non-window region. The full width at half maximum of the PL wavelength is 16.4 nanometers before the annealing process, and is 16.5 nanometers in the non-window region and is 16.7 nanometers in the window region after the annealing process, and has not changed so much before and after the annealing process. This SIMS analysis result also indicates that the impurity is not introduced into the active layer 10010, because, if the impurity was introduced into the active layer 10010, for example, the impurity level would be formed and the full width at half maximum of the PL wavelength would be wider. Based on FIGS. 4 and 45, it can be concluded that atomic vacancy diffusion, but not impurity diffusion, has induced disordering in the active layer in the window region.

Ridge Structure Forming Process

Figure 46:
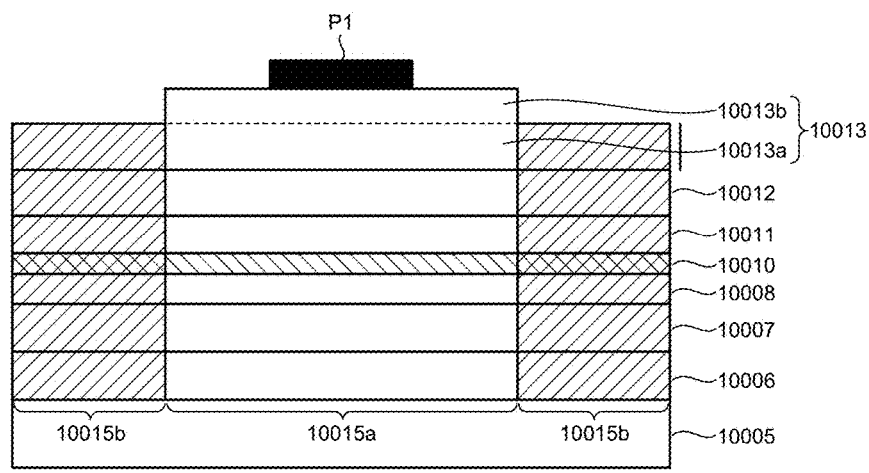
FIG. 46 is a schematic for explaining the exemplary method for manufacturing a semiconductor laser element according to the third embodiment.
Figure 47:
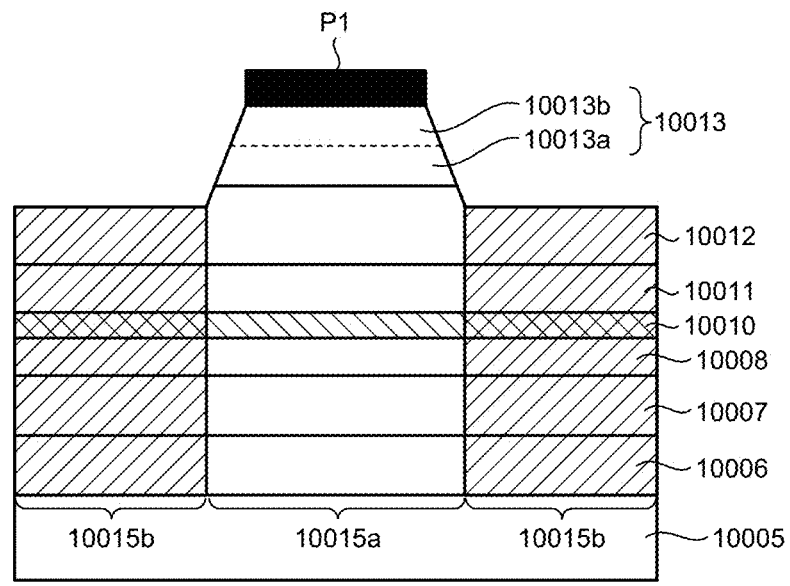
FIG. 47 is a schematic for explaining the exemplary method for manufacturing a semiconductor laser element according to the third embodiment.
Figure 48:
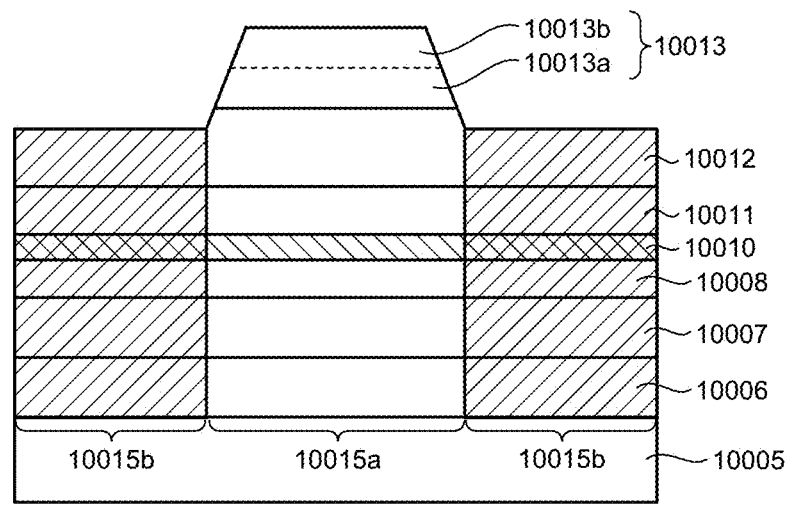
FIG. 48 is a schematic for explaining the exemplary method for manufacturing a semiconductor laser element according to the third embodiment.
Figure 49:
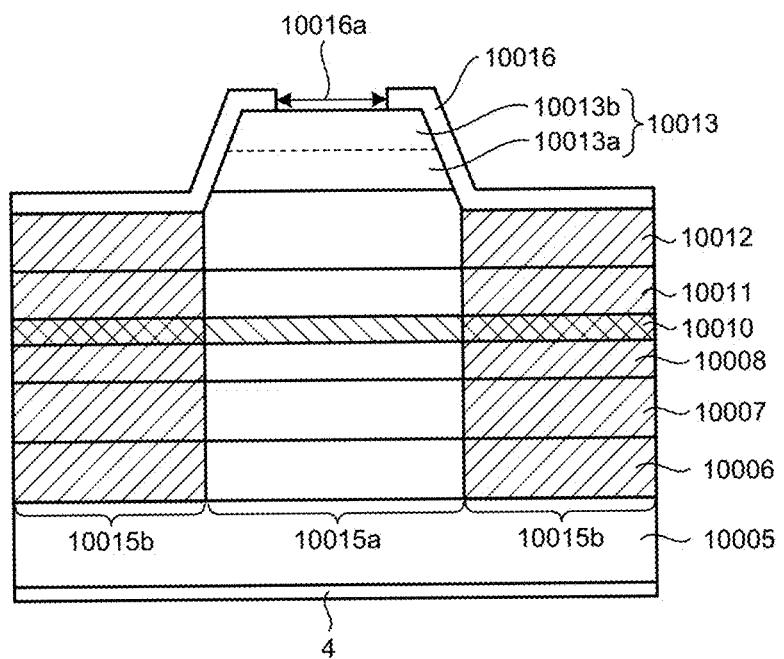
FIG. 49 is a schematic for explaining the exemplary method for manufacturing a semiconductor laser element according to the third embodiment.

The ridge structure forming process at Step S105 will now be explained. In this process, as illustrated in FIG. 46, after the promoting film 10032 and the suppressing film 10033 are removed, a stripe pattern P1 of resist for achieving the ridge structure is formed on the p-type contact layer 10013 through a photolithography process. The p-type contact layer 10013 is then etched to a trapezoid shape, as illustrated in FIG. 47, and the stripe pattern P1 is removed, and the ridge structure illustrated in FIG. 48 is achieved. The insulating film 10016 is then deposited, and the opening 10016*a* for bringing the upper electrode 10017 into contact with the p-type contact layer 10013 is formed through a photolithography process and an etching process, as illustrated in FIG. 49.

The upper electrode 10017 and the lower electrode 4 that is on the bottom surface of the substrate 10005 are then deposited. The substrate 10005 is then cleaved, and the high reflection film 2 and the low reflection film 3 are applied to the respective cleavage facets. The semiconductor layer structure is then diced into elements, and the semiconductor laser element 10100 is achieved thereby.

As described above, because the p-type contact layer 10013 is doped with different types of impurities in different concentrations and in different combination, the impurity content of the p-type semiconductor layer section 10014 in the non-window region 10015*a* is different from that in the window region 10015*b*. As a result, the semiconductor laser element 10100 according to the third embodiment has a larger band gap energy difference.

Fourth Embodiment

Figure 50:
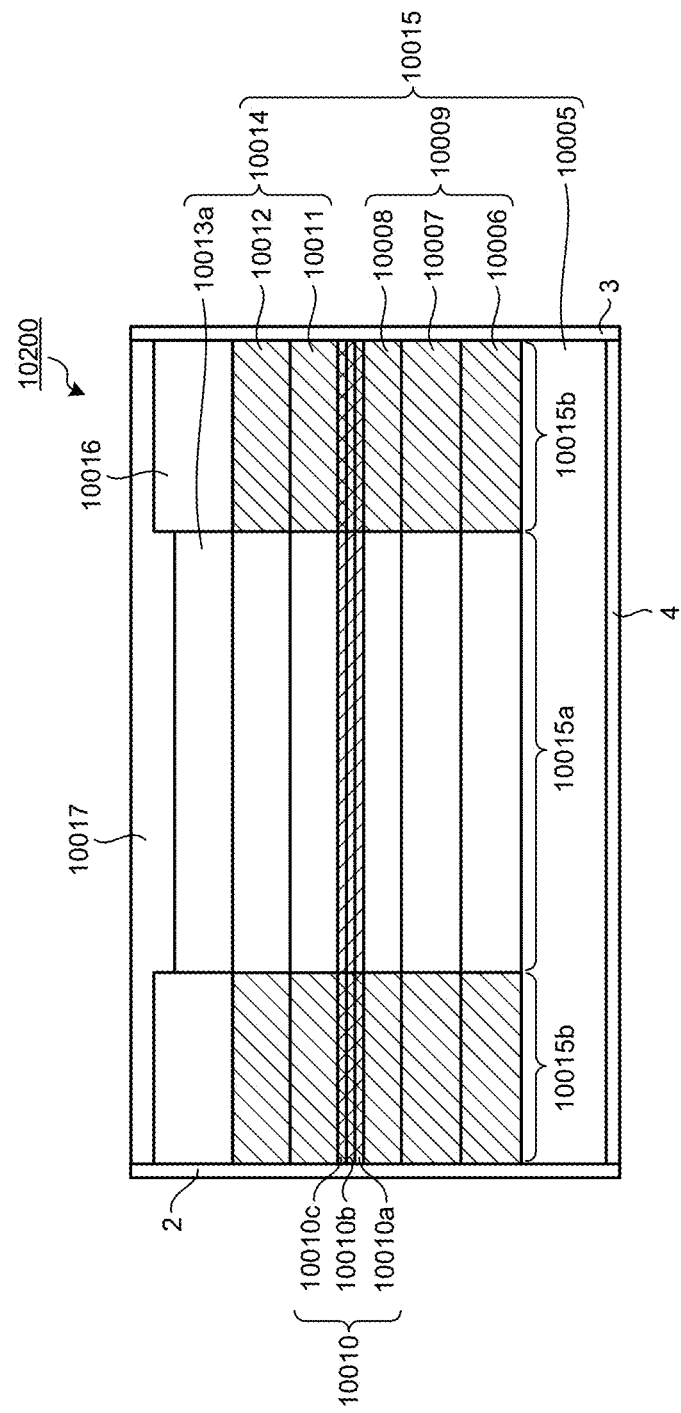
FIG. 50 is a cross-sectional view along the y-z plane in a semiconductor laser element according to a fourth embodiment of the present invention.

A semiconductor laser element according to a fourth embodiment of the present invention will now be explained. FIG. 50 is a cross-sectional view along the y-z plane in the semiconductor laser element according to the fourth embodiment. This semiconductor laser element 10200 according to the fourth embodiment has the same structure as the semiconductor laser element 10100 according to the third embodiment except that the p-type contact layer 10013*a* is removed from the window region 10015*b* and the p-type contact layer 10013*b* is removed from the non-window region 10015*a*.

Figure 51:
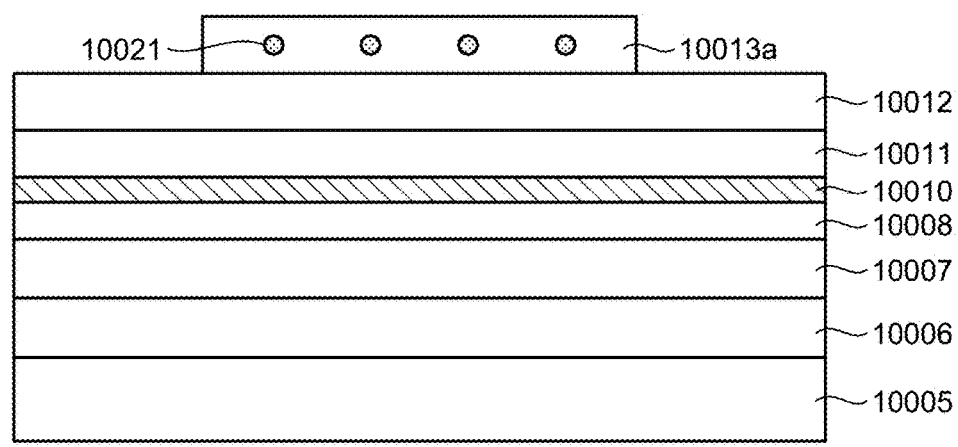
FIG. 51 is a schematic for explaining an exemplary method for manufacturing a semiconductor laser element according to the second embodiment.

FIG. 51 is a schematic for explaining an exemplary method for manufacturing a semiconductor laser element according to the fourth embodiment. After the annealing process is completed in the exemplary method for manufacturing semiconductor laser element 10100 according to the third embodiment illustrated in FIG. 35, the semiconductor layer portion 10015 according to the fourth embodiment is etched to remove the p-type contact layer 10013*a* from the area corresponding to the window region 10015*b*, and to remove the p-type contact layer 10013*b* from the area corresponding to the non-window region 10015*a*, as illustrated in FIG. 51. The ridge structure forming process and the like are then performed in the same manner as in the third embodiment, and the final semiconductor laser element 10200 is achieved thereby.

In the semiconductor laser element 10200 according to the fourth embodiment, before the p-type contact layer 10013*a* is removed from the window region 10015*b* and the p-type contact layer 10013*b* is removed from the non-window region 10015*a*, the RTA induces disordering in the active layer 10010. Therefore, C 10021 with which the p-type contact layer 10013*a* is doped functions as the promoting species, and Zn 10022 with which the p-type contact layer 10013*b* is doped functions as an suppressing species. Because Zn 10022 diffuses easily, the Zn 10022 concentration in the p-type contact layer 10013*b* is reduced. Therefore, if the p-type contact layer 10013*b* is brought into contact with the upper electrode 10017, the resistance against the current injected from the upper electrode 10017 is increased. An increased resistance results in lower luminous efficacy. By contrast, because C 10021 are atoms that diffuse less easily than Zn 10022, C 10021 with which the p-type contact layer 10013*a* is doped remains at almost the same concentration even after the RTA process. The p-type contact layer 10013*b* is therefore removed by etching or the like so that the p-type contact layer 10013*a* is exposed to the topmost surface, and brought into contact with the upper electrode 10017, to prevent a resistance increase thereby. The p-type contact layer 10013*a* may be the surface of the window region 10015*b*, but the p-type cladding layer 10012 made of AlGaAs with a high resistance is more preferable as the surface of the window region 10015*b*, so that the effectiveness of current injection into the non-window region 10015*a* can be further improved.

Fifth Embodiment

Figure 52:
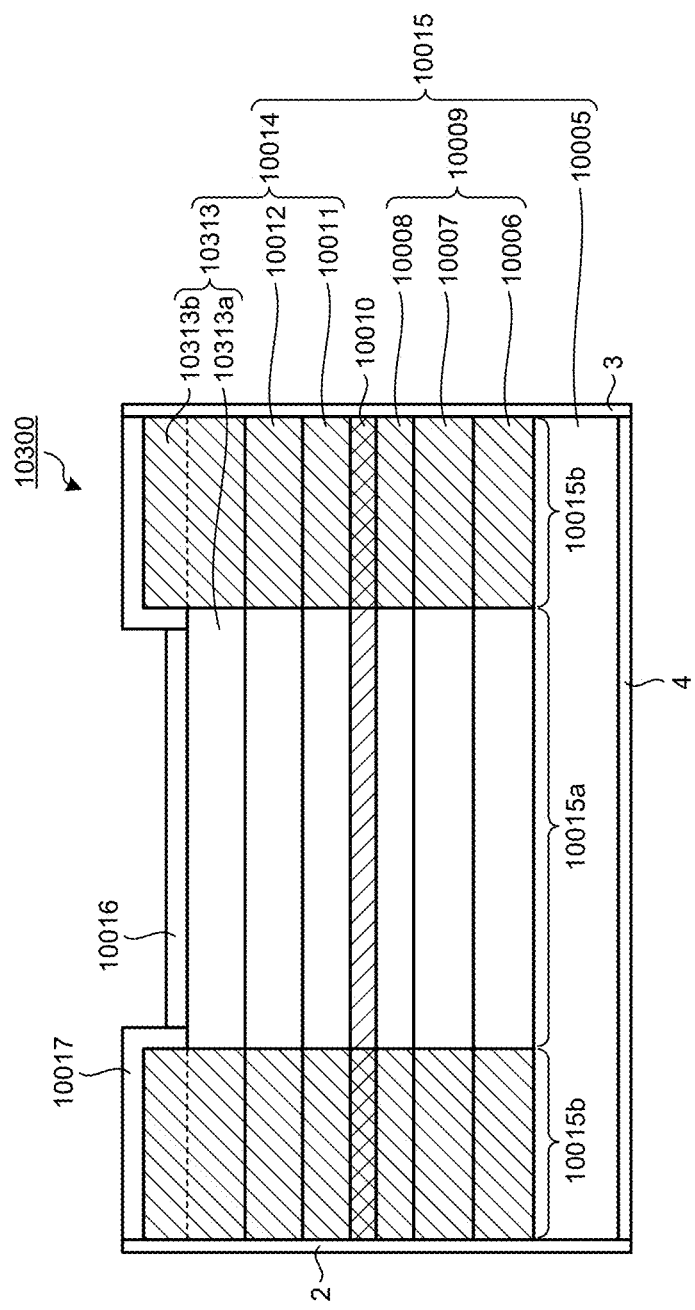
FIG. 52 is a cross-sectional view along the y-z plane in a semiconductor laser element according to a fifth embodiment of the present invention.

A semiconductor laser element according to a fifth embodiment of the present invention will now be explained. FIG. 52 is a cross-sectional view along the y-z plane in the semiconductor laser element according to the fifth embodiment. While the p-type contact layer 10013*b* is removed from the window region 10015*b* in the semiconductor laser element 10100 according to the fifth embodiment, this semiconductor laser element 10300 according to the fifth embodiment has a structure in which a p-type contact layer 10313*b* is removed from the non-window region 10015*a*. The p-type contact layer 10313*b* and a p-type contact layer 10313*a* together form a p-type contact layer 10313. The p-type contact layer 10313*a* is doped with Zn 10022, and the p-type contact layer 10313*b* is doped with C 10021. In the semiconductor laser element 10300, the p-type contact layer 10313*b* is removed from the non-window region 10015*a* before the RTA process, so that the C 10021 content of the p-type semiconductor layer section 10014 becomes higher in the window region 10015*b* than in the non-window region 10015*a*.

In the semiconductor laser element 10300 according to the fifth embodiment, after the p-type contact layer 10313*b* uniformly doped with C 10021, including the area corresponding to the non-window region 10015*a*, is formed, the p-type contact layer 10313*b* is removed from the area corresponding to the non-window region 10015*a* by etching, for example, before the RTA process. Through this process, even after C 10021 become diffused during the RTA, the C 10021 content of the p-type semiconductor layer section 10014 in the window region 10015*b* remains higher than the C 10021 content of the p-type semiconductor layer section 10014 in the non-window region 10015*a*.

When C 10021 is used as a dopant together with Zn 10022, C 10021 functions as the promoting species that promotes disordering in the active layer 10010. When the window region 10015*b* has a higher C 10021 content, therefore, the degree of disordering becomes higher in the window region 10015*b*. As a result, the differences between the degrees of disordering and between the band gap energies in the non-window region 10015*a* and the window region 10015*b* are increased, so that a smaller amount of laser light is absorbed at the facet, and the risk of COD is reduced.

Figure 53:
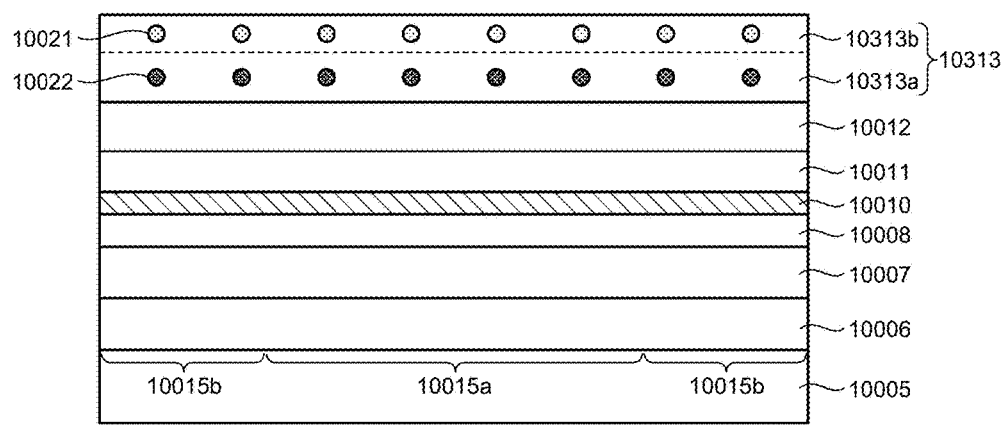
FIG. 53 is a schematic for explaining an exemplary method for manufacturing a semiconductor laser element according to the fifth embodiment.
Figure 54:
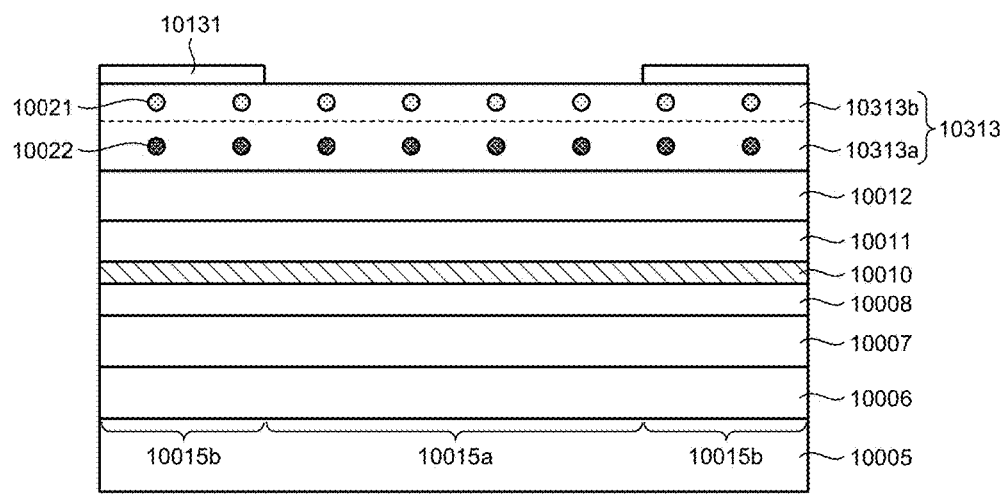
FIG. 54 is a schematic for explaining the exemplary method for manufacturing a semiconductor laser element according to the fifth embodiment.
Figure 55:
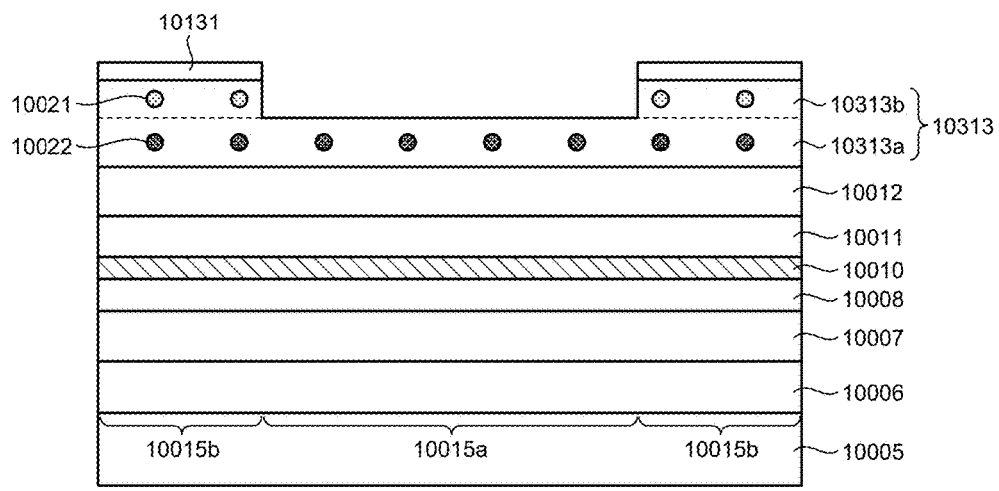
FIG. 55 is a schematic for explaining the exemplary method for manufacturing a semiconductor laser element according to the fifth embodiment.
Figure 56:
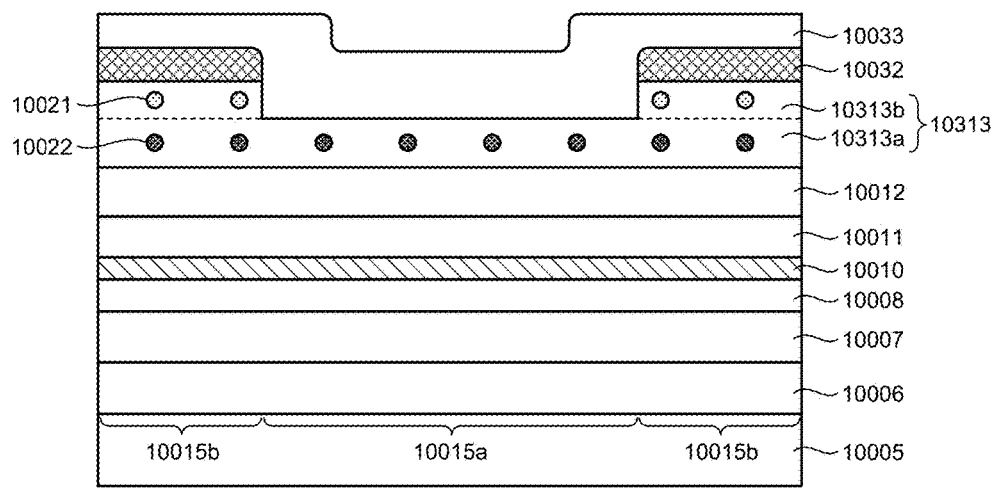
FIG. 56 is a schematic for explaining the exemplary method for manufacturing a semiconductor laser element according to the fifth embodiment.

FIGS. 53 to 56 are schematics for explaining an exemplary method for manufacturing a semiconductor laser element according to the fifth embodiment. To begin with, in the semiconductor layer portion forming process according to the third embodiment, the p-type contact layer 10313*a* is doped with Zn 10022, and the p-type contact layer 10313*b* is doped with C 10021, as illustrated in FIG. 53, oppositely to those in the semiconductor layer portion forming process according to the third embodiment. As illustrated in FIG. 54, the photoresist 10131 is then applied to the area corresponding to the window region 10015*b*. As illustrated in FIG. 55, the p-type contact layer 10313*b* is then removed from the area corresponding to the non-window region 10015*a* by etching. As illustrated in FIG. 56, the promoting film 10032 and the suppressing film 10033 are then formed in the promoting film forming process and the suppressing film forming process, respectively, in the same manner as in the third embodiment. The annealing process and the ridge structure forming process are then carried out, in the same manner as in the third embodiment, and the final semiconductor laser element 10300 is achieved thereby.

Sixth Embodiment

Figure 57:
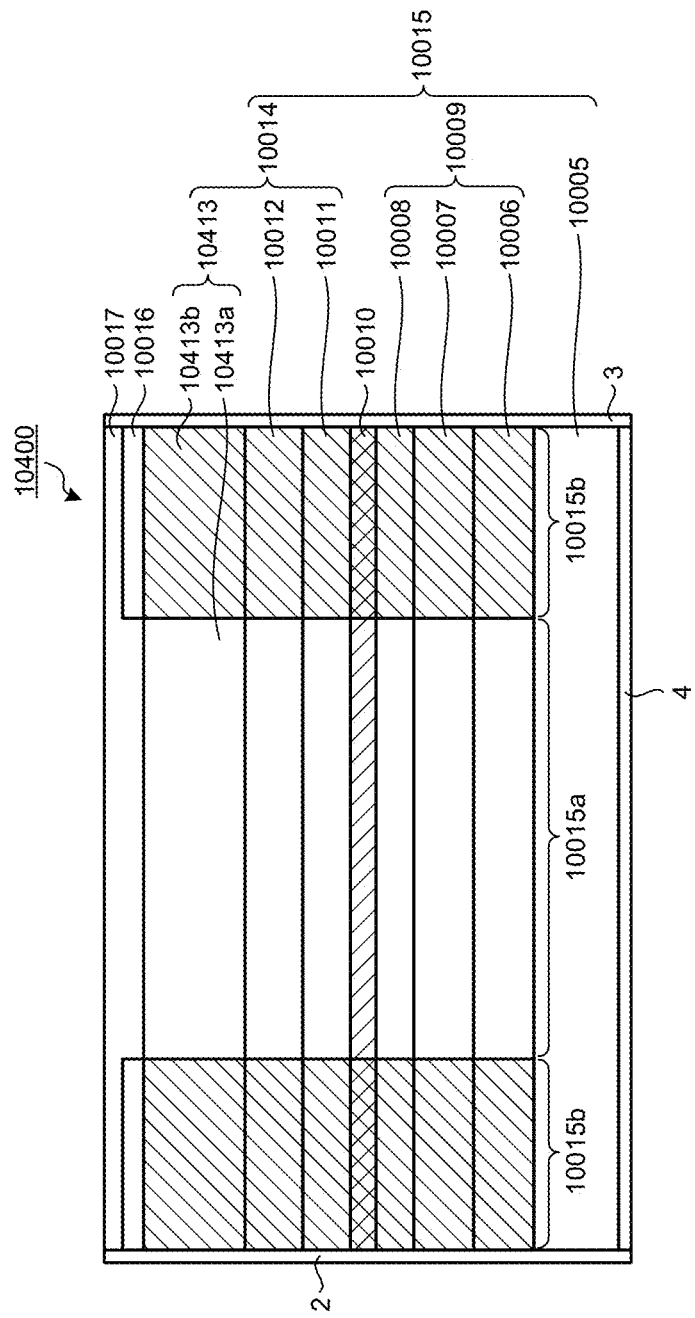
FIG. 57 is a cross-sectional view along the y-z plane in a semiconductor laser element according to a fourth embodiment of the present invention.

A semiconductor laser element according to a sixth embodiment of the present invention will now be explained. FIG. 57 is a cross-sectional view along the y-z plane in the semiconductor laser element according to the sixth embodiment. In the structure of this semiconductor laser element 10400 according to the sixth embodiment, a p-type contact layer 10413 has only one layer in the deposition direction, and a p-type contact layer 10413*a* in the non-window region 10015*a* contains more Zn 10022, and a p-type contact layer 10413*b* in the window region 10015*b* contains more C 10021.

In the semiconductor laser element 10400 according to the sixth embodiment, Zn 10022 the content of which is higher in the non-window region 10015*a* functions as the suppressing species, and C 10021 the content of which is higher in the window region 10015*b* functions as the promoting species. Disordering is therefore suppressed in the non-window region 10015*a*, and is promoted in the window region 10015*b*. Hence, the differences between the degrees of disordering and between the band gap energies in the non-window region 10015*a* and the window region 10015*b* are increased, and as a result, a smaller amount of laser light is absorbed at the facet, and the risk of COD is reduced.

Figure 58:
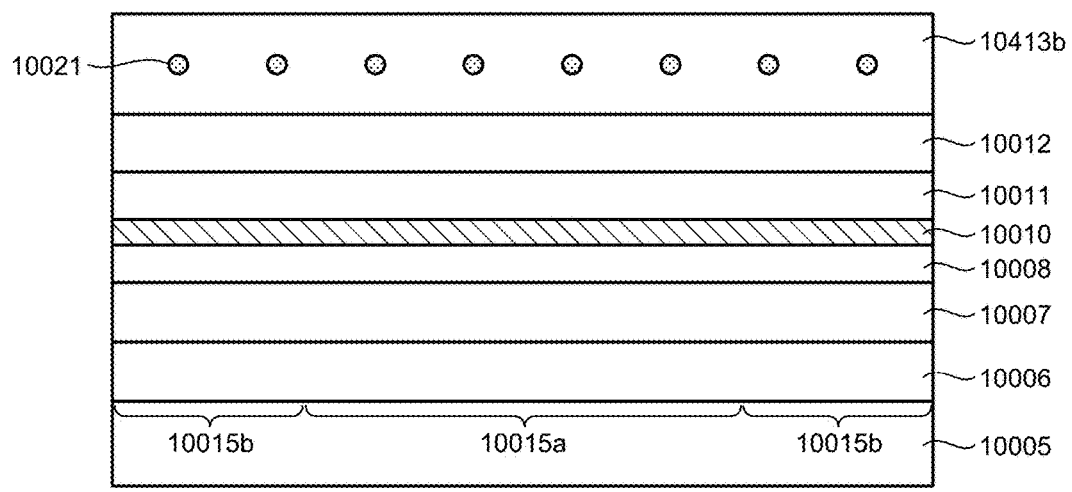
FIG. 58 is a schematic for explaining an exemplary method for manufacturing a semiconductor laser element according to the fourth embodiment.
Figure 59:
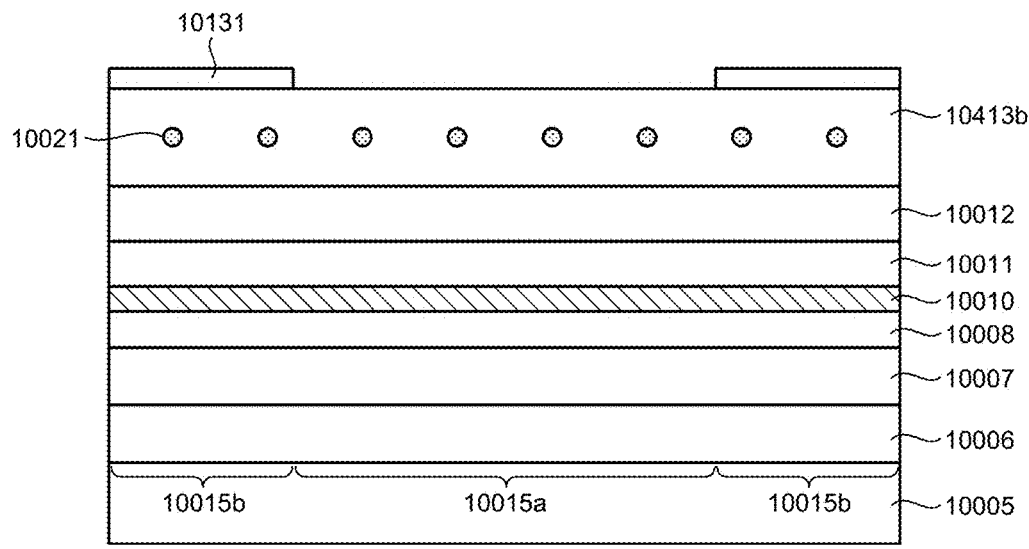
FIG. 59 is a schematic for explaining the exemplary method for manufacturing a semiconductor laser element according to the fourth embodiment.
Figure 60:
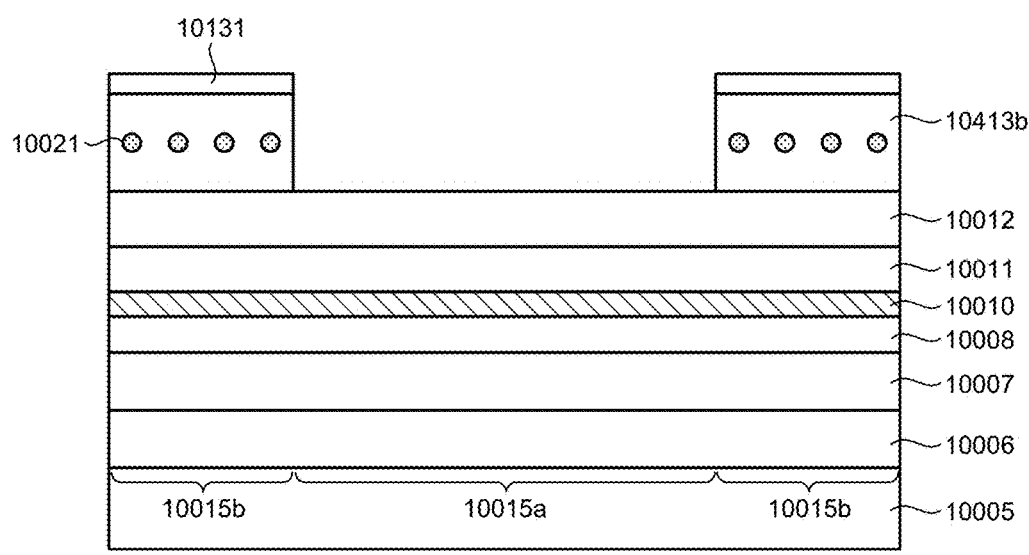
FIG. 60 is a schematic for explaining the exemplary method for manufacturing a semiconductor laser element according to the fourth embodiment.
Figure 61:
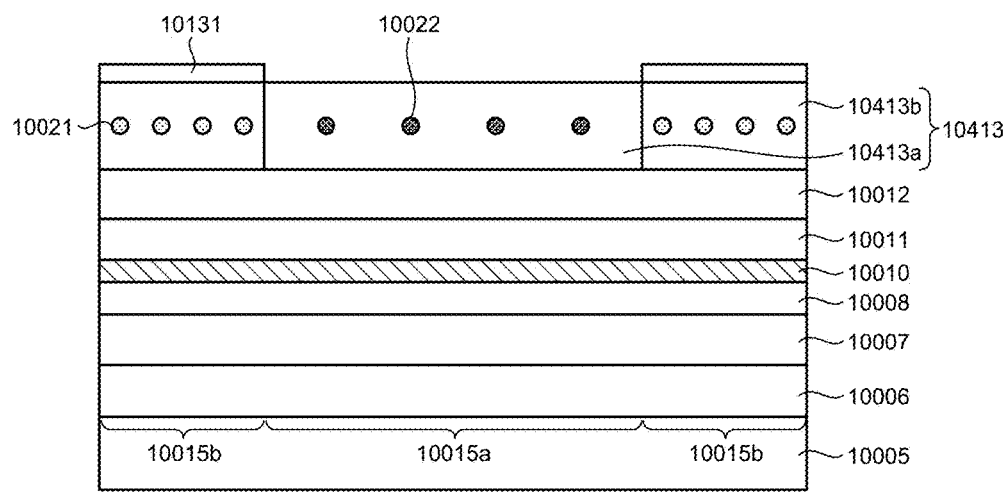
FIG. 61 is a schematic for explaining the exemplary method for manufacturing a semiconductor laser element according to the fourth embodiment.
Figure 62:
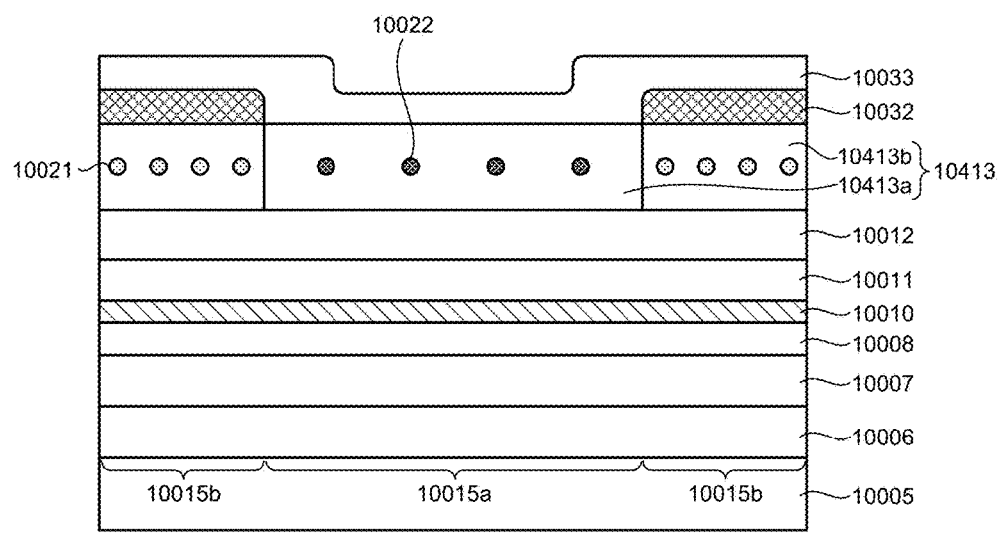
FIG. 62 is a schematic for explaining the exemplary method for manufacturing a semiconductor laser element according to the fourth embodiment.

FIGS. 58 to 62 are schematics for explaining an exemplary method for manufacturing a semiconductor laser element according to the sixth embodiment. To begin with, as illustrated in FIG. 58, in the semiconductor layer portion forming process according to the third embodiment, a p-type contact layer 10413*b* doped with C 10021 is uniformly deposited across the area corresponding to the non-window region 10015*a* and the area corresponding to the window region 10015*b*. As illustrated in FIG. 59, the photoresist 10131 is left unremoved in the area corresponding to the window region 10015*b*. As illustrated in FIG. 60, the p-type contact layer 10413*b* is then removed from the area corresponding to the non-window region 10015*a* by etching, so that the p-type contact layer 10413*b* is provided only in the area corresponding to the window region 10015*b*. As illustrated in FIG. 61, the p-type contact layer 10413*a* doped with Zn 10022 is then formed on the etched area corresponding to the non-window region 10015*a*, using the photoresist 10131 as a mask. As illustrated in FIG. 62, in the same manner as in the third embodiment, the promoting film 10032 and the suppressing film 10033 are then formed through the promoting film forming process and the suppressing film forming process, respectively. The annealing process and the ridge structure forming process are then carried out, in the same manner as in the third embodiment, and the final semiconductor laser element 10400 is achieved thereby.

Seventh Embodiment

Figure 63:
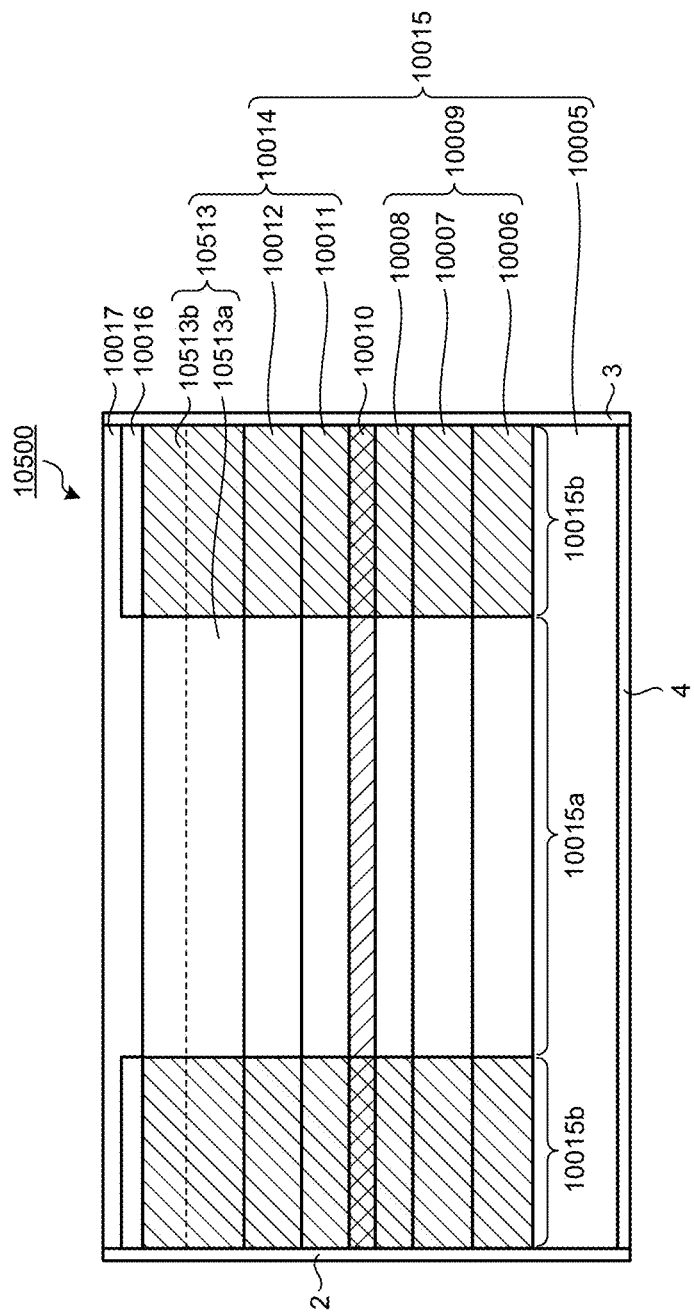
FIG. 63 is a cross-sectional view along the y-z plane in a semiconductor laser element according to a fifth embodiment of the present invention.

A semiconductor laser element according to a seventh embodiment of the present invention will now be explained. FIG. 63 is a cross-sectional view along the y-z plane in the semiconductor laser element according to the seventh embodiment. The semiconductor laser element 10500 according to the seventh embodiment has a structure in which a p-type contact layer 10513*a* in the window region 10015*b* contains more C 10021, and a p-type contact layer 10513*b* in the non-window region 10015*a* contains more Zn 10022. In the seventh embodiment, these different C 10021 and Zn 10022 contents are achieved by ion implantation, unlike in the sixth embodiment.

In the semiconductor laser element 10500 according to the seventh embodiment, Zn 10022 the content of which is higher in the non-window region 10015*a* functions as the suppressing species, and C 10021 the content of which is higher in the window region 10015*b* functions as the promoting species, in the same manner as in the sixth embodiment. Disordering is therefore suppressed in the non-window region 10015*a*, and is promoted in the window region 10015*b*. Hence, the differences between the degrees of disordering and between the band gap energies in the non-window region 10015*a* and the window region 10015*b* are increased, and as a result, a smaller amount of laser light is absorbed at the facet, and the risk of COD is reduced.

Figure 64:
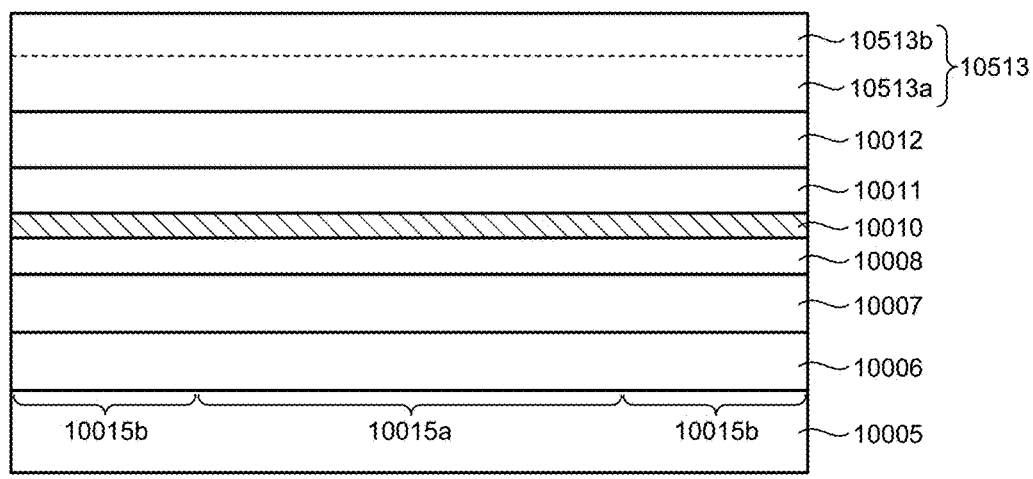
FIG. 64 is a schematic for explaining an exemplary method for manufacturing a semiconductor laser element according to the fifth embodiment.
Figure 65:
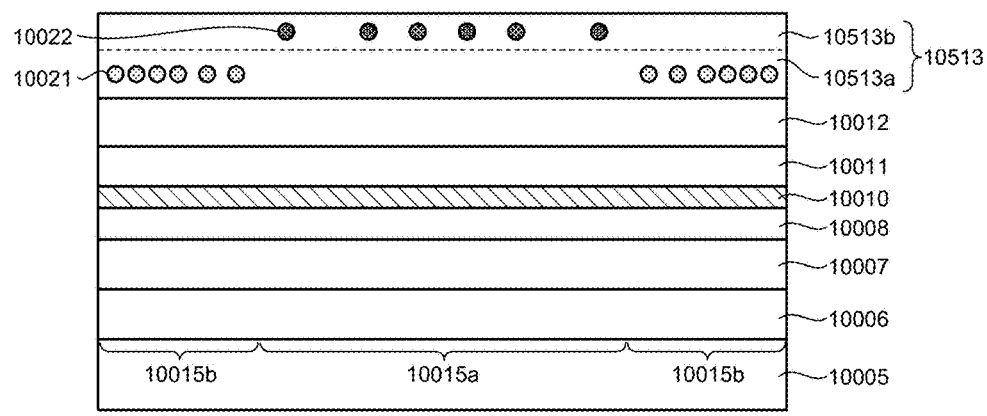
FIG. 65 is a schematic for explaining the exemplary method for manufacturing a semiconductor laser element according to the fifth embodiment.
Figure 66:
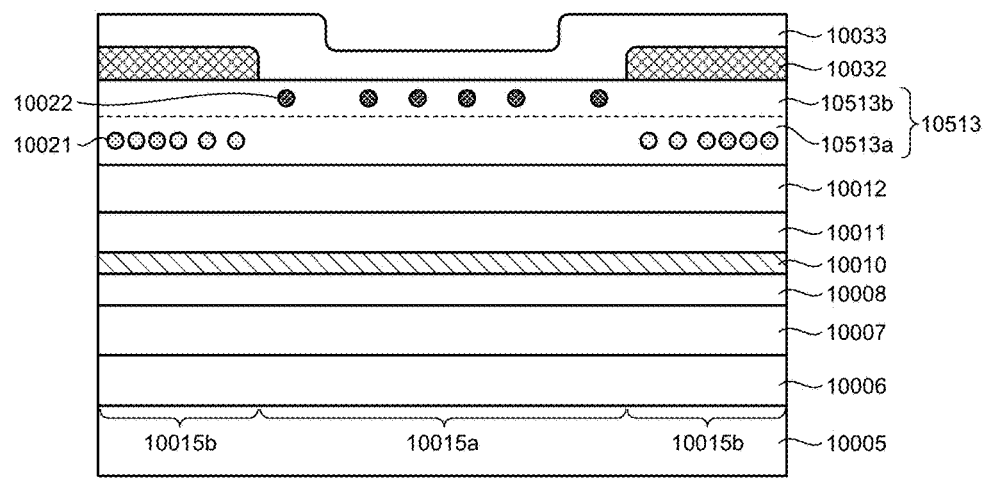
FIG. 66 is a schematic for explaining the exemplary method for manufacturing a semiconductor laser element according to the fifth embodiment.

FIG. 64 is a schematic for explaining an exemplary method for manufacturing a semiconductor laser element according to the seventh embodiment. To begin with, as illustrated in FIG. 64, in the semiconductor layer portion forming process according to the third embodiment, a GaAs layer not doped with any impurity is formed as a layer that is to be a p-type contact layer 10513 on the p-type cladding layer 10012. As illustrated in FIG. 65, the area corresponding to the non-window region 10015*a* that is to be the p-type contact layer 10513*b* is selectively doped with Zn 10022, and the area corresponding to the window region 10015*b* that is to be the p-type contact layer 10513*a* is selectively doped with C 10021 through ion implantation. Through this process, the p-type contact layer 10513 is formed. As illustrated in FIG. 66, the promoting film 10032 and the suppressing film 10033 are then formed through the promoting film forming process and the suppressing film forming process, respectively, in the same manner as in the third embodiment. The annealing process and the ridge structure forming process are then carried out, in the same manner as in the third embodiment, and the final semiconductor laser element 10500 is achieved thereby.

As described in the embodiments, in the semiconductor laser element according to any one of the embodiments of the present invention, the differences between the degrees of disordering and between the band gap energies in the non-window region 10015*a* and the window region 10015*b* are increased by allowing the p-type semiconductor layer section 10014 to contain more of the impurity functioning as the promoting species in the window region 10015*b*, and allowing the p-type semiconductor layer section 10014 to contain more of the impurity functioning as the suppressing species in the non-window region 10015*a*. In such a structure, the effects of increasing the band gap energy difference and reducing the risk of COD are more prominent, compared with those in the conventional technologies, so that a reliable semiconductor laser element can be provided.

Explained now with reference to some drawings is how the band gap energies in the non-window region 10015*a* and the window region 10015*b* change when the impurity content of the p-type semiconductor layer section 10014 in the non-window region 10015*a* and the window region 10015*b* is changed in accordance with the embodiments.

Figure 67:
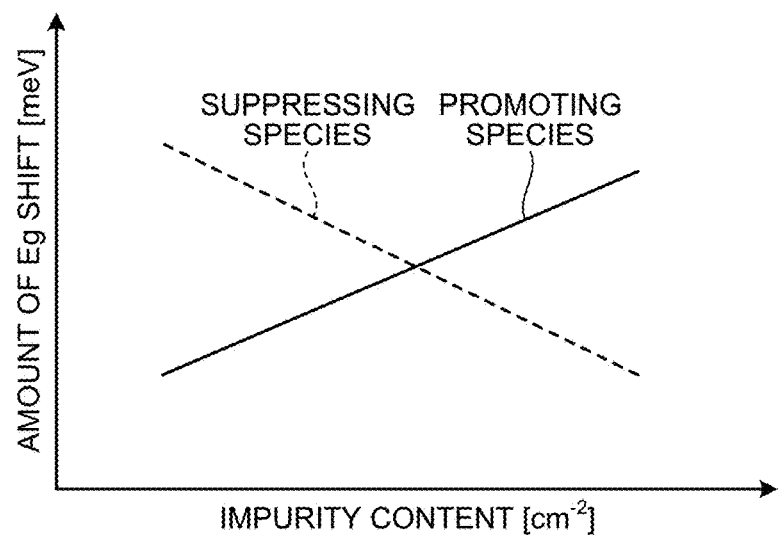
FIG. 67 is a schematic indicating a relation between the promoting species content and the suppressing species content, and the amount of band gap energy shift.

FIG. 67 is a schematic illustrating how the band gap energy (Eg) is changed by the annealing process when the promoting species content and the suppressing species content of the p-type semiconductor layer section 10014 are changed. As illustrated in FIG. 67, when the promoting species content of the p-type semiconductor layer section 10014 is increased (toward the right in the drawing), the amount of Eg shift is increased, and the band gap energy is increased (upwardly in the drawing). By contrast, when the suppressing species content of the p-type semiconductor layer section 10014 is increased (toward the right in the drawing), the amount of Eg shift is decreased, and the band gap energy is reduced (downwardly in the drawing).

Figure 68:
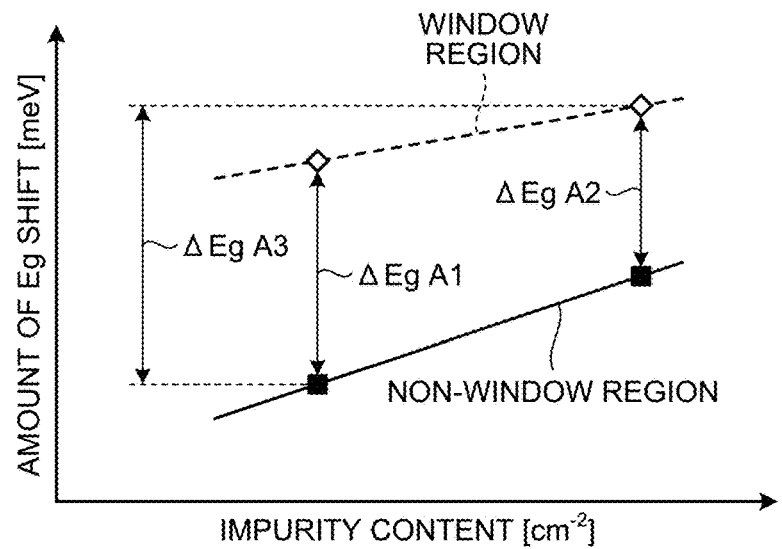
FIG. 68 is a schematic illustrating how the band gap energy changes when the promoting species contents of the p-type semiconductor layer section in the non-window region and the window region are changed.

FIG. 68 is a schematic illustrating how the band gap energy is changed by the annealing process when the promoting species content of the p-type semiconductor layer section 10014 is changed in the non-window region 10015*a* and the window region 10015*b*. The graph with a smaller amount of shifted Eg corresponds to the non-window region 10015*a* where disordering is suppressed by the suppressing film, and the graph with a larger amount of shifted Eg corresponds to the window region 10015*b* where disordering is promoted by the promoting film. When the promoting species content of the p-type semiconductor layer section 10014 is increased in the non-window region 10015*a* and the window region 10015*b* as illustrated in FIG. 68, the amount of Eg shift is increased accordingly. In the semiconductor laser element manufactured with a conventional technology, because the impurity content is the same across the non-window region 10015*a* and the window region 10015*b*, ΔEgA1 or ΔEgA2 represents the band gap energy difference (ΔEg) in the non-window region 10015*a* and the window region 10015*b*. By contrast, in the semiconductor laser element according to any one of the embodiments of the present invention, because the non-window region 10015*a* has a lower promoting species content and the window region 10015*b* has a higher promoting species content, ΔEg can be increased to ΔEgA3, which is larger than ΔEgA1 or ΔEgA2. With the embodiments, therefore, the band gap energy difference in the non-window region 10015*a* and the window region 10015*b* can be increased, and the risk of COD can be reduced more prominently, compared with when the conventional technologies are used.

Figure 69:
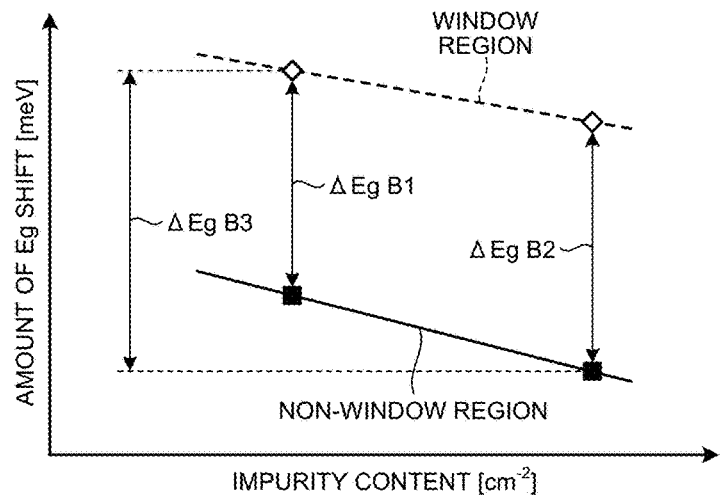
FIG. 69 is a schematic illustrating how band gap energy changes when the suppressing species contents of the p-type semiconductor layer section in the non-window region and in window region are changed.

FIG. 69 is a schematic illustrating how the band gap energy is changed by the annealing process when the suppressing species content of the p-type semiconductor layer section 10014 is changed in the non-window region 10015*a* and the window region 10015*b*. As illustrated in FIG. 69, when the suppressing species content of the p-type semiconductor layer section 10014 is increased in the non-window region 10015*a* and the window region 10015*b*, the amount of Eg shift is decreased accordingly. In the semiconductor laser element manufactured with a conventional technology, because the impurity content is the same in the non-window region 10015*a* and in the window region 10015*b*, ΔEgB1 or ΔEgB2 represents the band gap energy difference (ΔEg) between the non-window region 10015*a* and the window region 10015*b*. By contrast, in the semiconductor laser element according to any one of the embodiments of the present invention, because the non-window region 10015*a* has a higher suppressing species content, and the window region 10015*b* has a lower suppressing species content, ΔEg can be increased to ΔEgB3, which is larger than ΔEgB1 or ΔEgB2.

Figure 70:
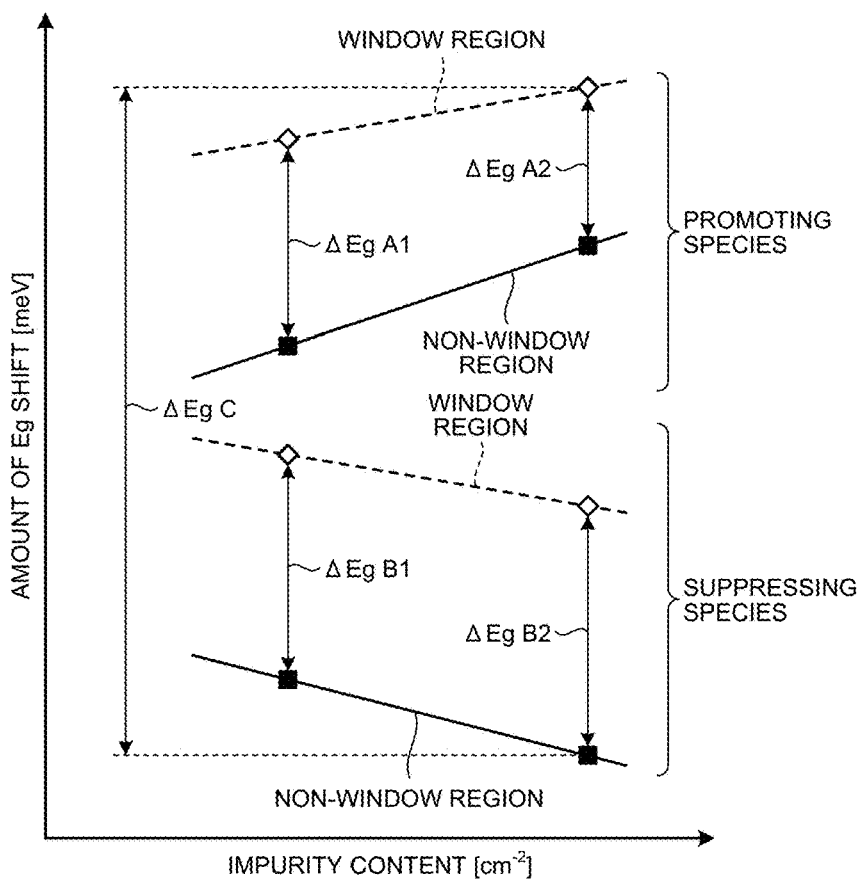
FIG. 70 is a schematic indicating a relation between the impurity content and the amount of band gap energy shift when the p-type semiconductor layer section in the window region contains the promoting species, and the p-type semiconductor layer section in the non-window region contains the suppressing species.

Furthermore, in the semiconductor laser element according to any one of the embodiments of the present invention, the impurity content of the p-type semiconductor layer section 10014 in the non-window region 10015*a* and that the window region 10015*b* are adjusted as appropriate. When Eg shifts more with doping of the promoting species than of the suppressing species, for example, the relation illustrated in FIG. 70 is established, based on FIGS. 68 and 69. Assuming that the p-type semiconductor layer section 10014 in the window region 10015*b* has a higher promoting species content, and the p-type semiconductor layer section 10014 in the non-window region 10015*a* has a higher suppressing species content, the band gap energy difference between the window region 10015*b* and the non-window region 10015*a* can be increased to ΔEgC. In this manner, by changing the promoting species content as well as the suppressing species content of the p-type semiconductor layer section 10014 in the window region 10015*b* and in the non-window region 10015*a*, the band gap energy difference between the window region 10015*b* and the non-window region 10015*a* can be further increased.

In the manner described above, by changing the promoting species content and the suppressing species content across the p-type semiconductor layer section 10014, the band gap energy difference between the non-window region 10015*a* and the window region 10015*b* can be increased. With such a structure, the semiconductor laser element according to the embodiments can provide a semiconductor laser element that has a larger band gap energy difference, that absorbs a smaller amount of laser light at its facet, in which the risk of COD is reduced, and that is more reliable.

In the embodiments described above, the semiconductor layer portion includes two regions that are the window region and the non-window region extending along the deposition direction of the semiconductor layer portion. Alternatively, the non-window region may have two or more active layers with different degrees of disordering achieved through atomic vacancy diffusion and different band gap energies. Such a semiconductor laser element can oscillate two or more beams of laser light at different wavelengths from the respective active layers. In other words, while disordering is intended to make the window region transparent to the oscillation wavelength of the semiconductor laser element in the embodiments described above, disordering in the non-window region can also change the oscillation wavelength of the semiconductor laser element. In this manner, with different degrees of disordering in a plurality of regions through atomic vacancy diffusion and different band gap energies of such regions, a semiconductor laser element with a plurality of emission wavelengths (and laser oscillating wavelengths) can be achieved.

When there are n non-window regions (plane-direction regions) extending in the deposition direction, for example, by etching each of the first to the nth plane-direction regions by different degrees, a wavelength-tunable semiconductor laser element capable of oscillating laser light at n different wavelengths can be manufactured. It is also possible to fabricate a wavelength-tunable semiconductor laser element capable of oscillating laser light at n×m wavelengths at the maximum, by forming m different dielectric films the compositions or materials of which are different on each of the n regions before the semiconductor layer portion is annealed, where n and m are integers equal to or more than one.

For example, a wavelength-tunable semiconductor laser element with eight different laser emission wavelengths can be manufactured by: forming four dielectric films having different materials and refractive indices, for example, on each of two regions having different promoting species contents or suppressing species contents or both; forming two different dielectric films having different materials and refractive indices, for example, on each of four regions having different promoting species contents or suppressing species contents or both; or forming one dielectric film on each of eight regions having different promoting species contents or suppressing species contents or both.

Furthermore, in the embodiments described above, a ridge structure is used to ensure the optical confinement in the semiconductor laser module in the light guiding direction, but the present embodiment is not limited thereto. A buried laser structure or a self-aligned structure (SAS), for example, may be used. In the description herein, in a structure such as SAS, the width of the internal current confining region is considered as the current injection width.

Explained now as a semiconductor laser element according to some examples of the present embodiment are exemplary measurements of the band gap energy shifts, measured while changing the C content or the Zn content of the p-type semiconductor layer section 10014 in the non-window region 10015a and the window region 10015b.

Example 1

Figures 71, 72:
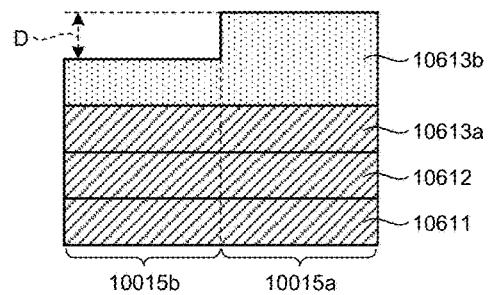
FIG. 71 is a schematic for explaining a structure of a semiconductor laser element according to Example 1.
FIG. 72 is a schematic of a relation between the etched amount of a Zn-containing layer in the p-type semiconductor layer section, and the amount of band gap energy shift in the window region, when the p-type semiconductor layer section contain both C and Zn.

FIG. 71 is a schematic for explaining a structure of a semiconductor laser element according to Example 1. In the semiconductor laser element according to Example 1, a p-type guide layer 10611, a p-type cladding layer 10612, and a p-type contact layer 10613a are doped with C. A p-type contact layer 10613b is a layer uniformly doped with Zn. In FIG. 71 and thereafter, the structures of the layers such as the active layer 10010 and the n-type semiconductor layer section 10009 of the semiconductor laser element, other than the p-type semiconductor layer section are the same as those in the semiconductor laser element 10100, so that these parts are omitted in the drawings.

In Example 1, in the semiconductor layer portion forming process according to the third embodiment, only a part of the p-type contact layer 10613b was removed by etching, as illustrated in FIG. 71, instead of removing the entire p-type contact layer 10013b as disclosed in the third embodiment. The Zn content of the p-type semiconductor layer section 10014 in the window region 10015b was thus changed by changing the etched amount D in FIG. 71. The semiconductor was then annealed with the RTA at a temperature of 835 degrees Celsius for 30 seconds.

FIG. 72 is a schematic of a relation between the etched amount of a Zn-containing layer in the p-type semiconductor layer section, and the amount of band gap energy shift in the window region, when the p-type semiconductor layer section contain both C and Zn. In Example 1, the amount of band gap energy shift was measured as Examples 1-1 to 1-3 with different etched amounts D, and Comparative Example 1 in which the p-type contact layer is not etched at all.

As illustrated in FIG. 72, when the p-type contact layer 10613b in the window region 10015b was etched more, the Zn content of the p-type semiconductor layer section 10014 decreased, while the amount of band gap energy shift was increased. This result indicates that Zn was functioning as the suppressing species. While the Zn concentration of the topmost layer of the p-type contact layer 10613b remained constant, the amount of band gap energy shift varied depending on the etched amount. In other words, the amount of band gap energy shift is dependent on the Zn content, not on the Zn concentration. In this manner, a greater band gap energy difference can be achieved even when the Zn concentrations of the topmost layer in the window region and the non-window region are constant.

Example 2

Figures 73, 74:
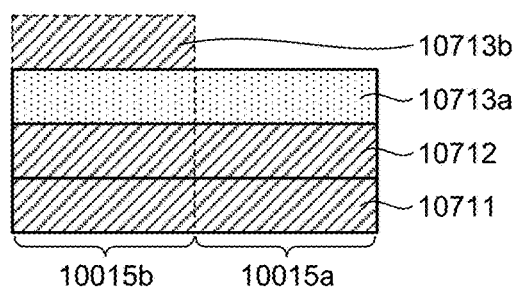
FIG. 73 is a schematic for explaining a structure of a semiconductor laser element according to Example 2.
FIG. 74 is a schematic of a relation between the C content and the amount of band gap energy shift in the p-type semiconductor layer section in the window region when the p-type semiconductor layer section contain both C and Zn.

FIG. 73 is a schematic for explaining a structure of a semiconductor laser element according to Example 2. In the semiconductor laser element according to Example 2, after a p-type guide layer 10711 and a p-type cladding layer 10712 doped with C are deposited, a p-type contact layer 10713a doped with Zn is deposited. A p-type contact layer 10713b doped with C is selectively deposited in the window region 10015b, as illustrated in FIG. 73. Through this process, the C content of the p-type semiconductor layer section is made different in the non-window region 10015a and in the window region 10015b. The RTA is then carried out at a temperature of 850 degrees Celsius for 30 seconds.

FIG. 74 is a schematic of a relation between the C content and the amount of band gap energy shift in the p-type semiconductor layer section in the window region when the p-type semiconductor layer section contain both C and Zn. In FIG. 74, the amount of band gap energy shift was also measured as Comparative Example 2 in which the p-type contact layer 10713b was provided in none of the non-window region 10015a and the window region 10015b, as well as in Example 2.

As illustrated in FIG. 74, when the C content of the p-type semiconductor layer section in the window region 10015b was increased, the amount of band gap energy shift increased. This result indicates that C was functioning as the promoting species.

Example 3

Figures 75, 76:
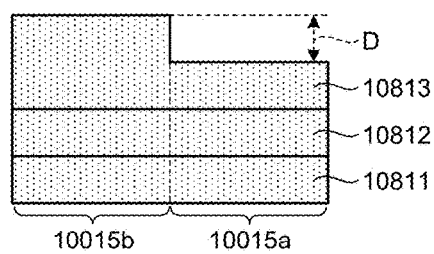
FIG. 75 is a schematic for explaining a structure of a semiconductor laser element according to Examples 3 and 4.
FIG. 76 is a schematic of a relation between the Zn content of and the amount of band gap energy shift in the p-type semiconductor layer section in the non-window region when p-type semiconductor layer section only contains Zn, and Zn functions as the promoting species.

FIG. 75 is a schematic for explaining a structure of a semiconductor laser element according to Example 3. In the semiconductor laser element according to Example 3, all of the layers from a p-type guide layer 10811 to a p-type contact layer 10813 included in the p-type semiconductor layer section were doped only with Zn, and were not doped with C. The Zn content of the p-type semiconductor layer section was changed by changing the etched amount D of the p-type contact layer 10813, in the same manner as in Example 1. Example 3 is different from Example 1 in that the etched amount in the non-window region 10015*a* was changed, while the window region 10015*b* was etched in Example 1. Through this process, the Zn content of the p-type semiconductor layer section 10014 in the non-window region 10015*a* was changed. The RTA was then carried out at a temperature of 825 degrees Celsius for 30 seconds. In Example 3, the amount of band gap energy shift was measured as Examples 3-1 and 3-2 with different etched amounts D, and as Comparative Example 3 in which the p-type semiconductor layer was not etched at all.

FIG. 76 is a schematic of a relation between the Zn content of and the amount of band gap energy shift in the p-type semiconductor layer section in the non-window region when p-type semiconductor layer section only contains Zn, and Zn functions as the promoting species. As illustrated in FIG. 76, when the Zn content of the p-type semiconductor layer section 10014 in the non-window region 10015*a* was increased, the amount of band gap energy shift increased as well. This result indicates that Zn was functioning as the promoting species.

Example 4

In Example 4, the Zn content of the p-type semiconductor layer section in the non-window region 10015*a* was changed with the structure illustrated in FIG. 75, in the same manner as in Example 3. The RTA was then carried out at a temperature of 830 degrees Celsius for 30 seconds. While the refractive index of SiN that is an suppressing film was 1.9 in Example 3, the refractive index of SiN that is an suppressing film was 2.0, that is, more dense, in Example 4. In Example 4, the amount of band gap energy shift was measured as Examples 4-1 and 4-2 with different etched amounts D, and as Comparative Example 4 in which the p-type semiconductor layer was not etched at all.

Figures 77, 78:
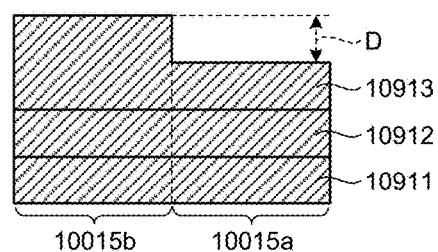
FIG. 77 is a schematic of a relation between the Zn content of and the amount of band gap energy shift in the p-type semiconductor layer section in the non-window region when the p-type semiconductor layer section only contains Zn, and Zn functions as the suppressing species.
FIG. 78 is a schematic for explaining a structure of a semiconductor laser element according to Example 5.

FIG. 77 is a schematic of a relation between the Zn content of and the amount of band gap energy shift in the p-type semiconductor layer section in the non-window region when the p-type semiconductor layer section only contains Zn, and Zn functions as the suppressing species. As illustrated in FIG. 77, when the Zn content of the p-type semiconductor layer section 10014 in the non-window region 10015*a* was increased, the amount of band gap energy shift decreased. This result indicates that Zn was functioning as the suppressing species. Even when the p-type contact layer is only doped with Zn as one type of impurity, Zn might change its function between the function as the promoting species and the suppressing species depending on the conditions of the suppressing film. The RTA temperature and time, as well as the type and the concentration of the impurity, the densities and refractive indices of the promoting film and the suppressing film, may also affect how the impurity functions.

Example 5

FIG. 76 is a schematic for explaining a structure of a semiconductor laser element according to Example 5. In the semiconductor laser element according to Example 5, all of a p-type guide layer 10912, a p-type cladding layer 10912, and a p-type contact layer 10913 included in the p-type semiconductor layer section 10014 were doped only with C, oppositely to Examples 3 and 4, and the etched amount D in the p-type contact layer 10913 was changed in the non-window region 10015*a*. Through this process, the C content of the p-type semiconductor layer section 10014 in the non-window region 10015*a* was changed. The RTA was then carried out at a temperature of 825 degrees Celsius for 30 seconds. In Example 5, the amount of band gap energy shift was measured as Examples 5-1 and 5-2 with different etched amounts D, and as Comparative Example 5 in which p-type semiconductor layer was not etched at all.

Figures 79, 80:
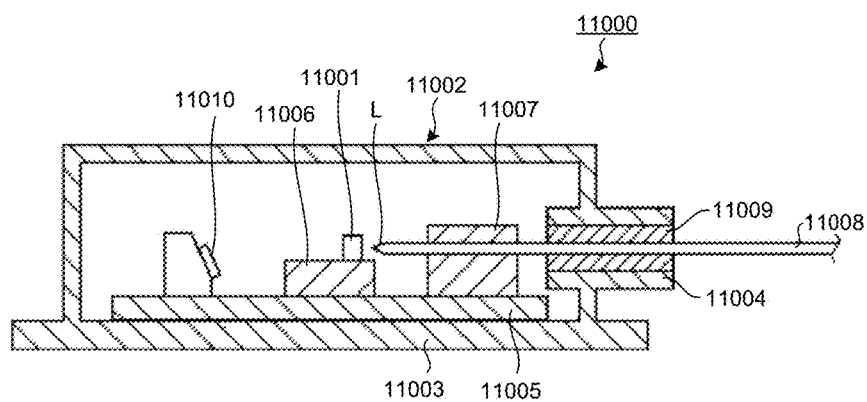
FIG. 79 is a schematic of a relation between the C content and the amount of band gap energy shift in the p-type semiconductor layer section in the non-window region when the p-type semiconductor layer section contains only C.
FIG. 80 is an exemplary side view of a semiconductor laser module according to an eighth embodiment of the present invention with a part of the housing removed.

FIG. 79 is a schematic of a relation between the C content and the amount of band gap energy shift in the p-type semiconductor layer section in the non-window region when the p-type semiconductor layer section contains only C. As illustrated in FIG. 79, when the C content of the p-type semiconductor layer section 10014 in the non-window region 10015*a* was increased, the amount of band gap energy shift increased as well. This result indicates that C was functioning as the promoting species.

In Examples 1 to 5, the impurity content of the p-type semiconductor layer section 10014 is made different between the non-window region 10015*a* and the window region 10015*b* by changing the etched amount of the p-type contact layer or by selective deposition of the impurity-containing layer. Alternatively, the impurity content of the p-type semiconductor layer section 10014 may be made different between the non-window region 10015*a* and the window region 10015*b* by selective deposition of the impurity-containing layers in different concentrations, by selective diffusion of the impurity from a diffusion source, or by selective implantation of the impurity through ion implantation.

As indicated by the examples described above, the types of impurities, the amount doped, a combination of the impurities, the density of the dielectric film, and the refractive index of the impurity contained in the p-type semiconductor layer section determine if the impurity functions as the promoting species or as the suppressing species. Therefore, using a promoting species and an suppressing species in an appropriate combination, by increasing the promoting species content of the p-type semiconductor layer section in the window region 10015*b*, and by increasing the suppressing species content of the p-type semiconductor layer section in the non-window region 10015*a*, the difference between the degrees of disordering and the band gap energy difference in the non-window region 10015*a* and the window region 10015*b* can be increased, so that a smaller amount of laser light is absorbed at the facet, and the risk of COD is reduced.

When there are two or more regions with different degrees of disordering and different band gap energies, as the window region and the non-window region described above, it is preferable that at least one of the two or more regions contains both the first impurity and the second impurity, and that the content of at least one of the impurities is made different between the two or more regions. With such a configuration, compared with when these two or more regions merely has different degrees of disordering, or compared with when only one impurity is used and only the impurity content is made different between the two or more regions, so much larger energy band gap difference can be achieved. The reason is, because the suppressing species such as Zn presumably inhibits disordering by becoming thermally diffused and filling out the atomic vacancies, as mentioned earlier, the suppressing species can achieve the suppressing effect when the vacancies exist at a certain level. Therefore, the suppressing effect achieved with the suppressing species can be enhanced by using the promoting species such as C.

To allow at least one of two or more regions to contain both the first impurity and the second impurity, and the content of at least one of the impurities to be different between the two or more regions, the regions that are to be the window region and the non-window region are both doped with Zn and C, and the Zn content, C content, or both may be made different between these two regions. It is preferable that the Zn content, C content, or both are made different so that the band gap energy difference between these regions are maximized.

While the contact layer 13b is completely removed only in the region that is to be the window region in the third embodiment, as illustrated in FIG. 38, a slight amount of the contact layer 13b may be left unremoved in the region that is to be the window region, or the contact layer 13a may be slightly removed by etching from the region that is to be the window region. When the contact layer 13a is slightly removed by etching, it is more likely that a larger band gap energy difference at a level near that achieved when only the contact layer 13b is completely removed is achieved, because Zn has a larger impact on the change in the amount of band gap energy shift with respect to a unit content than C, as can be seen in FIGS. 72 and 79.

While the contact layer 313b is completely removed only from the region that is to be the window region in the fifth embodiment, as illustrated in FIG. 55, and a slight amount of the contact layer 313b may be left unremoved in the region that is to be the window region, or the contact layer 313a may be slightly removed by etching from the region that is to be the window region. When the contact layer 313b is slightly left unremoved, it is more likely that a larger band gap energy difference at a level near that achieved when only the contact layer 313b is completely removed is achieved, because Zn has a larger impact on a change in the amount of band gap energy shift with respect to a unit content than C, as can be seen in FIGS. 72 and 79.

The semiconductor laser element explained in the embodiments may be mounted onto a package together with a controller, an optical element, or the like to achieve a semiconductor laser module. Semiconductor laser modules generally have a temperature adjusting mechanism that provides cooling or heating for controlling the temperature of the semiconductor laser element at an appropriate level. The semiconductor laser elements according to the embodiments are more reliable and capable of operating stably without the temperature adjustment, because the semiconductor laser element has a larger band gap energy difference and a lower risk of COD. The semiconductor laser module, therefore, does not necessarily need to have a temperature adjusting mechanism for adjusting the temperature of the semiconductor laser element. As a result, a low-cost uncooled semiconductor laser module with a simple structure can be provided.

Eighth Embodiment

A semiconductor laser module according to an eighth embodiment of the present invention will now be explained. The semiconductor laser module according to the eighth embodiment is a semiconductor laser module having a semiconductor laser element that is more reliable and in which the risk of COD is reduced, as described in one of the first to the seventh embodiments and the embodiments described below, for example. FIG. 80 is an exemplary side view of the semiconductor laser module according to the eighth embodiment with a part of the housing removed. This semiconductor laser module 11000 includes a semiconductor laser element 11001 that is the same as the semiconductor laser element 10100 according to the third embodiment, for example, and outputs laser light received from the semiconductor laser element 11001 via an optical fiber 11008. The semiconductor laser module 11000 includes a housing 11002, a bottom plate 11003, a tubular hole 11004, a base 11005, a mount 11006, a fiber fixer 11007, an optical fiber 11008, a sleeve 11009, and an optical receiver 11010.

The housing 11002, the bottom plate 11003, and the tubular hole 11004 are made of a metal. The housing 11002, the bottom plate 11003, and the tubular hole 11004 is made of aluminum (Al), as an example, and internal of the housing 11002 is sealed. The housing 11002, the bottom plate 11003, and the tubular hole 11004 may be configured as a butterfly package.

The base 11005 may be made of a material such as aluminum nitride (AlN), copper-tungsten (CuW), Si, or diamond. The mount 11006 may be made of the same material as the base 11005.

The fiber fixer 11007 is placed on the top surface of the base 11005, and the optical fiber 11008 is fixed to the fiber fixer 11007. The optical fiber 11008 may be fixed to the fiber fixer 11007 with resin, sealing glass, adhesive, or the like.

The optical fiber 11008 is inserted from external of the housing 11002 into the housing 11002 through the tubular hole 11004. The optical fiber 11008 may be a lensed fiber one end of which indicated by L in FIG. 80 is processed to have an aspheric surface providing a collecting lens. The optical fiber 11008 is fixed near the facet from which the light is output from the semiconductor laser element 11001, and the collecting lens collects the light output from the semiconductor laser element 11001. With this structure, the optical fiber 11008 can transmit the optical output of the semiconductor laser element 11001 to the external of the housing 11002.

The sleeve 11009 is positioned between the housing 11002 and the optical fiber 11008, and the optical fiber 11008 is fixed to the housing 11002 via the sleeve 11009. The optical fiber 11008 may be fixed to the sleeve 11009 with resin, sealing glass, adhesive, or the like.

The optical receiver 11010 receives an optical output from one side of the semiconductor laser element 11001, the side being on the opposite of the side facing the optical fiber 11008, and monitors the optical power of the semiconductor laser element 11001. The optical receiver 11010 may be positioned on the side of the high reflection film provided on the semiconductor laser element 11001. The optical receiver 11010 may be a photodiode. In this semiconductor laser module 11000 according to the eighth embodiment, because the semiconductor laser element 11001 has a structure less easily heated and with a lower risk of COD, a semiconductor laser module not provided with a temperature adjusting mechanism and capable of operating stably without temperature adjustment can be provided.

Ninth Embodiment

Figure 81:
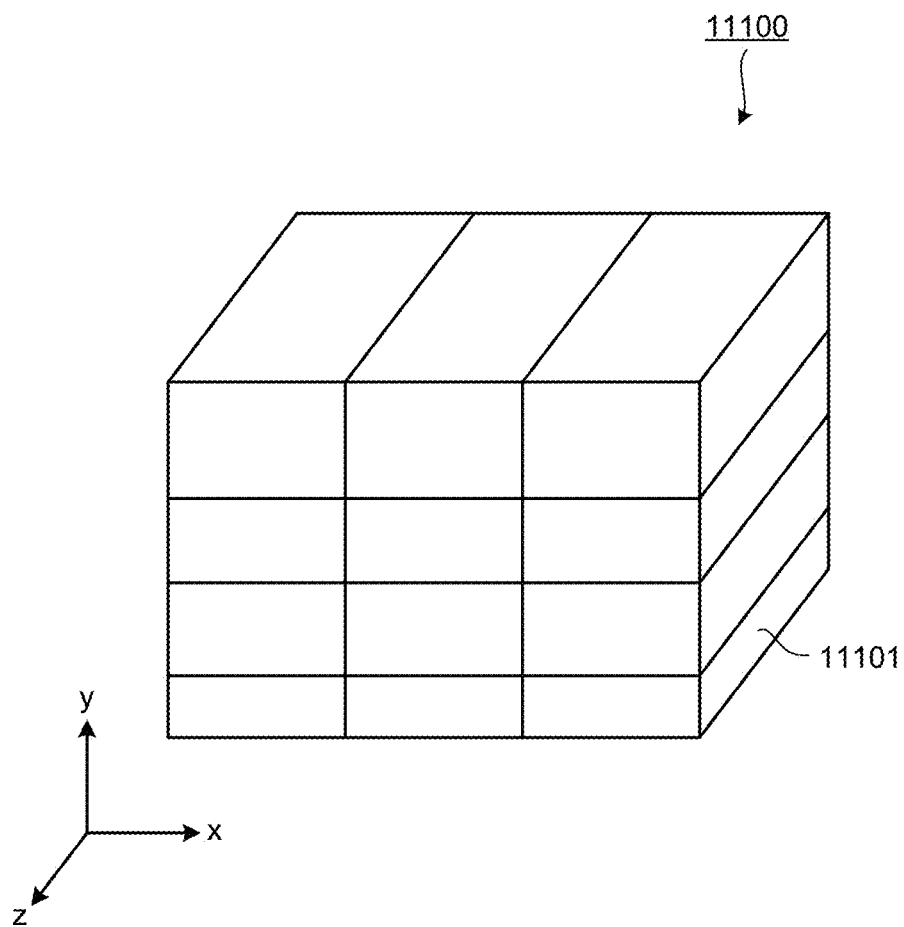
FIG. 81 is a schematic perspective view of a semiconductor optical element according to a seventh embodiment of the present invention.

A semiconductor optical element according to a ninth embodiment of the present invention will now be explained. FIG. 81 is a schematic perspective view of the semiconductor optical element according to the ninth embodiment. As illustrated in FIG. 81, this semiconductor optical element 11100 semiconductor optical element 11100 according to the ninth embodiment has an element body 1101, and functions as a semiconductor light waveguide that guides the incident light along the z-axial direction while keeping the light confined, with no resonating structure achieved with the low reflection film and the high reflection film.

Figure 82:
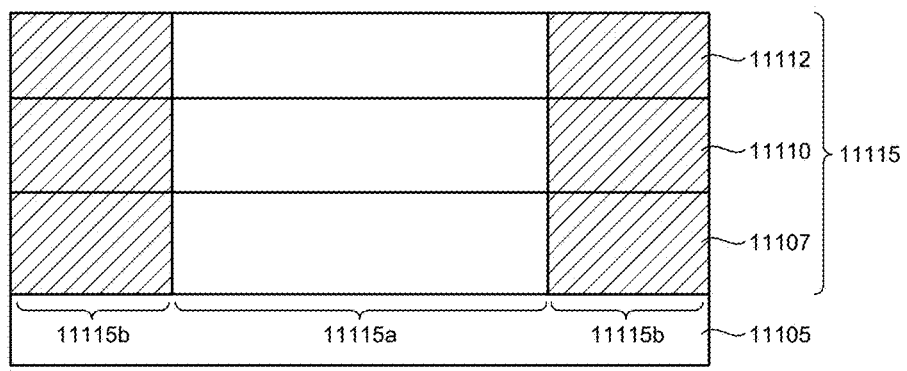
FIG. 82 is a cross-sectional view along the x-y plane in a semiconductor optical element according to the ninth embodiment.

FIG. 82 is a cross-sectional view along the x-y plane in the semiconductor optical element illustrated in FIG. 81. This semiconductor optical element 11100 is provided with a substrate 11105, and a semiconductor layer portion 11115 having a lower cladding layer 11107, a core layer 11110, and an upper cladding layer 11112 that are made of InP and sequentially layered on the substrate 11105. The semiconductor layer portion 11115 has a disordering suppressed region 11115a and a disordering promoted region 11115b.

The semiconductor optical element 11100 has a structure that confines light in the y-axial direction with the core layer 11110, and the lower cladding layer 11107 and the upper cladding layer 11112 between which the core layer 11110 is sandwiched and that are made of a semiconductor with a smaller refractive index than that of the core layer. The semiconductor optical element 11100 also has a structure that confines the light in the x-axial direction with the disordering suppressed region 11115a, and with the disordering promoted region 11115b by which the disordering suppressed region 11115a is surrounded and the refractive index of which is smaller than that of the disordering suppressed region 11115a because disordering has took place in the disordering promoted region 11115b. The semiconductor optical element 11100 thus functions as a semiconductor light waveguide that guides the light in the z-axial direction.

An exemplary method for manufacturing semiconductor optical element 11100 will now be explained. The method for manufacturing the semiconductor optical element 11100 according to the ninth embodiment includes the semiconductor layer portion forming process, the promoting film forming process, the suppressing film forming process, and the annealing process as illustrated in FIG. 35, in the same manner as in the third embodiment.

Semiconductor Layer Portion Forming Process

Figure 83:
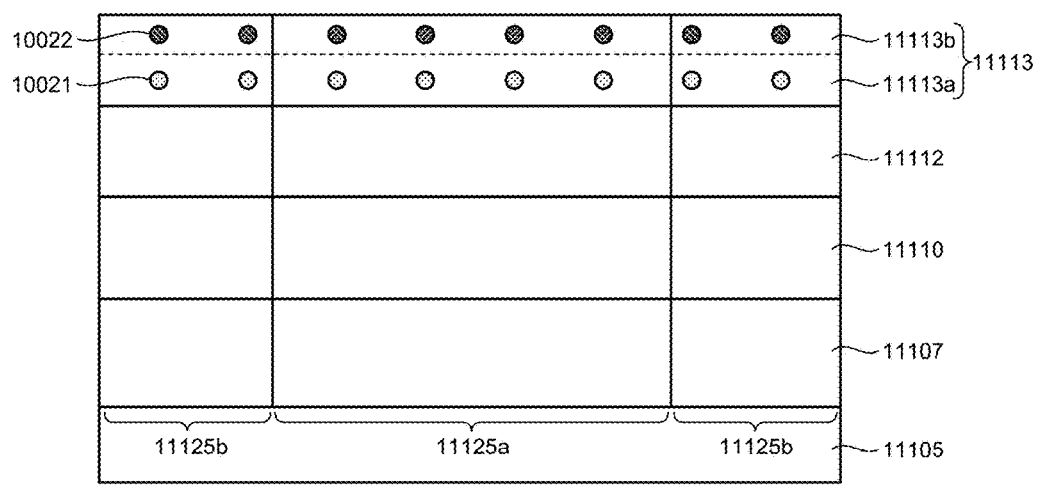
FIG. 83 is a schematic for explaining an exemplary method for manufacturing a semiconductor optical element according to the ninth embodiment.

To begin with, the semiconductor layer portion forming process will now be explained. In this process, to begin with, as illustrated in FIG. 83, the lower cladding layer 11107, the core layer 11110, and the upper cladding layer 11112 are grown on the substrate 11105 through MOCVD. An impurity-containing layer 11113 including a promoting species containing layer 11113a that is doped with C 10021 as the promoting species, for example, and a suppressing species containing layer 11113b that is doped with Zn 10022 as the suppressing species, for example, is then formed.

Figure 84:
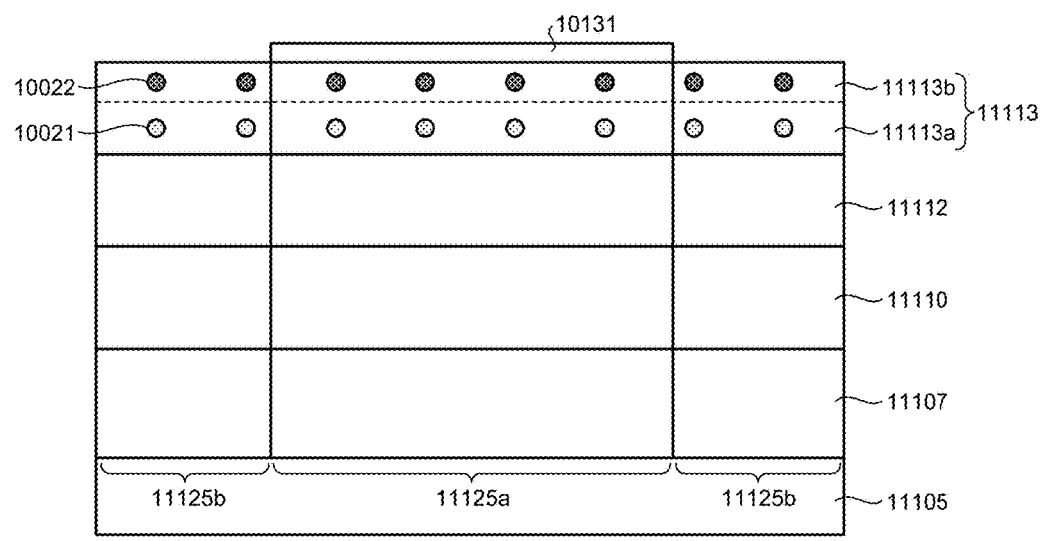
FIG. 84 is a schematic for explaining the exemplary method for manufacturing a semiconductor optical element according to the ninth embodiment.
Figure 85:
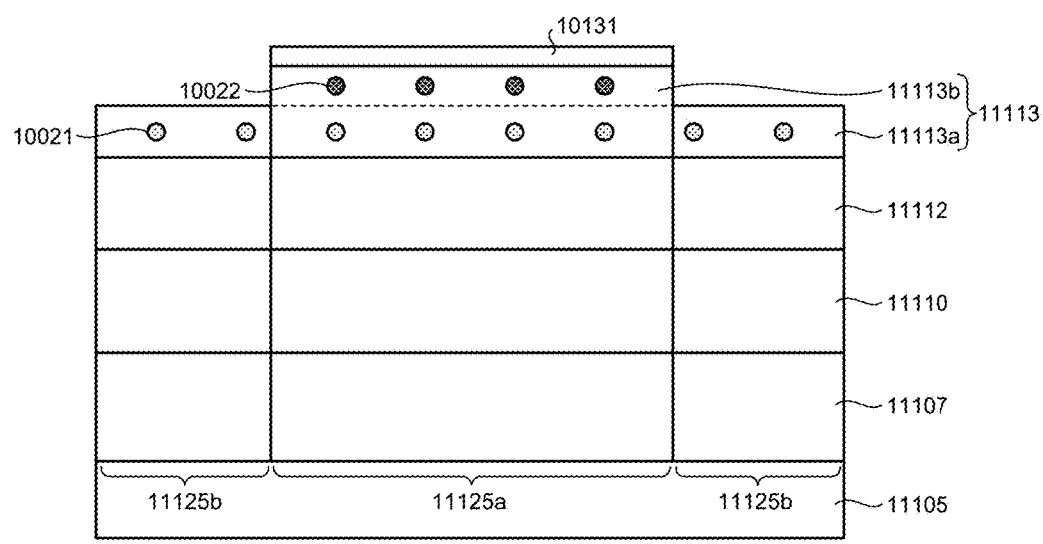
FIG. 85 is a schematic for explaining the exemplary method for manufacturing a semiconductor optical element according to the ninth embodiment.
Figure 86:
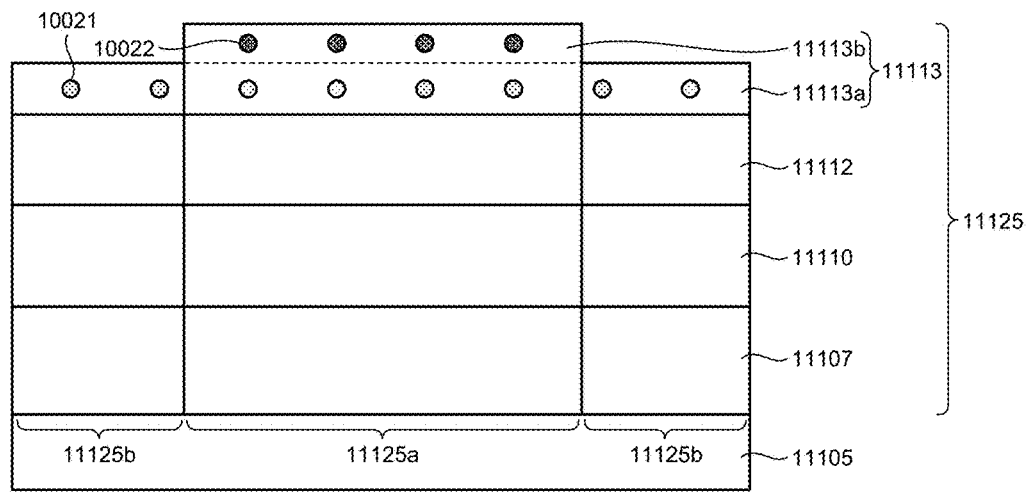
FIG. 86 is a schematic for explaining the exemplary method for manufacturing a semiconductor optical element according to the ninth embodiment.

The photolithography process and the etching process are then performed to remove the suppressing species containing layer 11113b from a second region 11125b that corresponds to the disordering promoted region 11115b, using the photoresist 10131, while leaving the suppressing species containing layer unremoved from a first region 11125a that corresponds to the disordering suppressed region 11115a, as illustrated in FIGS. 84 and 85. The photoresist 10131 is then removed, as illustrated in FIG. 86. Through this process, a semiconductor layer structure 11125 including layers from the substrate 11105 through the impurity-containing layer 11113 is produced.

Promoting Film Forming Process

Figure 87:
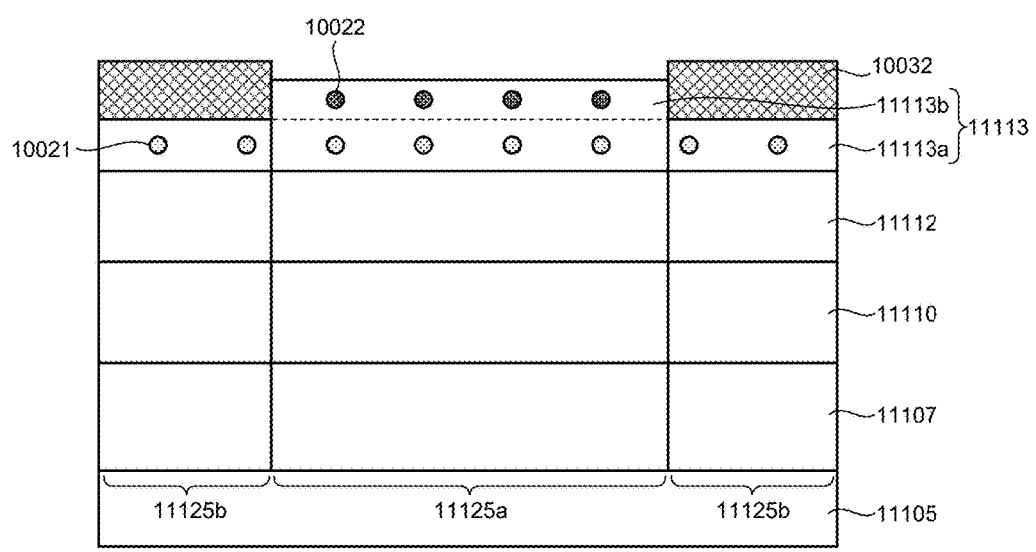
FIG. 87 is a schematic for explaining the exemplary method for manufacturing a semiconductor optical element according to the ninth embodiment.

The promoting film forming process will now be explained. In this process, the promoting film 10032 is formed on the top surface of the second region 11125b in order to produce the disordering promoted region 11115b by disordering through atomic vacancy diffusion. To begin with, the promoting film 10032 that is a SiN insulating layer is deposited on the top surface of the semiconductor layer structure 11125. The photolithography process and the etching process are then performed to remove the promoting film 10032 from the region in which the disordering suppressed region 11115a is to be provided, as illustrated in FIG. 87. Through this process, the promoting film 10032 is formed on the top surface of the second region 11125b.

Suppressing Film Forming Process

Figure 88:
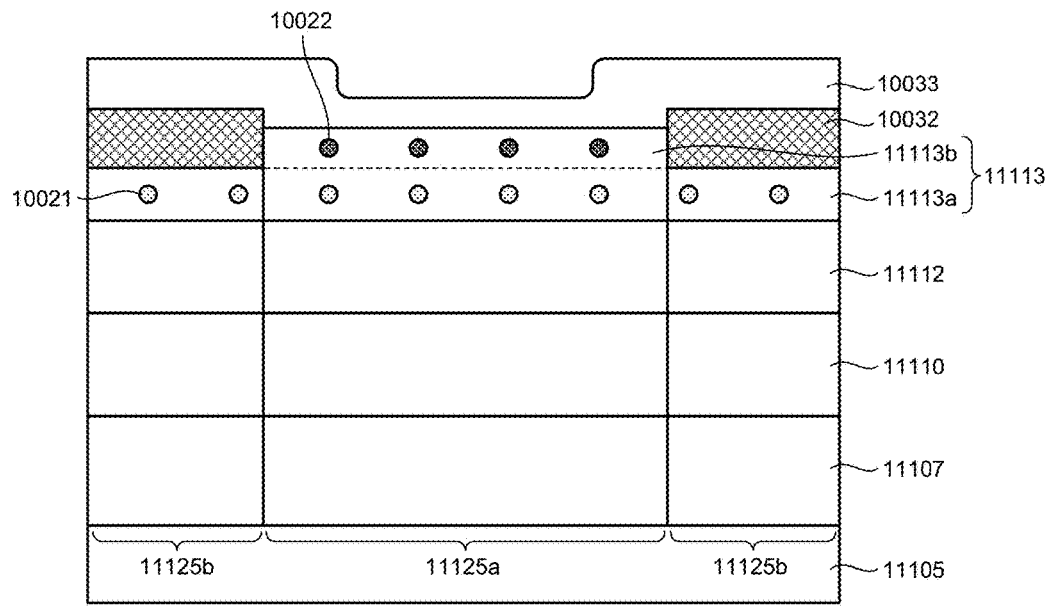
FIG. 88 is a schematic for explaining the exemplary method for manufacturing a semiconductor optical element according to the ninth embodiment.

The suppressing film forming process will now be explained. In this process, the suppressing film 10033 that is a SiN insulating layer is formed, as illustrated in FIG. 88.

Annealing Process

Figure 89:
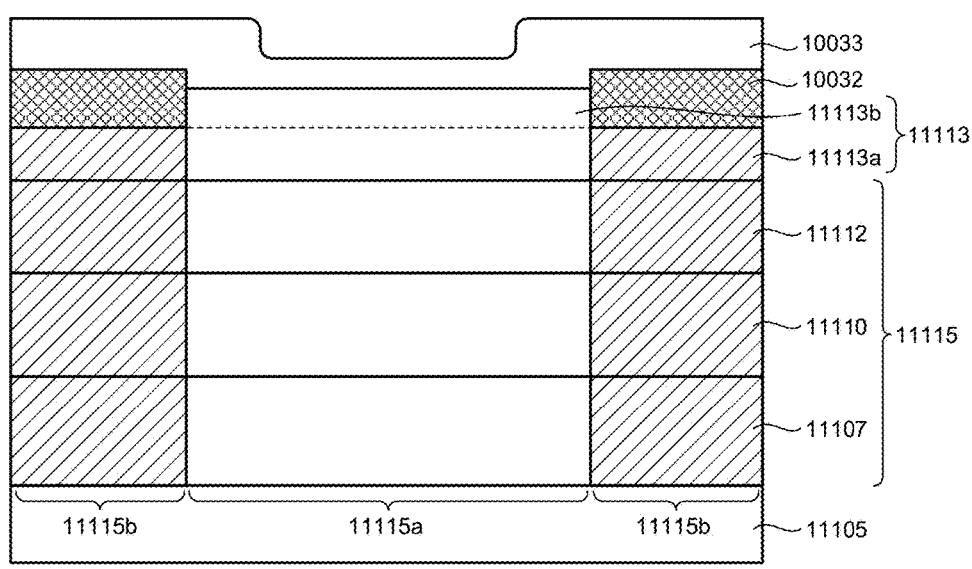
FIG. 89 is a schematic for explaining the exemplary method for manufacturing a semiconductor optical element according to the ninth embodiment.

The annealing process will now be explained. In this process, the RTA is carried out at a temperature of 850 degrees Celsius for 30 seconds, for example. When the RTA is carried out, the promoting film 10032 and the suppressing film 10033 allow the atomic vacancies to diffuse across the semiconductor layer portion, inducing disordering in the semiconductor layer portion thereby. Through this process, the disordering suppressed region 11115a and the disordering promoted region 11115b with different degrees of disordering are produced, as illustrated in FIG. 89. The disordering suppressed region 11115a and the disordering promoted region 11115b have different effective refractive indices. The impurity-containing layer 11113 is then removed by etching, for example, the final semiconductor optical element 11100 is achieved.

As described above, with the semiconductor optical element 11100 according to the ninth embodiment, a semiconductor optical element with a larger band gap energy difference can be achieved. In the manner described above, the present invention can be used in a semiconductor light waveguide, such as that according to the ninth embodiment, without limitation to the semiconductor laser element as disclosed in the third embodiment.

The band gap energy and the refractive index of a semiconductor material are generally correlated to each other. In the ninth embodiment, because a larger band gap energy difference can be ensured, the selectable or settable range of refractive index difference can be increased. When the selectable or settable range of refractive index difference is increased, an increased number of selections of materials, waveguide structures, and the like are made available to achieve a desired refractive index difference, and therefore, the waveguide can be designed more freely.

In the ninth embodiment, while the light confining structure in the x-axial direction is provided by making the degree of disordering different between the first region 11125a and the second region 11125b extending in the deposition direction, the optical confinement in the x-axial direction may be improved by providing another third region with different degree of disordering outside of the second region 11125b. Furthermore, the degrees of disordering may be continuously changed by continuously changing the thickness of the first region in the x-axial direction, for example. Such a structure can also achieve the same effect as that achieved in the ninth embodiment, so that a semiconductor optical element with a larger band gap energy difference can be achieved.

Furthermore, in the ninth embodiment, the border between the first region 11125*a* and the second region 11125*b* extends in the light guiding direction, but the border between the regions may extend in a direction traversing the light guiding direction. For example, a grating structure may be manufactured by forming layers each with a different refractive index alternatingly in the light guiding direction.

The semiconductor optical element according to the ninth embodiment may be used in combination with the semiconductor laser element according to any one of the first to the seventh embodiments. In such a configuration, each of the regions may have different degrees of disordering, or has different band gap energies.

Furthermore, the seventh embodiment may be used to fabricate a passive waveguide by inducing disordering in the active layer, or may be used in monolithic integration of an active element and a passive waveguide.

As the results described above indicate, the semiconductor optical element according to the embodiments having the regions with different degrees of disordering has been proven to provide a semiconductor optical element having a larger band gap energy difference.

Tenth Embodiment

A semiconductor laser element according to an tenth embodiment of the present invention will now be explained.

Figure 90A:
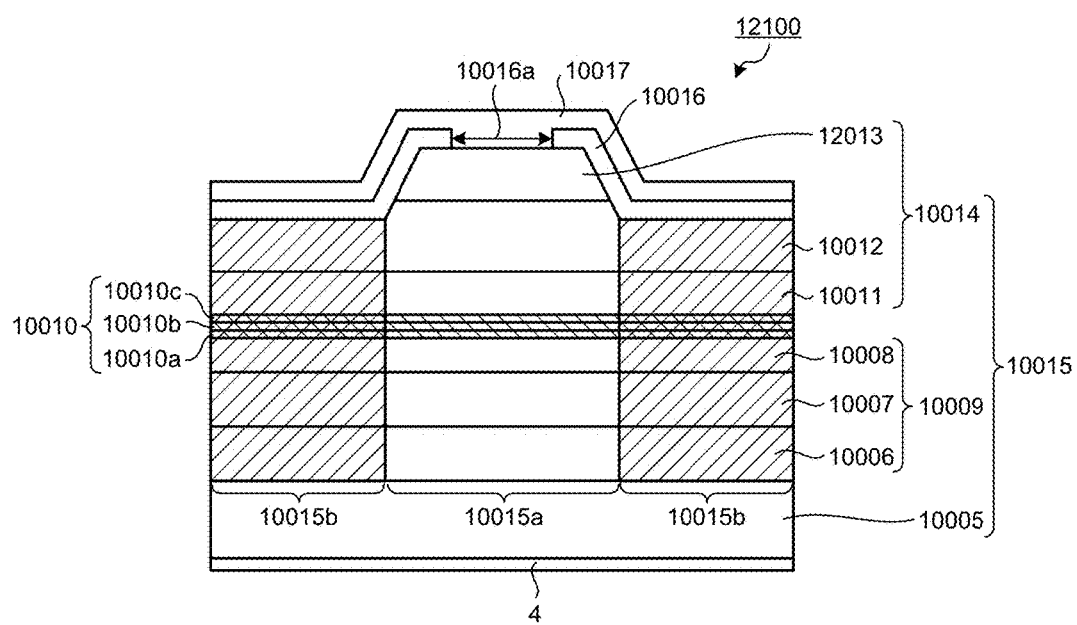
FIG. 90A is a cross-sectional view along the x-y plane in a semiconductor laser element according to a tenth embodiment of the present invention.

FIG. 90A is a cross-sectional view along the x-y plane in the semiconductor laser element according to the tenth embodiment. FIG. 90B is a cross-sectional view along the y-z plane in the semiconductor laser element according to the tenth embodiment. As illustrated in FIG. 90A, this semiconductor laser element 12100 is provided with the semiconductor layer portion 10015 semiconductor layer portion 10015 including the substrate 10005 the bottom surface of which is provided with the lower electrode 4, and the n-type semiconductor layer section 10009, the active layer 10010, and the p-type semiconductor layer section 10014. The n-type semiconductor layer section 10009 includes the n-type buffer layer 10006, the n-type cladding layer 10007, and the n-type guide layer 10008. The p-type semiconductor layer section 10014 includes the p-type guide layer 10011, the p-type cladding layer 10012, and a p-type contact layer 12013. The n-type semiconductor layer section 10009, the active layer 10010, and the p-type semiconductor layer section 10014 are sequentially formed on the substrate 10005. The p-type contact layer 12013 has a trapezoidal cross section, and has stripes extending in the z-axial direction. This p-type contact layer 12013 provides the semiconductor laser element 12100 with a ridge structure. The semiconductor laser element 12100 also includes the insulating film 10016 formed on the p-type semiconductor layer section 10014, and the upper electrode 10017 that is a p-side electrode that is brought into contact with the p-type contact layer 201 via a part of the upper base of the trapezoidal ridge structure, the part being not provided with the insulating film 10016.

The p-type contact layer 12013 including a topmost layer region that is brought into contact with the upper electrode 10017 in the semiconductor layer portion 10015 semiconductor layer portion 10015 contains C as a p-type second impurity having a function of promoting atomic vacancy diffusion. The p-type contact layer 12013 also contains zinc (Zn) as a p-type first impurity having a function of suppressing atomic vacancy diffusion.

The semiconductor layer portion 10015 has the non-window region 10015*a*, and the window region 10015*b* in which the active layer 10010 has larger band gap energy than that in the non-window region 10015*a*.

It is preferable for disordered crystals to increase the band gap energy in the window region, and not to increase the band gap energy in the non-window region. Therefore, the window region and the non-window region are doped with impurities promoting and suppressing disordering respectively, at concentrations selected appropriately.

In the tenth embodiment, C functions as the promoting species, and Zn functions as the suppressing species, but which one of the impurities functions as the promoting species or the suppressing species is dependent on the types, the concentrations, and the combination of the impurities, and the conditions of the RTA such as the temperature and time.

The topmost layer region is a region that belongs to the topmost layer of the semiconductor layer portion 10015, and that is brought into contact with the upper electrode 10017 and via which a current is injected. The topmost layer region is also a region from the topmost surface of the semiconductor layer portion 10015 to the depth affecting the contact resistance against the injection current. The topmost layer region is also a region epitaxially grown under approximately the same conditions and covering a depth of 0 nanometers to 200 nanometers from the topmost surface, for example. The impurities with which the semiconductor layer portion is doped may be changed while the topmost layer region is being deposited. In the tenth embodiment, the topmost layer region means the p-type contact layer 12013. The impurity contents are calculated as an integral of the impurity concentration at a depth from the surface with respect to the depth.

In the semiconductor laser element 12100 according to the tenth embodiment, the topmost layer region of the semiconductor layer portion 10015, the topmost layer being brought into contact with the upper electrode 10017, is provided as the p-type contact layer 12013 doped with C. When the topmost layer region of the semiconductor layer portion brought into contact with the upper electrode is provided as a p-type contact layer doped with Zn, Zn having a higher diffusion coefficient than C diffuses to the p-type semiconductor layer section from the p-type contact layer during the RTA for inducing disordering in the active layer, and the Zn concentration in the p-type contact layer is reduced thereby. When the p-type contact layer with less Zn is brought into contact with the upper electrode, the contact resistance is increased, because there is less Zn working as acceptors in the ohmic contact. When the contact resistance is increased, the power conversion efficiency with respect to the input power becomes reduced. Therefore, a reduced Zn content of the p-type contact layer directly contributes to the deterioration of the performance of the semiconductor laser element.

The semiconductor laser element 12100 according to the tenth embodiment has a structure in which the p-type contact layer 12013 containing C is brought into contact with the upper electrode 10017. This is because C has a lower diffusion coefficient than Zn, and becomes diffused less by the heat. The upper electrode 10017 is then brought into ohmic-contact with the p-type contact layer 12013 with its concentration of C functioning as acceptors almost not reduced. In the semiconductor laser element 12100 according to the tenth embodiment, this structure suppresses an increase of the contact resistance by the RTA. The topmost layer region of the semiconductor laser element 12100 according to the tenth embodiment also contains Zn diffused in the RTA in the manufacture process. With this structure, the contact resistance is further reduced.

As described above, in the semiconductor laser element 12100 according to the tenth embodiment, an increase of the contact resistance resulting from the RTA is suppressed by bringing the upper electrode 10017 into contact with the p-type contact layer 12013 containing C with a lower diffusion coefficient. Furthermore, the contact resistance is reduced by Zn diffused during the RTA process. Because the risk of COD is reduced, the reliability is improved, and the contact resistance is kept low by disordered crystals in the active layer in the window region obtained by the RTA, a semiconductor laser element high power conversion efficiency can be provided.

Figure 91:
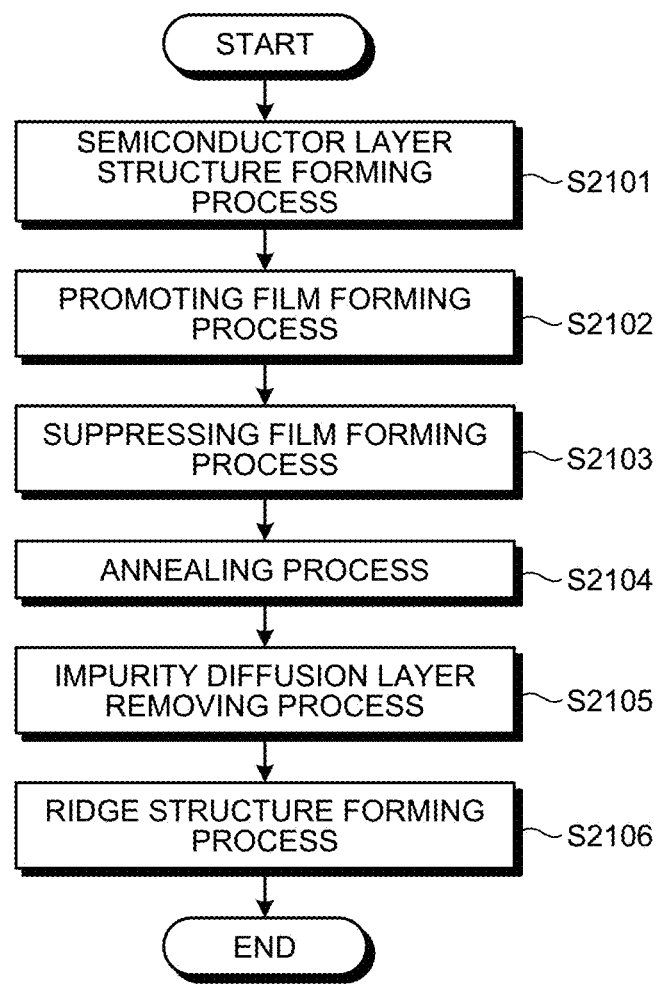
FIG. 91 is a flowchart of a method for manufacturing a semiconductor laser element.

An exemplary method for manufacturing the semiconductor laser element 12100 will now be explained. FIG. 91 is a flowchart of the method for manufacturing the semiconductor laser element. As illustrated in FIG. 91, the method for manufacturing the semiconductor laser element 12100 according to the tenth embodiment includes a semiconductor layer structure forming process (Step S2101), a promoting film forming process (Step S2102), an suppressing film forming process (Step S2103), an annealing process (Step S2104), an impurity diffusion layer removing process (Step S2105), and a ridge structure forming process (Step S2106).

Each of these processes will now be explained. The values specified in these processes are merely exemplary, and the embodiment is not limited thereto.

Semiconductor Layer Structure Forming Process

Figure 92:
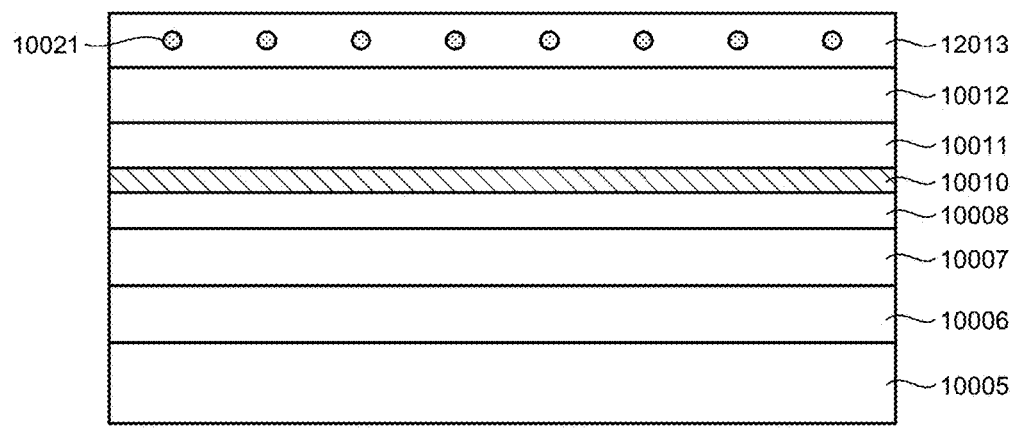
FIG. 92 is a schematic for explaining an exemplary method for manufacturing a semiconductor laser element according to the tenth embodiment.
Figure 93:
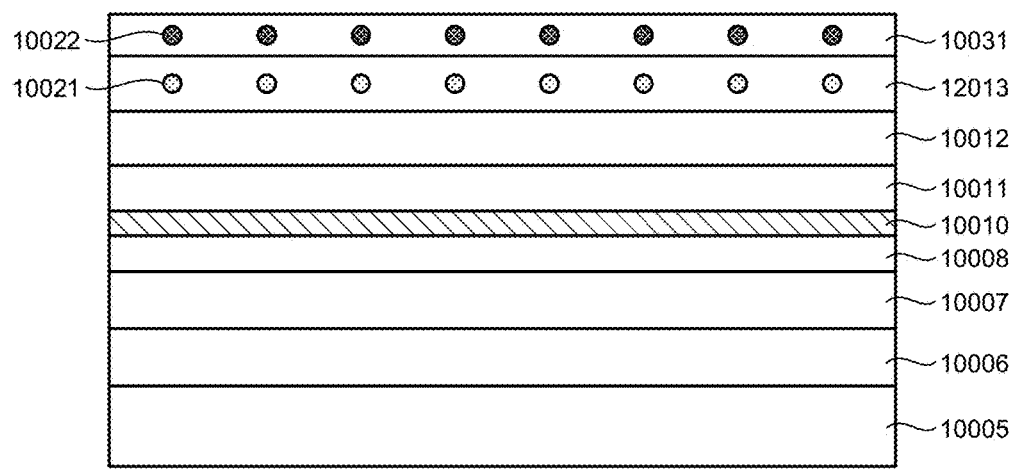
FIG. 93 is a schematic for explaining the exemplary method for manufacturing a semiconductor laser element according to the tenth embodiment.

To begin with, at Step S2101, in the semiconductor layer structure forming process, the n-type buffer layer 10006, the n-type cladding layer 10007, the n-type guide layer 10008, the active layer 10010, the p-type guide layer 10011, the p-type cladding layer 10012, and the p-type contact layer 12013 are epitaxially grown on the substrate 10005 through MOCVD, as illustrated in FIG. 92. The p-type contact layer 12013 is doped with C (C 10021) that is a promoting species having a function of promoting disordering and is a second impurity of a first conductivity type, in a concentration of $1.0 \times 10^{17}$ cm$^{-3}$ to $5.0 \times 10^{19}$ cm$^{-3}$ to $5 \times 10^{20}$ cm$^{-3}$, or so, for example. The p-type contact layer 12013 is preferably doped with C in a concentration of $1.0 \times 10^{19}$ cm$^{-3}$ or higher. An impurity diffusion layer 10031 is then formed on the semiconductor layer portion 10015, as illustrated in FIG. 93, and the semiconductor layer structure is achieved. The impurity diffusion layer 10031 is made of GaAs, and is doped with Zn (Zn 10022) that is the suppressing species having a function of suppressing disordering in the active layer 10010 and is a first impurity of the first conductivity type, in a concentration of $1.0 \times 10^{17}$ cm$^{-3}$ to $5.0 \times 10^{19}$ cm$^{-3}$ to $5 \times 10^{20}$ cm$^{-3}$ or so, for example.

Promoting Film Forming Process

Figure 94:
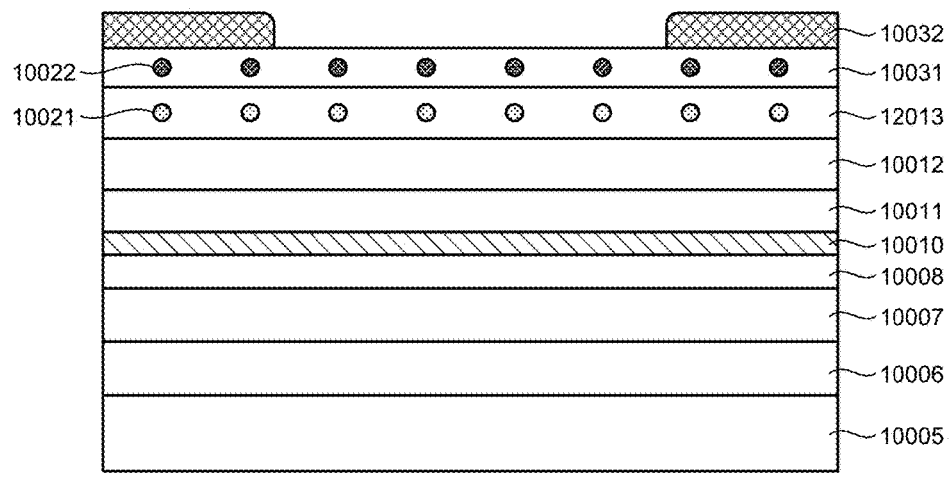
FIG. 94 is a schematic for explaining the exemplary method for manufacturing a semiconductor laser element according to the tenth embodiment.

The promoting film forming process at Step S2102 will now be explained. In this process, the promoting film 10032 is deposited in order to produce the window region 10015b by disordering through atomic vacancy diffusion. This method is also referred to as IFVD. To begin with, the promoting film 10032 that is a SiN insulating layer is deposited on the top surface of the semiconductor layer portion 10015. The photolithography process and the etching process are then performed to remove the promoting film 10032 from the region in which the non-window region 10015a is to be formed, as illustrated in FIG. 94. Through this process, the promoting film 10032 is formed on the top surface of the region to be the window region 10015b.

Suppressing Film Forming Process

Figure 95:
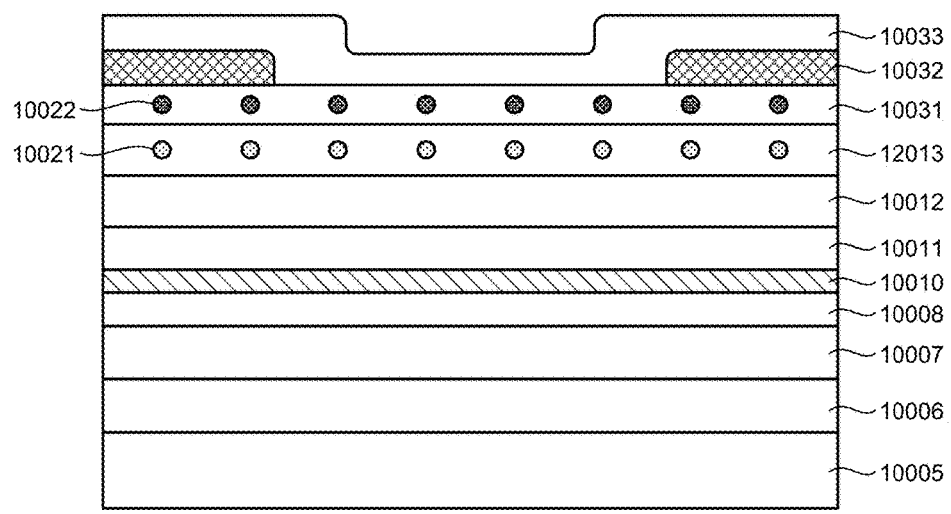
FIG. 95 is a schematic for explaining the exemplary method for manufacturing a semiconductor laser element according to the tenth embodiment.

The suppressing film forming process at Step S2103 will now be explained. In this process, the suppressing film 10033 that is a SiN insulating layer is deposited, as illustrated in FIG. 95.

Annealing Process

Figure 96:
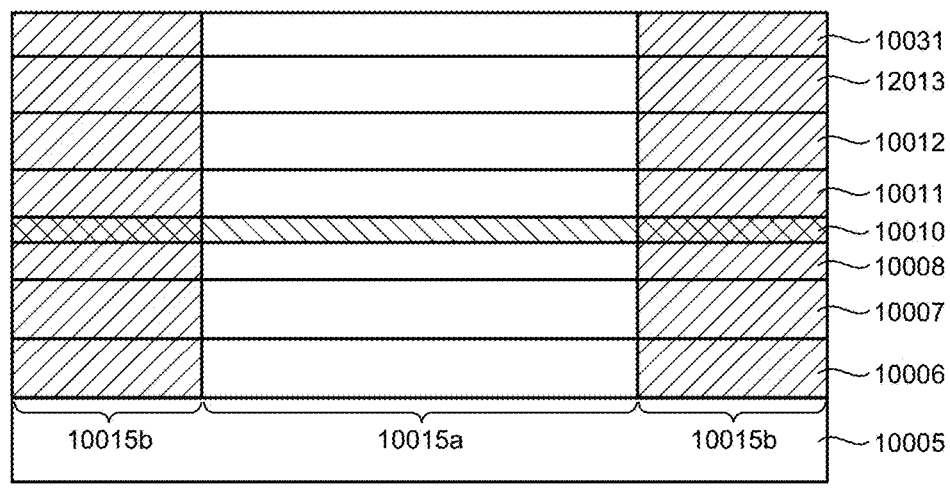
FIG. 96 is a schematic for explaining the exemplary method for manufacturing a semiconductor laser element according to the tenth embodiment.

The annealing process at Step S2104 will now be explained. In this process, the semiconductor layer structure is annealed over a short time period with the RTA. As the semiconductor layer structure is annealed, in the region provided with the promoting film 10032 in contact with the p-type contact layer 12013, the promoting film 10032 promotes disordering in the active layer 10010, and the window region 10015b is formed thereby, as illustrated in FIG. 96. In the region provided with the suppressing film 10033 in contact with the p-type contact layer 10013, the suppressing film 10033 inhibits disordering in the active layer 10010, and the non-window region 10015a is formed thereby, as illustrated in FIG. 96.

In the tenth embodiment in which C 10021 and Zn 10022 are both used as dopants, C 10021 serves as the second impurity having a function of promoting disordering in the active layer 10010, and Zn 10022 serves as the first impurity having a function of suppressing disordering in the active layer 10010. By allowing C 10021 and Zn 10022 to function as the promoting species and the suppressing species, respectively, the band gap energy difference between the non-window region 10015a and the window region 10015b can be increased, so that the risk of COD can be reduced.

The RTA causes Zn 10022 with a higher diffusion coefficient to become diffused across the p-type semiconductor layer section 10014, greatly reducing the Zn 10022 concentration in the impurity diffusion layer 10031 thereby. By contrast, because C 10021 has a lower diffusion coefficient, the C 10021 concentration in the p-type contact layer 12013 remains almost not reduced.

Impurity Diffusion Layer Removing Process

Figure 97:
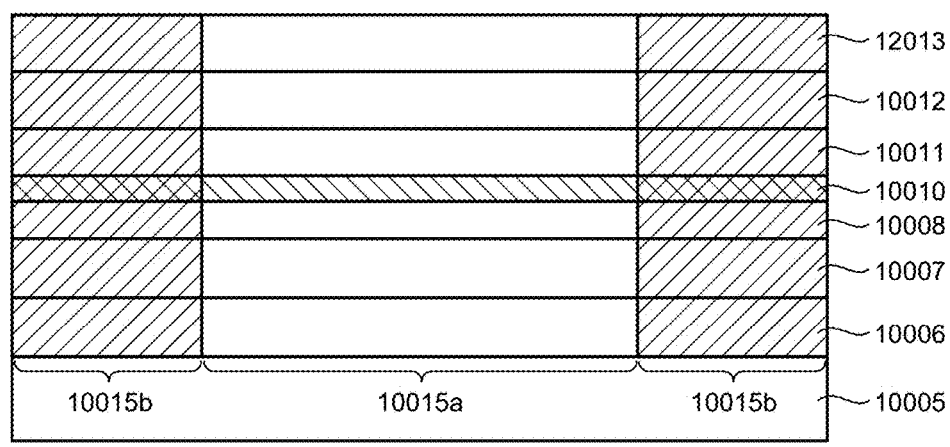
FIG. 97 is a schematic for explaining the exemplary method for manufacturing a semiconductor laser element according to the tenth embodiment.

The impurity diffusion layer removing process at Step S2105 will now be explained. In this process, as illustrated in FIG. 97, the impurity diffusion layer 10031 is removed by etching.

Figure 98A:
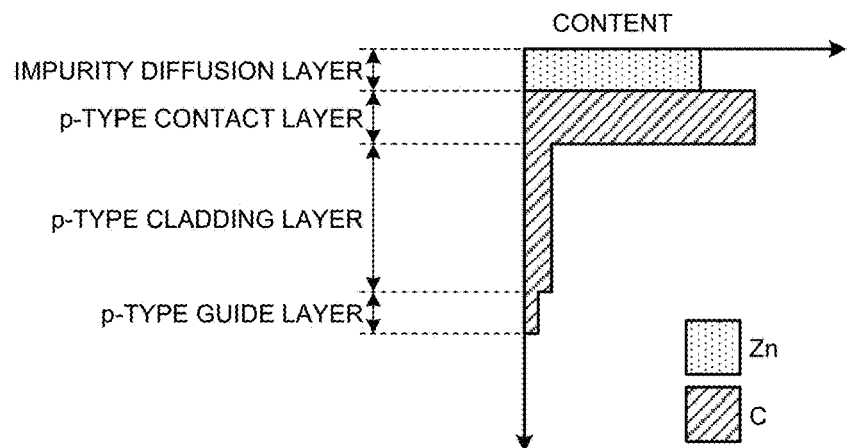
FIG. 98A is a schematic for explaining how the C content and the Zn content change before and after an RTA.
Figure 98B:
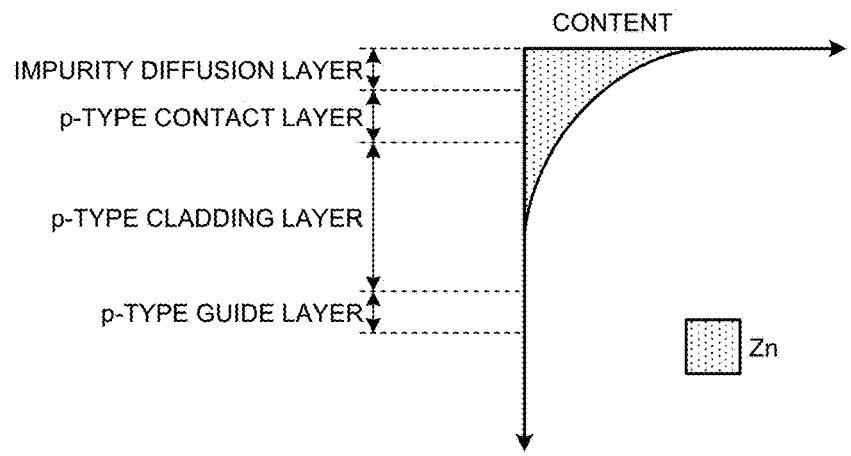
FIG. 98B is a schematic for explaining how the C content and the Zn content change before and after the RTA.
Figure 98C:
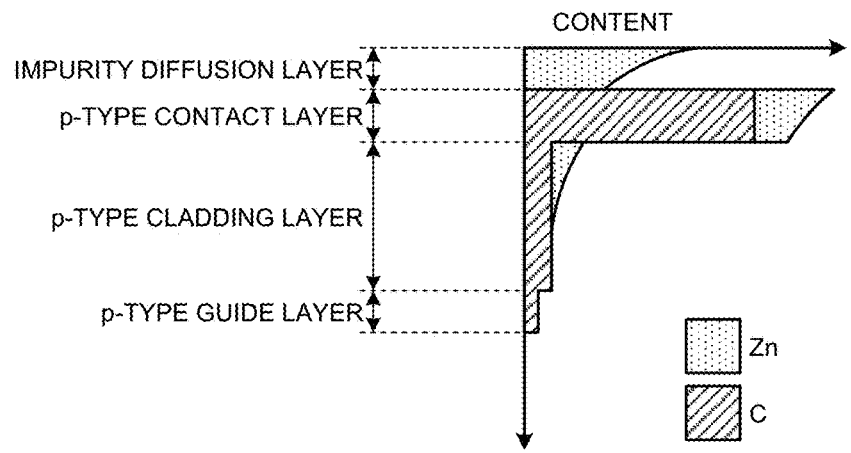
FIG. 98C is a schematic for explaining how the C content and the Zn content change before and after the RTA.

Explained now is how the RTA changes the C 10021 content and the Zn 10022 content of the layers in the p-type semiconductor layer section 10014. FIGS. 98A, 98B, and 98C are schematics for explaining how the RTA changes the C content and the Zn content. The horizontal axes in FIGS. 98A, 98B, and 98C represent the C 10021 content and the Zn 10022 content of the layers. Before the layers are annealed with the RTA, the layers have C 10021 and Zn 10022 concentration distribution illustrated in FIG. 98A. Once the layers are annealed with the RTA, a large amount of Zn 10022 that is an impurity with a higher diffusion coefficient becomes diffused, and results in a concentration distribution in which Zn 10022 is distributed at a lower concentration toward the internal from the topmost surface, as illustrated in FIG. 98B. While Zn 10022 has a diffusion coefficient of $10^{-8}$ cm$^2$/s or so at a temperature of 900 degrees Celsius, for example, C 10021 has a diffusion coefficient of $10^{-15}$ cm$^2$/s or so, being much smaller than that of Zn 10022, making the diffusion coefficient of C 10021 ignorable. The gross C 10021 and Zn 10022 content after the diffusion of the impurities during the RTA can therefore be represented as illustrated in FIG. 98C.

After the RTA, the Zn 10022 concentration in the topmost layer region of the impurity diffusion layer 10031 becomes reduced, as illustrated in FIG. 98C, so that high contact resistance would be incurred if the upper electrode 10017 is directly brought into contact with the topmost layer region. Therefore, in the semiconductor laser element according to the tenth embodiment, the impurity diffusion layer 10031 is removed, and the upper electrode 10017 is brought into contact with the p-type contact layer 12013. At this time, the gross Zn 10022 and C 10021 content, Zn being the impurity with a higher diffusion coefficient and C 10021 being the impurity with a lower diffusion coefficient, is set higher than the amount of doped C 10021 that is the impurity with a lower diffusion coefficient. This configuration allows the atoms functioning as the acceptors in an ohmic contact to be larger in number than those in the topmost layer region of the impurity diffusion layer 10031 after the RTA, and to be larger in amount than the amount of C 10021 with which the p-type contact layer 12013 is doped. In this manner, a lower contact resistance can be achieved than when provided is only the p-type contact layer 12013 containing C 10021, without the impurity diffusion layer 10031 for allowing Zn 10022 to be diffused.

For example, let us assume that the Zn concentration of the impurity diffusion layer 10031 is designed as $1.0 \times 10^{19}$ cm$^{-3}$, and the C concentration of the p-type contact layer 12013 positioned below the impurity diffusion layer 10031 is designed as $2.0 \times 10^{19}$ cm$^{-3}$. It is experimentally known that Zn diffused during the RTA is found in a region at a depth of 100 nanometers to 200 nanometers from the top surface of the p-type contact layer 12013 after the impurity diffusion layer 10031 is removed by etching, in a concentration of ten percent or so of that the designed Zn concentration of the impurity diffusion layer 10031. The gross C and Zn concentration of the p-type contact layer 12013 therefore becomes $2.1 \times 10^{19}$ cm$^{-3}$ or so.

Ridge Structure Forming Process

The ridge structure forming process at Step S2106 can be performed following the same sequence as that in the third embodiment. The insulating film 10016 is then deposited, and the opening 10016a is formed. The upper electrode 10017 and the lower electrode 4 are then deposited, the substrate 10005 is cleaved, and the high reflection film 2 and the low reflection film 3 are applied to the respective cleavage facets. The semiconductor layer structure is then diced into elements, achieving the semiconductor laser element 12100 thereby.

As described above, in the semiconductor laser element 12100 according to the tenth embodiment, by bringing the upper electrode 10017 into contact with the p-type contact layer 10013 doped with C 10021 the diffusion coefficient of which is lower and the concentration of which is almost not reduced by the RTA, the contact resistance is less increased by the RTA. Furthermore, in the semiconductor laser element 12100 according to the tenth embodiment, Zn 10022 having diffused in the RTA becomes contained in the topmost layer region, and contributes to reduce the contact resistance. With this structure, the semiconductor laser element 12100 that is more reliable and with high power conversion efficiency can be provided.

Example 6

A current-voltage characteristic and a current-optical power characteristic of the semiconductor laser element 12100 were measured as an example of the tenth embodiment.

In this Example 6, the semiconductor laser element 12100 according to the tenth embodiment was soldered onto a heat sink, and the heat sink on which the semiconductor laser element 12100 was placed was soldered onto a submount made of CuW. The solder may be tin-lead (Sn—Pb) solder, or gold-tin (Au—Sn) solder. A current was then injected into the semiconductor laser element 12100 via the lower electrode 4 and the upper electrode 10017. The injected current was measured with an amperemeter, and an applied voltage was measured with a voltmeter. The optical power was detected using a photodiode. The optical power may be detected with a charge-coupled element (CCD), for example.

As Comparative Example 6, the same measurements were collected from a semiconductor laser element having an upper electrode brought into contact with the impurity diffusion layer 10031, by performing the ridge structure forming process immediately after the annealing process, without performing the impurity diffusion layer removing process in which the impurity diffusion layer 10031 doped with Zn is removed, in the method for manufacturing the semiconductor laser element 12100 according to the tenth embodiment. The semiconductor laser element according Comparative Example 6 is the same as the semiconductor laser element 12100 according to Example 6 including the thicknesses of the layers, the concentration of the dopant impurities, and the RTA conditions, except that the impurity diffusion layer 10031 was not removed.

Figure 99:
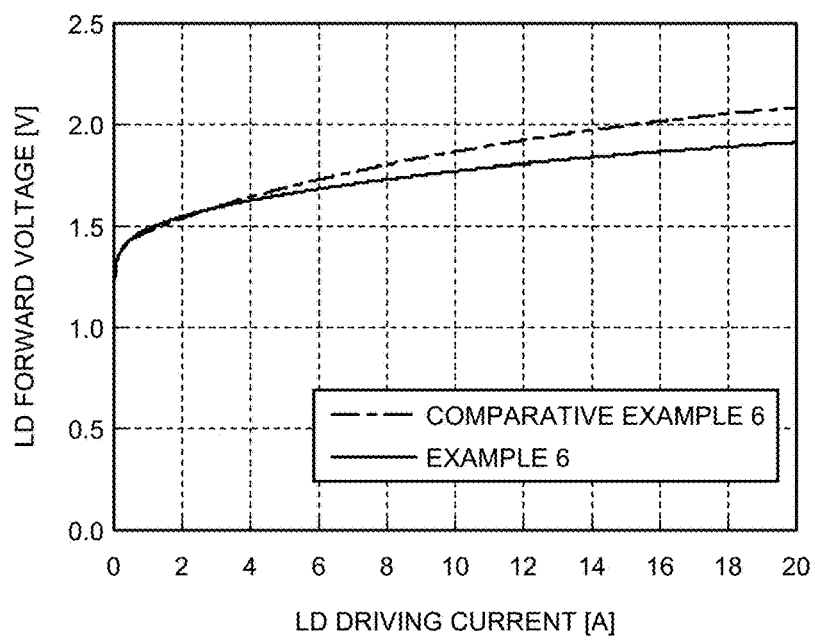
FIG. 99 is a schematic illustrating current-voltage characteristics of a semiconductor laser element according to Example 6 and a semiconductor laser element according to Comparative Example 6.

FIG. 99 is a schematic illustrating current-voltage characteristics of the semiconductor laser element according to Example 6 and the semiconductor laser element according to Comparative Example 6. The relation between a voltage E [volts], a resistance R [ohms], and a current I [amperes] is expressed as follows, based on Ohm's law:

$$E = R \times I \qquad (1).$$

As indicated by FIG. 99 representing the resistance R as a gradient, the semiconductor laser element 12100 according to Example 6 has a smaller resistance R than the semiconductor laser element according to Comparative Example 6.

Figure 100:
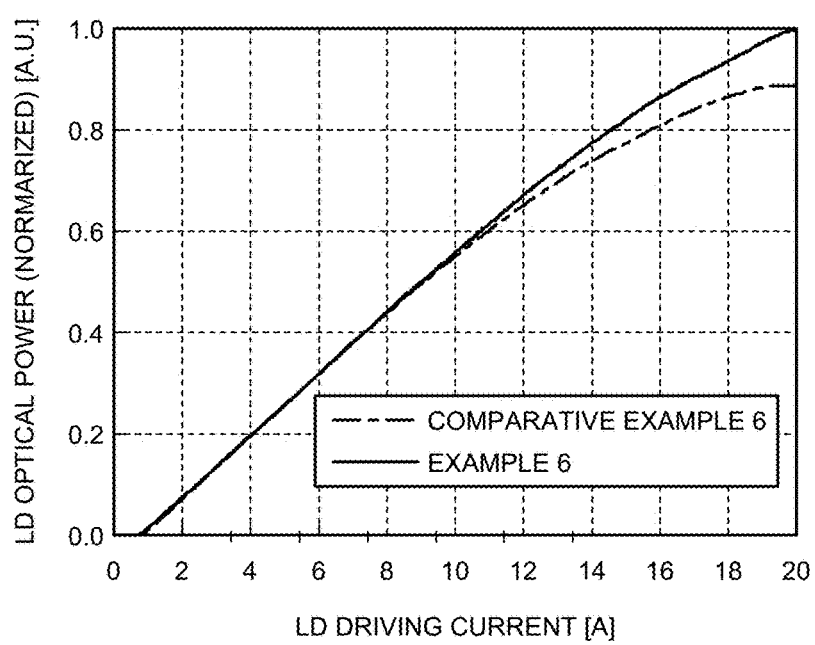
FIG. 100 is a schematic illustrating current-optical power characteristics of the semiconductor laser element according to Example 6 and the semiconductor laser element according to Comparative Example 6.

FIG. 100 is a schematic illustrating current-optical power characteristics of the semiconductor laser element according to Example 6 and the semiconductor laser element according to Comparative Example 6. As indicated by FIG. 100, when a current is higher, the optical power output from the semiconductor laser element 12100 according to Example 6 is higher than that from the semiconductor laser element according to Comparative Example 6.

The input power $P_E$ [watts] input for the semiconductor laser element can be calculated by the following equation:

$$P_E = E \times I \qquad (2).$$

A power conversion efficiency $E_f$ [percent] representing an optical power with respect to a power input to the semiconductor laser element can be calculated by the following equation, denoting the normalized optical power by $P_o$. The optical power is normalized by representing the optical power detected by the photodiode as 1 when a current of 20 [amperes] is injected as an LD driving current.

$$E_f = (P_o / P_E) \times 100 \text{ percent} \qquad (3)$$

In this manner, the power conversion efficiency $E_f$ can be calculated. For example, when the LD driving current is [amperes], the power conversion efficiency $E_f$ in Example 6 can be calculated as 2.90 [%/W]. Similarly, when the LD driving current is 16 [amperes], the power conversion efficiency $E_f$ of Comparative Example 6 can be calculated as 2.54 [%/W]. Example 6 has a power conversion efficiency $E_f$ improved by 14 [percent], compared with Comparative Example 6. Similarly, when the LD driving current is 20 [amperes], the power conversion efficiency $E_f$ of Example 6 can be calculated as 2.61 [%/W], and the power conversion efficiency $E_f$ of Comparative Example 6 can be calculated as 2.13 [%/W], representing an improvement of 23 [percent] or so.

Based on the above, the semiconductor laser element 12100 according to Example 6, in which an increase of the contact resistance is suppressed by bringing the upper electrode 10017 into contact with the p-type contact layer 12013 doped with C, has been proven to be a semiconductor laser element with higher power conversion efficiency.

Eleventh Embodiment

Figure 101:
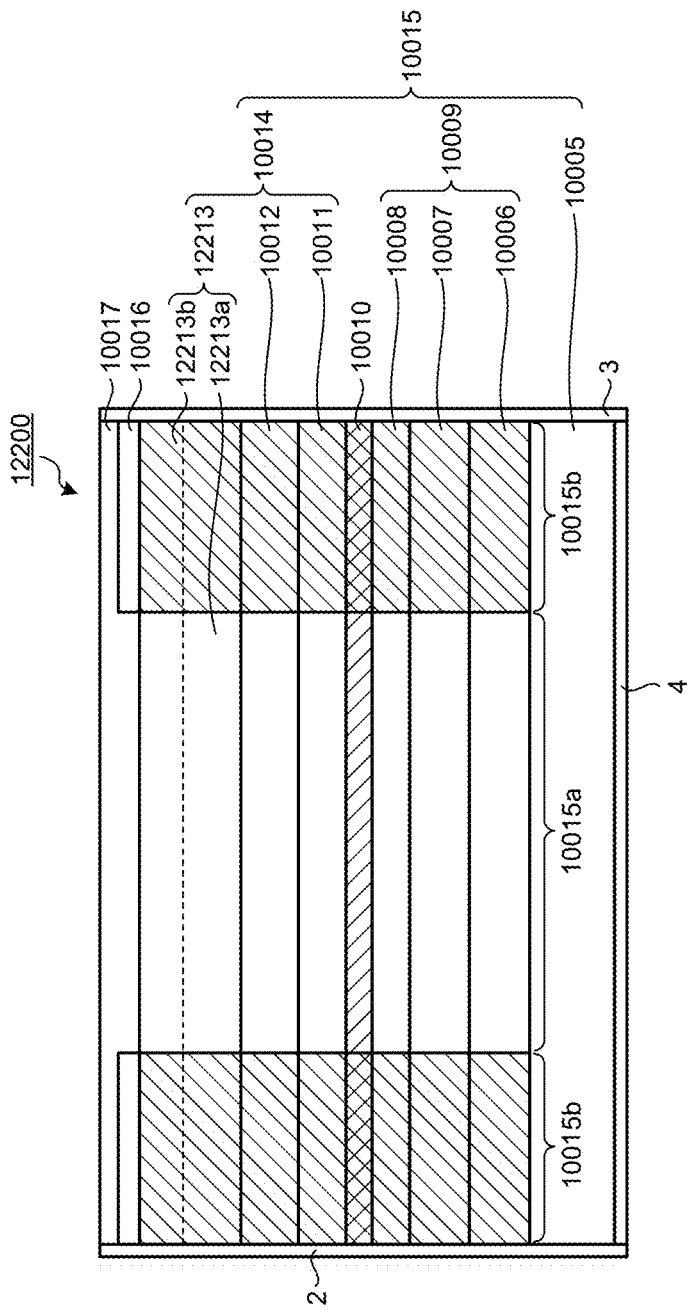
FIG. 101 is a cross-sectional view along the y-z plane in a semiconductor laser element according to an eleventh embodiment of the present invention.

A semiconductor laser element according to a eleventh embodiment of the present invention will now be explained. FIG. 101 is a cross-sectional view along the y-z plane in the semiconductor laser element according to the eleventh embodiment. In the semiconductor laser element 12200 according to the eleventh embodiment, a p-type contact layer 12213 has two layers including a p-type contact layer 12213a and a p-type contact layer 12213b, unlike the p-type contact layer in the semiconductor laser element 12100 according to the tenth embodiment. The p-type contact layer 12213 also has a structure in which the p-type contact layer 12213a is doped with Zn, and the p-type contact layer 12213b is doped with C.

In the semiconductor laser element 12200 according to the eleventh embodiment, the p-type contact layer 12213b doped with C with a lower diffusion+coefficient is provided as the topmost layer region of the semiconductor layer portion 10015. The upper electrode 10017 can therefore be brought into contact with the p-type contact layer 12213b doped with C with a lower diffusion coefficient, without performing the impurity diffusion layer removing process in which the impurity diffusion layer 10031 doped with Zn is removed after the annealing process, as in the tenth embodiment. With this structure, the contact resistance is increased less by the RTA.

Figure 102:
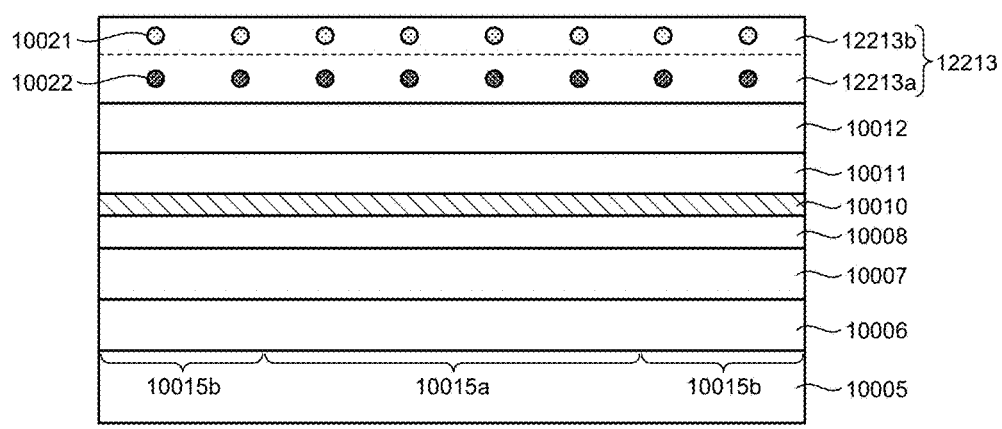
FIG. 102 is a schematic for explaining an exemplary method for manufacturing a semiconductor laser element according to the eleventh embodiment.

FIG. 102 is a schematic for explaining an exemplary method for manufacturing a semiconductor laser element according to the eleventh embodiment. As illustrated in FIG. 102, for the semiconductor layer structure according to the eleventh embodiment, during the semiconductor layer structure forming process in the exemplary method for manufacturing the semiconductor laser element 12100 according to the tenth embodiment, the p-type contact layer is formed as two layers, and the p-type contact layer 12213a that is the lower layer is doped with Zn 10022, and the p-type contact layer 12213b that is the upper layer is doped with C 10021, without depositing the impurity diffusion layer 10031. The promoting film is then deposited following the same promoting film forming process as that in the tenth embodiment, and the suppressing film is deposited in the suppressing film forming process. The semiconductor layer structure is then annealed to induce disordering and form the non-window region 10015a and the window region 10015b. The ridge structure forming process is then performed, without performing the impurity diffusion layer removing process, and the final semiconductor laser element 12200 is achieved thereby.

Example 7

As Example 7, a semiconductor laser element having the structure of the semiconductor laser element 12200 according to the eleventh embodiment was manufactured, and currents, voltages, and optical powers were measured in the same manner as in Example 6. The power conversion efficiency was then compared with that of the semiconductor laser element according to Comparative Example 6. This semiconductor laser element according to Example 7 exhibited higher power conversion efficiency than the semiconductor laser element according to Comparative Example 6.

Twelfth Embodiment

Figure 103:
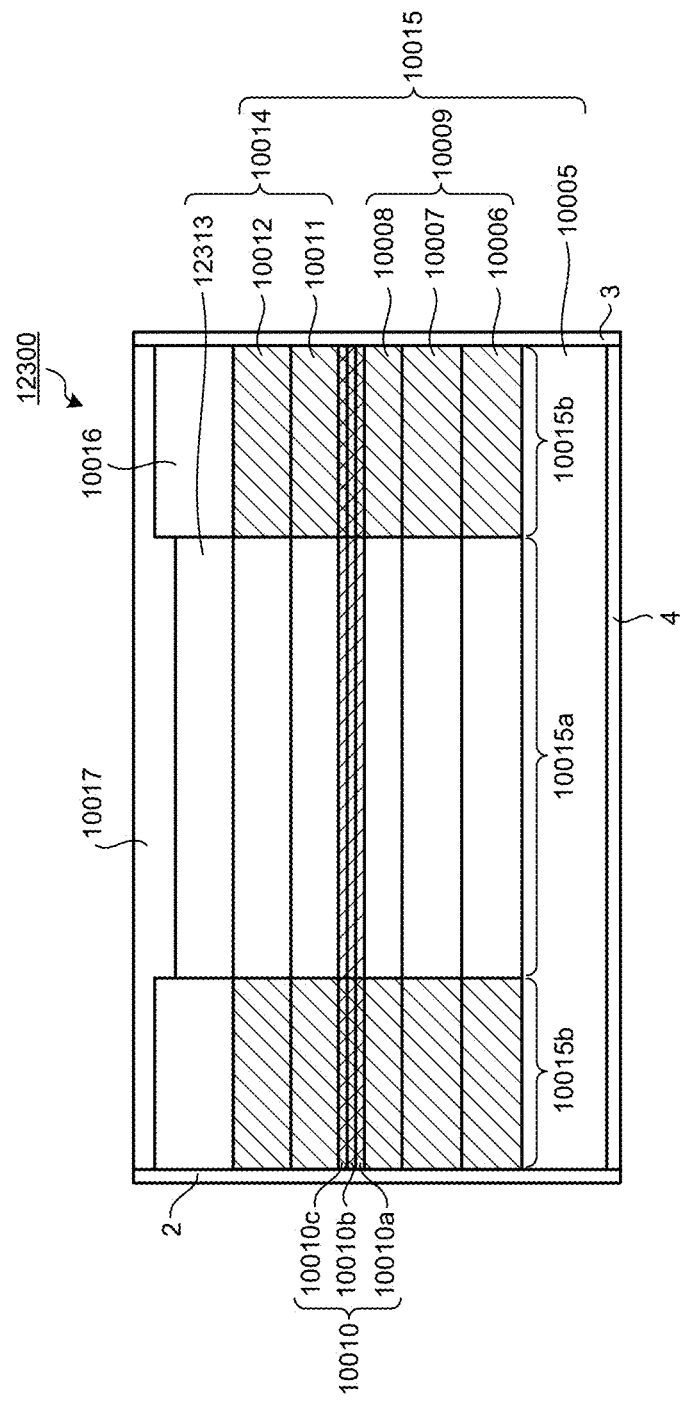
FIG. 103 is a cross-sectional view along the y-z plane in a semiconductor laser element according to a twelfth embodiment of the present invention.

A semiconductor laser element according to a twelfth embodiment of the present invention will now be explained. FIG. 103 is a cross-sectional view along the y-z plane in the semiconductor laser element according to the twelfth embodiment. The semiconductor laser element 12300 according to the twelfth embodiment has a structure of the semiconductor laser element 12100 according to the tenth embodiment except that the p-type contact layer (p-type contact layer 10313) is removed from the window region 10015b.

Figure 104:
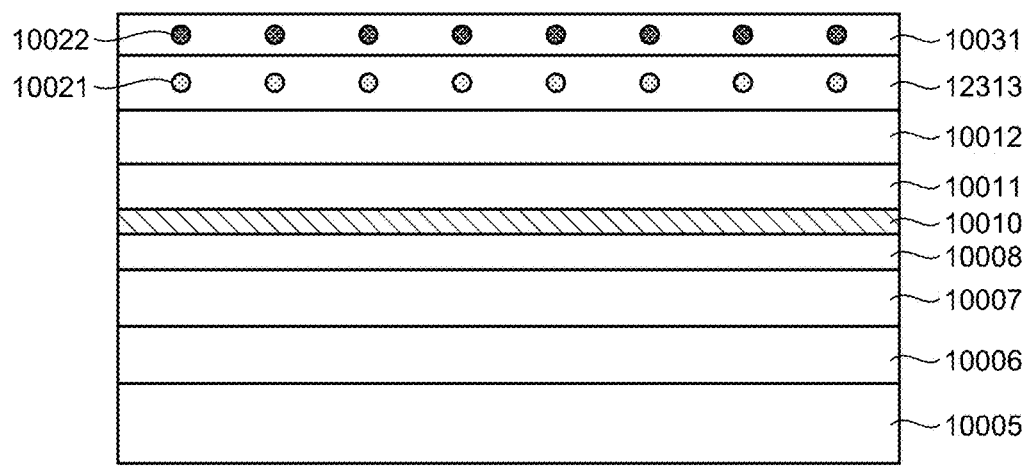
FIG. 104 is a schematic for explaining an exemplary method for manufacturing a semiconductor laser element according to the twelfth embodiment.
Figure 105:
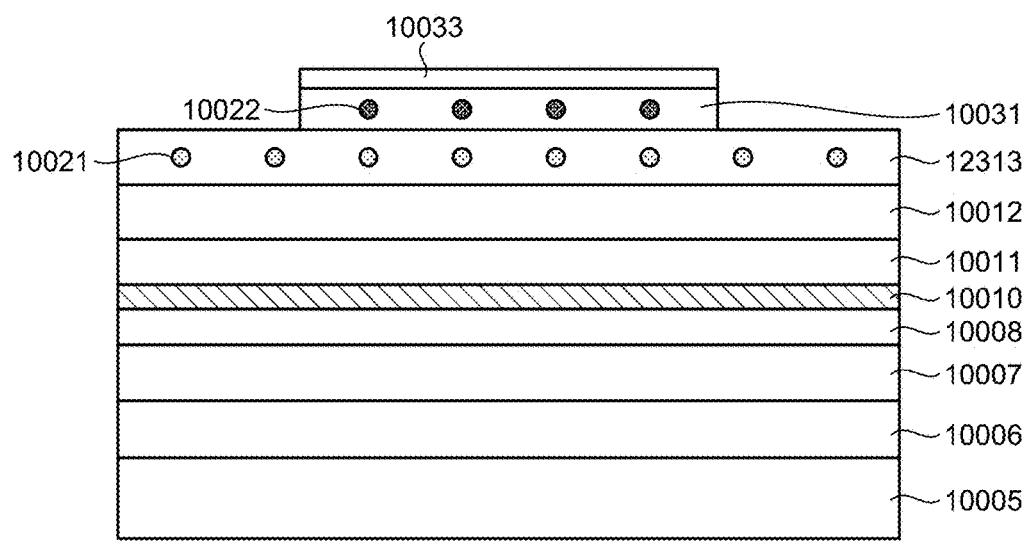
FIG. 105 is a schematic for explaining the exemplary method for manufacturing a semiconductor laser element according to the twelfth embodiment.
Figure 106:
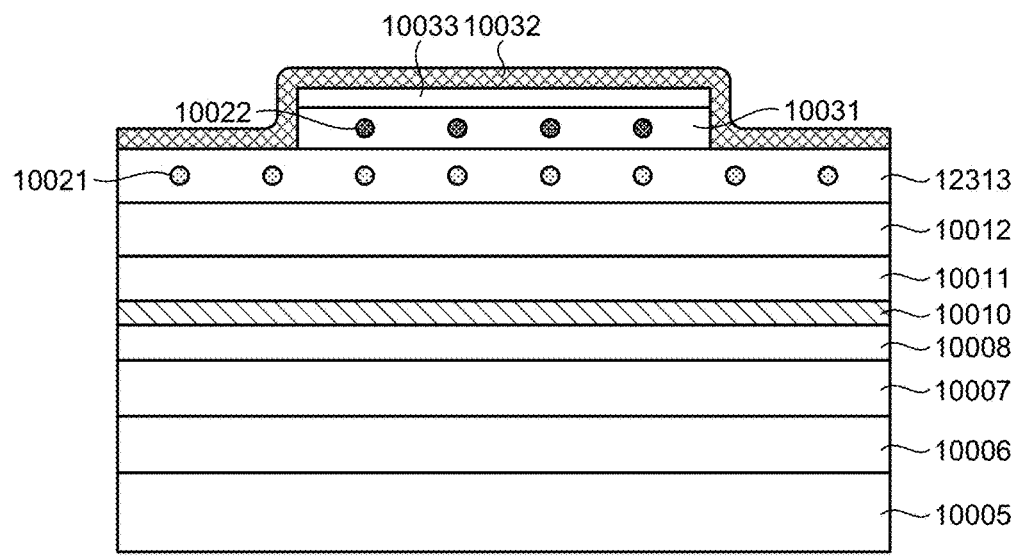
FIG. 106 is a schematic for explaining the exemplary method for manufacturing a semiconductor laser element according to the twelfth embodiment.
Figure 107:
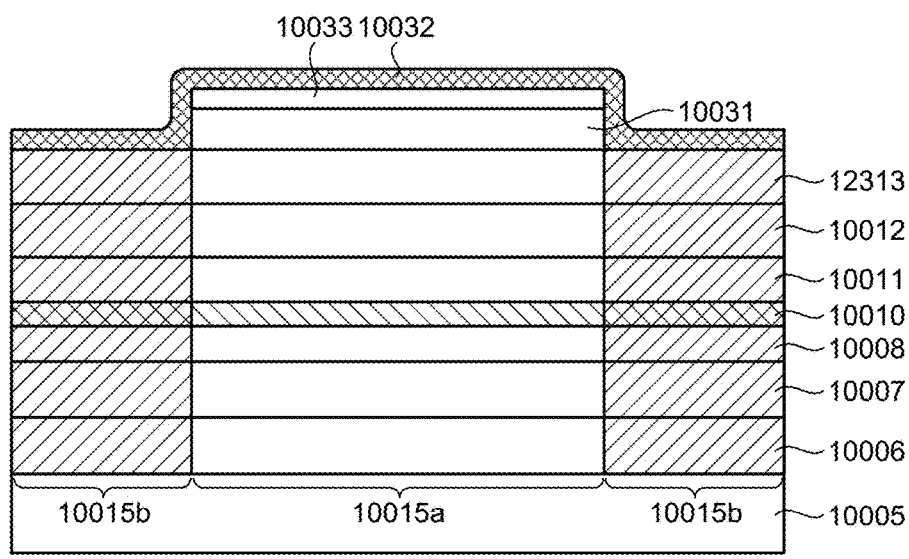
FIG. 107 is a schematic for explaining the exemplary method for manufacturing a semiconductor laser element according to the twelfth embodiment.
Figure 108:
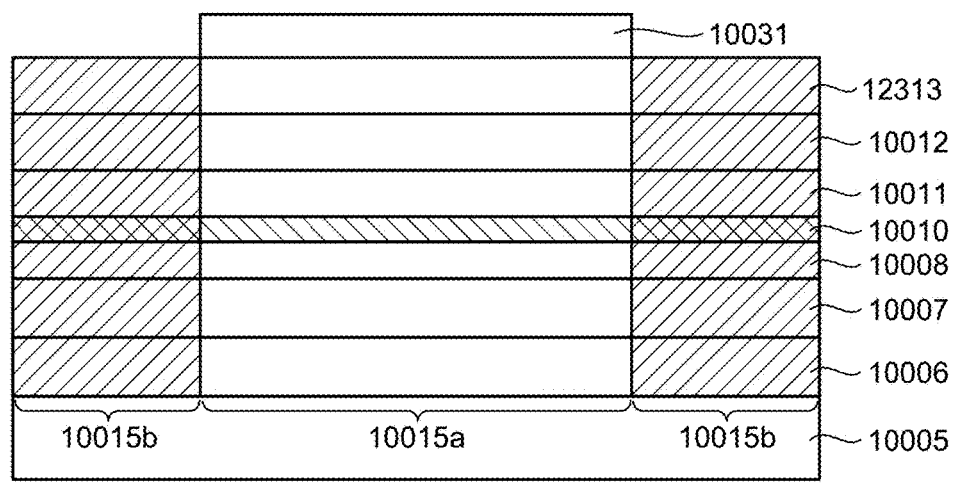
FIG. 108 is a schematic for explaining the exemplary method for manufacturing a semiconductor laser element according to the twelfth embodiment.
Figure 109:
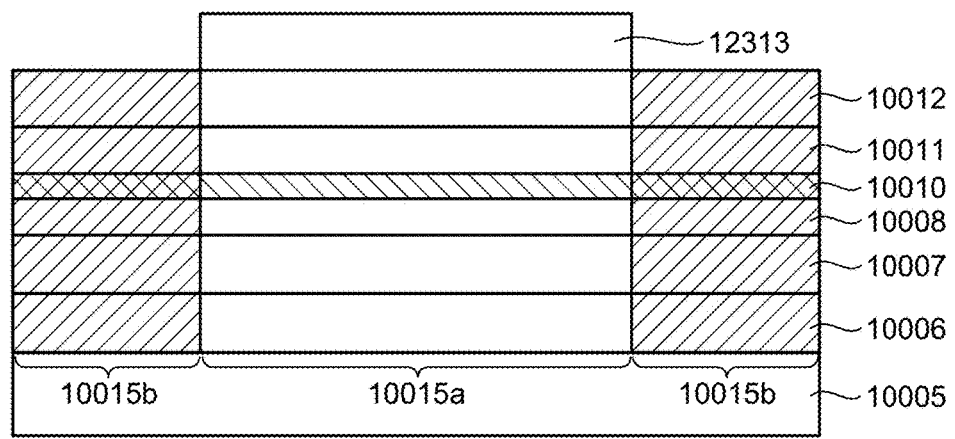
FIG. 109 is a schematic for explaining the exemplary method for manufacturing a semiconductor laser element according to the twelfth embodiment.

FIGS. 104 to 109 are schematics for explaining the exemplary method for manufacturing a semiconductor laser element according to the twelfth embodiment. To begin with, in the same manner as in the semiconductor layer structure forming process according to the tenth embodiment, the layers up to the p-type cladding layer 10012 are deposited on the substrate 10005, and a p-type contact layer 12313 doped with C 10021 is then provided. The impurity diffusion layer 10031 doped with Zn 10022 is then formed, as illustrated in FIG. 104. The suppressing film 10033 is then deposited on the region corresponding to the non-window region 10015a, unlike the method for manufacturing the semiconductor laser element 10100 according to the third embodiment. The impurity diffusion layer 10031 is then removed by etching, from the region corresponding to the window region 10015b, using the suppressing film 10033 as a mask, as illustrated in FIG. 105. As a result of this process, a larger amount of Zn 10022 that is the first impurity is contained in the non-window region 10015a than that in the window region 10015b. The promoting film 10032 is then deposited as illustrated in FIG. 106. Produced then with the RTA are the window region 10015b in which disordering in the active layer 10010 took place, and the non-window region 10015a in which disordering in the active layer 10010 was suppressed, as illustrated in FIG. 107. The promoting film 10032 and the suppressing film 10033 are then removed, as illustrated in FIG. 108. The p-type contact layer 10313 in the window region 10015b and the impurity diffusion layer 10031 in the non-window region 10015a are removed by etching, as illustrated in FIG. 109. The ridge structure forming process and the like are then performed, in the same manner as in the tenth embodiment, and the final semiconductor laser element 12300 is achieved thereby.

In the semiconductor laser element 12300 according to the twelfth embodiment, by removing the impurity diffusion layer 10031 from the region corresponding to the window region 10015b before the RTA, the p-type semiconductor layer section 10014 in the non-window region 10015a is allowed to contain more Zn 10022 that is the first impurity than that in the p-type semiconductor layer section 10014 in the window region 10015b. Furthermore, when Zn is used as a dopant together with C, Zn functions as the suppressing species that inhibits disordering. With this structure, disordering is suppressed in the non-window region 10015a in which the Zn content of the p-type semiconductor layer section 10014 is high, and disordering is not suppressed in the window region 10015b in which the Zn content of the p-type semiconductor layer section 10014 is low. Therefore, the band gap energy difference between the non-window region 10015a and the window region 10015b is increased, a smaller amount of laser light is absorbed at the facet of the semiconductor element, and the risk of COD is reduced.

In the semiconductor laser element 12300 according to the twelfth embodiment, the p-type contact layer 12313 in the window region 10015b and the impurity diffusion layer 10031 in the non-window region 10015a are removed after the RTA. With this structure, the impurity diffusion layer 10031 doped with Zn with a higher diffusion coefficient is removed, and the p-type contact layer 12313 doped with C with a lower diffusion coefficient is brought into contact with the upper electrode 10017. As a result, the contact resistance is increased less by the RTA. This structure is more preferable in that disordering can be suppressed in the non-window region 10015a and the contact resistance can be reduced at the same time, because the first impurity that is the suppressing species has a larger diffusion coefficient than the second impurity. The surface of the window region 10015b may be the p-type contact layer 12313a, but is preferably the p-type cladding layer 10012 made of AlGaAs with a high resistance so that the effect of current injection into the non-window region 10015a can be further improved. Furthermore, it is preferable to set the gross impurity content of the topmost layer region in the non-window region higher than the amount of impurity with which the topmost layer region in the window region is doped so that the effect of current injection can be further improved.

To summarize the relation between the impurity concentrations of the topmost layer regions in the non-window region 10015a and in the window region 10015b, while the topmost layer region in the non-window region 10015a has a lower impurity concentration than that in the topmost layer region in the window region 10015b before the RTA, the topmost layer region in the non-window region 10015a has a higher impurity concentration than the topmost layer region in the window region 10015b after the RTA, because the p-type contact layer 12313 and the impurity diffusion layer 10031 are removed from the window region 10015b and the non-window region 10015a, respectively.

Example 8

As Example 8, a semiconductor laser element having the structure of the semiconductor laser element 12300 according to the twelfth embodiment was manufactured, and currents, voltages, and optical powers were measured in the same manner as in Example 6. The power conversion efficiency was then compared with that of the semiconductor laser element according to a comparative example, and this semiconductor laser element according to Example 8 exhibited higher power conversion efficiency than the semiconductor laser element according to the comparative example.

Thirteenth Embodiment

Figure 110:
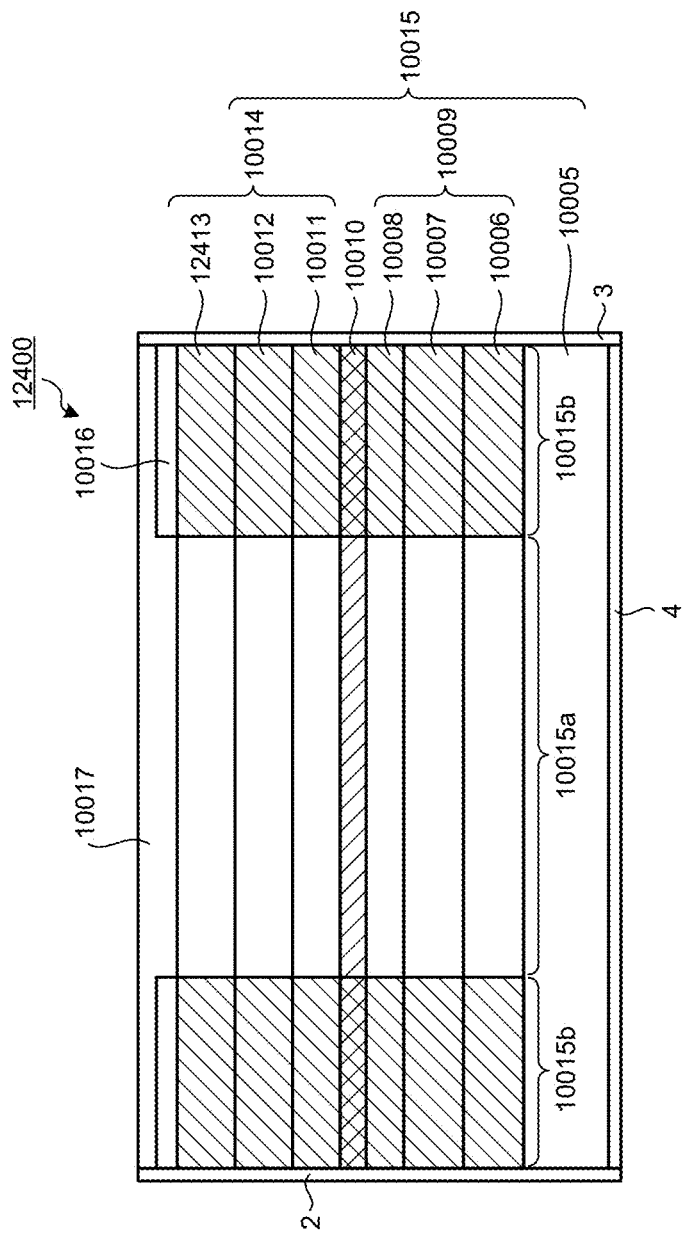
FIG. 110 is a cross-sectional view along the y-z plane in a semiconductor laser element according to a thirteenth embodiment of the present invention.

A semiconductor laser element according to an thirteenth embodiment of the present invention will now be explained. FIG. 110 is a cross-sectional view along the y-z plane in the semiconductor laser element according to the thirteenth embodiment. In the semiconductor laser element 12400 according to the thirteenth embodiment, a p-type contact layer 12413 has only one layer in the deposition direction, and the p-type contact layer 12413 is doped with both C and Zn.

Figure 111:
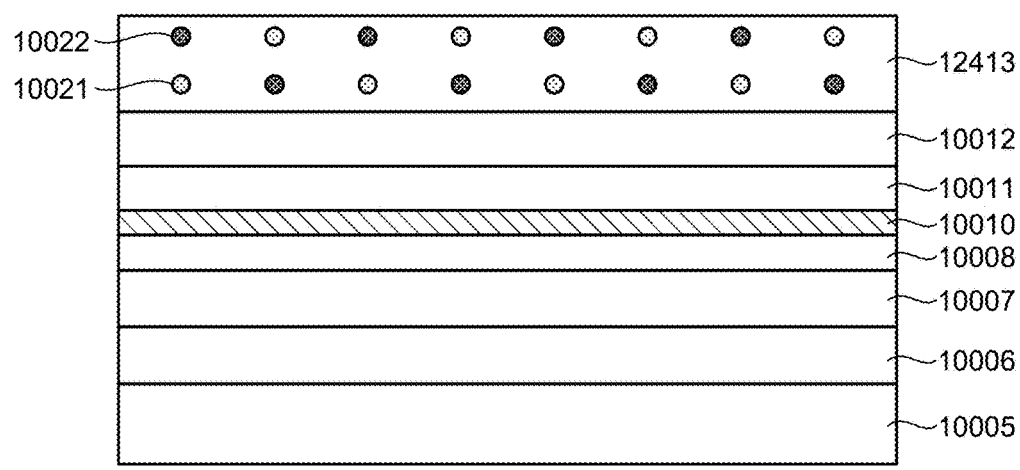
FIG. 111 is a schematic for explaining an exemplary method for manufacturing a semiconductor laser element according to the thirteenth embodiment.

FIG. 111 is a schematic for explaining an exemplary method for manufacturing a semiconductor laser element according to the thirteenth embodiment. As illustrated in FIG. 111, in the semiconductor laser element 12400 according to the thirteenth embodiment, in the semiconductor layer structure forming process, the p-type contact layer 12413 is doped with both C 10021 and Zn 10022. The impurity diffusion layer 10031 is not provided. The processes from the promoting film forming process to the ridge structure forming process (except for the impurity diffusion layer removing process) are then performed in the same manner as in the tenth embodiment, and the final semiconductor laser element 12400 is achieved thereby.

In the semiconductor laser element 12400 according to the thirteenth embodiment, the Zn concentration, Zn having a higher diffusion coefficient, is significantly reduced in the p-type contact layer 12413 by the RTA, but the C concentration, C having a lower diffusion coefficient, does not change so much. Therefore, the semiconductor laser element 12400 has a structure in which contact resistance increases less easily than a structure in which the upper electrode is brought into contact with a p-type contact layer doped only with Zn.

Example 9

As Example 9, a semiconductor laser element having the structure of the semiconductor laser element 12400 according to the thirteenth embodiment was manufactured, and currents, voltages, and optical powers were measured in the same manner as in Example 6. The power conversion efficiency was then compared with that of the semiconductor laser element according to a comparative example, and this semiconductor laser element according to Example 9 exhibited higher power conversion efficiency than the semiconductor laser element according to the comparative example.

As this result indicates, the semiconductor laser element according to this example is capable of suppressing an increase in the contact resistance resulting from the RTA, so that a semiconductor laser element with high luminous efficacy can be provided.

While the p-type contact layer is explained to be included in the topmost layer region of the semiconductor layer portion in the embodiments described above, the topmost layer region of the semiconductor layer portion is a region with which the upper electrode is brought into contact and that affects the contact resistance, and therefore, the topmost layer region may include the p-type cladding layer and some layers below the p-type cladding layer.

In the embodiment described above, when the first conductivity type is the p-type, C and Zn are used as an example of the p-type first impurity or the second impurity, but the p-type first or second impurity may be Mg or Be, for example, and two or more impurities may be used as dopants. Because these impurities have higher diffusion coefficients in the order of Zn>Be>Mg>C, the impurity(ies) to be contained in the topmost layer region may be selected as appropriate. As mentioned earlier, Zn has a diffusion coefficient of $10^{-8}$ cm$^2$/s or so, and C has a diffusion coefficient of $10^{-15}$ cm$^2$/s or so at 900 degrees Celsius, for example. The diffusion coefficient changes depending on the type of the semiconductor crystal or constituent atoms, but the diffusion coefficient of an impurity with a higher diffusion coefficient is preferably within a range of $10^{-6}$ to $10^{-10}$ cm²/S. The diffusion coefficient of an impurity with a lower diffusion coefficient is preferably within a range of $10^{-11}$ to $10^{-16}$ cm²/s. The difference in the diffusion coefficient between the impurity with a lower diffusion coefficient and that with a higher diffusion coefficient is preferably $10^1$ cm²/s or more.

When the first conductivity type is the n-type, the n-type first or second impurity may be Si, C, Ge, Sn, S, or Se, for example, and two or more impurities may be used as dopants. By allowing the topmost layer region of the semiconductor layer portion 10015 to have a higher impurity content with a lower diffusion coefficient, a contact resistance increase resulting from the RTA can be suppressed. Because these impurities have higher diffusion coefficients in the order of Sn>Si, Ge, and S>Se>C, the impurity(ies) to be contained in the topmost layer region may be selected as appropriate.

Fourteenth Embodiment

Figure 112A:
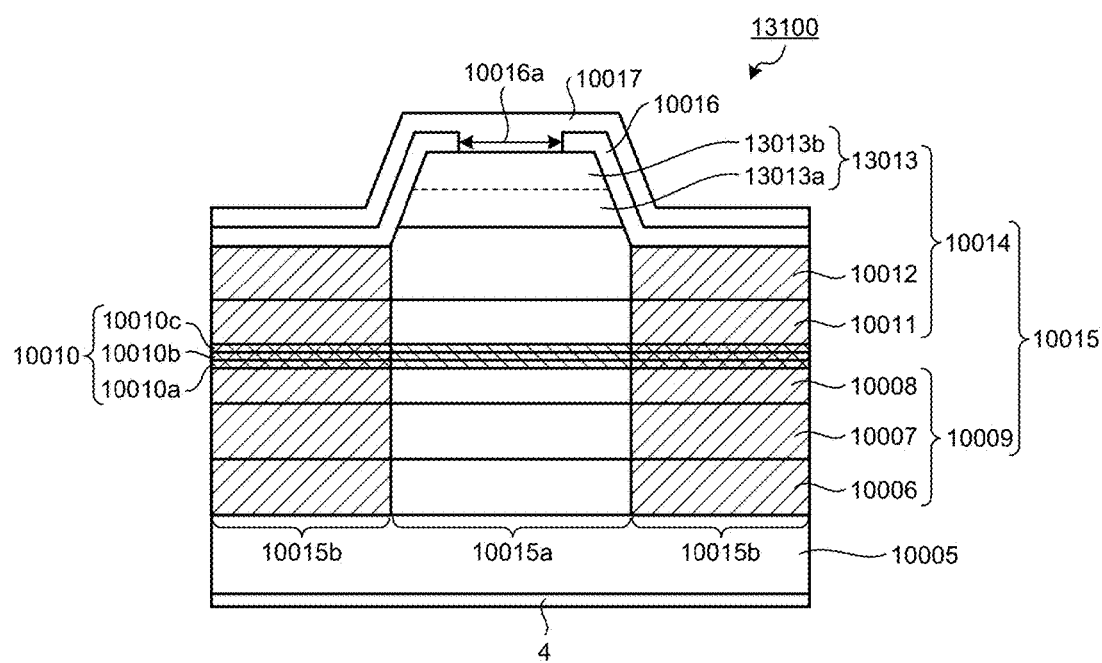
FIG. 112A is a cross-sectional view along the x-y plane in a semiconductor element that can be fabricated with the manufacturing method according to a fourteenth embodiment of the present invention.
Figure 112B:
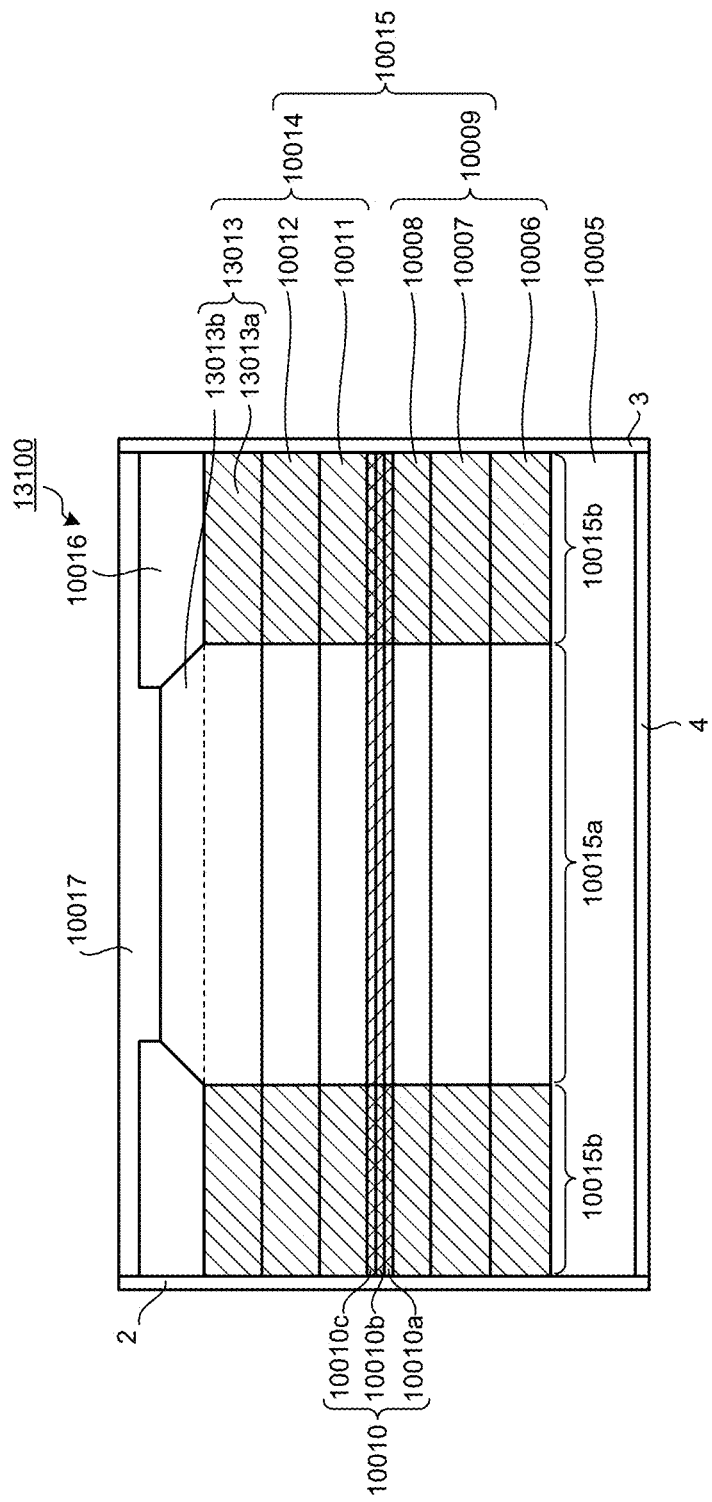
FIG. 112B is a cross-sectional view along the y-z plane in the semiconductor element that can be fabricated with the manufacturing method according to the fourteenth embodiment.

FIG. 112A is a cross-sectional view along the x-y plane in a semiconductor laser element that is a semiconductor element that can be manufactured with a method for manufacturing a semiconductor element according to a fourteenth embodiment of the present invention. FIG. 112B is a cross-sectional view along the y-z plane in the semiconductor element that can be manufactured with the method for manufacturing a semiconductor element according to the fourteenth embodiment. As illustrated in FIG. 112A, this semiconductor element 13100 is provided with the semiconductor layer portion 10015 including the substrate 10005 the bottom surface of which is provided with the lower electrode 4, and the n-type semiconductor layer section 10009, the active layer 10010, and the p-type semiconductor layer section 10014 p-type semiconductor layer section 10014. The n-type semiconductor layer section 10009 includes the n-type buffer layer 10006, the n-type cladding layer 10007, and the n-type guide layer 10008. The p-type semiconductor layer section 10014 includes the p-type guide layer 10011, the p-type cladding layer 10012, and a p-type contact layer 12013. The n-type semiconductor layer section 10009, the active layer 10010, and the p-type semiconductor layer section 10014 p-type semiconductor layer section 10014 are sequentially formed on the substrate 10005 substrate 10005. The p-type contact layer 13013 has a trapezoidal cross section, and has stripes extending in the z-axial direction. This p-type contact layer 13013 provides the ridge structure to the semiconductor element 13100. The semiconductor laser element 3100 also includes the insulating film 10016 that is formed on the p-type semiconductor layer section 10014, and the upper electrode 10017 that is a p-side electrode that is brought into contact with the p-type contact layer 13013 via a part of the upper base of the trapezoidal ridge structure, the part being not provided with the insulating film 10016.

The p-type contact layer 13013 has a p-type contact layer 13013a made of GaAs doped with C at a concentration of $1.0 \times 10^{17}$ cm⁻³ to $5.0 \times 10^{19}$ cm⁻³ to $5 \times 10^{20}$ cm⁻³ or so, for example, and a p-type contact layer 13013b made of GaAs doped with Zn at a concentration of $1.0 \times 10^{17}$ cm⁻³ to $5.0 \times 10^{19}$ cm⁻³ to $5 \times 10^{20}$ cm⁻³ or so, for example. C and Zn diffuse across the p-type semiconductor layer section 10014 during the RTA in the manufacture process.

In the fourteenth embodiment, C functions as the promoting species, and Zn functions as the suppressing species.

In the semiconductor element 13100, because the facet from which the laser light is output is disordered as the window region, the window region has larger band gap energy than the non-window region, and the window region has become transparent to the emission wavelength, so that a smaller amount of laser light is absorbed at the facet. Therefore, a reliable semiconductor laser element with a lower risk of COD is provided.

Figure 113:
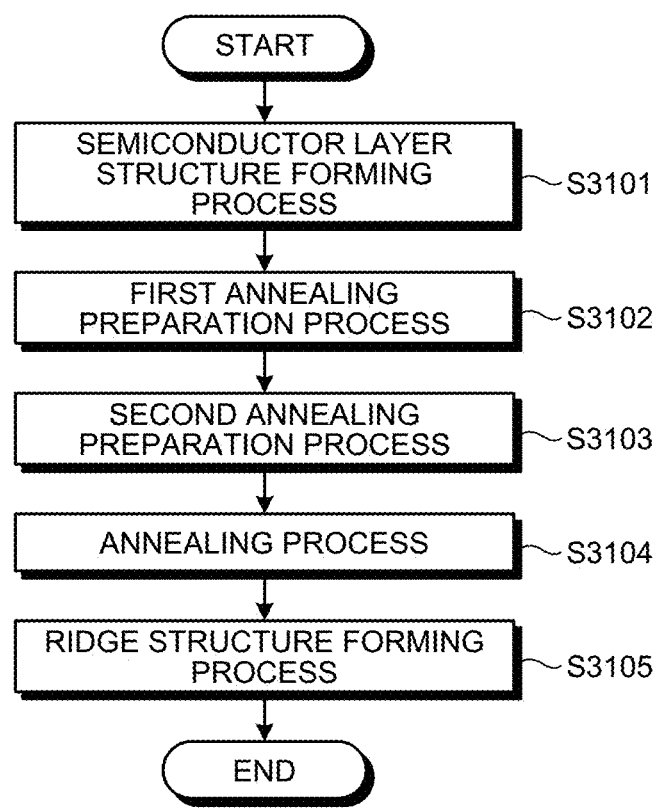
FIG. 113 is a flowchart of the method for manufacturing a semiconductor element.

As the fourteenth embodiment, a method for manufacturing the semiconductor element 13100 will now be explained. FIG. 113 is a flowchart of the method for manufacturing the semiconductor element. As illustrated in FIG. 113, the method for manufacturing the semiconductor element 13100 according to the fourteenth embodiment includes a semiconductor layer structure forming process (Step S3101), a first annealing preparation process (Step S3102), a second annealing preparation process (Step 3103), an annealing process (Step S3104), and a ridge structure forming process (Step S3105).

Each of these processes will now be explained. The values specified in these processes are merely exemplary, and the embodiment is not limited thereto.

Semiconductor Layer Structure Forming Process

Figure 114:
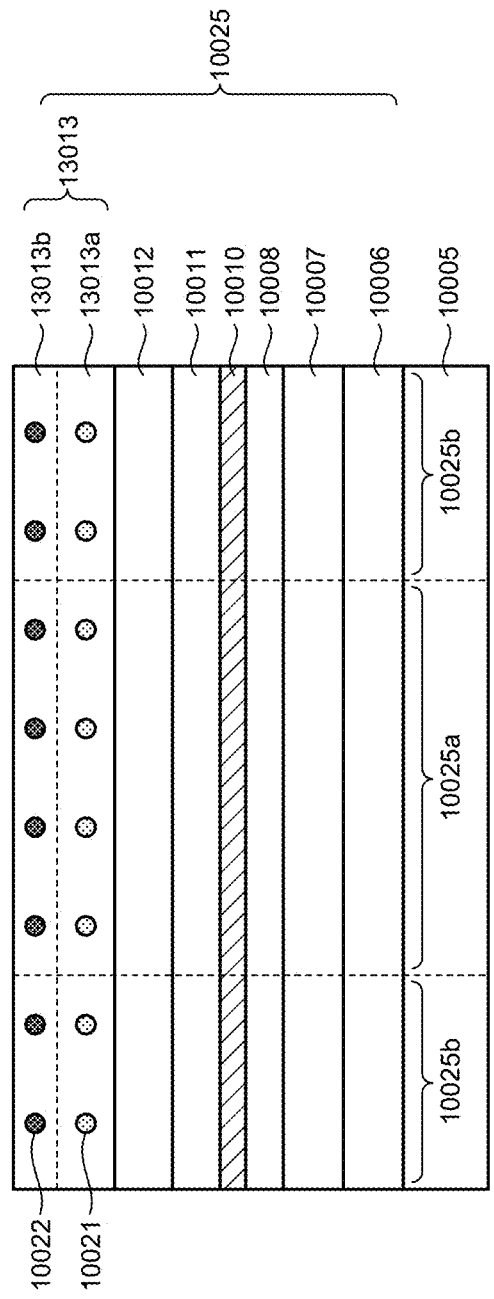

To begin with, the semiconductor layer structure forming process at Step S3101 will now be explained. In this process, to begin with, as illustrated in FIG. 114, the n-type buffer layer 10006, the n-type cladding layer 10007, the n-type guide layer 10008, the active layer 10010, the p-type guide layer 10011, the p-type cladding layer 10012, and the p-type contact layer 13013 are epitaxially grown on the substrate 10005 through MOCVD. The p-type contact layer 13013a is doped with C 10021, and the p-type contact layer 13013b is doped with Zn 10022. In the semiconductor layer structure 10025, the region that is to be the non-window region 10015a is referred to as a first region 10025a, and the region that is to be the window region 10015b is referred to as a second region 10025b. Through this process, the semiconductor layer structure 10025 having the active layer 10010 is produced.

First Annealing Preparation Process

The first annealing preparation process at Step S3102 will now be explained. In this process, a part of the semiconductor layer structure 10025 is removed by etching, so that the second region 10025b contains less Zn 10022 that is the first impurity having a function of suppressing atomic vacancy diffusion than in the first region 10025a. Preferably, the p-type contact layer 13013b containing Zn is completely removed from the second region 10025b. With this process, disordering in the active layer 10010 is promoted in the second region 10025b that is to be the window region 10015b, than in the first region 10025a that is to be the non-window region 10015a, during the subsequent annealing process, in the semiconductor layer structure 10025.

Figure 115:
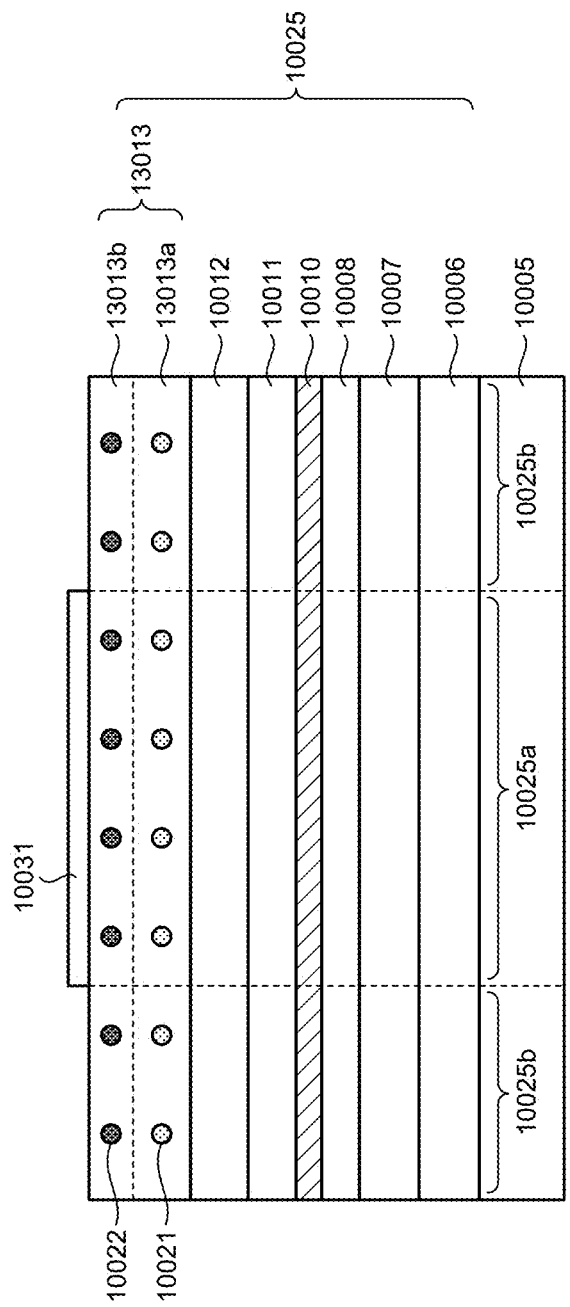
Figure 116:
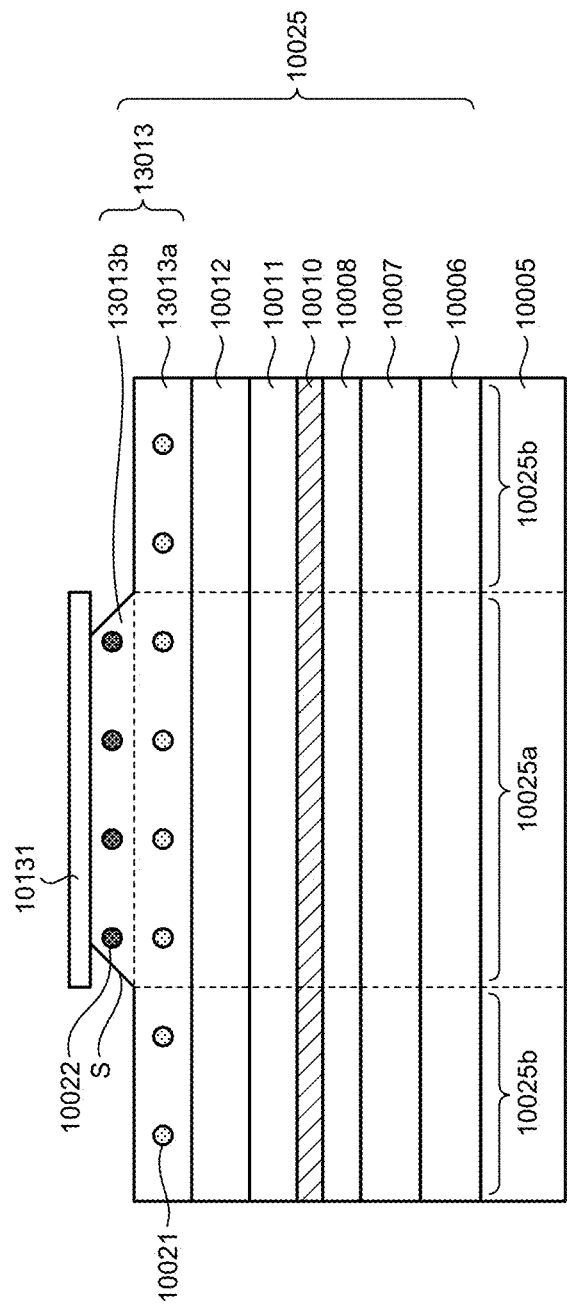

To begin with, as illustrated in FIG. 115, the photoresist 10131 photoresist 10131 is applied to the top surface of the first region 10025a of the semiconductor layer structure 10025 with a photolithography process. The p-type contact layer 13013b in the second region 10025b is then removed by etching, as illustrated in FIG. 116. An inclined surface S having an inclination with respect to the y axis is preferably provided along the border between the first region 10025a and the second region 10025b, as illustrated in FIG. 116. More preferably, the inclined surface S along the border is inclined by 30 degrees or more with respect to the y axis that is the deposition direction of the semiconductor layer structure 10025. With an inclination of 30 degrees or more, a dielectric film having a film quality and a film thickness equivalent to that to be deposited on a planar surface can be achieved on the inclined surface S. The inclination with respect to the y axis can be increased by reducing the etching rate. In particular, the etching rate may be set to 3 nm/sec or lower to achieve an inclination of 30 degrees or more with respect to the y axis along the border between the first region 10025a and the second region 10025b.

The photoresist 10131 is then removed. At this time, Zn 10022 suppressing disordering is less contained in the second region 10025b than in the first region 10025a. Disordered crystals grow in the active layer 10010 by the annealing more easily in the second region 10025b than in the first region 10025a as described later.

Second Annealing Preparation Process

Figure 117:
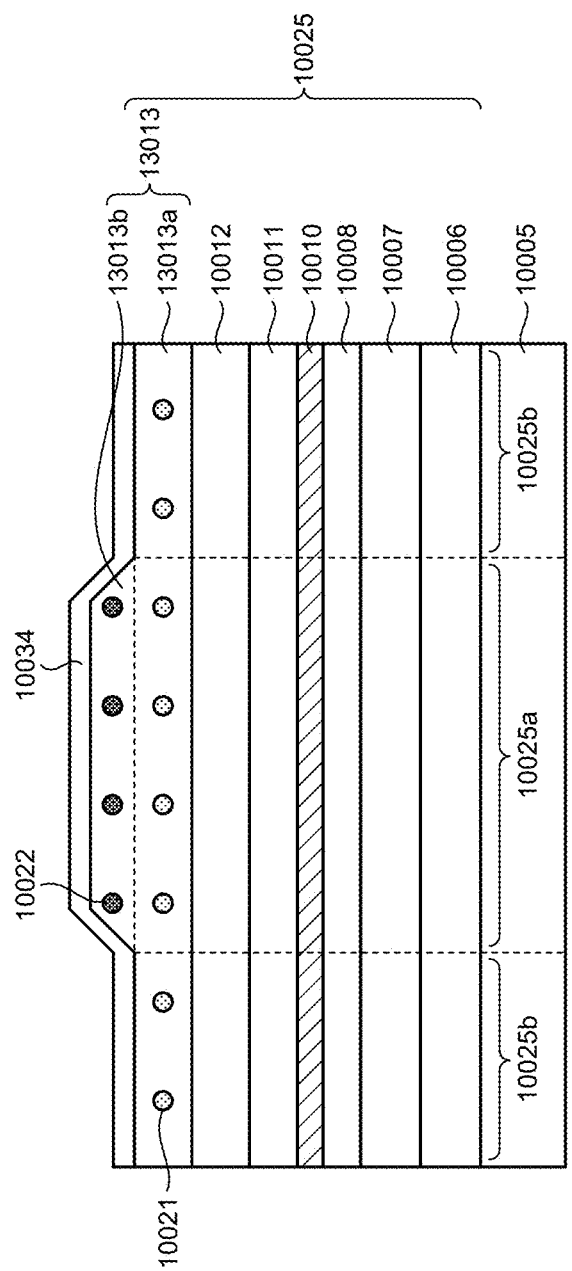
Figure 118:
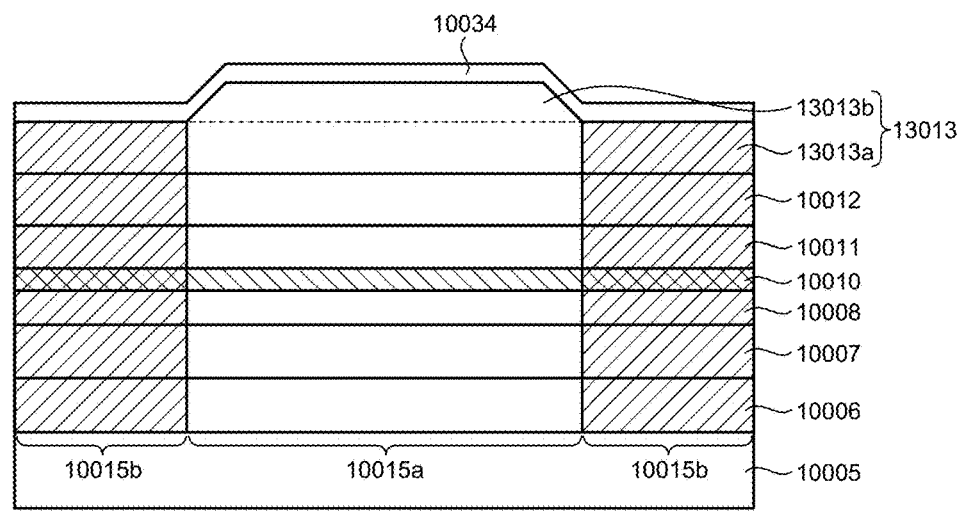

The second annealing preparation process at Step S3103 will now be explained. In this process, the topmost surface of the first region 10025a and the topmost surface of the second region 10025b are brought into contact with a uniform medium. In other words, as illustrated in FIG. 117, a dielectric film 10034 that is a SiN insulating layer is uniformly deposited on the topmost surface of the semiconductor layer structure 10025 that is partially etched. The areas other than the topmost surface of the first region and the topmost surface of the second region do not necessarily need to be brought into contact with the uniform medium. Before the dielectric film 10034 is deposited, the top surface is preferably cleaned with sulfuric acid or the like to remove any substance attached on the surface.

Annealing Process

The annealing process at Step S3104 will now be explained. In this process, the semiconductor layer structure is annealed over a short time period with the RTA. The semiconductor layer structure is annealed with the RTA for 30 seconds at 850 degrees Celsius, for example. As the semiconductor layer structure is annealed with the RTA, the dielectric film 10034 absorbs the Ga atoms, and atomic vacancies appear on the surface of the p-type contact layer 13013. The atomic vacancies diffuse as the diffusing species, resulting in disordering in the semiconductor layer portion, particularly in the active layer 10010.

In the fourteenth embodiment, C 10021 functions as the second impurity that is the promoting species, and Zn 10022 functions as the first impurity that is the suppressing species. In the first region 10025a, C 10021 promotes disordering in the active layer 10010, and Zn 10022 inhibits disordering in the active layer 10010. In the second region 10025b, C 10021 promotes disordering in the active layer 10010, but the process in which disordering in the active layer 10010 is suppressed by Zn 10022 does not take place. Therefore, the degrees of disordering in the active layer 10010 are different in the first region 10025a in which disordering in the active layer 10010 is suppressed by Zn 10022, and in the second region 10025b not containing Zn 10022. Specifically, the degree of disordering in the active layer 10010 is higher in the second region 10025b than that in the first region 10025a. As a result, different levels of band gap energy can be achieved in the active layer 10010 in the non-window region 10015a formed from the first region 10025a, and in the window region 10015b formed from the second region 10025b.

In the method for manufacturing a semiconductor element according to the fourteenth embodiment, the dielectric film 10034 is uniformly deposited on the first region 10025a and the second region 10025b, and the window region 10015b is made transparent but not the non-window region 10015a so that a semiconductor laser element with a lower risk of COD can be provided. Through this process, as illustrated in FIG. 18, the non-window region 10015a and the window region 10015b are formed. The dielectric film 10034 is then removed.

When a method for forming the suppressing film and the promoting film made of a dielectric film is used to achieve the non-window region and the window region, two films of different compositions need to be formed.

By contrast, in the method for manufacturing a semiconductor element according to the fourteenth embodiment, the first region 10025a and the second region 10025b in the semiconductor layer structure 10025 are made a predetermined difference. With this structure, the non-window region 10015a and the window region 10015b can be achieved despite that provided on both the first region 10025a and the second region 10025b is only one dielectric film 10034 having a uniform composition across the region to be contact with the topmost surface of the first region 10025a and the region to be in contact with the topmost surface of the second region 10025b. The method for manufacturing a semiconductor element according to the fourteenth embodiment is therefore capable of dramatically reducing complexities in the manufacture process compared with the method in which two films with different compositions are formed.

Furthermore, if two films that are the suppressing film and the promoting film are formed on the planer semiconductor layer structure, a step is formed at the border between the suppressing film and the promoting film, and a break where the dielectric film becomes discontinuous may be formed. The topmost surface of the semiconductor layer structure might have some area immediately below the break not covered by the dielectric film. If the semiconductor layer structure is annealed with the area not covered, the topmost surface immediately below the break in the semiconductor layer structure may become rough. Such a surface roughness may deteriorate the performance of the manufactured semiconductor element.

In the method for manufacturing a semiconductor element according to the fourteenth embodiment, because manufactured is only one dielectric film 10034, a continuous film capable of seamlessly covering the surface of the semiconductor layer structure can be easily formed. Therefore, the annealing of the semiconductor layer structure is less likely to cause the evaporation of the semiconductor composition element from the surface immediately below the break not covered by the dielectric film 10034, and to result in surface roughness. In this manner, the method for manufacturing a semiconductor element according to the fourteenth embodiment is capable of preventing or reducing the risk of surface roughness resulting from the annealing process. Even when used is one dielectric film 10034, the dielectric film 10034 may break if the inclination at the border between the first region 10025a and the second region 10025b is steep. It is therefore preferable that the border is inclined by 30 degrees or more with respect to the y axis extending along the deposition direction of the semiconductor layer structure 10025.

Furthermore, when the promoting film and the suppressing film are used, for example, the promoting film is uniformly deposited on the topmost surface of the semiconductor layer structure, and is removed from the topmost surface of the first region by the photolithography process and the etching process, and the suppressing film is then formed on the topmost surface of the first region. At this time, some of the promoting film may be left without being completely removed by etching. If the suppressing film is formed on the remaining promoting film, the suppressing film becomes incapable of providing the function of suppressing disordering in the active layer sufficiently, and therefore might become incapable of achieving a sufficient band gap energy difference between the non-window region and the window region, and of reducing the risk of COD.

By contrast, in the method for manufacturing a semiconductor element according to the fourteenth embodiment, because the process of removing the dielectric film before the annealing process can be omitted, the chances of not being able to sufficiently reduce the risk of COD due to the lack of sufficient etching can be prevented or reduced.

Ridge Structure Forming Process

The ridge structure forming process at Step S3105 can be conducted in the same manner as in the third embodiment. The insulating film 10016 is then deposited, and the opening 10016a is formed.

The upper electrode 10017 and the lower electrode 4 are then provided. The substrate 10005 is then cleaved, and the high reflection film 2 and the low reflection film 3 are formed on the cleavage facets. The semiconductor layer structure is then diced into elements, and the semiconductor element 13100 is achieved thereby.

As described above, with the method for manufacturing the semiconductor element 13100 according to the fourteenth embodiment, the regions with different degrees of disordering can be achieved with a more simplified process.

Example 10

Figure 119:
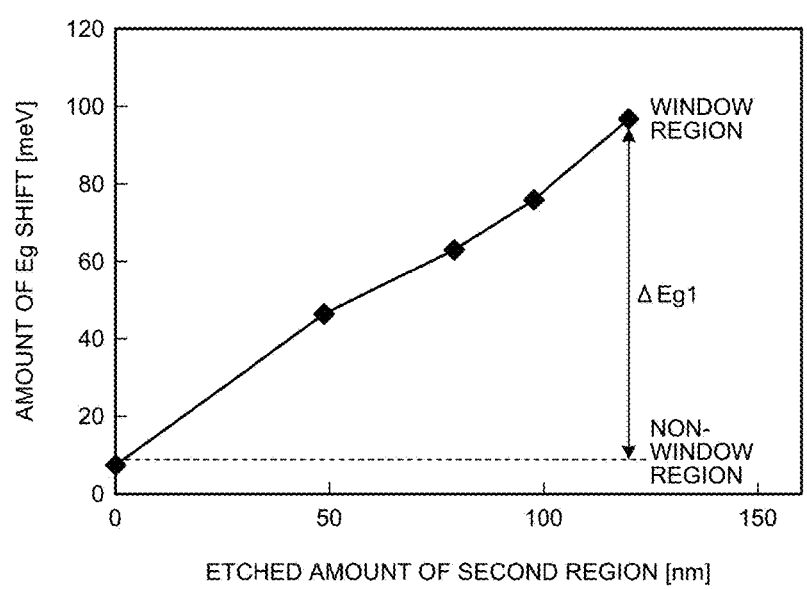

As Example 10 of the semiconductor element 13100 manufactured with the manufacturing method according to the fourteenth embodiment, a relation between the etched amount of the p-type contact layer 13013b in the second region 10025b and the degree of disordering in the active layer 10010 was measured. FIG. 119 is a schematic illustrating a relation between the etched amount of the p-type contact layer in the second region and the amount of band gap energy shift in Example 10. When the p-type contact layer 13013b is removed from the second region 10025b by etching, the Zn content of the second region 10025b, Zn 10022 being the suppressing species with the function of suppressing disordering, is reduced, and disordered crystals in the active layer 10010 grow more easily than when the p-type contact layer 13013b is not removed by etching. As a result, the amount of band gap energy shift is increased as illustrated in FIG. 119. The Zn 10022 content of the p-type contact layer 13013b can be calculated as an integral of the dopant concentration with respect to the layer thickness.

By contrast, the first region 10025a to be the non-window region 10015a was not etched, so that, when the etched amount of the p-type contact layer 13013b in the second region 10025b was increased, the band gap energy difference ΔEg1 between the non-window region 10015a and the window region 10015b was increased. When the second region 10025b was etched by 120 nanometers, in particular, the band gap energy difference ΔEg1 between the non-window region 10015a and the window region 10015b was 90 milli electron volts or higher. This result demonstrated that this structure can sufficiently reduce the risk of COD.

Figure 120:
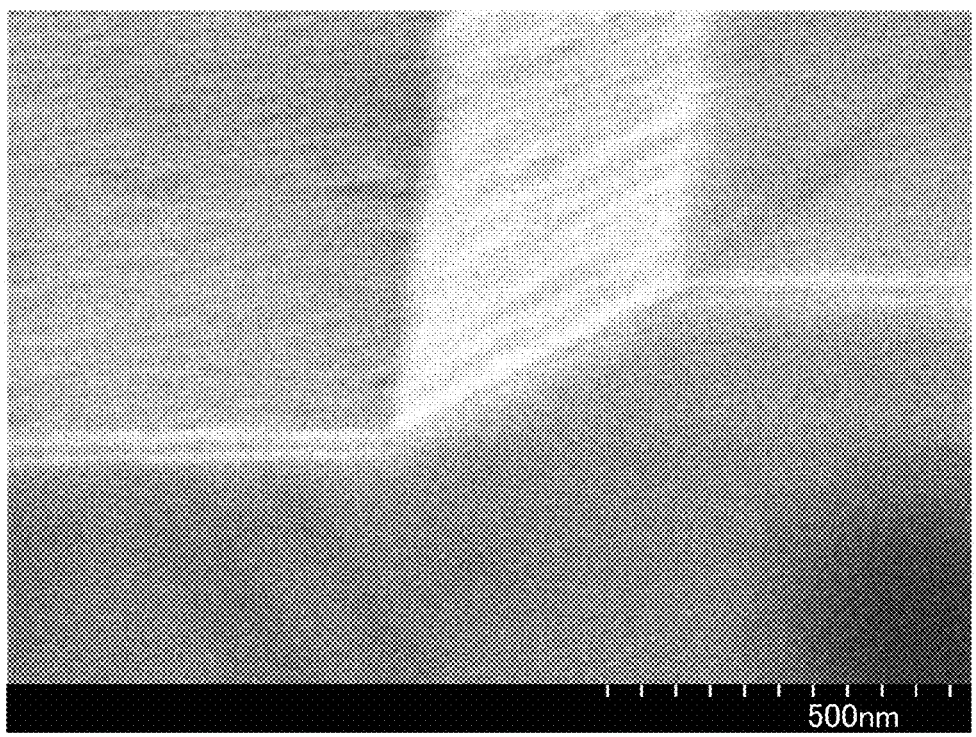

Furthermore, in Example 10 according to the fourteenth embodiment, no break was confirmed on the dielectric film 10034. This result renders the issue related to the surface roughness at the position immediately below the break irrelevant in the Example 10. FIG. 120 is a scanning electron microscope (SEM) photograph representing how the dielectric film is uniformly formed across the topmost surfaces of the first region and the second region of the semiconductor layer structure according to the twelfth embodiment. The inclination captured in FIG. 120 has a height of 200 nanometers and a width of 400 nanometers, and is inclined by 60 degrees with respect to the y axis extending along the deposition direction of the semiconductor layer structure 10025. A SiN film with a thickness of 30 nanometers is provided as the dielectric film 10034 on the semiconductor layer structure 10025. The cross-sectional SEM photograph in FIG. 120 represents no break in the dielectric film 10034, and that the dielectric film 10034 is uniformly provided. In this manner, the method for manufacturing a semiconductor element according to the Example 10 does not have any surface roughness, because the dielectric film 10034 has no break.

First Modification

A method for manufacturing a semiconductor element according to a first modification of the fourteenth embodiment will now be explained.

Figure 121:
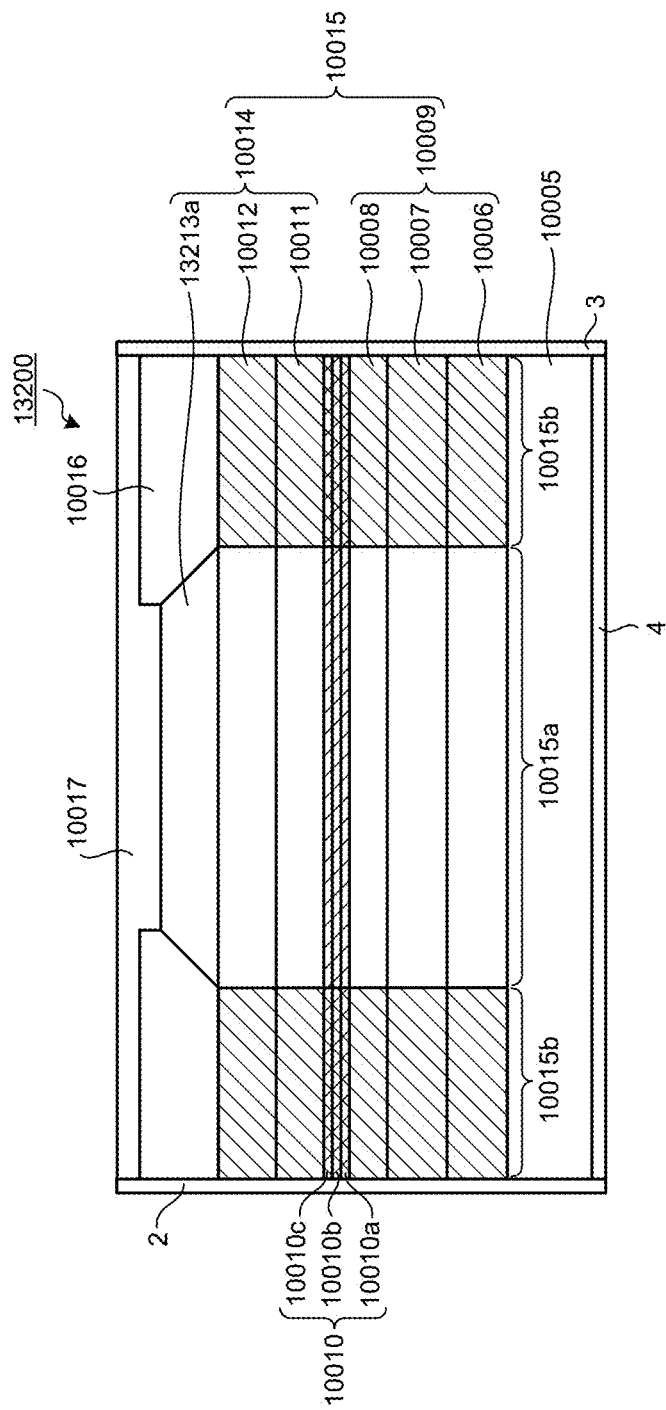
Figure 122:
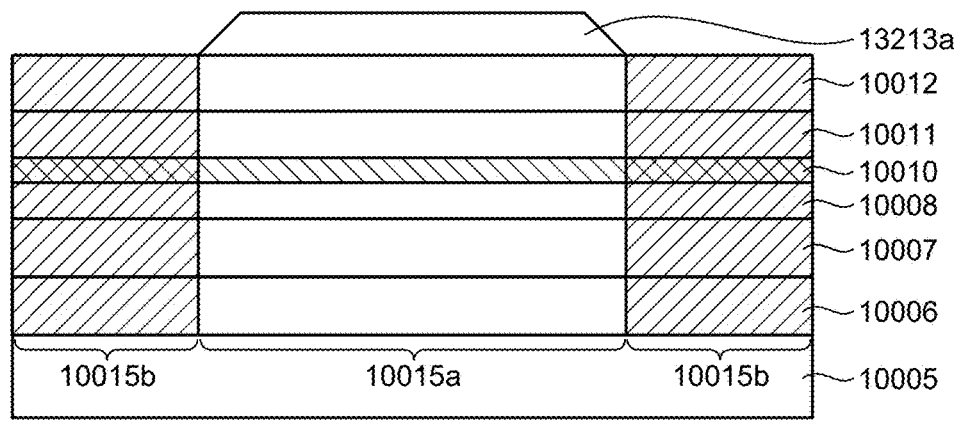

A semiconductor element 13200 manufactured with the manufacturing method according to the first modification has a structure in which a p-type contact layer 13213b containing less Zn 10022 after the annealing is removed by etching, as illustrated in FIG. 121. The method for manufacturing the semiconductor element 13200 according to the first modification follows the same process as the fourteenth embodiment up to the annealing process. As illustrated in FIG. 122, the dielectric film 10034 is then removed, in the same manner as in the ridge structure forming process in the method for manufacturing the semiconductor element 13100 according to the fourteenth embodiment, and the p-type contact layer 13213b is removed by etching. The subsequent process is the same as that in the method for manufacturing the semiconductor element 13100 according to the fourteenth embodiment. Through this process, the upper electrode 10017 is brought into contact with the p-type contact layer 13213a doped with C 10021 with a lower diffusion coefficient, and the final semiconductor element 13200 is achieved thereby.

Second Modification

Figure 123:
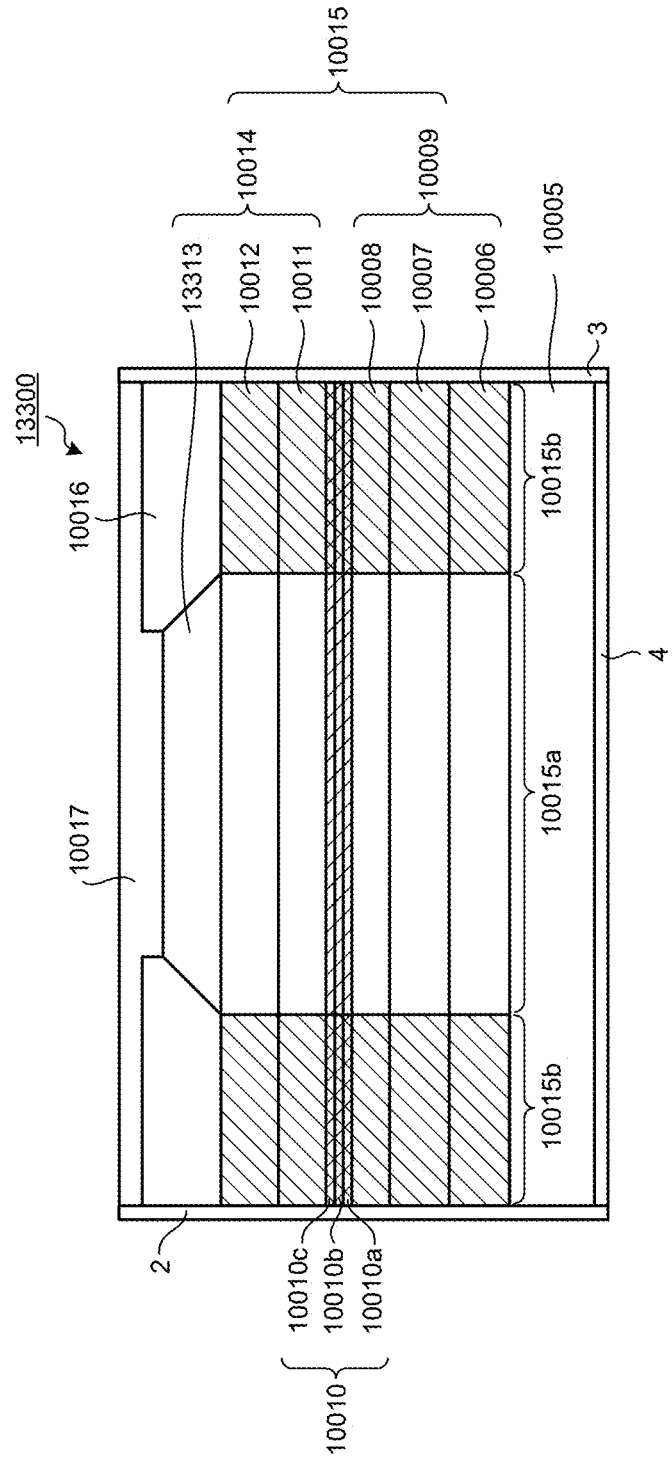

A method for manufacturing a semiconductor element according to a second modification of the fourteenth embodiment will now be explained. To begin with, a semiconductor element that can be manufactured with the method for manufacturing a semiconductor element according to the second modification will now be explained. FIG. 123 is a cross-sectional view along the y-z plane in the semiconductor element manufactured with the manufacturing method according to the second modification. As illustrated in FIG. 123, this semiconductor element 13300 manufactured with the manufacturing method according to the second modification has a structure in which the p-type contact layer has only one p-type contact layer 13313 that is doped with Zn 10022, unlike that in the semiconductor element 13100 according to the fourteenth embodiment. While only one p-type contact layer 13313 is provided, a plurality of regions with different degrees of disordering can be achieved with one dielectric film 10034 by providing the first region 10025a and the second region 10025b with different Zn 10022 contents, Zn 10022 functioning as the suppressing species.

Figure 124:
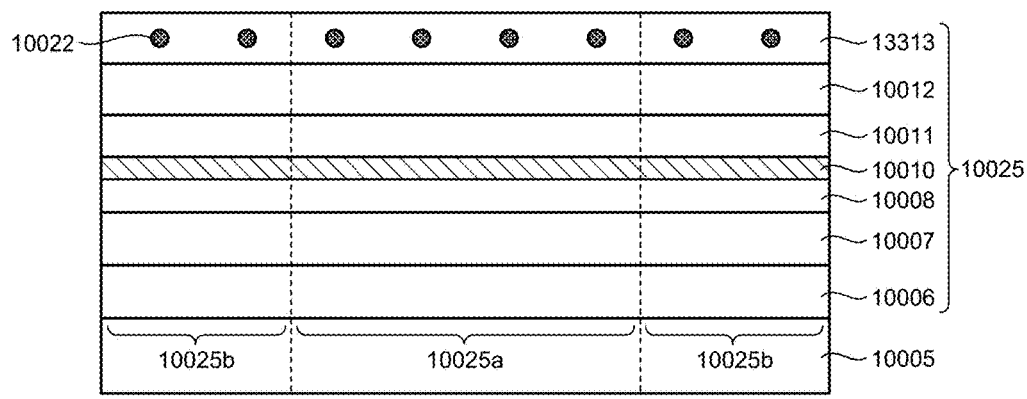
Figure 125:
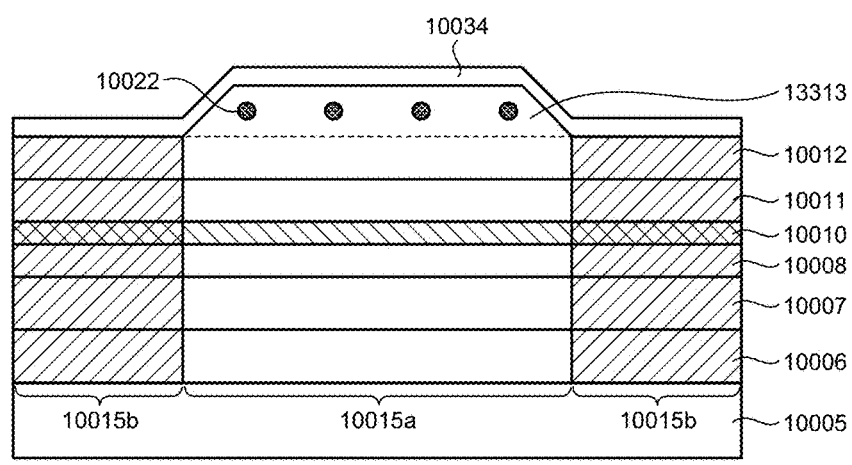

The method for manufacturing the semiconductor element 13300 according to the second modification will now be explained. FIGS. 124 and 125 are schematics for explaining the method for manufacturing a semiconductor element according to the second modification. As illustrated in FIG. 125, the method for manufacturing the semiconductor element 13300 according to the second modification, only one layer that is the p-type contact layer 13313 doped with Zn 10022 is formed on the p-type cladding layer 10012, as a semiconductor layer structure. The p-type contact layer 13313 in the second region 10025*b* is then removed in the photoresist process and the etching process, in the same manner as in the fourteenth embodiment. The dielectric film 10034 made of SiNx is then uniformly deposited on the etched area, and the semiconductor layer structure is annealed to achieve the non-window region 10015*a* and the window region 10015*b* with different degrees of disordering, as illustrated in FIG. 125. The ridge structure forming process is then conducted in the same manner as in the fourteenth embodiment, and the final semiconductor element 13300 is achieved thereby.

Third Modification

A method for manufacturing a semiconductor element according to a third modification of the fourteenth embodiment will now be explained. To begin with, a semiconductor element that can be manufactured with the method for manufacturing a semiconductor element according to the third modification will now be explained. FIG. 126 is a cross-sectional view along the y-z plane in the semiconductor element manufactured with the manufacturing method according to the third modification. As illustrated in FIG. 126, a semiconductor element 13400 according to the third modification has a structure in which a p-type contact layer 13413 has two layers, in the same manner as the semiconductor element 13100 according to the fourteenth embodiment. Unlike in the semiconductor element 13100 according to the fourteenth embodiment, in the semiconductor element 13400 according to the third modification, a p-type contact layer 13413*a* is doped with Zn 10022, and a p-type contact layer 13413*b* is doped with C 10021. Furthermore, unlike the fourteenth embodiment in which the p-type contact layer 13013*b* in the window region 10015*b* is removed by etching, the p-type contact layer 13413*b* in the non-window region 10015*a* is removed by etching.

The risk of COD can be reduced by making the degrees of disordering in the active layer 10010 different between the non-window region 10015*a* and the window region 10015*b*, and by setting the band gap energy of the window region 10015*b* higher than that of the non-window region 10015*a*. Therefore, the method may include a process of reducing the amount of Zn 10022 that is the first impurity having function of suppressing atomic vacancy diffusion in the second region 10025*b* to the level below that in first region 10025*a*, or a process of reducing the amount of C 10021 that is the second impurity having a function of promoting atomic vacancy diffusion from the first region 10025*a* to the level below that in the second region 10025*b*, before carrying out the annealing process. While the method according to the fourteenth embodiment includes the process of reducing the amount of Zn 10022 that is the first impurity having a function of suppressing atomic vacancy diffusion in the second region 10025*b* to a level below that in the first region 10025*a*, the method according to the third modification includes the process of reducing the amount of C 10021 that is the second impurity having a function of promoting atomic vacancy diffusion in the second region 10025*b* to the level below that in the first region 10025*a*. With such a process included, the regions with different degrees of disordering can be achieved with one dielectric film 10034 in the third modification.

The method for manufacturing the semiconductor element 13400 according to the third modification will now be explained. FIGS. 95 to 97 are schematics for explaining the method for manufacturing the semiconductor element according to the third modification. As illustrated in FIG. 127, in the method for manufacturing the semiconductor element 13400 according to the third modification, the p-type contact layer 13413 includes the p-type contact layer 13413*a* doped with Zn 10022 and the p-type contact layer 13413*b* doped with C 10021. As illustrated in FIG. 128, in the photolithography process, the photoresist 10131 is applied on the top surface of the second region 10025*b* in the semiconductor layer structure 10025. The p-type contact layer 13413*b* in the first region 10025*a* is then removed by etching, and the dielectric film 10034 is uniformly deposited on the first region 10025*a*, to achieve the structure illustrated in FIG. 129. When this structure is annealed, disordering in the active layer 10010 is promoted in the second region 10025*b* having the p-type contact layer 13413*b* containing C 10021 that is the promoting species. As a result, the band gap energy of the window region 10015*b* is increased to a level higher than that of the non-window region 10015*a* in which the p-type contact layer 13413*b* is removed. The non-window region 10015*a* and the window region 10015*b* with different degrees of disordering are thus achieved using one dielectric film 10034. The ridge structure forming process and the like are then carried out in the same manner as in the fourteenth embodiment, and the final semiconductor element 13400 is achieved thereby.

Fourth Modification

A method for manufacturing a semiconductor element according to a fourth modification of the fourteenth embodiment will now be explained. To begin with, a semiconductor element that can be manufactured with the method for manufacturing a semiconductor element according to the fourth modification will now be explained. FIG. 130 is a cross-sectional view along the y-z plane in the semiconductor element manufactured with the manufacturing method according to the fourth modification. As illustrated in FIG. 130, in this semiconductor element 13500 according to the fourth modification, a p-type contact layer 13513 has a p-type contact layer 13513*a* doped with Zn 10022 in the non-window region 10015*a*, and has a p-type contact layer 13513*b* doped with C 10021 in the window region 10015*b*, unlike that in the semiconductor element 13100 according to the fourteenth embodiment. With this structure, because Zn 10022 inhibits disordering in the active layer 10010 in the non-window region 10015*a*, and C 10021 promotes disordering in the active layer 10010 in the window region 10015*b*, the effects achieved with the fourteenth embodiment and the third modification can be achieved.

The method for manufacturing the semiconductor element 13500 according to the fourth modification will now be explained. FIG. 131 is a schematic for explaining the method for manufacturing a semiconductor element according to the fourth modification. In the method for manufacturing the semiconductor element 13500 according to the fourth modification, to begin with, a p-type contact layer 13513*a* doped with Zn 10022 is formed, and the photolithography process and the etching process are then performed to remove the p-type contact layer 13513*a* from the second region 10025*b*. The p-type contact layer 13513*b* doped with C 10021 is selectively formed again in the second region 10025*b*. The dielectric film 10034 is uniformly deposited on the p-type contact layer 13513*b*, to achieve the structure illustrated in FIG. 131. The annealing process, the ridge structure forming process, and the like are performed to this structure, in the same manner as in the fourteenth embodiment, and the final semiconductor element 13500 is achieved thereby.

Fifth Modification

A method for manufacturing a semiconductor element according to a fifth modification of the fourteenth embodiment will now be explained. To begin with, a semiconductor element that can be manufactured with the method for manufacturing a semiconductor element according to the fifth modification will now be explained. FIG. 132 is a cross-sectional view along the y-z plane in the semiconductor element according to the fifth modification. As illustrated in FIG. 132, this semiconductor element 13600 according to the fifth modification has a p-type contact layer 13613 including a p-type contact layer 13613*a* doped with C 10021 and a p-type contact layer 13613*b* doped with Zn 10022, in the same manner as the semiconductor element 13100 according to the fourteenth embodiment.

The method for manufacturing the semiconductor element 13600 according to the fifth modification will now be explained. FIG. 133 is a schematic for explaining an exemplary method for manufacturing the semiconductor element according to the fifth modification. In the method for manufacturing the semiconductor element 13600 according to the fifth modification, the p-type contact layer 13613*a* and the p-type contact layer 13613*b* not doped with any impurity is formed as the p-type contact layer 13613. The p-type contact layer 13613*a* is then doped with C 10021, and the p-type contact layer 13613*b* is doped with Zn 10022 by ion implantation. At this time, the p-type contact layer 13613*b* is doped with Zn 10022 that is the suppressing species so that a larger amount of Zn 10022 is contained in the first region 10025*a*, and the p-type contact layer 13613*a* is doped with C 10021 that is the promoting species so that a larger amount of C 10021 is contained in the second region 10025*b*. The dielectric film 10034 is then uniformly deposited on the p-type contact layer 13613, to achieve the structure illustrated in FIG. 133. The annealing process, the ridge structure forming process, and the like are performed to this structure in the same manner as in the fourteenth embodiment, and the final semiconductor element 13600 is achieved thereby. The same layer may be doped with both of C 10021 and Zn 10022 by the ion implantation.

In the fourteenth embodiment, the different degrees of disordering in the non-window region 10015*a* and the window region 10015*b* are achieved by selectively removing the semiconductor layer containing the impurity by etching or the like, by allowing the impurity-containing layer with an intended impurity content to grow again, or by performing selective ion implantation. However, embodiments of the present invention are not limited thereto. Alternatively, the different degrees of disordering may be achieved in the non-window region 10015*a* and the window region 10015*b* by selectively depositing a simple substance of an element functioning as the suppressing species or the promoting species, or a compound containing the suppressing species or the promoting species on the semiconductor layer structure 10025, and by causing diffusion by the annealing, for example.

Fifteenth Embodiment

A method for manufacturing a semiconductor element according to a fifteenth embodiment of the present invention will now be explained. To begin with, a semiconductor element that can be manufactured with the manufacture method according to the fifteenth embodiment will be explained. As illustrated in FIG. 134, a semiconductor element 13700 that can be manufactured with the manufacturing method according to the fifteenth embodiment has the same structure as the semiconductor element 13100 according to the fourteenth embodiment except for a p-type contact layer 13713. The p-type contact layer 13713 includes a p-type contact layer 13713*a* doped with C 10021 and a p-type contact layer 13713*b* doped with Zn 10022, in the same manner as the semiconductor element 13100, but the p-type contact layer 13713*b* in the window region 10015*b* is not removed by etching, unlike in the semiconductor element 13100. Furthermore, the topmost surface of the p-type contact layer 13713*b* in the window region 10015*b* is rougher than the topmost surface of the p-type contact layer 13713*b* in the non-window region 10015*a*. An operation of the semiconductor element 13700 is the same as that of the semiconductor element 13100, and the semiconductor element 13700 operates as a semiconductor laser element with a lower risk of COD.

An exemplary method for manufacturing the semiconductor element 13700 will now be explained. The method for manufacturing the semiconductor element 13700 according to the fifteenth embodiment includes the semiconductor layer structure forming process, the first annealing preparation process, the second annealing preparation process, the annealing process, and the ridge structure forming process illustrated in FIG. 81, in the same manner as in the fourteenth embodiment.

Semiconductor Layer Structure Forming Process

To begin with, the semiconductor layer structure forming process will be explained. In this process, to begin with, as illustrated in FIG. 135, the semiconductor layer structure 10025 including the active layer 10010 is formed through MOCVD. The semiconductor layer structure 10025 is the same as the semiconductor layer structure 10025 in the semiconductor element 13100, and the p-type contact layer 13713*a* is doped with C 10021, and the p-type contact layer 13713*b* is doped with Zn 10022. In the semiconductor layer structure 10025, the region that is to be the non-window region 10015*a* is referred to as the first region 10025*a*, and the region that is to be the window region 10015*b* is referred to as the second region 10025*b*.

First Annealing Preparation Process

The first annealing preparation process will now be explained. In this process, the surface roughness of the topmost surface of the first region 10025*a* is made different from that of the topmost surface of the second region 10025*b*. When the topmost surface of the semiconductor layer structure 10025 that is brought into contact with the dielectric film 10034 is rougher, atomic vacancies appear more easily on the interface with the dielectric film 10034 in the semiconductor layer structure 10025 when annealed, and disordering in the active layer 10010 is promoted thereby.

To begin with, as illustrated in FIG. 136, the photoresist 10131 is applied to the top surface of the first region 10025*a* of the semiconductor layer structure 10025 by the photolithography process. The topmost surface of the p-type contact layer 13713*b* in the second region 10025*b* is selectively etched using a plasma process such as reactive ion etching (RIE) as a surface treatment that increases the surface roughness. As the etching gas for the RIE, $O_2$ plasma gas may be used, for example. Through this process, the surface roughness as average surface roughness of the topmost surface of the p-type contact layer 13713*b* is increased to 3 nanometers or more, for example, in the second region 10025*b*. In the first region 10025*a* that is not etched due to the masking with the photoresist 10131, the surface roughness as average surface roughness of the topmost surface of the p-type contact layer 13713*b* is 1 nanometer or so.

The photoresist 10131 is then removed. Through this process, the topmost surface of the second region 10025*b* can made rougher than that of the topmost surface of the first region 10025*a*. Disordered crystals grow in the active layer 10010 more easily in the second region 10025*b* than in the first region 10025*a* when annealed. By allowing the topmost surface of the second region 10025*b* to be rougher than the topmost surface of the first region 10025*a*, the band gap energy difference can be achieved without etching out a large amount of the p-type contact layer 13713*b* in the second region 10025*b*. The p-type contact layer 13713*b* may even be left unremoved in the second region 10025*b*. The border between the first region 10025*a* and the second region 10025*b* can thus be kept covered more than in the fourteenth embodiment. When used is an equipment into which samples with photoresist cannot be introduced, or when used is a process causing the photoresist to deteriorate, a dielectric film can be used as a mask in replacement of the photoresist 10131. The surface roughness can be measured with a technique such as atomic force microscope (AFM) or X-ray reflectivity measurement.

Second Annealing Preparation Process

The second annealing preparation process will now be explained. In this process, as illustrated in FIG. 137, the dielectric film 10034 is uniformly deposited on the topmost surface of the semiconductor layer structure 10025. Before the dielectric film 10034 is deposited, the topmost surface is preferably cleaned with sulfuric acid or the like to remove any substance attached on the surface, while ensuring not to affect the surface roughness of the first region 10025*a* and the second region 10025*b*.

Annealing Process

The annealing process will now be explained. In this process, the RTA is carried out at a temperature of 850 degrees Celsius for 30 seconds, for example, in the same manner as in the fourteenth embodiment. During the RTA, disordering in the active layer 10010 is promoted in the second region 10025*b* with higher surface roughness, and the second region 10025*b* is turned into the window region 10015*b*, while the first region 10025*a* with low surface roughness is turned into the non-window region 10015*a*.

Ridge Structure Forming Process

The ridge structure forming process can be conducted in the same manner as in the fourteenth embodiment. The insulating film 10016, the opening 10016*a*, the lower electrode 4, and the upper electrode 10017 are then formed. The substrate 10005 is cleaved, and the high reflection film 2 and the low reflection film 3 are applied to the respective cleavage facets. The semiconductor layer structure is then diced into elements, achieving the semiconductor element 13700 thereby.

As described above, the method for manufacturing the semiconductor element 13700 according to the fifteenth embodiment is capable of producing the non-window region and the window region with different degrees of disordering with a more simplified process.

Example 11

As Example 11 of the semiconductor element 13700 manufactured with the manufacture method according to the fifteenth embodiment, a relation between the surface roughness and the degrees of disordering in the active layer 10010 in the p-type contact layer 13713*b* of the second region 10025*b* was measured. FIG. 138 is a schematic illustrating a relation between the average surface roughness of and the amount of band gap energy shift in the second region in Example 11. As indicated by FIG. 138, when the surface roughness of the topmost surface of the p-type contact layer 13713*b* in the second region 10025*b* was increased, disordering in the active layer 10010 was promoted, and the amount of band gap energy shift was increased.

Because the surface roughness in the first region 10025*a* not etched and to be the non-window region 10015*a* remains the same, when the surface roughness of the p-type contact layer 10013*b* in the second region 10025*b* is increased, the difference between the surface roughness in the first region 10025*a* and the surface roughness in the second region 10025*b* is increased, and the band gap energy difference $\Delta Eg2$ between the non-window region 10015*a* and the window region 10015*b* is increased. When the average surface roughness of the second region 10025*b* was increased to 3.0 nanometers or more, while the first region 10025*a* was 1.0 nanometer, ensuring an average surface roughness difference equal to or more than 2.0 nanometers between the first region 10025*a* and the second region 10025*b*, the resultant band gap energy difference $\Delta Eg2$ between the non-window region 10015*a* and the window region 10015*b* was 60 milli electron volts or more, so that the risk of COD can be sufficiently reduced. In particular, when the average surface roughness of the second region 10025*b* was set to 4.5 nanometers, ensuring the average surface roughness difference of 3.5 nanometers between the first region 10025*a* and the second region 10025*b*, the resultant $\Delta Eg2$ was equal to or more than 85 milli electron volts, demonstrating that the risk of COD can be further reduced.

The RIE using $O_2$ plasma is described as an example of the surface process in the fifteenth embodiment. However, different levels of surface roughness on the first region and the second region can also be achieved using other techniques such as wet etching using sulfuric acid, hydrogen peroxide, or citric acid, for example, acid treatment with sulfuric acid, hydrochloric acid, hydrofluoric acid, phosphoric acid, or tartaric acid, for example, alkali treatment with ammonia or a developer (e.g., tetramethylammonium hydroxide), for example, organic cleaning using acetone, ethanol, methanol, methyl ethyl ketone, or isopropyl alcohol (IPA), for example, a mechanical process such as polishing, or a physical process using laser processing, or electron beam irradiation, for example. Furthermore, embodiments of the present invention are not limited thereto, and the regions with different degrees of disordering can be achieved with one dielectric film using any method for achieving different levels of surface roughness on the first region and the second region by means of some kind of surface treatment.

Sixteenth Embodiment

A method for manufacturing a semiconductor element according to a sixteenth embodiment of the present invention will now be explained. With the manufacturing method according to the sixteenth embodiment, a semiconductor element having the same structure as in the ninth embodiment can be manufactured.

FIG. 139 is a cross-sectional view along the x-y plane in the semiconductor element that can be manufactured with the manufacturing method according to the sixteenth embodiment. This semiconductor element 13800 is provided with semiconductor layer portion 13815 including a substrate 13805, and a lower cladding layer 13807, a core layer 13810, and an upper cladding layer 13812 made of GaAs, for example, sequentially formed on the substrate 13805.

The semiconductor layer portion 13815 also included a disordering suppressed region 13815a and a disordering promoted region 13815b.

The semiconductor element 13800 has a structure that confines light in the y-axial direction with the core layer 13810, and the lower cladding layer 13807 and the upper cladding layer 13812 between which the core layer 13810 is sandwiched and made of a semiconductor with a smaller refractive index than that of the core layer. The semiconductor element 13800 also has a structure that confines light in the x-axial direction by the disordering suppressed region 13815a and the disordering promoted region 13815b surrounding the disordering suppressed region 13815a and having a smaller refractive index than the disordering suppressed region 13815a. The semiconductor element 13800 thus functions as a semiconductor light waveguide guiding the light in the z-axial direction.

An exemplary method for manufacturing the semiconductor element 13800 will now be explained. The method for manufacturing the semiconductor element 13800 according to the sixteenth embodiment includes the semiconductor layer structure forming process, the first annealing preparation process, the second annealing preparation process, and the annealing process, as illustrated in FIG. 81, in the same manner as in the fourteenth embodiment.

Semiconductor Layer Structure Forming Process

In this process, to begin with, as illustrated in FIG. 140, the lower cladding layer 13807, the core layer 13810, and the upper cladding layer 13812 are deposited on the substrate 13805 through MOCVD. An impurity-containing layer 13813 including a promoting species containing layer 13813a doped with the promoting species and an suppressing species containing layer 13813b doped with the suppressing species is then further formed, to achieve a semiconductor layer structure 13825.

First Annealing Preparation Process

In this process, the suppressing species containing layer 13813b is removed from a second region 13825b in the semiconductor layer structure 13825 by etching, so that a less amount of the suppressing species is contained in the second region 13825b than in a first region 13825a. With this structure, disordered crystals grow more easily by the subsequent annealing in the second region 13825b to be the disordering promoted region 13815b, than the first region 13825a to be the disordering suppressed region 13815a, in the semiconductor layer structure 13825.

To begin with, the photoresist 10131 is applied on the top surface of the first region 13825a in the semiconductor layer structure 13825 by the photolithography process. The suppressing species containing layer 13813b in the second region 13825b is then removed by etching, as illustrated in FIG. 141.

The photoresist 10131 is then removed. After this process, the second region 13825b contains a less amount of the suppressing species than the first region 13825a, so that disordered crystals grow in the semiconductor layer portion 13815 more easily in the second region 13825b than in the first region 13825a by the annealing. An inclined surface may be provided along the border between the first region 13825a and the second region 13825b, as illustrated, but no inclined surface may be provided. This is because the semiconductor layer structure 13825 is not affected by the surface roughness resulting from the annealing, because the impurity-containing layer 13813 is removed in the subsequent process.

Second Annealing Preparation Process

In this process, as illustrated in FIG. 142, the dielectric film 10034 is uniformly deposited on the topmost surface of the semiconductor layer structure 13825. Before the dielectric film 10034 is deposited, the top surface is preferably cleaned with sulfuric acid or the like to remove any substance attached on the surface.

Annealing Process

In this process, the RTA is carried out at a temperature of 850 degrees Celsius for 30 seconds, for example, in the same manner as in the fourteenth embodiment. When the RTA is carried out, the dielectric film 10034 absorbs the Ga atoms, and atomic vacancies appear on the impurity-containing layer 13813. The atomic vacancies diffuse as the diffusing species, and disordering is induced in the semiconductor layer portion thereby. Through this process, the disordering suppressed region 13815a and the disordering promoted region 13815b with different degrees of disordering are formed (see FIG. 139). The impurity-containing layer 13813 is then removed by etching, for example, and the final semiconductor element 13800 is achieved thereby.

As described above, in the manufacture method according to the sixteenth embodiment, the regions with different degrees of disordering can be achieved with a more simplified process. In the manner described above, the present invention can be applied to a semiconductor light waveguide, such as that according to the sixteenth embodiment, without limitation to the semiconductor laser element as disclosed in the fourteenth and the fifteenth embodiment, and to the semiconductor laser element or the semiconductor element according to the other embodiments.

In the sixteenth embodiment, a third region with a different degree of disordering may be provided outside of the second region, in the same manner as in the ninth embodiment, to improve the optical confinement in the x-axial direction. Furthermore, the degrees of disordering may be changed continuously by continuously changing the thickness of the suppressing species containing layer in the x-axial direction, for example. Such a structure can also achieve the regions with different degrees of disordering with one dielectric film, in the same manner as in the embodiments described above.

As the results described above indicate, the method for manufacturing the semiconductor element according to any one of the embodiments of the present invention was demonstrated to be capable of forming the regions with different degrees of disordering using one dielectric film, capable of providing a simple manufacture process, and capable of sufficiently reducing the risk of COD.

The manufacture of a semiconductor element is explained as those of a semiconductor laser element and of a semiconductor light waveguide in the embodiments, but the present invention is not limited thereto, and the present invention may be also used in manufacturing a semiconductor element as an electronic element such as a transistor or a diode.

Furthermore, in the embodiment described above, the topmost surface of the semiconductor layer structure is brought into contact with a dielectric film that is uniform $SiN_x$ before the annealing, but the present invention is not limited thereto. A semiconductor layer structure with different degrees of disordering may also be achieved by uniformly depositing a dielectric film made of $SiO_x$, $ZnO_x$, $AlO_x$, $AlN_x$, $AlO_xN_y$, $TiO_x$, $TiN_x$, $TiO_xN_y$, $TaO_x$, or $HfO_x$, a metallic film such as Ti, Ta, Al, Au, Ni, Zn, and Pt, or a semiconductor film such as Si, Ge, GaAs, AlGaAs, GaN, AlGaN, and ZnSe on the topmost surface of the semiconductor layer structure before the annealing. According to the present invention, the uniform medium is not limited to a uniform film. For example, the regions with different degrees of disordering may also be achieved in the semiconductor layer structure by bringing the topmost surface of the semiconductor layer structure into contact with uniform gaseous atmosphere such as $N_2$, As, As compounds such as arsine, and Ar, and annealing in the gaseous atmosphere.

Furthermore, in the fourteenth and the sixteenth embodiments, the impurity-containing layer is selectively removed by etching so that disordered crystals grow in the active layer more easily by the annealing in the second region than that in the first region. In the fifteenth embodiment, different levels of surface roughness are provided to the topmost surface of the semiconductor layer structure with which the dielectric film is brought into contact so that disordered crystals grow in the active layer more easily in the second region than that in the first region by the annealing. However, the selective etching as disclosed in the fourteenth and the sixteenth embodiments and providing different levels of surface roughness to the topmost surface as disclosed in the fifteenth embodiment may also be combined to achieve the regions with a larger difference in the degrees of disordering in the semiconductor layer structure in order to provide a semiconductor laser element with a lower risk of COD, for example.

Furthermore, in the embodiment described above, C and Zn are mentioned as examples of the p-type impurity, but the first impurity may be Mg and Be, for example, and the second impurity may be Si, Ge, Sn, S, and Se, for example, and two or more that are a plurality of impurities may be used as dopants.

Furthermore, used in the embodiments described above as an example is a semiconductor laser element having a ridge structure, but the present invention may be also used in any semiconductor laser element without limitation to those with a ridge structure. Explained in the embodiments described above is a structure in which the n-type buffer layer 10006, the n-type cladding layer 10007, the n-type guide layer 10008, the active layer 10010, the p-type guide layer 10011, the p-type cladding layer 10012, and the p-type contact layer 10013 are formed on the substrate 10005, but the structure may also include a p-type buffer layer, a p-type cladding layer, a p-type guide layer, an active layer, an n-type guide layer, an n-type cladding layer, and an n-type contact layer sequentially formed on the substrate 10005. In such a structure, different impurity contents of the n-type semiconductor layer section, the impurity being the n-type dopant, may be provided to the non-window region 10015a and the window region 10015b. As the n-type dopant, Si, C, Ge, Sn, S, Se, or the like may be used.

Furthermore, the layer structure may include a substrate made of another material such as InP, or include other materials, depending on the desired oscillation wavelength.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor optical element comprising:
   a semiconductor layer portion that includes an optical waveguide layer, wherein
   the semiconductor layer portion contains a first impurity having a function of suppressing atomic vacancy diffusion and a second impurity having a function of promoting atomic vacancy diffusion, between a topmost surface of the semiconductor layer portion and the optical waveguide layer,
   the semiconductor layer portion includes two or more regions that extend in a deposition direction,
   at least one of the two or more regions contains both the first impurity and the second impurity in a topmost layer of the semiconductor layer portion, and
   the two or more regions have different degrees of disordering in the optical waveguide layer achieved through atomic vacancy diffusion and different band gap energies of the optical waveguide layer,
   an entirety of a first of the two or more regions is formed along a first plane that extends in the deposition direction, an entirety of a second of the two or more regions is formed along a second plane that extends in the deposition direction, the first plane being arranged adjacent to the second plane,
   the topmost layer is a contact layer, and
   the second impurity is not zinc.

2. The semiconductor optical element according to claim 1, wherein
   the two or more regions includes different contents of the at least one of the impurities.

3. The semiconductor optical element according to claim 2, wherein
   the two or more regions in the semiconductor layer portion has different contents of the first impurity,
   one of the two or more regions with a higher content of the first impurity has a lower band gap energy of the optical waveguide layer.

4. The semiconductor optical element according to claim 2, wherein
   the two or more regions in the semiconductor layer portion has different contents of the second impurity, and
   one of the two or more regions with a higher content of the second impurity has a higher band gap energy of the optical waveguide layer.

5. The semiconductor optical element according to claim 1, wherein
   at least one border between the two or more regions is formed along a light guiding direction of the optical waveguide layer, and
   the two or more regions have different effective refractive indices.

6. The semiconductor optical element according to claim 1, wherein
   the semiconductor layer portion includes an active layer as the optical waveguide layer, and
   at least one border between the two or more regions is formed in a manner traversing a light guiding direction of the optical waveguide layer.

7. The semiconductor optical element according to claim 2, wherein
   the topmost layer region has a higher content of one of the first impurity and the second impurity with a lower diffusion coefficient.

* * * * *